(12) United States Patent
Karino et al.

(10) Patent No.: US 8,058,660 B2
(45) Date of Patent: Nov. 15, 2011

(54) SEMICONDUCTOR LIGHT EMITTING DEVICE, METHOD FOR MANUFACTURING SAME, AND METHOD FOR FORMING UNDERLYING LAYER

(75) Inventors: Sachio Karino, Miyagi (JP); Eiji Takase, Miyagi (JP); Makoto Oogane, Kanagawa (JP); Tsuyoshi Nagatake, Kanagawa (JP); Michiru Kamada, Miyagi (JP); Hironobu Narui, Kanagawa (JP); Nobukata Okano, Kanagawa (JP)

(73) Assignee: Sony Corporation, Tokyo (JP)

( * ) Notice: Subject to any disclaimer, the term of this patent is extended or adjusted under 35 U.S.C. 154(b) by 332 days.

(21) Appl. No.: 12/208,776

(22) Filed: Sep. 11, 2008

(65) Prior Publication Data
US 2009/0072253 A1    Mar. 19, 2009

(30) Foreign Application Priority Data

Sep. 14, 2007 (JP) ................................. 2007-239801

(51) Int. Cl.
*H01L 33/00* (2010.01)
(52) U.S. Cl. .................. 257/94; 257/E33.023
(58) Field of Classification Search .............. 257/95, 257/96
See application file for complete search history.

(56) References Cited

U.S. PATENT DOCUMENTS
5,111,469 A * 5/1992 Narui et al. ............... 372/46.01

FOREIGN PATENT DOCUMENTS
| JP | 2990837 | 10/1999 |
| JP | 3399018 | 2/2003 |
| JP | 2006-5130 A * | 5/2006 |

OTHER PUBLICATIONS

Sze, Physics of Semiconductor Devices, 2007, Wiley-Interscience, Third Edition, pp. 611, 789.*

* cited by examiner

*Primary Examiner* — Steven Loke
*Assistant Examiner* — David Ziskind
(74) *Attorney, Agent, or Firm* — SNR Denton US LLP

(57) ABSTRACT

Disclosed herein is a semiconductor light emitting device including: (A) an underlying layer configured to be formed on a major surface of a substrate having a {100} plane as the major surface; (B) a light emitting part; and (C) a current block layer, wherein the underlying layer is composed of a III-V compound semiconductor and is formed on the major surface of the substrate by epitaxial growth, the underlying layer extends in parallel to a <110> direction of the substrate, a sectional shape of the underlying layer obtained when the underlying layer is cut along a virtual plane perpendicular to the <110> direction of the substrate is a trapezoid, and oblique surfaces of the underlying layer corresponding to two oblique sides of the trapezoid are {111}B planes, and the top surface of the underlying layer corresponding to an upper side of the trapezoid is a {100} plane.

4 Claims, 64 Drawing Sheets

[STEP-100]

[STEP-110]

[STEP-120]

[STEP-130]

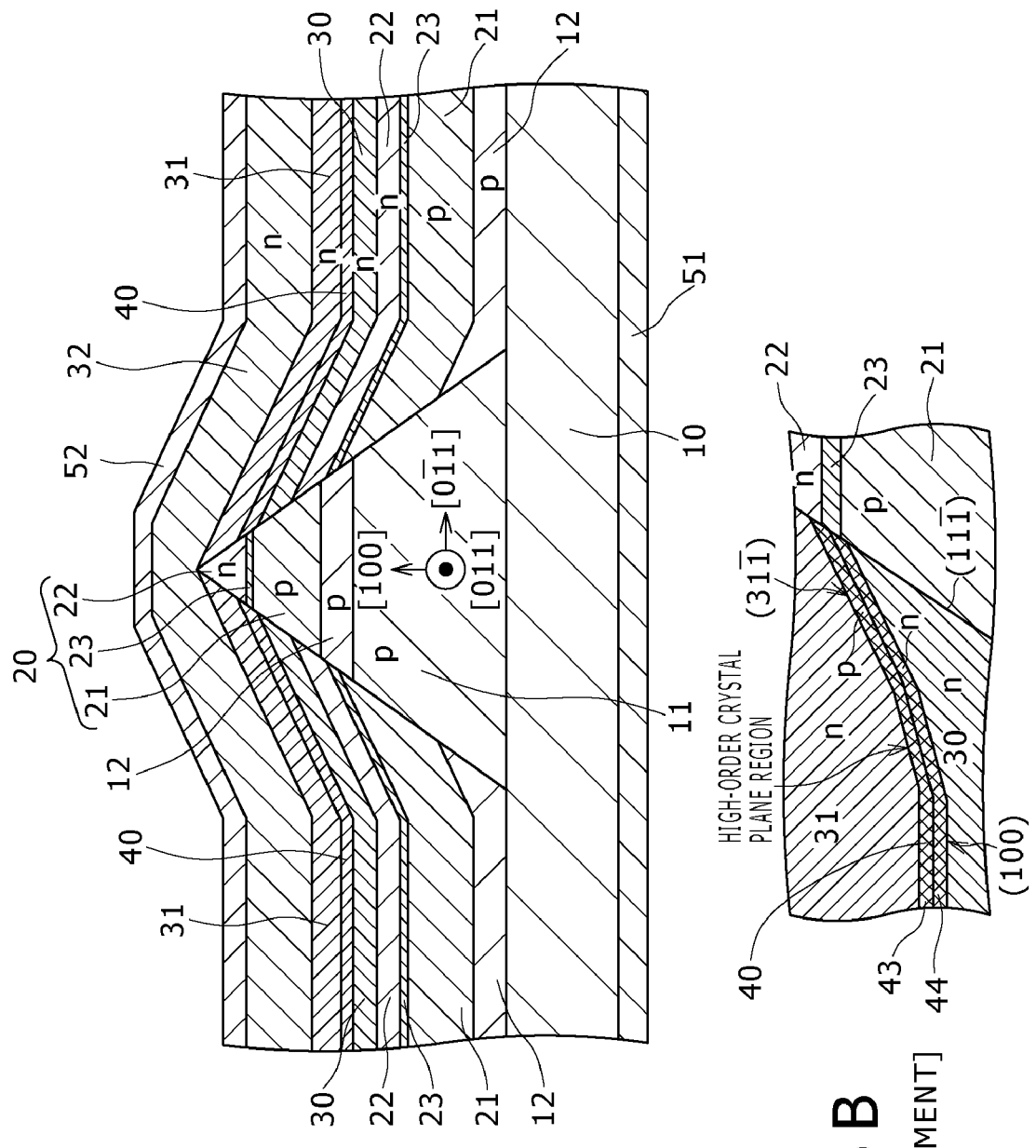
FIG. 6A [THIRD EMBODIMENT]
FIG. 6B [THIRD EMBODIMENT]

[( I )-1-A-TH CONFIGURATION, ( I )-2-A-TH CONFIGURATION, ( I )-4-A-TH CONFIGURATION]

[( I )-1-a-TH CONFIGURATION, ( I )-3-a-TH CONFIGURATION, ( I )-4-a-TH CONFIGURATION]

[(I)-1-C-TH CONFIGURATION, (I)-2-C-TH CONFIGURATION, (I)-4-A-TH CONFIGURATION]

[(I)-1-c-TH CONFIGURATION, (I)-3-c-TH CONFIGURATION, (I)-4-a-TH CONFIGURATION]

[(Ⅰ)-1-D-TH CONFIGURATION, (Ⅰ)-2-D-TH CONFIGURATION]

[(Ⅰ)-1-d-TH CONFIGURATION, (Ⅰ)-3-d-TH CONFIGURATION]

[( I )-5-A-1-TH CONFIGURATION]

[( I )-5-A-2-TH CONFIGURATION]

[( I )-5-a-1-TH CONFIGURATION]

[( I )-5-a-2-TH CONFIGURATION]

[(Ⅰ)-5-B-1-TH CONFIGURATION]

[(Ⅰ)-5-B-2-TH CONFIGURATION]

[( I )-5-B-1-TH CONFIGURATION](MODIFICATION)

[( I )-5-B-2-TH CONFIGURATION](MODIFICATION)

[( I )-5-b-1-TH CONFIGURATION]

[( I )-5-b-2-TH CONFIGURATION]

[( I )-5-b-1-TH CONFIGURATION](MODIFICATION)

[( I )-5-b-2-TH CONFIGURATION](MODIFICATION)

[(I)-5-C-1-TH CONFIGURATION]

[(I)-5-C-2-TH CONFIGURATION]

[( I )-5-C-1-TH CONFIGURATION](MODIFICATION)

[( I )-5-C-2-TH CONFIGURATION](MODIFICATION)

[(I)-5-c-1-TH CONFIGURATION]

[(I)-5-c-2-TH CONFIGURATION]

[(II)-1-A-TH CONFIGURATION, (II)-2-A-TH CONFIGURATION, (II)-4-A-TH CONFIGURATION]
[BOTH END PARTS OF LIGHT EMITTING PART]

[(II)-1-A-TH CONFIGURATION, (II)-2-A-TH CONFIGURATION, (II)-4-A-TH CONFIGURATION]
[CENTER PART OF LIGHT EMITTING PART]

[(II)-1-B-TH CONFIGURATION, (II)-2-B-TH CONFIGURATION]
[BOTH END PARTS OF LIGHT EMITTING PART]

[(II)-1-B-TH CONFIGURATION, (II)-2-B-TH CONFIGURATION]
[CENTER PART OF LIGHT EMITTING PART]

[(II)-1-C-TH CONFIGURATION, (II)-2-C-TH CONFIGURATION, (II)-4-A-TH CONFIGURATION]
[BOTH END PARTS OF LIGHT EMITTING PART]

[(II)-1-C-TH CONFIGURATION, (II)-2-C-TH CONFIGURATION, (II)-4-A-TH CONFIGURATION]
[CENTER PART OF LIGHT EMITTING PART]

[(II)-1-D-TH CONFIGURATION, (II)-2-D-TH CONFIGURATION]
[BOTH END PARTS OF LIGHT EMITTING PART]

[(II)-1-D-TH CONFIGURATION, (II)-2-D-TH CONFIGURATION]
[CENTER PART OF LIGHT EMITTING PART]

[(II)-1-a-TH CONFIGURATION, (II)-3-a-TH CONFIGURATION, (II)-4-a-TH CONFIGURATION]
[BOTH END PARTS OF LIGHT EMITTING PART]

[(II)-1-a-TH CONFIGURATION, (II)-3-a-TH CONFIGURATION, (II)-4-a-TH CONFIGURATION]
[CENTER PART OF LIGHT EMITTING PART]

[(II)-1-b-TH CONFIGURATION, (II)-3-b-TH CONFIGURATION]
[BOTH END PARTS OF LIGHT EMITTING PART]

[(II)-1-b-TH CONFIGURATION, (II)-3-b-TH CONFIGURATION]
[CENTER PART OF LIGHT EMITTING PART]

[(II)-1-c-TH CONFIGURATION, (II)-3-c-TH CONFIGURATION, (II)-4-a-TH CONFIGURATION]
[BOTH END PARTS OF LIGHT EMITTING PART]

[(II)-1-c-TH CONFIGURATION, (II)-3-c-TH CONFIGURATION, (II)-4-a-TH CONFIGURATION]
[CENTER PART OF LIGHT EMITTING PART]

[(II)-1-d-TH CONFIGURATION, (II)-3-d-TH CONFIGURATION]
[BOTH END PARTS OF LIGHT EMITTING PART]

[(II)-1-d-TH CONFIGURATION, (II)-3-d-TH CONFIGURATION]
[CENTER PART OF LIGHT EMITTING PART]

[(II)-5-A-1-TH CONFIGURATION]
[BOTH END PARTS OF LIGHT EMITTING PART]

[(II)-5-A-1-TH CONFIGURATION]
[CENTER PART OF LIGHT EMITTING PART]

[(II)-5-A-2-TH CONFIGURATION]
[BOTH END PARTS OF LIGHT EMITTING PART]

[(II)-5-A-2-TH CONFIGURATION]
[CENTER PART OF LIGHT EMITTING PART]

[(II)-5-a-1-TH CONFIGURATION]
[BOTH END PARTS OF LIGHT EMITTING PART]

[(II)-5-a-1-TH CONFIGURATION]
[CENTER PART OF LIGHT EMITTING PART]

[(II)-5-a-2-TH CONFIGURATION]
[BOTH END PARTS OF LIGHT EMITTING PART]

[(II)-5-a-2-TH CONFIGURATION]
[CENTER PART OF LIGHT EMITTING PART]

[(II)-5-B-1-TH CONFIGURATION]
[BOTH END PARTS OF LIGHT EMITTING PART]

[(II)-5-B-1-TH CONFIGURATION]
[CENTER PART OF LIGHT EMITTING PART]

[MODIFICATION OF (II)-5-B-1-TH CONFIGURATION]
[BOTH END PARTS OF LIGHT EMITTING PART]

[MODIFICATION OF (II)-5-B-1-TH CONFIGURATION]
[CENTER PART OF LIGHT EMITTING PART]

[(II)-5-B-2-TH CONFIGURATION]
[BOTH END PARTS OF LIGHT EMITTING PART]

[(II)-5-B-2-TH CONFIGURATION]
[CENTER PART OF LIGHT EMITTING PART]

[MODIFICATION OF (II)-5-B-2-TH CONFIGURATION]
[BOTH END PARTS OF LIGHT EMITTING PART]

[MODIFICATION OF (II)-5-B-2-TH CONFIGURATION]
[CENTER PART OF LIGHT EMITTING PART]

[(II)-5-b-1-TH CONFIGURATION]
[BOTH END PARTS OF LIGHT EMITTING PART]

[(II)-5-b-1-TH CONFIGURATION]
[CENTER PART OF LIGHT EMITTING PART]

[MODIFICATION OF (II)-5-b-1-TH CONFIGURATION]
[BOTH END PARTS OF LIGHT EMITTING PART]

[MODIFICATION OF (II)-5-b-1-TH CONFIGURATION]
[CENTER PART OF LIGHT EMITTING PART]

[(II)-5-b-2-TH CONFIGURATION]
[BOTH END PARTS OF LIGHT EMITTING PART]

[(II)-5-b-2-TH CONFIGURATION]
[CENTER PART OF LIGHT EMITTING PART]

[(II)-5-C-1-TH CONFIGURATION]
[BOTH END PARTS OF LIGHT EMITTING PART]

[(II)-5-C-1-TH CONFIGURATION]
[CENTER PART OF LIGHT EMITTING PART]

[MODIFICATION OF (II)-5-C-1-TH CONFIGURATION]
[BOTH END PARTS OF LIGHT EMITTING PART]

[MODIFICATION OF (II)-5-C-1-TH CONFIGURATION]
[CENTER PART OF LIGHT EMITTING PART]

[( II )-5-C-2-TH CONFIGURATION]
[BOTH END PARTS OF LIGHT EMITTING PART]

[( II )-5-C-2-TH CONFIGURATION]
[CENTER PART OF LIGHT EMITTING PART]

[MODIFICATION OF (II)-5-C-2-TH CONFIGURATION]
[BOTH END PARTS OF LIGHT EMITTING PART]

[MODIFICATION OF (II)-5-C-2-TH CONFIGURATION]
[CENTER PART OF LIGHT EMITTING PART]

[(II)-5-c-1-TH CONFIGURATION]
[BOTH END PARTS OF LIGHT EMITTING PART]

[(II)-5-c-1-TH CONFIGURATION]
[CENTER PART OF LIGHT EMITTING PART]

[MODIFICATION OF (II)-5-c-1-TH CONFIGURATION]
[BOTH END PARTS OF LIGHT EMITTING PART]

[MODIFICATION OF (II)-5-c-1-TH CONFIGURATION]
[CENTER PART OF LIGHT EMITTING PART]

[(II)-5-c-2-TH CONFIGURATION]
[BOTH END PARTS OF LIGHT EMITTING PART]

[(II)-5-c-2-TH CONFIGURATION]
[CENTER PART OF LIGHT EMITTING PART]

[MODIFICATION OF (II)-5-c-2-TH CONFIGURATION]
[BOTH END PARTS OF LIGHT EMITTING PART]

[MODIFICATION OF (II)-5-c-2-TH CONFIGURATION]
[CENTER PART OF LIGHT EMITTING PART]

[STEP-10]

[STEP-10]

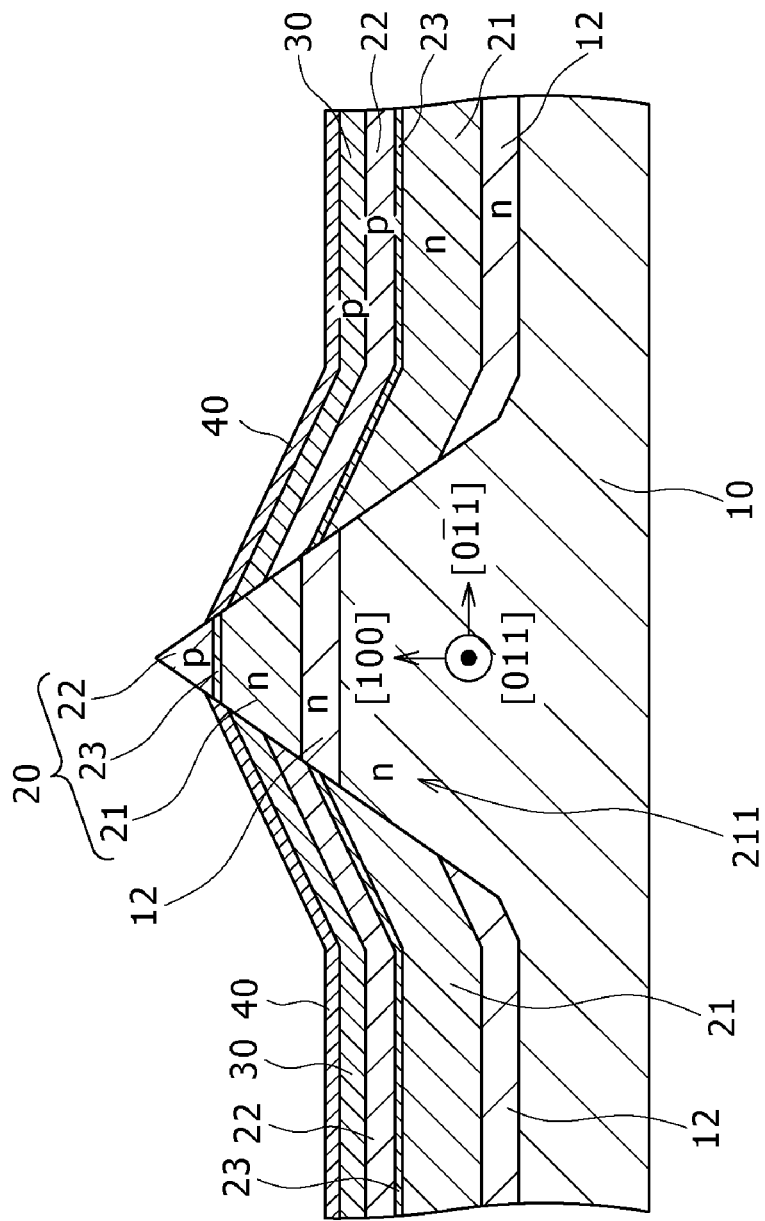

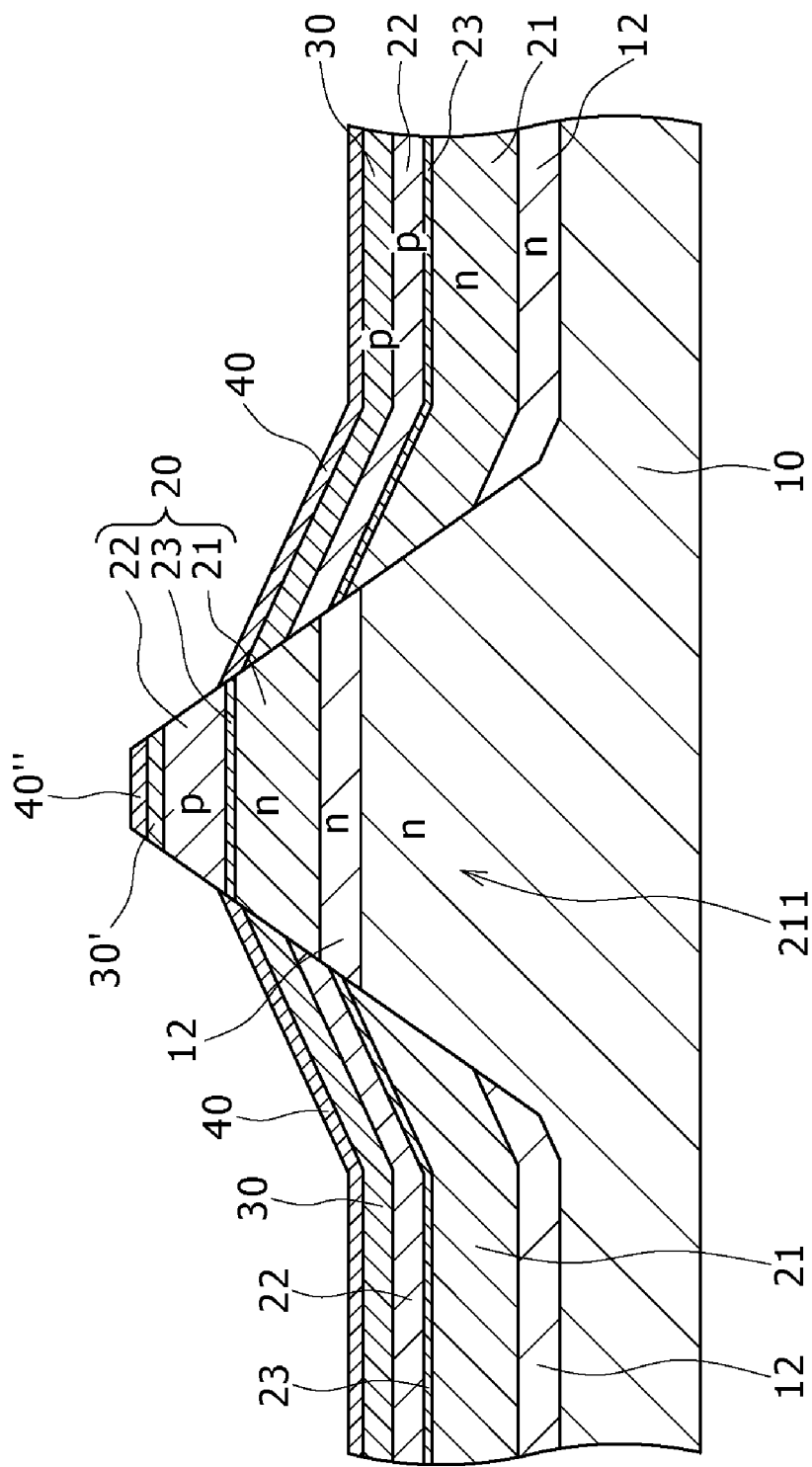
FIG. 62 [STEP-30]

[STEP-40]

[STEP-40]

SEMICONDUCTOR LIGHT EMITTING DEVICE, METHOD FOR MANUFACTURING SAME, AND METHOD FOR FORMING UNDERLYING LAYER

CROSS REFERENCES TO RELATED APPLICATIONS

The present invention contains subject matter related to Japanese Patent Application JP 2007-239801 filed in the Japan Patent Office on Sep. 14, 2007, the entire contents of which being incorporated herein by reference.

BACKGROUND OF THE INVENTION

1. Field of the Invention

The present invention relates to a semiconductor light emitting device, a method for manufacturing the same, and a method for forming an underlying layer.

2. Description of the Related Art

As a semiconductor laser having low threshold current $I_{th}$, a semiconductor laser having a separated double hetero junction (SDH) structure that can be formed through one time of an epitaxial growth step (hereinafter, referred to as an SDH semiconductor laser) is known from e.g. Japanese Patent No. 2990837.

For this SDH semiconductor laser, initially a projection part extending along the {110}A plane direction is formed on a substrate having the {100} plane as its major surface. Subsequently, through crystal growth over the major surface of this substrate, a light emitting part arising from stacking of compound semiconductor layers is formed on the {100} plane of the projection part (for convenience, referred to as the projection surface). The light emitting part has e.g. a structure arising from sequential stacking of a first compound semiconductor layer of a first conductivity type, an active layer, and a second compound semiconductor layer of a second conductivity type. The sectional shape obtained when this light emitting part is cut along a virtual plane perpendicular to the extension direction of the projection part is e.g. a triangle, and the side surface (oblique surface) of the light emitting part is the {111}B plane. In general, the {111}B plane is known as a non-growth surface in MOCVD (Metal Organic Chemical Vapor Deposition referred to also as MOVPE (Metal Organic Vapor Phase Epitaxy)), except for special crystal growth conditions. Therefore, in the case of the SDH semiconductor laser, after the light emitting part whose side surface is the {111}B plane is formed, "self growth stop" of the crystal growth of the light emitting part is kept even if the MOCVD is continued thereafter. The inclination angle (α) of the {111}B plane is 54.7 degrees.

In the present specification, the crystal planes shown below are represented as the (hkl) plane and the (hk-l) plane, respectively, for convenience.

(hkl) plane (hk$\bar{l}$)plane

In addition, the directions shown below are represented as the [hkl] direction and the [hk-l] direction, respectively, for convenience.

[hkl]direction

[hk$\bar{l}$] direction

On the other hand, the {100} plane part as the major surface of the substrate except the projection part (for convenience, referred to as the recess surface) does not involve a non-growth surface. Thus, if the MOCVD is continued, a compound semiconductor layer formed through crystal growth from the recess surface will completely cover the light emitting part in the self growth stop state in time. The compound semiconductor layer formed through crystal growth from the recess surface has, on the second compound semiconductor layer, a structure arising from sequential formation of a layer for adjustment of the current block layer position (hereinafter, referred to simply as the adjustment layer) a current block layer, and a burying layer. In general, controlling the thickness of the adjustment layer makes it possible to form a structure that permits current injection only to the active layer of the light emitting part through formation of the current block layer at an intermediate phase before the compound semiconductor layer formed through crystal growth from the recess surface covers the light emitting part (in particular, when the upper surface of the compound semiconductor layer is about to reach both the side surfaces of the active layer formed in the light emitting part).

In this manner, for the SDH semiconductor laser, the respective compound semiconductor layers can be formed based on one time of a crystal growth step. In addition, the active layer can be completely surrounded by compound semiconductor layers favorable for light confinement by selecting materials whose energy band gaps are sufficiently wider than that of the active layer, i.e., materials having lower refractive indexes, as the materials used for the compound semiconductor layers that vertically sandwich the active layer in the light emitting part (the first compound semiconductor layer and the second compound semiconductor layer) and the materials used for the current block layer, the burying layer, and the adjustment layer located outside the light emitting part. Due to this feature, the shape of a beam emitted from the semiconductor laser whose light emitting surface is the end surface of the projection part can be brought close to a perfect circle. That is, as the far field pattern (FFP), the following relationship can be achieved.

$\theta_{//} \approx \theta_{\perp}$

Furthermore, depending on e.g. the efficiency of coupling with a lens, it is often needed that the shape of a beam emitted from the semiconductor laser is an ellipse. For such a case, the θ// of the FFP can be set small e.g. by employing a so-called flare-stripe structure, in which the width of the projection part near the ends of the projection part is increased (refer to e.g. Japanese Patent No. 3399018). Moreover, employing the flare-stripe structure can achieve high light output.

SUMMARY OF THE INVENTION

As described above, for the SDH semiconductor laser, initially a projection part extending along the {110}A plane direction is formed on a substrate having the {100} plane as its major surface (see FIG. 58A). Therefore, the size of the light emitting part is defined by the width ($W_P$) of the projection part. On the other hand, the width ($W_A$) of the active layer is determined based on the specification of the SDH semiconductor laser. Therefore, if the width ($W_P$) of the projection part is small and the active layer having a desired width ($W_A$) is formed, the distance ($H_1$) from the active layer to the projection part is short naturally (see FIG. 58B). The parameters $H_1$, $W_P$, and $W_A$ have the following relationship.

$H_1 = \{(W_P - W_A)/2\} \times \tan(\alpha)$

If the distance ($H_1$) from the active layer to the projection part is short, the following problem arises. Specifically, light generated by the active layer is absorbed by the substrate as the projection part, which leads to an incomplete light confinement effect and thus the lowering of the light emission efficiency (the slope efficiency, represented by "light output/injected current").

The height ($H_2$) of the light emitting part is also defined by the width ($W_P$) of the projection part. The parameters $H_2$ and $W_P$ have the following relationship.

$$H_2 = (W_P/2) \times \tan(\alpha)$$

Therefore, if an SDH semiconductor laser is manufactured based on a projection part having a low height ($H_0$) and a large width ($W_P$), i.e., having a so-called low aspect ratio, as shown in FIG. 59A, there will be no room for formation of a current block layer on the side surfaces of the active layer as shown in FIG. 59B.

There is a need for the present invention to provide a semiconductor light emitting device, a method for manufacturing the same, and a method for forming an underlying layer that all allow enhancement in the design flexibility of the underlying layer (base part) for forming the light emitting part and allow achievement of high light emission efficiency.

According to a first mode of the present invention, there is provided a semiconductor light emitting device that includes:

(A) an underlying layer configured to be formed on the major surface of a substrate having the {100} plane as the major surface;

(B) a light emitting part configured to arise from sequential stacking of a first compound semiconductor layer of a first conductivity type, an active layer, and a second compound semiconductor layer of a second conductivity type above the top surface of the underlying layer; and (C) a current block layer configured to be formed above a part of the major surface of the substrate on which the underlying layer is not formed and cover at least the exposed side surface of the active layer of the light emitting part, wherein the underlying layer is composed of a III-V compound semiconductor and is formed on the major surface of the substrate by epitaxial growth, the underlying layer extends in parallel to the <110> direction of the substrate, the sectional shape of the underlying layer obtained when the underlying layer is cut along a virtual plane perpendicular to the <110> direction of the substrate is a trapezoid, and the oblique surfaces of the underlying layer corresponding to two oblique sides of the trapezoid are the {111}B planes, and the top surface of the underlying layer corresponding to the upper side of the trapezoid is the {100} plane.

In the semiconductor light emitting device according to the first mode of the present invention, it is desirable that the energy band gap ($E_g$) of the material of the underlying layer be larger than the energy band gap ($E_{g-0}$) of the material of the substrate. This condition will be referred to as "energy band gap condition-A," for convenience.

Furthermore, in the semiconductor light emitting device according to the first mode of the present invention including the above-described preferred mode, it is desirable that the energy band gap ($E_g$) of the material of the underlying layer be larger than the energy band gap ($E_{g-1}$) of the material of the first compound semiconductor layer. This condition will be referred to as "energy band gap condition-B," for convenience.

In the semiconductor light emitting device according to the first mode of the present invention including the above-described various preferred modes, it is preferable that the III-V compound semiconductor of the underlying layer contain, as an element, at least one of arsenic (As), antimony (Sb), and bismuth (Bi), and aluminum (Al). Alternatively, it is preferable that the III-V compound semiconductor of the underlying layer contain at least phosphorus (P) as an element. As the combinations of (the III-V compound semiconductor of the substrate, the III-V compound semiconductor of the underlying layer, the III-V compound semiconductor of the first compound semiconductor layer) in the former configuration, the following compositions can be cited, as long as energy band gap condition-A or energy band gap condition-B is satisfied.

Composition-A: (GaAs, $Al_{x1}Ga_{(1-x1)}As$, $Al_yGa_{(1-y)}As$)
  [$0<x1 \leq 1$, $0<y \leq 1$, and ($E_g$ of GaAs)<($E_{g-0}$ of $Al_{x1}Ga_{(1-x1)}As$), ($E_g$ of $Al_{x1}Ga_{(1-x1)}As$)$\geq$($E_{g-1}$ of $Al_yGa_{(1-y)}As$)]

Composition-B: (GaAs, Superlattice Structure of $Al_{x2}Ga_{(1-x2)}As/Al_{x3}Ga_{(1-x3)}As$, $Al_yGa_{(1-y)}As$)
  [$0 \leq x2$, $x3 \leq 1$, $x2 \neq x3$, $0<y \leq 1$, and ($E_g$ of GaAs)<($E_{g-0}$ of superlattice structure of $Al_{x2}Ga_{(1-x2)}As/Al_{x3}Ga_{(1-x3)}As$), ($E_g$ of superlattice structure of $Al_{x2}Ga_{(1-x2)}As/Al_{x3}Ga_{(1-x3)}As$)$\geq$($E_{g-1}$ of $Al_yGa_{(1-y)}As$)]

Furthermore, as long as energy band gap condition-A or energy band gap condition-B is satisfied, when GaSb(As) or GaBi(As) is used as the III-V compound semiconductor of the substrate, the following composition can be cited as Composition-A or Composition-B. Specifically, in this composition, at least one layer of the compound semiconductor layers containing As (arsenic) contains Sb (antimony) or Bi (bismuth), which has an atomic radius larger than that of As and has a vapor pressure lower than that of As. Furthermore, the composition can also be cited in which, in at least one layer of the compound semiconductor layers containing As (arsenic), As is replaced by Sb (antimony) or Bi (bismuth), which has an atomic radius larger than that of As and has a vapor pressure lower than that of As. As the combinations of (the III-V compound semiconductor of the substrate, the III-V compound semiconductor of the underlying layer, the III-V compound semiconductor of the first compound semiconductor layer) in the latter configuration, the following composition can be cited, as long as energy band gap condition-A or energy band gap condition-B is satisfied.

Composition-C: (GaAs, $\{Al_{x4}Ga_{(1-x4)}\}_{x5}In_{(1-x5)}P$, $Al_yGa_{(1-y)}As$)
  [$0 \leq x4 \leq 1$, $0 \leq x5 \leq 1$, $0<y \leq 1$, and ($E_g$ of GaAs)<($E_{g-0}$ of $\{Al_{x4}Ga_{(1-x4)}\}_{x5}In_{(1-x5)}P$), ($E_g$ of $\{Al_{x4}Ga_{(1-x4)}\}_{x5}In_{(1-x5)}P$)$\geq$($E_{g-1}$ of $Al_yGa_{(1-y)}As$)]

Furthermore, as long as energy band gap condition-A or energy band gap condition-B is satisfied, when GaSb(As) or GaBi(As) is used as the III-V compound semiconductor of the substrate, the following composition can be cited as Composition-C. Specifically, in this composition, at least one layer of the compound semiconductor layers containing As (arsenic) contains Sb (antimony) or Bi (bismuth), which has an atomic radius larger than that of As and has a vapor pressure lower than that of As. Furthermore, the composition can also be cited in which, in at least one layer of the compound semiconductor layers containing As (arsenic), As is replaced by Sb (antimony) or Bi (bismuth), which has an atomic radius larger than that of As and has a vapor pressure lower than that of As. This feature applies also to a method for manufacturing a semiconductor light emitting device according to a second mode of the present invention, to be described later.

In addition, as long as energy band gap condition-A or energy band gap condition-B is satisfied, as the substrate, e.g. a GaN substrate, GaP substrate, AlN substrate, AlP substrate, InN substrate, InP substrate, AlGaInN substrate, AlGaN substrate, AlInN substrate, GaInN substrate, AlGaInP substrate, AlGaP substrate, AlInP substrate, GaInP substrate, and ZnS substrate can be cited, including the above-described compositions. In particular, it is preferable to use a substrate having a zinc blende crystal structure or a substrate on which a crystal film of the zinc blende crystal structure is formed. As atoms included in the substrate having the zinc blende crystal structure, at least As, Sb, and Bi can be cited. In embodiments of the present invention, it is possible to suppress light absorption of a substrate having high light absorbability to which the atoms of As, Sb, or Bi are added and hence in which the atoms are contained as a mixed crystal. As a result, enhancement and uniformization of the characteristics of the semiconductor light emitting device can be achieved. Moreover, a component obtained by forming a buffer layer or an intermediate layer on the surface (major surface) of any of the above-described substrates can be used as the substrate. In crystal growth of the underlying layer with use of any of these substrates, at least one of As, Sb, and Bi is added as a group V material or used as a mixed crystal. This makes it easy to set a crystal growth condition under which the migration of group III atoms hardly occurs. Thus, it becomes possible to form a group V trimer on the outermost surface of the {111}B plane and thereby turn the {111}B plane to a non-growth surface. Furthermore, as long as energy band gap condition-A or energy band gap condition-B is satisfied, e.g. the following materials can be cited as the materials of various compound semiconductor layers (the substrate, the underlying layer, the first compound semiconductor layer) including the active layer: GaInNAs-based compound semiconductors (including GaInAs-based mixed crystals and GaNAs-based mixed crystals), AlGaInP-based compound semiconductors, AlGaInAs-based compound semiconductors, GaInAs-based compound semiconductors, GaInAsP-based compound semiconductors, GaInP-based compound semiconductors, GaP-based compound semiconductors, and InP-based compound semiconductors.

According to the second mode of the present invention, there is provided a method for manufacturing a semiconductor light emitting device. The method includes the steps of:

(a) forming a plurality of mask layers extending along the <110> direction on the major surface of a substrate having the {100} plane as the major surface, and exposing a part of the major surface of the substrate between the mask layers;

(b) epitaxially growing an underlying layer composed of a III-V compound semiconductor on the exposed part of the major surface of the substrate, and then removing the mask layers, the sectional shape of the underlying layer obtained when the underlying layer is cut along a virtual plane perpendicular to the <110> direction of the substrate being a trapezoid, the oblique surfaces of the underlying layer corresponding to two oblique sides of the trapezoid being the {111}B planes, and the top surface of the underlying layer corresponding to the upper side of the trapezoid being the {100} plane;

(c) forming, above the top surface of the underlying layer, a light emitting part arising from sequential stacking of a first compound semiconductor layer of a first conductivity type, an active layer, and a second compound semiconductor layer of a second conductivity type, and forming, on the exposed major surface of the substrate on which the underlying layer is not formed, a multilayer structure arising from sequential stacking of the first compound semiconductor layer of the first conductivity type, the active layer, and the second compound semiconductor layer of the second conductivity type; and (d) forming, above the multilayer structure, a current block layer that covers at least the exposed side surface of the active layer of the light emitting part.

In the method for manufacturing a semiconductor light emitting device according to the second mode of the present invention, it is desirable to use the underlying layer composed of a material having an energy band gap ($E_g$) larger than the energy band gap ($E_{g-0}$) of the material of the substrate. That is, it is desirable to satisfy energy band gap condition-A.

Furthermore, in the method for manufacturing a semiconductor light emitting device according to the second mode of the present invention including the above-described preferred mode, it is desirable to use the underlying layer composed of a material having an energy band gap ($E_g$) larger than the energy band gap ($E_{g-1}$) of the material of the first compound semiconductor layer. That is, it is desirable to satisfy energy band gap condition-B.

In the method for manufacturing a semiconductor light emitting device according to the second mode of the present invention including the above-described various preferred modes, it is preferable that the III-V compound semiconductor of the underlying layer contain, as an element, at least one of arsenic (As), antimony (Sb), and bismuth (Bi), and aluminum (Al). Alternatively, it is preferable that the III-V compound semiconductor of the underlying layer contain at least phosphorus (P). The combinations of (the III-V compound semiconductor of the substrate, the III-V compound semiconductor of the underlying layer, the III-V compound semiconductor of the first compound semiconductor layer) are as described above.

According to a third mode of the present invention, there is provided a method for forming an underlying layer. The method includes the steps of:

(a) forming a plurality of mask layers on the major surface of a substrate, and exposing a part of the major surface of the substrate between the mask layers; and (b) epitaxially growing an underlying layer composed of a III-V compound semiconductor on the exposed part of the major surface of the substrate, and then removing the mask layers, wherein an impurity whose substitution site is the site occupied by a group III atom and an impurity whose substitution site is the site occupied by a group V atom are added to a material used for the epitaxial growth of the underlying layer of the n conductivity type in order to cause the underlying layer to have the n conductivity type.

The method for forming an underlying layer according to the third mode of the present invention may have a mode in which the impurity whose substitution site is the site occupied by a group III atom is at least one kind of impurity selected from the group composed of silicon and tin and the impurity whose substitution site is the site occupied by a group V atom is at least one kind of impurity selected from the group composed of selenium, tellurium, and sulfur.

In the method for forming an underlying layer according to the third mode of the present invention including the above-described preferred mode, a configuration in which the substrate has the n conductivity type may be employed.

Furthermore, the method for forming an underlying layer according to the third mode of the present invention including the above-described preferred mode may have the following configuration. Specifically, the substrate has the p conductivity type, subsequently to the step (a), a base layer of the p conductivity type is epitaxially grown on the exposed part of the major surface of the substrate, and then in the step (b), the underlying layer composed of the III-V compound semiconductor is epitaxially grown on the base layer instead of epitaxially growing the underlying layer composed of the III-V compound semiconductor and having a single conductivity type on the exposed part of the major surface of the substrate, a tunnel junction is formed by the base layer and the underlying layer, and at least around the interface between the base layer and the underlying layer and the vicinity of the interface, an impurity whose substitution site is the site occupied by a group III atom and an impurity whose substitution site is the site occupied by a group V atom are added to a material used for the epitaxial growth of the base layer of the p conductivity type in order to cause the base layer to have the p conductivity type. In particular, a tunnel junction formed of a superlattice structure may be formed at least across the interface between the base layer and the underlying layer and in the vicinity of the interface. In this case, for example, it is preferable that the following configuration be employed at least in the tunnel junction part. Specifically, the impurity whose substitution site is the site occupied by a group III atom in the base layer is at least one kind of impurity selected from the group composed of zinc, magnesium, beryllium, and manganese, and the impurity whose substitution site is the site occupied by a group V atom in the base layer is carbon. Furthermore, it is preferable to employ the following configuration. Specifically, the impurity whose substitution site is the site occupied by a group III atom in the underlying layer is at least one kind of impurity selected from the group composed of silicon and tin, and the impurity whose substitution site is the site occupied by a group V atom in the underlying layer is at least one kind of impurity selected from the group composed of selenium, tellurium, and sulfur.

As the condition under which the tunnel junction is formed by the base layer and the underlying layer, the underlying layer having the conductivity type opposite to that of the substrate is joined onto the base layer having the same conductivity type as that of the substrate. Furthermore, on the underlying layer, the first compound semiconductor layer having the same conductivity type as that of the underlying layer, i.e. having the first conductivity type, is stacked. In addition, the light emitting part arising from sequential stacking of the active layer and the second compound semiconductor layer of the second conductivity type can be formed. With a mere pn junction, no current flows in the reverse direction basically. However, when a high voltage is applied in the reverse direction, the depletion layer becomes very thin and electrons tunnel through the depletion layer, so that current flow starts. This is referred to as the Zener breakdown of a diode, and such a diode is referred to as a Zener diode. The thickness of the depletion layer can be further adjusted depending on the impurity concentration. Therefore, in this case, for example, if the junction is so made that the respective impurity concentrations of the interface junction part between the base layer and the underlying layer and the vicinity thereof are set as high as possible without significantly deteriorating the crystal quality (at carrier concentrations in the range of $1\times10^{18}/cm^3$ to $1\times10^{21}/cm^3$), the width of the depletion layer formed across the junction interface is small, which easily allows the tunnel effect. Furthermore, the tunnel effect will occur more readily when the band gap of the semiconductor is smaller. Therefore, the materials may be so selected that, at least in the interface junction structure part, one of the outermost layer (top surface layer) of the base layer and the lowermost layer of the underlying layer closest to the base layer has a small energy band gap while the other of the layers has a large energy band gap. In addition, by using the compound semiconductor layer composed of such a material as a superlattice layer partially (using a very thin layer), the percentage of the material having the small energy band gap can be suppressed to the minimum, which makes it possible to suppress the absorption amount of light generated by the light emitting layer to the minimum necessary. As above, by paying attention on the impurity concentrations, energy band gaps, and thicknesses of the compound semiconductor layers around the interface between the base layer and the underlying layer and the vicinity of the interface, a structure that can achieve both enhancement in the tunnel effect and suppression of the light absorption amount can be obtained. This feature applies also to a method for forming an underlying layer according to a fourth mode of the present invention, to be described below.

According to the fourth mode of the present invention, there is provided another method for forming an underlying layer. The method includes the steps of:

(a) forming a plurality of mask layers on the major surface of a substrate, and exposing a part of the major surface of the substrate between the mask layers; and (b) epitaxially growing an underlying layer composed of a III-V compound semiconductor on the exposed part of the major surface of the substrate, and then removing the mask layers, wherein an impurity whose substitution site is the site occupied by a group III atom and an impurity whose substitution site is the site occupied by a group V atom are added to a material used for the epitaxial growth of the underlying layer of the p conductivity type in order to cause the underlying layer to have the p conductivity type.

The method for forming an underlying layer according to the fourth mode of the present invention may have a mode in which the impurity whose substitution site is the site occupied by a group III atom is at least one kind of impurity selected from the group composed of zinc, magnesium, beryllium, and manganese and the impurity whose substitution site is the site occupied by a group V atom is carbon.

In the method for forming an underlying layer according to the fourth mode of the present invention including the above-described preferred mode, a configuration in which the substrate has the p conductivity type may be employed.

Furthermore, the method for forming an underlying layer according to the fourth mode of the present invention including the above-described preferred mode may have the following configuration. Specifically, the substrate has the n conductivity type, subsequently to the step (a), a base layer of the n conductivity type is epitaxially grown on the exposed part of the major surface of the substrate, and then in the step (b), the underlying layer composed of the III-V compound semiconductor is epitaxially grown on the base layer instead of epitaxially growing the underlying layer composed of the III-V compound semiconductor and having a single conductivity type on the exposed part of the major surface of the substrate, a tunnel junction is formed by the base layer and the underlying layer, and at least around the interface between the base layer and the underlying layer and the vicinity of the interface, an impurity whose substitution site is the site occupied by a group III atom and an impurity whose substitution site is the site occupied by a group V atom are added to a material used for the epitaxial growth of the base layer of the n conductivity type in order to cause the base layer to have the n conductivity type. In particular, a tunnel junction formed of a superlattice structure may be formed at least across the interface between the base layer and the underlying layer and in the vicinity of the interface. In this case, for example, it is preferable that the following configuration be employed at least in the tunnel junction part. Specifically, the impurity whose substitution site is the site occupied by a group III atom in the base layer is at least one kind of impurity selected from the group composed of silicon and tin, and the impurity whose substitution site is the site occupied by a group V atom in the base layer is at least one kind of impurity selected from the group composed of selenium, tellurium, and sulfur. Furthermore, it is preferable to employ the following configuration. Specifically, the impurity whose substitution site is the site occupied by a group III atom in the underlying layer is at least one kind of impurity selected from the group composed of zinc, magnesium, beryllium, and manganese, and the impurity whose substitution site is the site occupied by a group V atom in the underlying layer is carbon.

In the semiconductor light emitting device and the method for manufacturing the same according to the first and second modes of the present invention, and in the methods for forming an underlying layer according to the third and fourth modes of the present invention, it is desirable to satisfy energy band gap condition-A or energy band gap condition-B as described above. The term "energy band gap" is not limited to an energy band gap in the case in which the related compound semiconductor layer is a single layer, but refers to an energy band gap in a broad sense, encompassing also an effective energy band gap obtained in the case in which the related compound semiconductor layer is formed of a multilayer structure (e.g. a superlattice multilayer structure composed of a compound semiconductor layer having a large energy band gap and a compound semiconductor layer having a small energy band gap, a quantum well multilayer structure, or the average composition of a multilayer structure). Therefore, even when a compound semiconductor layer that is considered to absorb light originally if it is a single layer is combined with another compound semiconductor layer that does not absorb light so as to be included in the underlying layer, this underlying layer can be used as the underlying layer in the modes of the present invention if it does not function as an absorbing layer substantially.

In the following description, at least one kind of impurity selected from the group composed of three kinds of impurities of selenium (Se), tellurium (Te), and sulfur (S) is referred to as a group VI impurity, for convenience. Furthermore, at least one kind of impurity selected from the group composed of two kinds of impurities of silicon (Si) and tin (Sn) is referred to as a group IV impurity, for convenience. Moreover, at least one kind of impurity selected from the group composed of four kinds of impurities of zinc (Zn), magnesium (Mg), beryllium (Be), and manganese (Mn) is referred to as a group II impurity, for convenience.

In the semiconductor light emitting device and the method for manufacturing the same according to the first and second modes of the present invention and the methods for forming an underlying layer according to the third and fourth modes of the present invention including the above-described various preferred configurations and modes (hereinafter, they will be often referred to simply as the present invention generically), the following materials can be cited as the material of the underlying layer: semiconductor oxides and semiconductor nitrides such as $SiO_2$, SiN, and SiON; refractory metals; refractory metal oxides; and refractory metal nitrides. Examples of the method for forming the mask layers include physical vapor deposition (PVD) such as sputtering and chemical vapor deposition (CVD). For the removal of the mask layers, either wet etching or dry etching may be employed depending on the material of the mask layers.

In the semiconductor light emitting device and the method for manufacturing the same as the present invention, a semiconductor laser or a light emitting diode (LED) can be cited as the semiconductor light emitting device.

Examples of the method for epitaxially growing the underlying layer and the method for forming (depositing) various kinds of compound semiconductor layers including the active layer in the present invention include metal organic chemical vapor deposition (MOCVD, MOVPE), metal organic molecular beam epitaxy (MOMBE), and hydride vapor phase epitaxy (HVPE), in which a halogen contributes to transportation and reaction.

In the semiconductor light emitting device and the method for manufacturing the same as the present invention, the underlying layer is formed for forming the light emitting part. This underlying layer is provided on the substrate separately from the substrate. Thus, the material of the underlying layer can be so selected that light generated by the active layer will not be absorbed by the underlying layer even when the active layer having a desired width is formed above the underlying layer having a small width and thus the distance from the active layer to the underlying layer is small. As a result, the occurrence of a problem that the light emission efficiency (the slope efficiency, represented by "light output/injected current") is decreased can be suppressed. The height of the light emitting part is also defined by the width of the underlying layer. However, because a desired height can be designed as the height of the underlying layer, the occurrence of a problem that the current block layer can not be formed on the side surfaces of the active layer can also be suppressed.

Moreover, in the methods for forming an underlying layer as the present invention, to the material used for the epitaxial growth of the underlying layer of the n conductivity type or the p conductivity type, both an impurity whose substitution site is the site occupied by a group III atom and an impurity whose substitution site is the site occupied by a group V atom are added in order to cause the underlying layer to have the n conductivity type or the p conductivity type. This allows the conductivity type of the underlying layer to be surely the desired conductivity type.

In general, e.g. in the case of an anode-common semiconductor light emitting device, if the underlying layer of the p conductivity type with high concentration and large thickness is formed on the substrate of the p conductivity type, white turbidity will arise in the underlying layer and the crystal quality of the compound semiconductor layer of the underlying layer will be significantly deteriorated, depending on the condition. Consequently, the crystal quality of the first compound semiconductor layer and the light emitting layer stacked over such an underlying layer will also be adversely affected. For such a case, the substrate having the conductivity type opposite to that of the underlying layer is used and the base layer having the conductivity type opposite to that of the underlying layer is epitaxially grown on the substrate. Thereby, the occurrence of the above-described problem can be surely avoided, and an anode-common semiconductor light emitting device can be realized similarly to the case of using a p-type substrate. In addition, a tunnel junction is formed by the underlying layer and the base layer. Therefore, even when voltage is applied to the semiconductor light emitting device with the same polarity as that of the related art, a tunnel current is generated and thus electric conduction arises due to application of a reverse bias to the tunnel junction interface. Thus, a current flows to the active layer of the semiconductor light emitting device, so that light emission is obtained. An actual tunnel junction structure may be e.g. $n^+$ layer/(i layer (lightly-doped layer)/n layer as a so-called delta-doped layer)/$p^+$ layer in order to enhance the tunnel effect performance.

BRIEF DESCRIPTION OF THE DRAWINGS

FIG. 6A is a schematic partial sectional view of a semiconductor light emitting device according to a third embodiment of the present invention, and FIG. 6B is a schematic partial sectional view of partially-enlarged third compound semiconductor layer and fourth compound semiconductor layer;

FIG. 61 is a schematic partial sectional view of the substrate and so on (at the center part of the semiconductor light emitting device), subsequent to FIG. 60A, for explaining the method for manufacturing a semiconductor light emitting device having the flare-stripe structure;

FIG. 62 is a schematic partial sectional view of the substrate and so on (at both the end parts of the semiconductor light emitting device), subsequent to FIG. 60A, for explaining the method for manufacturing a semiconductor light emitting device having the flare-stripe structure;

DETAILED DESCRIPTION OF THE PREFERRED EMBODIMENTS

Embodiments of the present invention will be described below with reference to the accompanying drawings.

First Embodiment

A first embodiment of the present invention relates to the semiconductor light emitting device and the method for manufacturing the same according to the first and second modes of the present invention and the method for forming an underlying layer according to the third mode of the present invention.

In the first embodiment, and second to twenty-second embodiments of the present invention, to be described later, selenium (Se) is used as at least one kind of impurity selected from the group composed of selenium (Se), tellurium (Te), and sulfur (S) (group VI impurity). Furthermore, silicon (Si) is used as at least one kind of impurity selected from the group composed of silicon (Si) and tin (Sn) (group IV impurity). In addition, zinc (Zn) is used as at least one kind of impurity selected from the group composed of zinc (Zn), magnesium (Mg), beryllium (Be), and manganese (Mn) (group II impurity). However, the present invention is not limited to these impurities.

The semiconductor light emitting devices in the first embodiment and the second to twenty-second embodiments to be described later are formed of a semiconductor laser, and specifically an SDH semiconductor laser.

Figure 1:
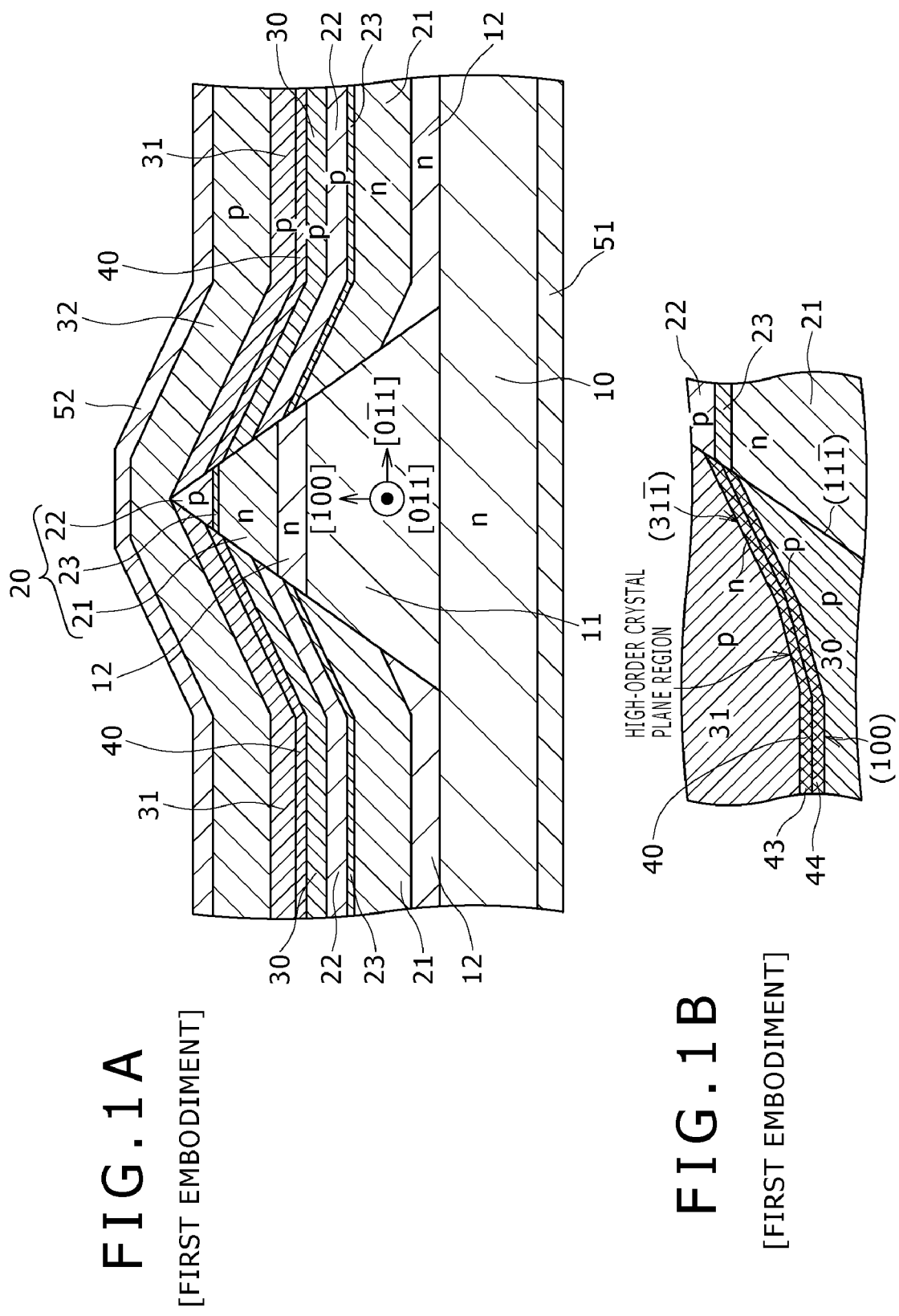
FIG. 1A is a schematic partial sectional view of a semiconductor light emitting device according to a first embodiment of the present invention.
FIG. 1B is a schematic partial sectional view of partially-enlarged third compound semiconductor layer and fourth compound semiconductor layer.
Figure 2:
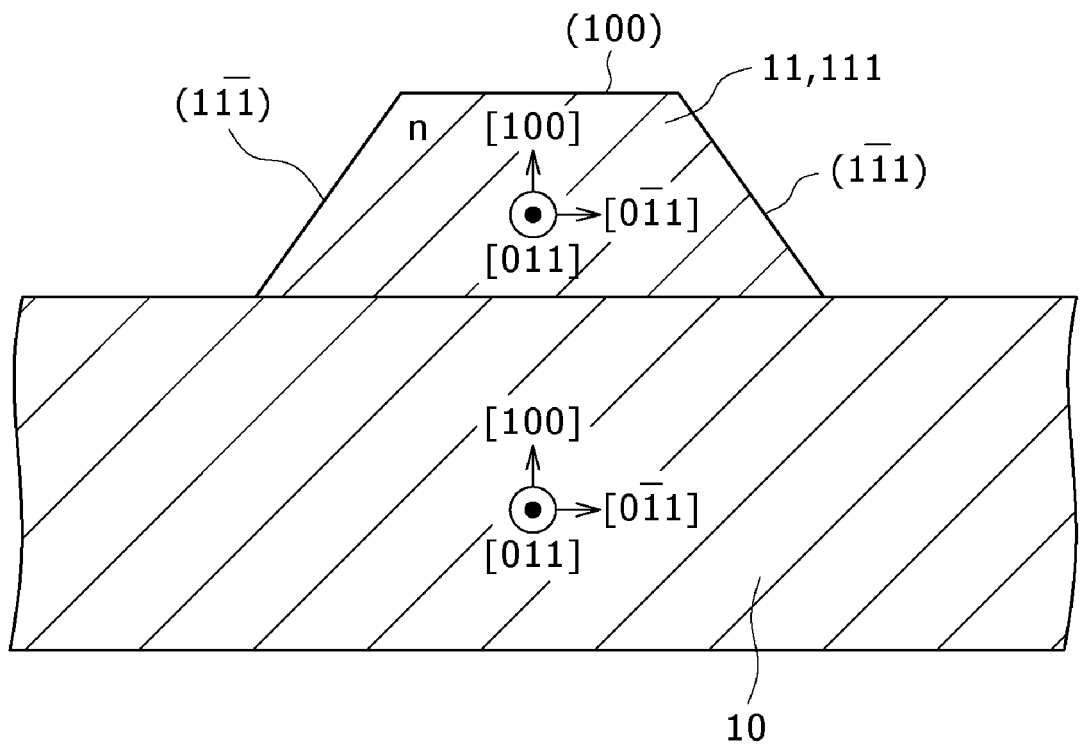
FIG. 2 is a schematic partial sectional view of a substrate and an underlying layer.

A schematic partial sectional view of the semiconductor light emitting device of the first embodiment is shown in FIG. 1A, and a schematic partial sectional view of a substrate and an underlying layer is shown in FIG. 2. The semiconductor light emitting device of the first embodiment includes:

(A) an underlying layer 11 that is formed on the major surface of a substrate 10 having the {100} plane as the major surface;

(B) a light emitting part 20 that arises from sequential stacking of a first compound semiconductor layer 21 of a first conductivity type (n-type, in the first embodiment), an active layer 23, and a second compound semiconductor layer 22 of a second conductivity type (p-type, in the first embodiment) above the top surface of the underlying layer 11; and (C) a current block layer 40 that is formed above a part of the major surface of the substrate 10 on which the underlying layer 11 is not formed (this part will be often referred to as the exposed surface of the substrate 10) and covers at least the exposed side surface of the active layer 23 of the light emitting part 20.

The underlying layer 11 is composed of a III-V compound semiconductor and is formed on the major surface of the substrate 10 by epitaxial growth. The underlying layer 11 extends in parallel to the <110> direction of the substrate 10. The sectional shape of the underlying layer 11 obtained when the underlying layer 11 is cut along a virtual plane perpendicular to the <110> direction of the substrate 10 is a trapezoid. The oblique surfaces of the underlying layer 11 corresponding to two oblique sides of this trapezoid are the {111}B planes, and the top surface of the underlying layer 11 corresponding to the upper side of the trapezoid is the {100} plane. That is, the underlying layer 11 has a so-called mesa structure and extends along the [011] direction.

Specifically, in the first embodiment, the substrate 10 is composed of n-GaAs, and the III-V compound semiconductor of the underlying layer 11 contains as its elements at least one of arsenic (As), antimony (Sb), and bismuth (Bi), and aluminum (Al). More specifically, the underlying layer 11 is composed of e.g. n-Al$_{x1}$Ga$_{(1-x1)}$As: Se [0<x1≦1, specifically, e.g. x1=0.1, 0.2, 0.3, 0.4, or 0.47], and the first compound semiconductor layer 21 is composed of n-Al$_{0.4}$Ga$_{0.6}$As: Se. Therefore, the energy band gap ($E_g$) of the material of the underlying layer 11 is larger than the energy band gap ($E_{g\text{-}0}$) of the material of the substrate 10. Furthermore, the energy band gap ($E_g$) of the material of the underlying layer 11 is larger than the energy band gap ($E_{g\text{-}1}$) of the material of the first compound semiconductor layer 21. The current block layer 40 is composed of a third compound semiconductor layer 43 of the first conductivity type (n-type) and a fourth compound semiconductor layer 44 of the second conductivity type (p-type) in contact with the third compound semiconductor layer 43. For simplification, in the drawings, two or more layers that have the same conductivity type and the same impurity site but have different refractive indexes (e.g. in the case of two layers, a second compound semiconductor layer 22A and a second compound semiconductor layer 22B) are collectively represented as one layer (the second compound semiconductor layer 22). FIG. 1B is a schematic partial sectional view of the partially-enlarged third compound semiconductor layer 43 and fourth compound semiconductor layer 44. Details will be described later about the compositions of the respective compound semiconductor layers included in the light emitting part 20 and the compositions of the respective compound semiconductor layers included in the current block layer 40 in the semiconductor light emitting device of the first embodiment.

In the semiconductor light emitting device of the first embodiment, above the top surface of the underlying layer 11 provided on the substrate 10, a buffer layer 12 composed of GaAs of the first conductivity type, the first compound semiconductor layer 21, the active layer 23, and the second compound semiconductor layer 22A are sequentially formed. Furthermore, the second compound semiconductor layer 22B is formed on the second compound semiconductor layer 22A, so that the apex is formed. The sectional shape of the light emitting part 20 including the second compound semiconductor layer 22B, obtained when the underlying layer 11 is cut along the {011}A plane, is a triangle. The side surfaces of the light emitting part 20 are the {111}B planes (specifically, the (11-1)B plane and the (1-11)B plane). By controlling the compositions of the second compound semiconductor layer 22A and the second compound semiconductor layer 22B, the light emitting part 20 having a triangular sectional shape can be accurately formed. In general, the {111}B plane is known as a non-growth surface covered by an As trimer in MOCVD (referred to also as MOVPE), except for special crystal growth conditions. Therefore, in the case of an SDH semiconductor laser, after the light emitting part 20 whose oblique surface (side surface) is the {111}B plane is formed, "self growth stop" of the crystal growth of the light emitting part is kept even if the MOCVD is continued thereafter. The angle of the {111}B plane is 54.7 degrees. Depending on the growth condition and so on, it is also possible that the part having a triangular sectional shape be composed only of the light emitting part 20.

On the other hand, over the part of the {100} plane (the (100) plane, in the illustrated example) as the exposed surface (major surface) of the substrate 10, the following components are sequentially formed: the same structure as that of the light emitting part 20; a layer 30 for adjustment of the current block layer position (hereinafter, referred to simply as the adjustment layer 30, and the adjustment layer 30 is a continuation part of the second compound semiconductor layer 22 substantially); the current block layer 40; and a burying layer (clad layer for burying) 31.

Furthermore, the whole device is covered by the contact layer (cap layer) 32 that is composed of GaAs of the second conductivity type. In addition, the first electrode 51 is formed on the backside of the substrate 10, and the second electrode 52 is formed on the contact layer (cap layer) 32.

A method for manufacturing a semiconductor light emitting device and a method for forming an underlying layer according to the first embodiment will be described below.

[Step-100]

Figure 3A:
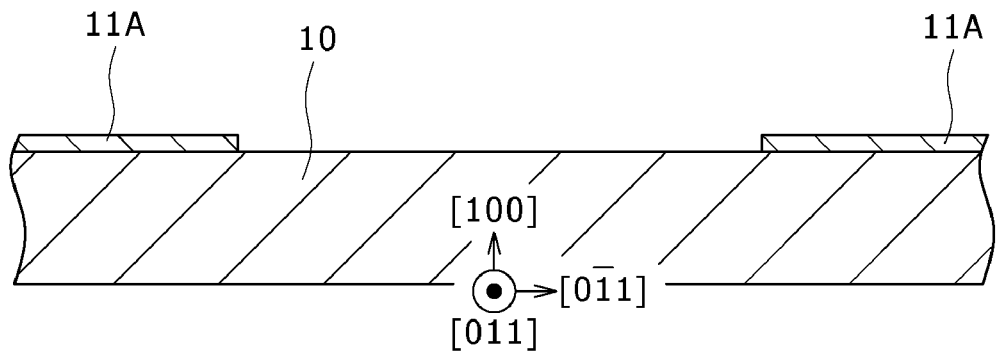
FIGS. 3A and 3B are schematic partial sectional views of a substrate and so on, for explaining the semiconductor light emitting device, a method for manufacturing the same, and a method for forming an underlying layer according to the first embodiment.

Initially, plural mask layers 11A extending along the <110> direction are formed on the major surface of the substrate 10 having the {100} plane as the major surface, and a part of the major surface of the substrate 10 is exposed between the mask layers 11A. Alternatively, the plural mask layers 11A are formed on the major surface of the substrate 10, and a part of the major surface of the substrate 10 is exposed between the mask layers 11A. Specifically, on the {100} crystal plane, e.g. the (100) crystal plane, of the substrate 10 composed of n-GaAs as its major surface, the mask layers 11A that are composed of $SiO_2$ and extend along the [011]A direction are formed based on CVD and a photolithography technique (see FIG. 3A).

[Step-110]

Subsequently, the underlying layer 11 that is composed of a III-V compound semiconductor and has the following feature is epitaxially grown on the exposed part of the major surface of the substrate 10. Specifically, the sectional shape of the underlying layer 11 obtained when the underlying layer 11 is cut along a virtual plane perpendicular to the <110> direction of the substrate 10 is a trapezoid. Furthermore, the oblique surfaces of the underlying layer 11 corresponding to two oblique sides of this trapezoid are the {111}B planes, and the top surface of the underlying layer 11 corresponding to the upper side of the trapezoid is the {100} plane. Subsequently to the epitaxial growth of the underlying layer 11, the mask layers 11A are removed. Alternatively, the underlying layer 11 composed of a III-V compound semiconductor is epitaxially grown on the exposed part of the major surface of the substrate 10, and then the mask layers 11A are removed. To the material used for the epitaxial growth of the underlying layer 11 having the n conductivity type, an impurity whose substitution site is the site occupied by a group III atom and an impurity whose substitution site is the site occupied by a group V atom are added in order to cause the underlying layer 11 to have the n conductivity type.

Specifically, for example, trimethylaluminum (TMAl) or triethylaluminum (TEAl) is used as the material gas of the aluminum (Al) source, and trimethylgallium (TMGa) or triethylgallium (TEGa) is used as the material gas of the gallium (Ga) source. In addition, tertiary butyl arsine (TBAs) or arsine ($AsH_3$) is used as the material gas of the arsenic (As) source. Furthermore, as the gas for n-type impurity doping, disilane ($Si_2H_6$), monosilane ($SiH_4$), or trimethyltin (TMSn) is used, if the site to be substituted by the impurity is the group III site. In addition, as the gas for n-type impurity doping, hydrogen sulfide ($H_2S$), hydrogen selenide ($H_2Se$), or hydrogen telluride ($H_2Te$) is used, if the site to be substituted by the impurity is the group V site. Based on MOCVD, these group III gas, group V gas, and impurity gas are introduced into a reaction chamber and subjected to a pyrolytic reaction in a temperature range of 600° C. to 900° C. for high-temperature growth. This promotes the migration of the group III material, and thus allows the epitaxial growth of a compound semiconductor layer having high flatness of the {100} plane and high crystal quality. Furthermore, due to this MOCVD, it is possible to form the underlying layer 11 that is formed of an AlGaAs-based material layer whose energy band gap is larger than at least that of the GaAs substrate and has a trapezoidal shape with desired top-surface width and height.

In order to further improve the flatness of the top surface of the underlying layer 11, a growth condition that permits promotion of the migration of the group III material may be employed through adjustment to a high flow rate of the supply gas to be introduced into the reaction chamber and adjustment to a low mole supply ratio of (group V gas)/(group III gas). Furthermore, in order to increase the concentration of the n-type impurity in the underlying layer 11, the autodoping amount of carbon (C) arising from methyl groups ($CH_3$—), ethyl groups ($C_2H_5$—), and tertiary butyl groups (($CH_3)_3$C—) contained in the supplied material (organic metal) gas (i.e., the amount of formation of holes (p conductivity type layer) through substitution for the group V site) may be decreased. For this purpose, for the substitution for the group V site in the formation of the n conductivity type layer, a condition may be aggressively used under which carbon (C) arising from methyl groups ($CH_3$—), ethyl groups ($C_2H_5$—), and tertiary butyl groups (($CH_3)_3$C—) competes with an n-type impurity that can substitute for the group V site. Specifically, the ratio to carbon may be relatively increased. More specifically, the mole supply ratio of the n-type impurity material gas (e.g. $H_2S$, $H_2Se$, or $H_2Te$) to carbon (C) may be increased. In addition, to decrease the absolute amount of carbon (C) itself, e.g. the Al mole fraction of the AlGaAs-based underlying layer 11 (the gas supply amount of TMAl) may be decreased without permitting the underlying layer 11 to absorb light generated by the light emitting layer, to thereby reduce the capturing of carbon (C). This is because of the following reason. Specifically, in general, e.g. TMAl forms a dimer at the time of the growth of the AlGaAs-based underlying layer 11, and thus methyl groups ($CH_3$—) and ethyl groups ($C_2H_5$—) are also easily captured in the crystal together with Al. Therefore, by decreasing the Al mole fraction of the AlGaAs-based underlying layer 11, the capturing of carbon (C) can be reduced, and hence the autodoping amount can be decreased.

Figure 3B:
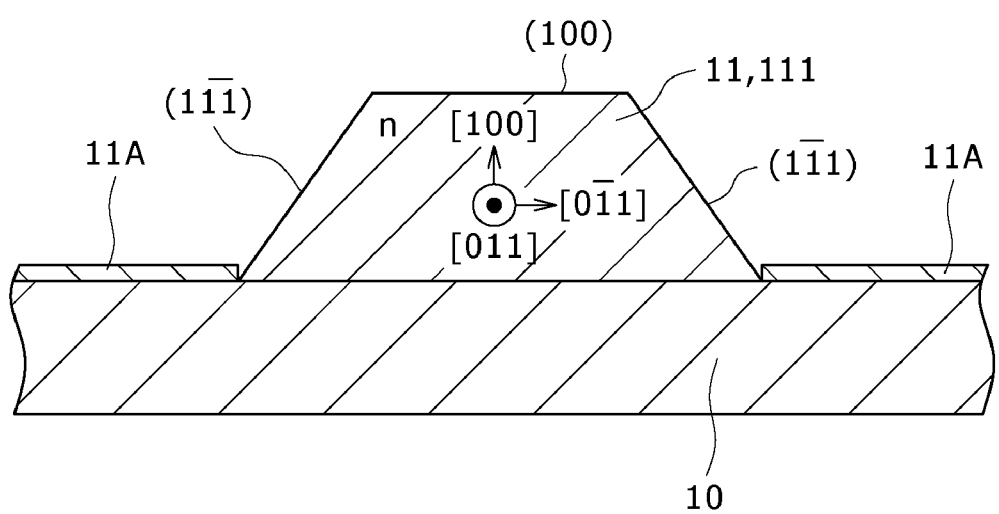

In this manner, the underlying layer 11 extending along the [001]A direction can be obtained (see FIG. 3B). The underlying layer 11 is deposited not on the mask layers 11A but on the major surface of the substrate 10. The width direction of the underlying layer 11 is parallel to the [0-11]B direction. Thereafter, the mask layers 11A composed of $SiO_2$ are removed based on wet etching. In this Way, the structure shown in FIG. 2 can be obtained. The underlying layer 11 has the oblique surfaces (side surfaces) formed of the (11-1)B plane and the (1-11)B plane, and the top surface of the underlying layer 11 is the (100) plane. The obtained underlying layer 11 contains, as impurities, selenium (impurity whose substitution site is the site occupied by a group V atom) and silicon (impurity whose substitution site is the site occupied by a group III atom) for causing the underlying layer 11 to be the n-type.

[Step-120]

Figure 4:
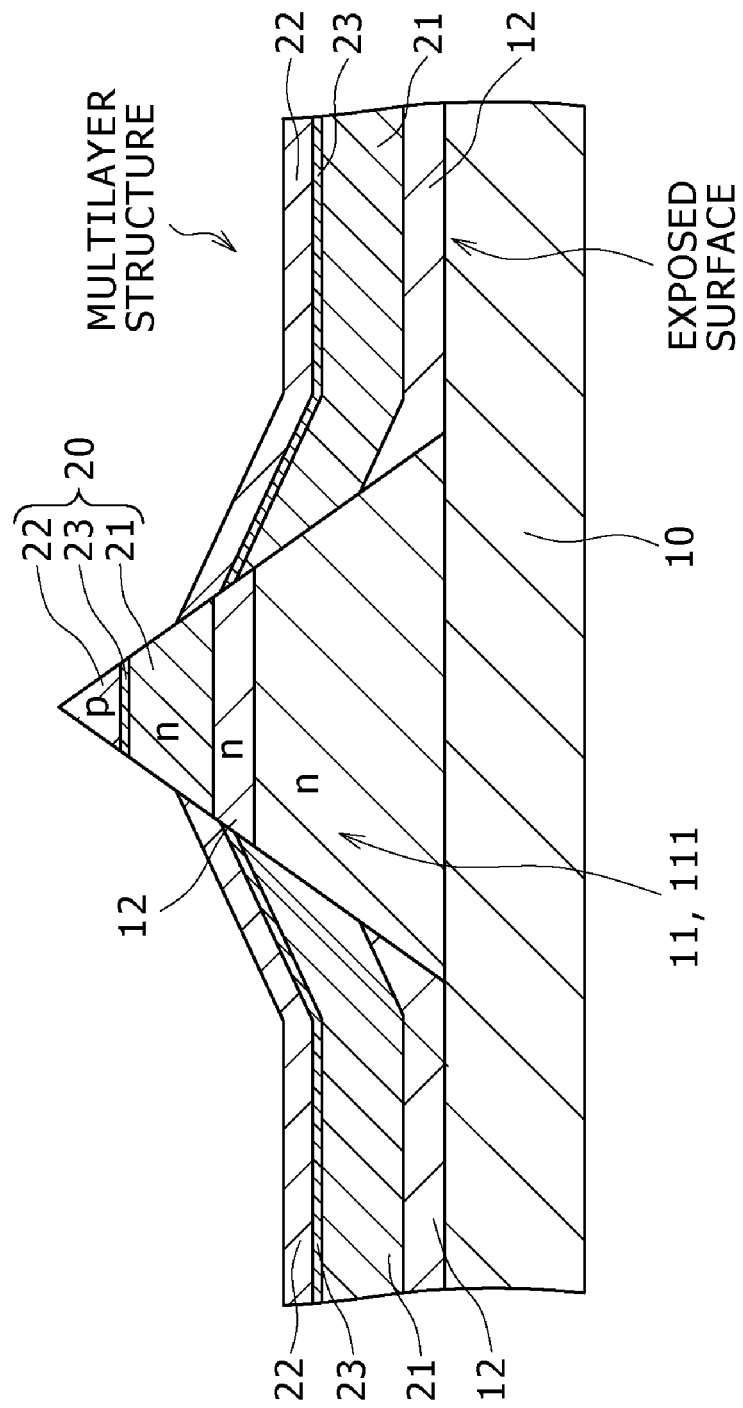
FIG. 4 is a schematic partial sectional view of the substrate and so on, subsequent to FIG. 3B, for explaining the semiconductor light emitting device and the method for manufacturing the same according to the first embodiment.

Thereafter, above the top surface of the underlying layer 11, the light emitting part 20 arising from sequential stacking of the first compound semiconductor layer 21 of the first conductivity type, the active layer 23, and the second compound semiconductor layer 22 of the second conductivity type is formed. In addition, on the exposed major surface of the substrate 10 on which the underlying layer 11 is not formed (the exposed surface of the substrate 10), a multilayer structure arising from sequential stacking of the first compound semiconductor layer 21 of the first conductivity type, the active layer 23, and the second compound semiconductor layer 22 of the second conductivity type is formed. Specifically, based on normal MOCVD, i.e., MOCVD with use of an organic metal and a hydrogen compound as the material gas, the buffer layer 12, the first compound semiconductor layer 21, the active layer 23, and the second compound semiconductor layers 22A and 22B are epitaxially grown over the underlying layer 11 and the exposed surface of the substrate 10. At this time, the oblique surfaces (side surfaces) of the compound semiconductor layers above the underlying layer 11 correspond to the {111}B plane. As described above, the {111}B plane is a non-growth surface. Therefore, the buffer layer 12, the first compound semiconductor layer 21, the active layer 23, and the second compound semiconductor layers 22A and 22B are so formed (stacked) that the layers in the region above the underlying layer 11 are separated from those in the region above the exposed surface of the substrate 10. In this way, the structure shown in FIG. 4 can be obtained.

By properly selecting the width of the top surface of the underlying layer 11 and the height of the underlying layer 11 and properly selecting the thicknesses of the buffer layer 12, the first compound semiconductor layer 21, the active layer 23, and the second compound semiconductor layers 22A and 22B, the multilayer structure of the light emitting part 20 having a triangular sectional shape can be obtained above the underlying layer 11.

As an alternative, the following configuration may be employed. Specifically, the substrate 10 is composed of p-GaAs. Furthermore, subsequently to [Step-100], on the exposed part of the major surface of the substrate 10, a base layer of the p conductivity type (specifically, a p-$Al_{x1}Ga_{(1-x1)}$As layer [$0 \leq x1 \leq 1$], and in particular, a $p^{++}$-$Al_{x1}Ga_{(1-x1)}$As layer [$0 < x1 \leq 1$] or a superlattice layer formed of a $p^{++}$-GaAs layer may be used at the uppermost part (top surface part) of the p-type base layer closest to the underlying layer) is epitaxially grown. Subsequently, in [Step-110], the underlying layer 11 composed of the above-described III-V compound semiconductor is epitaxially grown on the base layer. In this configuration, a tunnel junction is formed by the base layer and the underlying layer 11. In the case of a mere pn junction (the pn junction between the base layer and the underlying layer), current flowing in the reverse direction attributed to the tunnel effect will not occur basically. However, the thickness of the depletion layer can be further adjusted depending on the impurity concentration for example. Therefore, in order to cause the tunnel effect, the impurity concentrations of the respective layers in the region around the junction interface may be set as high as possible without significantly deteriorating the crystal quality. This decreases the width of the depletion layer formed across the junction interface. Thus, the tunnel effect is readily caused when a reverse bias is applied. Furthermore, the tunnel effect will occur more readily when the band gap of the semiconductor is smaller. Therefore, the materials may be so selected that, at least in the interface junction structure part, one of the outermost layer (top surface layer) of the base layer and the lowermost layer of the underlying layer closest to the base layer has a small energy band gap while the other of the layers has a large energy band gap. In addition, by using this compound semiconductor layer as a superlattice layer partially (using a very thin layer), the percentage of the material having the small energy band gap can be suppressed to the minimum, which makes it possible to suppress the absorption amount of light generated by the light emitting layer to the minimum necessary. In this manner, a condition with attention on the impurity concentrations, energy band gaps, and thicknesses of the compound semiconductor layers that form the interface between the base layer and the underlying layer and are in the vicinity of the interface may be employed.

At least around the interface between the base layer and the underlying layer and the vicinity of the interface, an impurity whose substitution site is the site occupied by a group III atom and an impurity whose substitution site is the site occupied by a group V atom are added to the material used for the epitaxial growth of the base layer having the p conductivity type in order to cause the base layer to have the p conductivity type. Specifically, as the material used for the epitaxial growth of the base layer, for example, trimethylaluminum (TMAl) or triethylaluminum (TEAl) is used as the material gas of the aluminum (Al) source, and trimethylgallium (TMGa) or triethylgallium (TEGa) is used as the material gas of the gallium (Ga) source. In addition, tertiary butyl arsine (TBAs) or arsine ($AsH_3$) is used as the material gas of the arsenic (As) source. Furthermore, as the gas for p-type impurity doping, e.g. trimethylzinc (TMZn), triethylzinc (TEZn), biscyclopentadienyl magnesium ($Cp_2Mg$), bisethylcyclopentadienyl magnesium ($EtCp_2Mg$), bisisopropylcyclopentadienyl magnesium ($i$-$PrCp_2Mg$), bismethylcyclopentadienyl magnesium ($MeCp_2Mg$), or trimethylmanganese (TMMn) is used, if the site to be substituted by the impurity is the group III site. In addition, as the gas for p-type impurity doping, carbon tetrachloride ($CCl_4$), carbon tetrabromide ($CBr_4$), carbon tetraiodide ($CI_4$), or the like is used as the material gas of the carbon (C) source, if the site to be substituted by the impurity is the group V site. Moreover, as another carbon (C) source, a growth condition may be employed under which methyl groups and ethyl groups contained in e.g. the material gases (organic metal gases) of the Al source, the Ga source, and the As source are aggressively captured in the crystal (used for autodoping). In particular, for the tunnel junction part formed by the p-type base layer and the n-type underlying layer and the vicinity thereof, the base layer formed of a $p^{++}$-type layer (heavily-doped layer) and the $n^{++}$-type underlying layer should be used. Therefore, it is important that, as the gases for the impurity doping for the $p^{++}$-type base layer, at least two kinds of gases by which the group III site and the group V site are to be substituted by impurities be used for the same layer.

Figure 5:
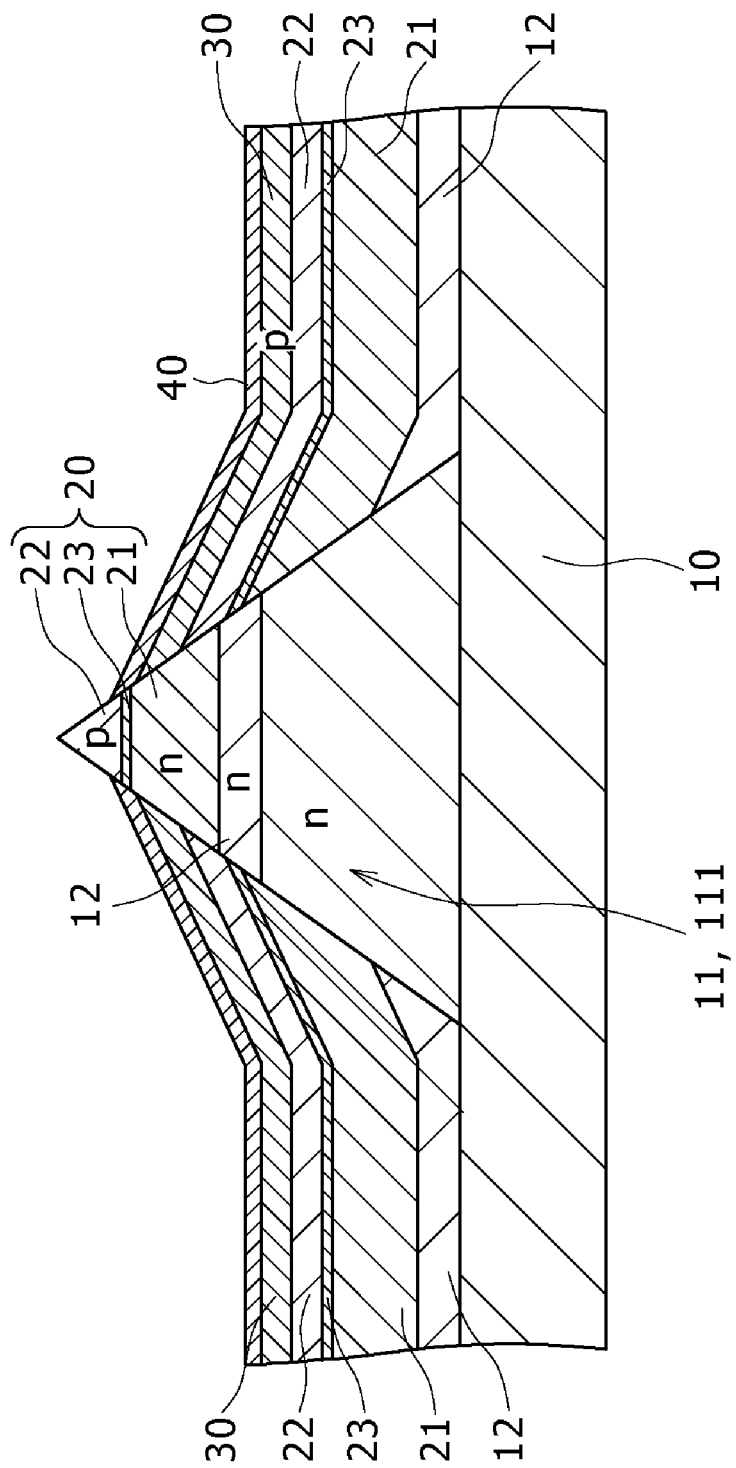
FIG. 5 is a schematic partial sectional view of the substrate and so on, subsequent to FIG. 4, for explaining the semiconductor light emitting device and the method for manufacturing the same according to the first embodiment.

Thereafter, over the multilayer structure, the current block layer 40 that covers at least the exposed side surfaces of the active layer 23 of the light emitting part 20 is formed. Specifically, continuously to the formation of the second compound semiconductor layer 22B, the adjustment layer 30 is formed across the entire surface based on MOCVD. Furthermore, the current block layer 40 composed of e.g. the fourth compound semiconductor layer 44 and the third compound semiconductor layer 43 is formed based on MOCVD (see FIG. 5). The current block layer 40 is not grown on the {111}B plane. The current block layer 40 is so formed that the end surfaces of the current block layer 40 cover at least the side surfaces of the active layer 23. Such configuration and structure can be achieved by properly selecting the width of the top surface of the underlying layer 11, the height of the underlying layer 11, and the thickness of the adjustment layer 30. Details of the configurations and structures of the third compound semiconductor layer 43 and the fourth compound semiconductor layer 44 will be described later.

[Step-140]

Subsequently, the burying layer 31 and the contact layer (cap layer) 32 are sequentially formed across the entire surface based on MOCVD. Specifically, due to the continuation of the MOCVD, the burying layer 31 formed of the compound semiconductor arising from the crystal growth from the exposed surface of the substrate 10 will in time completely cover the light emitting part 20 in the self growth stop state. Thereafter, the second electrode 52 is formed on the contact layer 32 based on vacuum evaporation. Furthermore, the substrate 10 is lapped to a proper thickness from the backside thereof, and then the first electrode 51 is formed based on vacuum evaporation.

[Step-150]

Thereafter, the respective semiconductor light emitting devices are separated from each other, so that the desired semiconductor light emitting devices can be obtained. The semiconductor light emitting devices of the second to thirteenth embodiments to be described later can also be manufactured based on a method similar to the above-described method basically.

In the first embodiment, the underlying layer 11 is formed for forming the light emitting part 20. This underlying layer 11 is provided on the substrate 10 separately from the substrate 10. Thus, even when the active layer 23 having a desired width is formed above the underlying layer 11 having a small width and thus the distance from the active layer 23 to the underlying layer 11 is small, the material of the underlying layer 11 can be so selected that light generated by the active layer 23 will not be absorbed by the underlying layer 11. As a result, the occurrence of a problem that the light emission efficiency (slope efficiency) is decreased can be suppressed. The height of the light emitting part 20 is also defined by the width of the underlying layer 11, and the predetermined range exists regarding the aspect ratio (e.g. the value of "height/width") of the underlying layer 11 corresponding to the desired width of the active layer 23. Thus, in order to allow the formation of the current block layer 40 on the side surfaces of the active layer 23, the aspect ratio should be set within this range. If the width of the apertures of the mask layers 11A (the windows of the mask layers 11A) is designed also in consideration of the characteristic that the angle formed by the {111}B plane as the side surface (trapezoid oblique surface) of the underlying layer 11 and the {100} plane is constant (54.7 degrees), the top-surface width and aspect ratio of the underlying layer 11 can be simultaneously controlled depending on the time of the epitaxial growth of the underlying layer 11. In a related art, a recess-and-projection substrate obtained through substrate etching (etching involving control fluctuation) involves variation in the width and height of the projection part, i.e., in the aspect ratio of the projection part, in the substrate and further in the aperture of one mask layer 11A. This results in the occurrence of a problem that, in a partial region of the substrate, the current block layer can not be formed on the side surfaces of the active layer in the light emitting part formed above the top surface of the underlying layer 11. In contrast, in the first embodiment, the desired aspect ratio of the underlying layer 11 corresponding to the desired width of the active layer 23 can be controlled depending on the design of the mask layers 11A and the time of the epitaxial growth of the underlying layer 11. This allows not only improvement to high carrier concentration but also great improvement in the in-plane flatness of the recess-and-projection structure in the substrate. Moreover, in the method for forming an underlying layer according to the first embodiment, an impurity whose substitution site is the site occupied by a group III atom and an impurity whose substitution site is the site occupied by a group V atom are added to the material used for the epitaxial growth of the underlying layer 11 having the n conductivity type in order to cause the underlying layer 11 to have the n conductivity type. This allows the conductivity type of the underlying layer 11 to be surely the n conductivity type.

Second Embodiment

The second embodiment is a modification of the first embodiment. In the second embodiment, the III-V compound semiconductor of the underlying layer 11 contains at least phosphorus (P) as its element. More specifically, the underlying layer 11 is composed of e.g. n-$\{Al_{x4}Ga_{(1-x4)}\}_{x5}In_{(1-x5)}P$: Se [$0 \leq x4 \leq 1$, x5=0.5, specifically, e.g. x4=0, 0.1, 0.2, 0.3, or 1], which readily achieves lattice matching with the substrate composed of GaAs, and the first compound semiconductor layer 21 is composed of n-$Al_{0.4}Ga_{0.6}As$: Se. Therefore, the energy band gap ($E_g$) of the material of the underlying layer 11 is larger than the energy band gap ($E_{g-0}$) of the material of the substrate 10. Furthermore, the energy band gap ($E_g$) of the material of the underlying layer 11 is larger than the energy band gap ($E_{g-1}$) of the material of the first compound semiconductor layer 21.

In a method for manufacturing a semiconductor light emitting device and a method for forming an underlying layer according to the second embodiment, in a step similar to [Step-110] of the first embodiment, e.g. trimethylaluminum (TMAl) or triethylaluminum (TEAl) is used as the material gas of the aluminum (Al) source, and trimethylgallium (TMGa) or triethylgallium (TEGa) is used as the material gas of the gallium (Ga) source. In addition, trimethylindium (TMIn) or triethylindium (TEIn) is used as the material gas of the indium (In) source, and tertiary butyl phosphine (TBP) or phosphine ($PH_3$) is used as the material gas of the phosphorus (P) source. Furthermore, as the gas for n-type impurity doping, disilane ($Si_2H_6$), monosilane ($SiH_4$), or trimethyltin (TMSn) is used, if the site to be substituted by the impurity is the group III site. In addition, as the gas for n-type impurity doping, hydrogen sulfide ($H_2S$), hydrogen selenide ($H_2Se$), or hydrogen telluride ($H_2Te$) is used, if the site to be substituted by the impurity is the group V site. Based on MOCVD, these group III gas, group V gas, and impurity gas are introduced into a reaction chamber and subjected to a pyrolytic reaction in a temperature range of 600° C. to 900° C. for high-temperature growth. This promotes the migration of the group III material, and thus allows the epitaxial growth of a compound semiconductor layer having high flatness of the {100} plane and high crystal quality. Furthermore, due to this MOCVD, it is possible to form the underlying layer 11 that is formed of an AlGaAs-based material layer whose energy band gap is larger than at least that of the GaAs substrate and has a trapezoidal shape with desired top-surface width and height.

In order to further improve the flatness of the top surface of the underlying layer 11, a growth condition that permits promotion of the migration of the group III material may be employed through adjustment to a high flow rate of the supply gas to be introduced into the reaction chamber and adjustment to a low mole supply ratio of (group V gas)/(group III gas). The material characteristic of the AlGaInP-based material is such that the {111}B plane (side surface) of the underlying layer 11 formed by using the AlGaInP-based material (containing no As) grows greatly readily compared with the {111}B plane (side surface) of the underlying layer 11 formed by using the AlGaAs-based material (containing As) (the range of the condition under which the {111}B plane grows is greatly wider in the case of the AlGaInP-based material). Therefore, selection of the material gas of the phosphorus (P) source is important for widening of the control range of the {111}B plane (side surface) growth of the AlGaInP-based material (e.g. for realization of the turning of the {111}B plane (side surface) to a non-growth surface). As this selection, it is desirable to use tertiary butyl phosphine (TBP), which is excellent in the low-temperature decomposition efficiency. By using such a group V material gas with high low-temperature decomposition efficiency, even with a smaller mole supply amount of the material gas compared with that of phosphine ($PH_3$), whose decomposition efficiency is low, the same effective mole supply ratio of group V/group III can be realized at the time of pyrolysis. Therefore, when the gas mole supply amount is the same, tertiary butyl phosphine (TBP) is advantageous over phosphine ($PH_3$) in terms of the following feature. Specifically, using tertiary butyl phosphine (TBP) allows, only through wide-range flow rate adjustment by a mass flow controller (MFC), changing in the condition range in which the effective mole supply ratio of group V/group III is high for a wide temperature range from a temperature for low-temperature growth to a temperature for high-temperature growth. This makes it possible to variously treat the control of the crystal planes of the underlying layer 11 (e.g. the flatness of the {100} plane and the degree of the growth of the {111}B plane). Because the present case relates to an example of the material "containing no As," the description thereof is made with use of tertiary butyl phosphine (TBP) as the material gas having excellent characteristics. However, it is obvious that, in the case of an example of the material "containing As," the description can be made with use of tertiary butyl arsine (TBAs) as the material gas having excellent characteristics similarly.

Except for the above-described features, the semiconductor light emitting device, the method for manufacturing the same, and the method for forming an underlying layer according to the second embodiment can be considered the same as those according to the first embodiment. Therefore, the detailed description thereof is omitted.

As an alternative, the following configuration may be employed. Specifically, the substrate 10 is composed of p-GaAs. Furthermore, subsequently to the step similar to [Step-100], on the exposed part of the major surface of the substrate 10, a base layer of the p conductivity type (specifically, a p-$\{Al_{x4}Ga_{(1-x4)}\}_{x5}In_{(1-x5)}P$ layer [$0 \leq x4 \leq 1$, $x5=0.5$], and in particular, a $p^{++}$-$\{Al_{x4}Ga_{(1-x4)}\}_{x5}In_{(1-x5)}P$ layer [$0 \leq x4 \leq 1$, $x5=0.5$] or a superlattice layer formed of a $p^{++}$-GaAs layer may be used at the uppermost part (top surface part) of the p-type base layer closest to the underlying layer) is epitaxially grown. Subsequently, in the step similar to [Step-110], the underlying layer 11 composed of the above-described III-V compound semiconductor is epitaxially grown on the base layer. In this configuration, a tunnel junction is formed by the base layer and the underlying layer 11. In the case of a mere pn junction (the pn junction between the base layer and the underlying layer), current flowing in the reverse direction attributed to the tunnel effect will not occur basically. However, the thickness of the depletion layer can be further adjusted depending on the impurity concentration for example. Therefore, in order to cause the tunnel effect, the impurity concentrations of the respective layers in the region around the junction interface may be set as high as possible without significantly deteriorating the crystal quality. This decreases the width of the depletion layer formed across the junction interface. Thus, the tunnel effect is readily caused when a reverse bias is applied. Furthermore, the tunnel effect will occur more readily when the band gap of the semiconductor is smaller. Therefore, the materials may be so selected that, at least in the interface junction structure part, one of the outermost layer (top surface layer) of the base layer and the lowermost layer of the underlying layer closest to the base layer has a small energy band gap while the other of the layers has a large energy band gap. In addition, by using this compound semiconductor layer as a superlattice layer partially (using a very thin layer), the percentage of the material having the small energy band gap can be suppressed to the minimum, which makes it possible to suppress the absorption amount of light generated by the light emitting layer to the minimum necessary. In this manner, a condition with attention on the impurity concentrations, energy band gaps, and thicknesses of the compound semiconductor layers that form the interface between the base layer and the underlying layer and are in the vicinity of the interface may be employed.

At least around the interface between the base layer and the underlying layer and the vicinity of the interface, an impurity whose substitution site is the site occupied by a group III atom and an impurity whose substitution site is the site occupied by a group V atom are added to the material used for the epitaxial growth of the base layer having the p conductivity type in order to cause the base layer to have the p conductivity type. Specifically, as the material used for the epitaxial growth of the base layer, for example, trimethylaluminum (TMAl) or triethylaluminum (TEAl) is used as the material gas of the aluminum (Al) source, and trimethylgallium (TMGa) or triethylgallium (TEGa) is used as the material gas of the gallium (Ga) source. Furthermore, trimethylindium (TMIn) or triethylindium (TEIn) is used as the material gas of the indium (In) source, and tertiary butyl phosphine (TBP) or phosphine ($PH_3$) is used as the material gas of the phosphorus (P) source. In addition, tertiary butyl arsine (TBAs) or arsine ($AsH_3$) is used as the material gas of the arsenic (As) source. Furthermore, as the gas for p-type impurity doping, e.g. trimethylzinc (TMZn), triethylzinc (TEZn), biscyclopentadienyl magnesium ($Cp_2Mg$), bisethylcyclopentadienyl magnesium ($EtCp_2Mg$), bisisopropylcyclopentadienyl magnesium ($i$-$PrCp_2Mg$), bismethylcyclopentadienyl magnesium ($MeCp_2Mg$), or trimethylmanganese (TMMn) is used, if the site to be substituted by the impurity is the group III site. In addition, as the gas for p-type impurity doping, carbon tetrachloride ($CCl_4$), carbon tetrabromide ($CBr_4$), carbon tetraiodide ($CI_4$), or the like is used as the material gas of the carbon (C) source, if the site to be substituted by the impurity is the group V site. Moreover, as another carbon (C) source, a growth condition may be employed under which methyl groups and ethyl groups contained in e.g. the material gases (organic metal gases) of the Al source, the Ga source, and the As source are aggressively captured in the crystal (used for autodoping). In particular, for the tunnel junction part formed by the p-type base layer and the n-type underlying layer and the vicinity thereof, the base layer formed of a $p^{++}$-type layer (heavily-doped layer) and the $n^{++}$-type underlying layer should be used. Therefore, it is important that, as the gases for the impurity doping for the $p^{++}$-type base layer, at least two kinds of gases by which the group III site and the group V site are to be substituted by impurities be used for the same layer.

Third Embodiment

The third embodiment is a modification of the semiconductor light emitting device and the method for manufacturing the same according to the first embodiment, and relates to the method for forming an underlying layer according to the fourth mode of the present invention.

A schematic partial sectional view of the semiconductor light emitting device of the third embodiment is shown in FIG. 6A. A schematic partial sectional view of the substrate and the underlying layer in this semiconductor light emitting device is similar to that shown in FIG. 2. The semiconductor light emitting device of the third embodiment has the same structure as that of the semiconductor light emitting device of the first embodiment, except that the conductivity types of a part of the compound semiconductor layers are different from those in the semiconductor light emitting device of the first embodiment.

Specifically, the semiconductor light emitting device of the third embodiment includes:

(A) an underlying layer 11 that is formed on the major surface of a substrate 10 having the {100} plane as the major surface;

(B) a light emitting part 20 that arises from sequential stacking of a first compound semiconductor layer 21 of a first conductivity type (p-type, in the third embodiment), an active layer 23, and a second compound semiconductor layer 22 of a second conductivity type (n-type, in the third embodiment) above the top surface of the underlying layer 11; and (C) a current block layer 40 that is formed above a part of the major surface of the substrate 10 on which the underlying layer 11 is not formed (the exposed surface of the substrate 10) and covers at least the exposed side surface of the active layer 23 of the light emitting part 20.

The underlying layer 11 has the same structure as that in the first embodiment but has a different configuration.

Specifically, in the third embodiment, the substrate 10 is composed of p-GaAs, and the III-V compound semiconductor of the underlying layer 11 contains at least arsenic and aluminum. More specifically, the underlying layer 11 is composed of e.g. p-$Al_{0.47}Ga_{0.53}As$: Zn, and the first compound semiconductor layer 21 is composed of p-$Al_{0.4}Ga_{0.6}As$: Zn. Therefore, the energy band gap ($E_g$) of the material of the underlying layer 11 is larger than the energy band gap ($E_{g\text{-}0}$) of the material of the substrate 10. Furthermore, the energy band gap ($E_g$) of the material of the underlying layer 11 is larger than the energy band gap ($E_{g\text{-}1}$) of the material of the first compound semiconductor layer 21. The current block layer 40 is composed of a third compound semiconductor layer 43 of the first conductivity type (p-type) and a fourth compound semiconductor layer 44 of the second conductivity type (n-type) in contact with the third compound semiconductor layer 43. FIG. 6B is a schematic partial sectional view of the partially-enlarged third compound semiconductor layer 43 and fourth compound semiconductor layer 44. Details will be described later about the compositions of the respective compound semiconductor layers included in the light emitting part 20 and the compositions of the respective compound semiconductor layers included in the current block layer 40 in the semiconductor light emitting device of the third embodiment.

A method for manufacturing a semiconductor light emitting device and a method for forming an underlying layer according to the third embodiment will be described below.

[Step-300]

Initially, similarly to [Step-100] of the first embodiment, plural mask layers 11A extending along the <110> direction are formed on the major surface of the substrate 10 having the {100} plane as the major surface, and a part of the major surface of the substrate 10 is exposed between the mask layers 11A. Alternatively, the plural mask layers 11A are formed on the major surface of the substrate 10, and a part of the major surface of the substrate 10 is exposed between the mask layers 11A. Specifically, on the {100} crystal plane, e.g. the (100) crystal plane, of the substrate 10 composed of p-GaAs as its major surface, the mask layers 11A that are formed of $SiO_2$ layers with a required width and extend along the [001]A direction are formed based on CVD and a photolithography technique.

[Step-310]

Subsequently, similarly to [Step-110] of the first embodiment, the underlying layer 11 that is composed of a III-V compound semiconductor and has the following feature is epitaxially grown on the exposed part of the major surface of the substrate 10. Specifically, the sectional shape of the underlying layer 11 obtained when the underlying layer 11 is cut along a virtual plane perpendicular to the <110> direction of the substrate 10 is a trapezoid. Furthermore, the oblique surfaces of the underlying layer 11 corresponding to two oblique sides of this trapezoid are the {111}B planes, and the top surface of the underlying layer 11 corresponding to the upper side of the trapezoid is the {100} plane. Subsequently to the epitaxial growth of the underlying layer 11, the mask layers 11A are removed. Alternatively, the underlying layer 11 composed of a III-V compound semiconductor is epitaxially grown on the exposed part of the major surface of the substrate 10, and then the mask layers 11A are removed. To the material used for the epitaxial growth of the underlying layer 11 having the p conductivity type, an impurity whose substitution site is the site occupied by a group III atom and an impurity whose substitution site is the site occupied by a group V atom are added in order to cause the underlying layer 11 to have the p conductivity type.

Specifically, e.g. the same material gases of the aluminum (Al) source, the gallium (Ga) source, and the arsenic (As) source as those in the first embodiment are used. Furthermore, as the gas for p-type impurity doping, e.g. trimethylzinc (TMZn), triethylzinc (TEZn), biscyclopentadienyl magnesium ($Cp_2Mg$), bisethylcyclopentadienyl magnesium ($EtCp_2Mg$), bisisopropylcyclopentadienyl magnesium (i-$PrCp_2Mg$), bismethylcyclopentadienyl magnesium ($MeCp_2Mg$), or trimethylmanganese (TMMn) is used, if the site to be substituted by the impurity is the group III site. In addition, as the gas for p-type impurity doping, carbon tetrachloride ($CCl_4$), carbon tetrabromide ($CBr_4$), carbon tetraiodide ($CI_4$), or the like is used as the material gas of the carbon (C) source, if the site to be substituted by the impurity is the group V site. Moreover, as another carbon (C) source, a growth condition may be employed under which methyl groups and ethyl groups contained in e.g. the material gases (organic metal gases) of the Al source, the Ga source, and the In source are aggressively captured in the crystal (used for autodoping), as described above for [Step-110] of the first embodiment. Based on MOCVD, these group III gas, group V gas, and impurity gas are introduced into a reaction chamber and subjected to a pyrolytic reaction in a temperature range of 600° C. to 900° C. for high-temperature growth. This promotes the migration of the group III material, and thus allows the epitaxial growth of a compound semiconductor layer having high flatness of the {100} plane and high crystal quality. Furthermore, due to this MOCVD, it is possible to form the underlying layer 11 that is formed of an AlGaAs-based material layer whose energy band gap is larger than at least that of the GaAs substrate and has a trapezoidal shape with desired top-surface width and height.

In order to further improve the flatness of the top surface of the underlying layer 11, a growth condition that permits promotion of the migration of the group III material may be employed through adjustment to a high flow rate of the supply gas to be introduced into the reaction chamber and adjustment to a low mole supply ratio of (group V gas)/(group III gas). Furthermore, in order to increase the concentration of the p-type impurity in the underlying layer 11, the absolute amount of the dopant is increased, naturally. In addition, it is effective to use not only carbon (C) arising from methyl groups ($CH_3$—) and ethyl groups ($C_2H_5$—) but also another p-type impurity whose impurity substitution site does not compete with that of carbon (C). Specifically, the substitution site of carbon (C) is the group V site, and the site that does not compete with the group V site is the group III site. Therefore, a group III impurity material gas may be used together with the carbon-containing gas. Moreover, in order to increase the absolute amount of carbon (C) itself by autodoping, e.g. the Al mole fraction of the AlGaAs-based underlying layer 11 (the gas supply amount of TMAl) may be increased to thereby increase the capturing of carbon (C), without permitting the underlying layer 11 to absorb light generated by the light emitting layer. This is because of the following reason. Specifically, e.g. TMAl forms a dimer at the time of the growth of the AlGaAs-based underlying layer 11, and thus methyl groups ($CH_3$—) and ethyl groups ($C_2H_5$—) are also easily captured in the crystal together with Al. Therefore, by increasing the Al mole fraction of the AlGaAs-based underlying layer 11, the capturing of carbon (C) can be increased, and hence the autodoping amount can be increased. In particular, in order to further increase the autodoping amount of carbon (C) in the underlying layer 11, it is desirable to use tertiary butyl arsine (TBAs) as the material gas of the arsenic (As) source. If tertiary butyl arsine (TBAs) is used, in addition to the related-art technique of using only carbon (C) arising from methyl groups ($CH_3$—) and ethyl groups ($C_2H_5$—) contained in the group III material (organic metal), carbon (C) arising from tertiary butyl groups (($CH_3)_3C$—) contained in the group V material (organic metal) is also used. This increases the absolute amount of carbon (C), and the amount of carbon (C) substituted for the group V site in the crystal by autodoping is increased, which can increase the hole concentration.

In this manner, the underlying layer 11 extending along the [001]A direction can be obtained. The width direction of the underlying layer 11 is parallel to the [0-11]B direction. Thereafter, the mask layers 11A composed of $SiO_2$ are removed based on wet etching. The underlying layer 11 has the oblique surfaces (side surfaces) formed of the (11-1)B plane and the (1-11)B plane, and the top surface of the underlying layer 11 is the (100) plane. The obtained underlying layer 11 contains, as impurities, zinc (impurity whose substitution site is the site occupied by a group III atom) and carbon (impurity whose substitution site is the site occupied by a group V atom) for causing the underlying layer 11 to be the p-type.
[Step-320]

Thereafter, steps similar to [Step-120] to [Step-150] of the first embodiment are carried out, so that the semiconductor light emitting device of the third embodiment can be achieved.

As an alternative, the following configuration may be employed. Specifically, the substrate 10 is composed of n-GaAs. Furthermore, subsequently to the step similar to [Step-100], on the exposed part of the major surface of the substrate 10, a base layer of the n conductivity type (specifically, an n-$Al_{x1}Ga_{(1-x1)}$As layer [$0 \leq x1 \leq 1$] and in particular, an n$^{++}$-$Al_{x1}Ga_{(1-x1)}$As layer [$0 < x1 \leq 1$] or a superlattice layer formed of an n$^{++}$-GaAs layer may be used at the uppermost part (top surface part) of the n-type base layer closest to the underlying layer) is epitaxially grown. Subsequently, in the step similar to [Step-110], the underlying layer 11 composed of the above-described III-V compound semiconductor is epitaxially grown on the base layer. In this configuration, a tunnel junction is formed by the base layer and the underlying layer 11. In the case of a mere np junction (the np junction between the base layer and the underlying layer), current flowing in the reverse direction attributed to the tunnel effect will not occur basically. However, the thickness of the depletion layer can be further adjusted depending on the impurity concentration for example. Therefore, in order to cause the tunnel effect, the impurity concentrations of the respective layers in the region around the junction interface may be set as high as possible without significantly deteriorating the crystal quality. This decreases the width of the depletion layer formed across the junction interface. Thus, the tunnel effect is readily caused when a reverse bias is applied. Furthermore, the tunnel effect will occur more readily when the band gap of the semiconductor is smaller. Therefore, the materials may be so selected that, at least in the interface junction structure part, one of the outermost layer (top surface layer) of the base layer and the lowermost layer of the underlying layer closest to the base layer has a small energy band gap while the other of the layers has a large energy band gap. In addition, by using this compound semiconductor layer as a superlattice layer partially (using a very thin layer), the percentage of the material having the small energy band gap can be suppressed to the minimum, which makes it possible to suppress the absorption amount of light generated by the light emitting layer to the minimum necessary. In this manner, a condition with attention on the impurity concentrations, energy band gaps, and thicknesses of the compound semiconductor layers that form the interface between the base layer and the underlying layer and are in the vicinity of the interface may be employed.

At least around the interface between the base layer and the underlying layer and the vicinity of the interface, an impurity whose substitution site is the site occupied by a group III atom and an impurity whose substitution site is the site occupied by a group V atom are added to the material used for the epitaxial growth of the base layer having the n conductivity type in order to cause the base layer to have the n conductivity type. Specifically, as the material used for the epitaxial growth of the base layer, for example, trimethylaluminum (TMAl) or triethylaluminum (TEAl) is used as the material gas of the aluminum (Al) source, and trimethylgallium (TMGa) or triethylgallium (TEGa) is used as the material gas of the gallium (Ga) source. In addition, tertiary butyl arsine (TBAs) or arsine ($AsH_3$) is used as the material gas of the arsenic (As) source. Furthermore, as the gas for n-type impurity doping, e.g. disilane ($Si_2H_6$), monosilane ($SiH_4$), or trimethyltin (TMSn) is used, if the site to be substituted by the impurity is the group III site. In addition, as the gas for n-type impurity doping, hydrogen sulfide ($H_2S$), hydrogen selenide ($H_2Se$), or hydrogen telluride ($H_2Te$) is used, if the site to be substituted by the impurity is the group V site. In particular, for the tunnel junction part formed by the n-type base layer and the p-type underlying layer and the vicinity thereof, the base layer formed of an n$^{++}$-type layer (heavily-doped layer) and the p$^{++}$-type underlying layer should be used. Therefore, it is important that, as the gases for the impurity doping for the n$^{++}$-type base layer, at least two kinds of gases by which the group III site and the group V site are to be substituted by impurities be used for the same layer.

Fourth Embodiment

The fourth embodiment is a modification of the third embodiment. In the fourth embodiment, the III-V compound semiconductor of the underlying layer 11 contains at least phosphorus. More specifically, the underlying layer 11 is composed of e.g. n-$\{Al_{x4}Ga_{(1-x4)}\}_{x5}In_{(1-x5)}$P: Se [$0 \leq x4 \leq 1$, x5=0.5, specifically, e.g. x4=0, 0.1, 0.2, 0.3, or 1], which readily achieves lattice matching with the substrate composed of GaAs, and the first compound semiconductor layer 21 is composed of p-$Al_{0.4}Ga_{0.6}As$:Zn. Therefore, the energy band gap ($E_g$) of the material of the underlying layer 11 is larger than the energy band gap ($E_{g-0}$) of the material of the substrate 10. Furthermore, the energy band gap ($E_g$) of the material of the underlying layer 11 is larger than the energy band gap ($E_{g-1}$) of the material of the first compound semiconductor layer 21.

In a method for manufacturing a semiconductor light emitting device and a method for forming an underlying layer according to the fourth embodiment, in a step similar to [Step-310] of the third embodiment, the material gases described for the second embodiment are used as the material gases of the aluminum (Al) source, the gallium (Ga) source, the indium (In) source, and the phosphorus (P) source. Furthermore, as the gas for p-type impurity doping, the material gas described for the third embodiment is used, if the site to be substituted by the impurity is the group III site. In addition, as the gas for p-type impurity doping, the material gas of the carbon (C) source described for the third embodiment is used, if the site to be substituted by the impurity is the group V site. Moreover, as another carbon (C) source, a growth condition may be employed under which methyl groups and ethyl groups contained in e.g. the material gases (organic metal gases) of the Al source, the Ga source, and the In source are aggressively captured in the crystal (used for autodoping), as described above for [Step-110] of the first embodiment. Based on MOCVD, these group III gas, group V gas, and impurity gas are introduced into a reaction chamber and subjected to a pyrolytic reaction in a temperature range of 600° C. to 900° C. for high-temperature growth. This promotes the migration of the group III material, and thus allows the epitaxial growth of a compound semiconductor layer having high flatness of the {100} plane and high crystal quality. Furthermore, due to this MOCVD, it is possible to form the underlying layer 11 that is formed of an AlGaAs-based material layer whose energy band gap is larger than at least that of the GaAs substrate and has a trapezoidal shape with desired top-surface width and height.

In order to further improve the flatness of the top surface of the underlying layer 11, a growth condition that permits promotion of the migration of the group III material may be employed through adjustment to a high flow rate of the supply gas to be introduced into the reaction chamber and adjustment to a low mole supply ratio of (group V gas)/(group III gas). Furthermore, in order to increase the concentration of the p-type impurity in the underlying layer 11, the absolute amount of the dopant is increased, naturally. In addition, it is effective to use not only carbon (C) arising from methyl groups ($CH_3$—) and ethyl groups ($C_2H_5$—) but also another p-type impurity whose impurity substitution site does not compete with that of carbon (C). Specifically, the substitution site of carbon (C) is the group V site, and the site that does not compete with the group V site is the group III site. Therefore, a group III impurity material gas may be used together with the carbon-containing gas. Moreover, in order to increase the absolute amount of carbon (C) itself by autodoping, e.g. the Al mole fraction of the AlGaInP-based or AlGaAs-based underlying layer 11 (the gas supply amount of TMAl) may be increased to thereby increase the capturing of carbon (C), without permitting the underlying layer 11 to absorb light generated by the light emitting layer. This is because of the following reason. Specifically, e.g. TMAl forms a dimer at the time of the growth of the AlGaInP-based or AlGaAs-based underlying layer 11, and thus methyl groups ($CH_3$—) and ethyl groups ($C_2H_5$—) are also easily captured in the crystal together with Al. Therefore, by increasing the Al mole fraction of the AlGaInP-based or AlGaAs-based underlying layer 11, the capturing of carbon (C) can be increased, and hence the autodoping amount can be increased. In particular, in order to further increase the autodoping amount of carbon (C) in the underlying layer 11, it is desirable to use tertiary butyl phosphine (TBP) as the material gas of the phosphorus (P) source. If tertiary butyl phosphine (TBP) is used, in addition to the related-art technique of using only carbon (C) arising from methyl groups ($CH_3$—) and ethyl groups ($C_2H_5$—) contained in the group III material (organic metal), carbon (C) arising from tertiary butyl groups (($CH_3$)$_3C$—) contained in the group V material (organic metal) is also used. This increases the absolute amount of carbon (C), and the amount of carbon (C) substituted for the group V site in the crystal by autodoping is increased, which can increase the hole concentration.

In particular, the material characteristic of the AlGaInP-based material is such that the {111}B plane (side surface) of the underlying layer 11 formed by using the AlGaInP-based material (containing no As) grows greatly readily compared with the {111}B plane (side surface) of the underlying layer 11 formed by using the AlGaAs-based material (containing As) (the range of the condition under which the {111}B plane grows is greatly wider in the case of the AlGaInP-based material). Therefore, selection of the material gas of the phosphorus (P) source is important for widening of the control range of the {111}B plane (side surface) growth of the AlGaInP-based material (e.g. for realization of the turning of the {111}B plane (side surface) to a non-growth surface). As this selection, it is desirable to use tertiary butyl phosphine (TBP), which is excellent in the low-temperature decomposition efficiency. By using such a group V material gas with high low-temperature decomposition efficiency, even with a smaller mole supply amount of the material gas compared with that of phosphine ($PH_3$), whose decomposition efficiency is low, the same effective mole supply ratio of group V/group III can be realized at the time of pyrolysis. Therefore, when the gas mole supply amount is the same, tertiary butyl phosphine (TBP) is advantageous over phosphine ($PH_3$) in terms of the following feature. Specifically, using tertiary butyl phosphine (TBP) allows, only through wide-range flow rate adjustment by a mass flow controller (MFC), changing in the condition range in which the effective mole supply ratio of group V/group III is high for a wide temperature range from a temperature for low-temperature growth to a temperature for high-temperature growth. This makes it possible to variously treat the control of the crystal planes of the underlying layer 11 (e.g. the flatness of the {100} plane and the degree of the growth of the {111}B plane). Because the present case relates to an example of the material "containing no As," the description thereof is made with use of tertiary butyl phosphine (TBP) as the material gas having excellent characteristics. However, it is obvious that, in the case of an example of the material "containing As," the description can be made with use of tertiary butyl arsine (TBAs) as the material gas having excellent characteristics similarly.

As an alternative, the following configuration may be employed. Specifically, the substrate 10 is composed of n-GaAs. Furthermore, subsequently to the step similar to [Step-100], on the exposed part of the major surface of the substrate 10, a base layer of the n conductivity type (specifically, an n-$\{Al_{x4}Ga_{(1-x4)}\}_{x5}In_{(1-x5)}P$ layer [$0 \leq x4 \leq 1$, $x5=0.5$], and in particular, an $n^{++}$-$\{Al_{x4}Ga_{(1-x4)}\}_{x5}In_{(1-x5)}P$ layer [$0 \leq x4 \leq 1$, $x5=0.5$] or a superlattice layer formed of an $n^{++}$-GaAs layer may be used at the uppermost part (top surface part) of the n-type base layer closest to the underlying layer) is epitaxially grown. Subsequently, in the step similar to

[Step-110], the underlying layer 11 composed of the above-described III-V compound semiconductor is epitaxially grown on the base layer. In this configuration, a tunnel junction is formed by the base layer and the underlying layer 11. In the case of a mere np junction (the np junction between the base layer and the underlying layer), current flowing in the reverse direction attributed to the tunnel effect will not occur basically. However, the thickness of the depletion layer can be further adjusted depending on the impurity concentration for example. Therefore, in order to cause the tunnel effect, the impurity concentrations of the respective layers in the region around the junction interface may be set as high as possible without significantly deteriorating the crystal quality. This decreases the width of the depletion layer formed across the junction interface. Thus, the tunnel effect is readily caused when a reverse bias is applied. Furthermore, the tunnel effect will occur more readily when the band gap of the semiconductor is smaller. Therefore, the materials may be so selected that, at least in the interface junction structure part, one of the outermost layer (top surface layer) of the base layer and the lowermost layer of the underlying layer closest to the base layer has a small energy band gap while the other of the layers has a large energy band gap. In addition, by using this compound semiconductor layer as a superlattice layer partially (using a very thin layer), the percentage of the material having the small energy band gap can be suppressed to the minimum, which makes it possible to suppress the absorption amount of light generated by the light emitting layer to the minimum necessary. In this manner, a condition with attention on the impurity concentrations, energy band gaps, and thicknesses of the compound semiconductor layers that form the interface between the base layer and the underlying layer and are in the vicinity of the interface may be employed.

At least around the interface between the base layer and the underlying layer and the vicinity of the interface, an impurity whose substitution site is the site occupied by a group III atom and an impurity whose substitution site is the site occupied by a group V atom are added to the material used for the epitaxial growth of the base layer having the n conductivity type in order to cause the base layer to have the n conductivity type. Specifically, as the material used for the epitaxial growth of the base layer, for example, trimethylaluminum (TMAl) or triethylaluminum (TEAl) is used as the material gas of the aluminum (Al) source, and trimethylgallium (TMGa) or triethylgallium (TEGa) is used as the material gas of the gallium (Ga) source. Furthermore, trimethylindium (TMIn) or triethylindium (TEIn) is used as the material gas of the indium (In) source, and tertiary butyl phosphine (TBP) or phosphine ($PH_3$) is used as the material gas of the phosphorus (P) source. In addition, tertiary butyl arsine (TBAs) or arsine ($AsH_3$) is used as the material gas of the arsenic (As) source. Furthermore, as the gas for n-type impurity doping, e.g. disilane ($Si_2H_6$), monosilane ($SiH_4$), or trimethyltin (TMSn) is used, if the site to be substituted by the impurity is the group III site. In addition, as the gas for n-type impurity doping, hydrogen sulfide ($H_2S$), hydrogen selenide ($H_2Se$), or hydrogen telluride ($H_2Te$) is used, if the site to be substituted by the impurity is the group V site. In particular, for the tunnel junction part formed by the n-type base layer and the p-type underlying layer and the vicinity thereof, the base layer formed of an $n^{++}$-type layer (heavily-doped layer) and the $p^{++}$-type underlying layer should be used. Therefore, it is important that, as the gases for the impurity doping for the $n^{++}$-type base layer, at least two kinds of gases by which the group III site and the group V site are to be substituted by impurities be used for the same layer.

Except for the above-described features, the semiconductor light emitting device, the method for manufacturing the same, and the method for forming an underlying layer according to the fourth embodiment can be considered the same as those according to the third embodiment. Therefore, the detailed description thereof is omitted.

When the features of the underlying layer 11 that can be realized are summarized by combining the concepts of the underlying layers described for the first to fourth embodiments, the following items (1) to (4) can be obtained:

(1) the underlying layer 11 whose light absorption is suppressed;

(2) the underlying layer 11 that is excellent in the uniformity of the width and the aspect ratio in the substrate;

(3) the underlying layer 11 that is allowed to have a higher concentration of a p-type impurity or an n-type impurity; and (4) the underlying layer 11 that allows formation of $p^+/n^+$ junction (tunnel junction).

In particular, regarding the tunnel junction of item (4), as described above, as specific examples of the structure formed around the junction interface between the base layer and the underlying layer and the vicinity thereof, a heavily-doped (Al)GaAs-based layer, a heavily-doped (Al)GaInP-based layer, and a heavily-doped GaAs layer are cited as an $n^{++}$-type compound semiconductor layer and a $p^{++}$-type compound semiconductor layer, in terms of selective growth that readily allows lattice matching with the GaAs substrate. However, the selection of the materials of the base layer and the underlying layer is not limited thereto as long as the lattice matching with the substrate is ensured. Also when a substrate composed of a material other than GaAs is used, the base layer and the underlying layer that readily achieve the tunnel effect can be obtained by combining group III and V materials through selection of the group III material from B, Al, Ga, and In and selection of the group V material from N, P, As, Sb, and Bi. In particular, when a high-quality light emitting device that is favorable in terms of all of the tunnel effect, the light absorption, and the lattice matching is intended, partially employing a superlattice layer for the tunnel junction interface allows adjustment of the critical thickness while reducing the light absorption amount as much as possible.

By the Way, the current block layer 40 obtained through crystal growth above the exposed surface of the substrate 10 is composed of a {311}B crystal plane region that extends from the side surface of the light emitting part 20, a {100} crystal plane region that extends along the major surface of the substrate 10, and a {h11}B crystal plane region (h is an integer equal to or larger than four, and it will be often referred to as a high-order crystal plane region, for convenience) that is located between the {311}B crystal plane region and the {100} crystal plane region (see FIGS. 1B and 6B).

In particular, the following problem often arises in the {h11}B crystal plane region and the vicinity of this region. Specifically, the current block layer 40 is annihilated or thinned due to impurity mutual diffusion between the n-type compound semiconductor layer and the p-type compound semiconductor layer of the current block layer 40. Consequently, the effect of the current block layer 40 becomes unstable and thus leakage current is increased. In order to solve such a problem, in a technique disclosed in the above-mentioned Japanese Patent No. 2990837, a p-type substrate is used as the substrate and the current block layer 40 is formed of a p-type compound semiconductor layer. There is a tendency that the {311}B crystal plane region is readily turned to an n-type region and the high-order crystal plane region is readily turned to a p-type region. Therefore, the thickness of the {311}B crystal plane region is eventually decreased from the original p-type epitaxial growth thickness, so that this region becomes a thin film part. On the other hand, the thickness of the high-order crystal plane region is eventually increased due to the turning to a p-type region, so that this region becomes a thick film part. As a result, the thickness of the high-order crystal plane region of the current block layer 40 becomes large, and thus leakage current of this part can be surely avoided. As above, the technique disclosed in Japanese Patent No. 2990837 is very effective to solve the above-described problem. However, using an n-type substrate is strongly demanded. Furthermore, also in the case of using a p-type substrate, it is desirable to further reduce leakage current of the current block layer. The above-described problem will be referred to as the second problem for the following description.

In order to meet the second need, the semiconductor light emitting device according to the embodiment of the present invention may have the following configuration. Specifically, the current block layer is composed of a third compound semiconductor layer of the first conductivity type and a fourth compound semiconductor layer of the second conductivity type in contact with the third compound semiconductor layer, the impurity for causing the first compound semiconductor layer to have the first conductivity type is such that the substitution site of the impurity in the first compound semiconductor layer does not compete with the substitution site of the impurity in the second compound semiconductor layer for causing the second compound semiconductor layer to have the second conductivity type, and the impurity for causing the third compound semiconductor layer to have the first conductivity type is such that the substitution site of the impurity in the third compound semiconductor layer competes with the substitution site of the impurity in the fourth compound semiconductor layer for causing the fourth compound semiconductor layer to have the second conductivity type. For convenience, this configuration will be referred to as "the semiconductor light emitting device according to the ((I)-1)-th configuration of the present invention." In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

The semiconductor light emitting device according to the ((I)-1)-th configuration of the present invention may have the following configuration. Specifically, the first compound semiconductor layer, the second compound semiconductor layer, the third compound semiconductor layer, and the fourth compound semiconductor layer are composed of a III-V compound semiconductor, the substitution site of the impurity in the first compound semiconductor layer is the site occupied by a group V atom, the substitution site of the impurity in the second compound semiconductor layer is the site occupied by a group III atom, the substitution site of the impurity in the third compound semiconductor layer and the substitution site of the impurity in the fourth compound semiconductor layer are the site occupied by a group III atom. For convenience, this configuration will be referred to as "the semiconductor light emitting device according to the ((I)-1-A)-th configuration of the present invention."

In addition, the semiconductor light emitting device according to the ((I)-1)-th configuration of the present invention may have the following configuration. Specifically, the first compound semiconductor layer, the second compound semiconductor layer, the third compound semiconductor layer, and the fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, and the substitution site of the impurity in the third compound semiconductor layer and the substitution site of the impurity in the fourth compound semiconductor layer are the site occupied by a group III atom. For convenience, this configuration will be referred to as "the semiconductor light emitting device according to the ((I)-1-B)-th configuration of the present invention."

In addition, the semiconductor light emitting device according to the ((I)-1)-th configuration of the present invention may have the following configuration. Specifically, the first compound semiconductor layer, the second compound semiconductor layer, the third compound semiconductor layer, and the fourth compound semiconductor layer are composed of a III-V compound semiconductor, the substitution site of the impurity in the first compound semiconductor layer is the site occupied by a group V atom, the substitution site of the impurity in the second compound semiconductor layer is the site occupied by a group III atom, and the substitution site of the impurity in the third compound semiconductor layer and the substitution site of the impurity in the fourth compound semiconductor layer are the site occupied by a group V atom. For convenience, this configuration will be referred to as "the semiconductor light emitting device according to the ((I)-1-a)-th configuration of the present invention."

In addition, the semiconductor light emitting device according to the ((I)-1)-th configuration of the present invention may have the following configuration. Specifically, the first compound semiconductor layer, the second compound semiconductor layer, the third compound semiconductor layer, and the fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is a site occupied by a group V atom, and the substitution site of the impurity in the third compound semiconductor layer and the substitution site of the impurity in the fourth compound semiconductor layer are the site occupied by a group V atom. For convenience, this configuration will be referred to as "the semiconductor light emitting device according to the ((I)-1-b)-th configuration of the present invention."

In addition, the semiconductor light emitting device according to the ((I)-1)-th configuration of the present invention may have the following configuration. Specifically, the first compound semiconductor layer, the second compound semiconductor layer, the third compound semiconductor layer, and the fourth compound semiconductor layer are composed of a III-V compound semiconductor, the substitution site of the impurity in the first compound semiconductor layer is the site occupied by a group III atom, the substitution site of the impurity in the second compound semiconductor layer is the site occupied by a group V atom, and the substitution site of the impurity in the third compound semiconductor layer and the substitution site of the impurity in the fourth compound semiconductor layer are the site occupied by a group V atom. For convenience, this configuration will be referred to as "the semiconductor light emitting device according to the ((I)-1-C)-th configuration of the present invention."

In addition, the semiconductor light emitting device according to the ((I)-1)-th configuration of the present invention may have the following configuration. Specifically, the first compound semiconductor layer, the second compound semiconductor layer, the third compound semiconductor layer, and the fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, and the substitution site of the impurity in the third compound semiconductor layer and the substitution site of the impurity in the fourth compound semiconductor layer are the site occupied by a group V atom. For convenience, this configuration will be referred to as "the semiconductor light emitting device according to the ((I)-1-D)-th configuration of the present invention."

In addition, the semiconductor light emitting device according to the ((I)-1)-th configuration of the present invention may have the following configuration. Specifically, the first compound semiconductor layer, the second compound semiconductor layer, the third compound semiconductor layer, and the fourth compound semiconductor layer are composed of a III-V compound semiconductor, the substitution site of the impurity in the first compound semiconductor layer is the site occupied by a group III atom, the substitution site of the impurity in the second compound semiconductor layer is the site occupied by a group V atom, and the substitution site of the impurity in the third compound semiconductor layer and the substitution site of the impurity in the fourth compound semiconductor layer are the site occupied by a group III atom. For convenience, this configuration will be referred to as "the semiconductor light emitting device according to the ((I)-1-c)-th configuration of the present invention."

In addition, the semiconductor light emitting device according to the ((I)-1)-th configuration of the present invention may have the following configuration. Specifically, the first compound semiconductor layer, the second compound semiconductor layer, the third compound semiconductor layer, and the fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, and the substitution site of the impurity in the third compound semiconductor layer and the substitution site of the impurity in the fourth compound semiconductor layer are the site occupied by a group III atom. For convenience, this configuration will be referred to as "the semiconductor light emitting device according to the ((I)-1-d)-th configuration of the present invention."

The above-described semiconductor light emitting devices according to the ((I)-1-A)-th configuration, ((I)-1-a)-th configuration, ((I)-1-B)-th configuration, ((I)-1-b)-th configuration, ((I)-1-C)-th configuration, ((I)-1-c)-th configuration, ((I)-1-D)-th configuration, and ((I)-1-d)-th configuration of the present invention, may have the following configuration. Specifically, the current block layer further includes a fifth compound semiconductor layer of the second conductivity type, the third compound semiconductor layer is sandwiched by the fourth compound semiconductor layer and the fifth compound semiconductor layer, and the impurity for causing the third compound semiconductor layer to have the first conductivity type is such that the substitution site of the impurity in the third compound semiconductor layer competes with the substitution site of the impurity in the fifth compound semiconductor layer for causing the fifth compound semiconductor layer to have the second conductivity type. In this configuration, the multilayer structure composed of the fourth compound semiconductor layer, the third compound semiconductor layer, and the fifth compound semiconductor layer stacked in that order from the lower side may be employed. Alternatively, the multilayer structure composed of the fifth compound semiconductor layer, the third compound semiconductor layer, and the fourth compound semiconductor layer stacked in that order from the lower side may be employed. In addition, the following configuration is also available. Specifically, the current block layer further includes a sixth compound semiconductor layer of the first conductivity type, the fourth compound semiconductor layer is sandwiched by the third compound semiconductor layer and the sixth compound semiconductor layer, and the impurity for causing the fourth compound semiconductor layer to have the second conductivity type is such that the substitution site of the impurity in the fourth compound semiconductor layer competes with the substitution site of the impurity in the sixth compound semiconductor layer for causing the sixth compound semiconductor layer to have the first conductivity type. In this configuration, the multilayer structure composed of the third compound semiconductor layer, the fourth compound semiconductor layer, and the sixth compound semiconductor layer stacked in that order from the lower side may be employed. Alternatively, the multilayer structure composed of the sixth compound semiconductor layer, the fourth compound semiconductor layer, and the third compound semiconductor layer stacked in that order from the lower side may be employed.

In order to meet the above-mentioned second need, the semiconductor light emitting device according to the embodiment of the present invention may have the following configuration. Specifically, the first compound semiconductor layer, the second compound semiconductor layer, the third compound semiconductor layer, and the fourth compound semiconductor layer are composed of a III-V compound semiconductor, the impurity for causing the first compound semiconductor layer to be the n-type as the first conductivity type is a group VI impurity, and the impurity for causing the third compound semiconductor layer to be the n-type as the first conductivity type is a group IV impurity. For convenience, this configuration will be referred to as "the semiconductor light emitting device according to the ((I)-2-A)-th configuration of the present invention." In the semiconductor light emitting device according to the ((I)-2-A)-th configuration of the present invention, the number of combinations of (the impurity in the first compound semiconductor layer, and the impurity in the third compound semiconductor layer) is 3×2=6.

The first compound semiconductor layer containing a group VI impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

In addition, in order to meet the above-mentioned second need, the semiconductor light emitting device according to the embodiment of the present invention may have the following configuration. Specifically, the first compound semiconductor layer, the second compound semiconductor layer, the third compound semiconductor layer, and the fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group IV impurity, and the impurity for causing the fourth compound semiconductor layer to be the p-type as the second conductivity type is a group II impurity. For convenience, this configuration will be referred to as "the semiconductor light emitting device according to the ((I)-2-B)-th configuration of the present invention." In the semiconductor light emitting device according to the ((I)-2-B)-th configuration of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the third compound semiconductor layer, and the impurity in the fourth compound semiconductor layer) is 2×3×4×1×2×4=192.

In addition, in order to meet the above-mentioned second need, the semiconductor light emitting device according to the embodiment of the present invention may have the following configuration. Specifically, the first compound semiconductor layer, the second compound semiconductor layer, the third compound semiconductor layer, and the fourth compound semiconductor layer are composed of a III-V compound semiconductor, the impurity for causing the first compound semiconductor layer to be the p-type as the first conductivity type is a group II impurity, and the impurity for causing the third compound semiconductor layer to be the p-type as the first conductivity type is carbon (C). For convenience, this configuration will be referred to as "the semiconductor light emitting device according to the ((I)-2-C)-th configuration of the present invention." In the semiconductor light emitting device according to the ((I)-2-C)-th configuration of the present invention, the number of combinations of (the impurity in the first compound semiconductor layer, and the impurity in the third compound semiconductor layer) is 4×1=4.

The first compound semiconductor layer containing a group II impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

In addition, in order to meet the above-mentioned second need, the semiconductor light emitting device according to the embodiment of the present invention may have the following configuration. Specifically, the first compound semiconductor layer, the second compound semiconductor layer, the third compound semiconductor layer, and the fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is carbon (C), and the impurity for causing the fourth compound semiconductor layer to be the n-type as the second conductivity type is a group VI impurity. For convenience, this configuration will be referred to as "the semiconductor light emitting device according to the ((I)-2-D)-th configuration of the present invention." In the semiconductor light emitting device according to the ((I)-2-D)-th configuration of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the third compound semiconductor layer, and the impurity in the fourth compound semiconductor layer) is $1 \times 4 \times 3 \times 2 \times 1 \times 3 = 72$.

In addition, in order to meet the above-mentioned second need, the semiconductor light emitting device according to the embodiment of the present invention may have the following configuration. Specifically, the first compound semiconductor layer, the second compound semiconductor layer, the third compound semiconductor layer, and the fourth compound semiconductor layer are composed of a III-V compound semiconductor, the impurity for causing the second compound semiconductor layer to be the p-type as the second conductivity type is a group II impurity, and the impurity for causing the fourth compound semiconductor layer to be the p-type as the second conductivity type is carbon (C). For convenience, this configuration will be referred to as "the semiconductor light emitting device according to the ((I)-3-a)-th configuration of the present invention." In the semiconductor light emitting device according to the ((I)-3-a)-th configuration of the present invention, the number of combinations of (the impurity in the second compound semiconductor layer, and the impurity in the fourth compound semiconductor layer) is $4 \times 1 = 4$.

The second compound semiconductor layer containing a group II impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

In addition, in order to meet the above-mentioned second need, the semiconductor light emitting device according to the embodiment of the present invention may have the following configuration. Specifically, the first compound semiconductor layer, the second compound semiconductor layer, the third compound semiconductor layer, and the fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group VI impurity, and the impurity for causing the fourth compound semiconductor layer to be the p-type as the second conductivity type is carbon (C). For convenience, this configuration will be referred to as "the semiconductor light emitting device according to the ((I)-3-b)-th configuration of the present invention." In the semiconductor light emitting device according to the ((I)-3-b)-th configuration of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the third compound semiconductor layer, and the impurity in the fourth compound semiconductor layer) is $2 \times 3 \times 4 \times 1 \times 3 \times 1 = 72$.

In addition, in order to meet the above-mentioned second need, the semiconductor light emitting device according to the embodiment of the present invention may have the following configuration. Specifically, the first compound semiconductor layer, the second compound semiconductor layer, the third compound semiconductor layer, and the fourth compound semiconductor layer are composed of a III-V compound semiconductor, the impurity for causing the second compound semiconductor layer to be the n-type as the second conductivity type is a group VI impurity, and the impurity for causing the fourth compound semiconductor layer to be the n-type as the second conductivity type is a group IV impurity. For convenience, this configuration will be referred to as "the semiconductor light emitting device according to the ((I)-3-c)-th configuration of the present invention." In the semiconductor light emitting device according to the ((I)-3-c)-th configuration of the present invention, the number of combinations of (the impurity in the second compound semiconductor layer, and the impurity in the third compound semiconductor layer) is 2×3=6.

The second compound semiconductor layer containing a group VI impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

In addition, in order to meet the above-mentioned second need, the semiconductor light emitting device according to the embodiment of the present invention may have the following configuration. Specifically, the first compound semiconductor layer, the second compound semiconductor layer, the third compound semiconductor layer, and the fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is a group II impurity, and the impurity for causing the fourth compound semiconductor layer to be the n-type as the second conductivity type is a group IV impurity. For convenience, this configuration will be referred to as "the semiconductor light emitting device according to the ((I)-3-d)-th configuration of the present invention." In the semiconductor light emitting device according to the ((I)-3-d)-th configuration of the present invention, the number of combinations of (the impurity in the 1A-th compound semiconductor layer, the impurity in the 1B-th compound semiconductor layer, the impurity in the 2A-th compound semiconductor layer, the impurity in the 2B-th compound semiconductor layer, the impurity in the third compound semiconductor layer, the impurity in the fourth compound semiconductor layer, the impurity in the first burying layer, and the impurity in the second burying layer) is 1×4×3×2×4×2=192.

In addition, in order to meet the above-mentioned second need, the semiconductor light emitting device according to the embodiment of the present invention may have a configuration in which the current block layer is composed of a third compound semiconductor layer of the first conductivity type and a fourth compound semiconductor layer of the second conductivity type in contact with the third compound semiconductor layer, and the impurity for causing the first compound semiconductor layer to have the first conductivity type is different from the impurity for causing the third compound semiconductor layer to have the first conductivity type. For convenience, this configuration will be referred to as "the semiconductor light emitting device according to the ((I)-4-A)-th configuration of the present invention."

The first compound semiconductor layer containing the impurity different from the impurity for causing the third compound semiconductor layer to have the first conductivity type is the part that is in contact with at least the active layer, specifically. The active layer with which the first compound semiconductor layer is in contact encompasses well layers and confinement layers. This applies also to the following description. The provision of the confinement layer allows light confinement and/or carrier confinement. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

In addition, in order to meet the above-described second need, the semiconductor light emitting device according to the embodiment of the present invention may have a configuration in which the current block layer is composed of a third compound semiconductor layer of the first conductivity type and a fourth compound semiconductor layer of the second conductivity type in contact with the third compound semiconductor layer, and the impurity for causing the second compound semiconductor layer to have the second conductivity type is different from the impurity for causing the fourth compound semiconductor layer to have the second conductivity type. For convenience, this configuration will be referred to as "the semiconductor light emitting device according to the ((I)-4-a)-th configuration of the present invention."

The second compound semiconductor layer containing the impurity different from the impurity for causing the fourth compound semiconductor layer to have the second conductivity type is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

In addition, in order to meet the above-described second need, the semiconductor light emitting device according to the embodiment of the present invention may have the following configuration. Specifically, the current block layer is formed of a multilayer structure arising from sequential stacking of at least the fourth compound semiconductor layer of the second conductivity type and the third compound semiconductor layer of the first conductivity type, the impurity for causing the fourth compound semiconductor layer to have the second conductivity type is such that the substitution site of the impurity in the fourth compound semiconductor layer competes with the substitution site of the impurity in the third compound semiconductor layer for causing the third compound semiconductor layer to have the first conductivity type, and competes with the substitution site of the impurity in the first compound semiconductor layer for causing the first compound semiconductor layer to have the first conductivity type, the impurity for causing the second compound semiconductor layer to have the second conductivity type is such that the substitution site of the impurity in the second compound semiconductor layer competes with the substitution site of the impurity in the third compound semiconductor layer for causing the third compound semiconductor layer to have the first conductivity type, and if a bypass channel that passes through the first compound semiconductor layer, the current block layer, and the second compound semiconductor layer is assumed, at least three pn junction interfaces formed of the interfaces between the compound semiconductor layers exist in the bypass channel. For convenience, this configuration will be referred to as "the semiconductor light emitting device according to the ((I)-5)-th configuration of the present invention."

It is possible for the semiconductor light emitting device according to the ((I)-5)-th configuration of the present invention to have a form in which the fourth compound semiconductor layer is in contact with the side surface of the first compound semiconductor layer and the third compound semiconductor layer is in contact with the side surface of the second compound semiconductor layer. In this case, the bypass channel is composed of the first compound semiconductor layer, the fourth compound semiconductor layer, the third compound semiconductor layer, and the second compound semiconductor layer. The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the side surface of the second compound semiconductor layer.

The semiconductor light emitting device according to the ((I)-5)-th configuration of the present invention may have the following configuration. Specifically, the first compound semiconductor layer is composed of a 1A-th compound semiconductor layer and a 1B-th compound semiconductor layer that is provided on the 1A-th compound semiconductor layer and is in contact with the active layer, and the impurity for causing the 1B-th compound semiconductor layer to have the first conductivity type is such that the substitution site of the impurity in the 1B-th compound semiconductor layer does not compete with the substitution site of the impurity in the 1A-th compound semiconductor layer for causing the 1A-th compound semiconductor layer to have the first conductivity type, and does not compete with the substitution site of the impurity in the second compound semiconductor layer for causing the second compound semiconductor layer to have the second conductivity type. In this case, the impurity for causing the 1A-th compound semiconductor layer to have the first conductivity type is such that the substitution site of the impurity in the 1A-th compound semiconductor layer competes with the substitution site of the impurity in the fourth compound semiconductor layer for causing the fourth compound semiconductor layer to have the second conductivity type.

In the case of the configuration in which the 1B-th compound semiconductor layer is used, the relationship between the 1B-th compound semiconductor layer and the fourth compound semiconductor layer in contact with the side surface of the 1B-th compound semiconductor layer is such that their impurity substitution sites do not compete with each other in some cases. In such a case, initially impurity diffusion between the 1B-th compound semiconductor layer and the fourth compound semiconductor layer will occur across this side surface part, and then the impurity diffusion will reach the third compound semiconductor layer included in the current block layer, so that a current leakage path is possibly formed.

Therefore, for this case, the following configuration may be employed. Specifically, a sixth compound semiconductor layer of the first conductivity type is provided under the fourth compound semiconductor layer, the impurity for causing the sixth compound semiconductor layer to have the first conductivity type is such that the substitution site of the impurity in the sixth compound semiconductor layer competes with the substitution site of the impurity in the first compound semiconductor layer (or the 1A-th compound semiconductor layer) for causing the first compound semiconductor layer (or the 1A-th compound semiconductor layer) to have the first conductivity type, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. Employing such a configuration eliminates the contact between the 1B-th compound semiconductor layer and the fourth compound semiconductor layer, whose impurity substitution sites do not compete with each other, and thus can prevent the impurity diffusion. In this case, the bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

In addition, in such a case, it is desirable to provide an impurity diffusion barrier layer in the current block layer in order to prevent the occurrence of current leakage attributed to impurity diffusion from the 1B-th compound semiconductor layer into the current block layer. Specifically, a seventh compound semiconductor layer of the second conductivity type whose impurity substitution site is different from that of the fourth compound semiconductor layer of the second conductivity type is provided as the "impurity diffusion barrier layer." More specifically, in the fourth compound semiconductor layer that is included in the current block layer and has the second conductivity type, at least one impurity diffusion barrier layer having the second conductivity type (e.g. the seventh compound semiconductor layer) is provided. Furthermore, impurities are so selected that the substitution site of the impurity in the fourth compound semiconductor layer is different from that of the impurity in the impurity diffusion barrier layer (e.g. the seventh compound semiconductor layer if the number of impurity diffusion barrier layers is one). Employing such a configuration allows further-ensured prevention of the phenomenon that a current leakage path from the bypass channel is formed due to impurity diffusion into the current block layer.

Furthermore, the semiconductor light emitting device according to the ((I)-5)-th configuration of the present invention may have the following configuration. Specifically, the second compound semiconductor layer is composed of a 2B-th compound semiconductor layer in contact with the active layer and a 2A-th compound semiconductor layer provided on the 2B-th compound semiconductor layer, and the impurity for causing the 2B-th compound semiconductor layer to have the second conductivity type is such that the substitution site of the impurity in the 2B-th compound semiconductor layer does not compete with the substitution site of the impurity in the 2A-th compound semiconductor layer for causing the 2A-th compound semiconductor layer to have the second conductivity type, and does not compete with the substitution site of the impurity in the first compound semiconductor layer for causing the first compound semiconductor layer to have the first conductivity type. In this case, the impurity for causing the 2A-th compound semiconductor layer to have the second conductivity type is such that the substitution site of the impurity in the 2A-th compound semiconductor layer competes with the substitution site of the impurity in the third compound semiconductor layer for causing the third compound semiconductor layer to have the first conductivity type.

In the case of the configuration in which the 2B-th compound semiconductor layer is used, the relationship between the 2B-th compound semiconductor layer and the third compound semiconductor layer in contact with the side surface of the 2B-th compound semiconductor layer is such that their impurity substitution sites do not compete with each other in some cases. In such a case, initially impurity diffusion between the 2B-th compound semiconductor layer and the third compound semiconductor layer will occur across this side surface part, and then the impurity diffusion will reach the fourth compound semiconductor layer included in the current block layer, so that a current leakage path is possibly formed.

Therefore, for this case, the following configuration may be employed. Specifically, a fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the second compound semiconductor layer (or the 2A-th compound semiconductor layer) for causing the second compound semiconductor layer (or the 2A-th compound semiconductor layer) to have the second conductivity type, and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). Employing such a configuration eliminates the contact between the 2B-th compound semiconductor layer and the third compound semiconductor layer, whose impurity substitution sites do not compete with each other, and thus can prevent the impurity diffusion. In this case, the bypass channel is composed of the first compound semiconductor layer, the fourth compound semiconductor layer, the third compound semiconductor layer, the fifth compound semiconductor layer, and the second compound semiconductor layer (the 2B-th compound semiconductor layer and the 2A-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

In addition, in such a case, it is desirable to provide an impurity diffusion barrier layer in the current block layer in order to prevent the occurrence of current leakage attributed to impurity diffusion from the 2B-th compound semiconductor layer into the current block layer. Specifically, an eighth compound semiconductor layer of the first conductivity type whose impurity substitution site is different from that of the third compound semiconductor layer of the first conductivity type is provided as the "impurity diffusion barrier layer." More specifically, in the third compound semiconductor layer that is included in the current block layer and has the first conductivity type, at least one impurity diffusion barrier layer having the first conductivity type (e.g. the eighth compound semiconductor layer) is provided. Furthermore, impurities are so selected that the substitution site of the impurity in the third compound semiconductor layer is different from that of the impurity in the impurity diffusion barrier layer (e.g. the eighth compound semiconductor layer if the number of impurity diffusion barrier layers is one). Employing such a configuration allows further-ensured prevention of the phenomenon that a current leakage path from the bypass channel is formed due to impurity diffusion into the current block layer.

In the semiconductor light emitting device according to the ((I)-5)-th configuration of the present invention, the first compound semiconductor layer, the second compound semiconductor layer, the fourth compound semiconductor layer, and the third compound semiconductor layer are composed of a III-V compound semiconductor. Alternatively, the 1A-th compound semiconductor layer, the 1B-th compound semiconductor layer, the second compound semiconductor layer, the fourth compound semiconductor layer, and the third compound semiconductor layer are composed of a III-V compound semiconductor. Alternatively, the first compound semiconductor layer, the 2B-th compound semiconductor layer, the 2A-th compound semiconductor layer, the fourth compound semiconductor layer, and the third compound semiconductor layer are composed of a III-V compound semiconductor.

Furthermore, the following configuration can be employed. Specifically, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. For convenience, this configuration will be referred to as "the semiconductor light emitting device according to the ((I)-5-A)-th configuration of the present invention." It is possible to employ a form in which the fourth compound semiconductor layer is in contact with the side surface of the first compound semiconductor layer and the third compound semiconductor layer is in contact with the side surface of the second compound semiconductor layer.

The semiconductor light emitting device according to the ((I)-5-A)-th configuration of the present invention may have the following configuration. Specifically, the impurity for causing the first compound semiconductor layer and the third compound semiconductor layer to be the n-type as the first conductivity type is a group IV impurity, and the impurity for causing the second compound semiconductor layer and the fourth compound semiconductor layer to be the p-type as the second conductivity type is a group II impurity. For convenience, this configuration will be referred to as "the semiconductor light emitting device according to the ((I)-5-A-1)-th configuration of the present invention." In the semiconductor light emitting device according to the ((I)-5-A-1)-th configuration of the present invention, the number of combinations of (the impurity in the first compound semiconductor layer, the impurity in the second compound semiconductor layer, the impurity in the fourth compound semiconductor layer, and the impurity in the third compound semiconductor layer) is $2\times4\times4\times2=64$.

In addition, the semiconductor light emitting device according to the ((I)-5-A)-th configuration of the present invention may have the following configuration. Specifically, the impurity for causing the first compound semiconductor layer and the third compound semiconductor layer to be the p-type as the first conductivity type is a group II impurity, and the impurity for causing the second compound semiconductor layer and the fourth compound semiconductor layer to be the n-type as the second conductivity type is a group IV impurity. For convenience, this configuration will be referred to as "the semiconductor light emitting device according to the ((I)-5-A-2)-th configuration of the present invention." In the semiconductor light emitting device according to the ((I)-5-A-2)-th configuration of the present invention, the number of combinations of (the impurity in the first compound semiconductor layer, the impurity in the second compound semiconductor layer, the impurity in the fourth compound semiconductor layer, and the impurity in the third compound semiconductor layer) is $4\times2\times2\times4=64$.

Furthermore, the following configuration can be employed. Specifically, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. For convenience, this configuration will be referred to as "the semiconductor light emitting device according to the ((I)-5-a)-th configuration of the present invention." It is possible to employ a form in which the fourth compound semiconductor layer is in contact with the side surface of the first compound semiconductor layer and the third compound semiconductor layer is in contact with the side surface of the second compound semiconductor layer.

The semiconductor light emitting device according to the ((I)-5-a)-th configuration of the present invention may have the following configuration. Specifically, the impurity for causing the first compound semiconductor layer and the third compound semiconductor layer to be the n-type as the first conductivity type is a group VI impurity, and the impurity for causing the second compound semiconductor layer and the fourth compound semiconductor layer to be the p-type as the second conductivity type is carbon (C). For convenience, this configuration will be referred to as "the semiconductor light emitting device according to the ((I)-5-a-1)-th configuration of the present invention." In the semiconductor light emitting device according to the ((I)-5-a-1)-th configuration of the present invention, the number of combinations of (the impurity in the first compound semiconductor layer, the impurity in the second compound semiconductor layer, the impurity in the fourth compound semiconductor layer, and the impurity in the third compound semiconductor layer) is $3\times1\times1\times3=9$.

In addition, the semiconductor light emitting device according to the ((I)-5-a)-th configuration of the present invention may have the following configuration. Specifically, the impurity for causing the first compound semiconductor layer and the third compound semiconductor layer to be the p-type as the first conductivity type is carbon (C), and the impurity for causing the second compound semiconductor layer and the fourth compound semiconductor layer to be the n-type as the second conductivity type is a group VI impurity. For convenience, this configuration will be referred to as "the semiconductor light emitting device according to the ((I)-5-a-2)-th configuration of the present invention." In the semiconductor light emitting device according to the ((I)-5-a-2)-th configuration of the present invention, the number of combinations of (the impurity in the first compound semiconductor layer, the impurity in the second compound semiconductor layer, the impurity in the fourth compound semiconductor layer, and the impurity in the third compound semiconductor layer) is $1\times3\times3\times1=9$.

Furthermore, the following configuration may be employed. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. The substitution site of the impurity in the 1B-th compound semiconductor layer is the site occupied by a group V atom. For convenience, this configuration will be referred to as "the semiconductor light emitting device according to the ((I)-5-B)-th configuration of the present invention."

The semiconductor light emitting device according to the ((I)-5-B)-th configuration of the present invention may have the following configuration. Specifically, the impurity for causing the 1A-th compound semiconductor layer and the third compound semiconductor layer to be the n-type as the first conductivity type is a group IV impurity, the impurity for causing the 1B-th compound semiconductor layer to be the n-type as the first conductivity type is a group VI impurity, and the impurity for causing the second compound semiconductor layer and the fourth compound semiconductor layer to be the p-type as the second conductivity type is a group II impurity. For convenience, this configuration will be referred to as "the semiconductor light emitting device according to the ((I)-5-B-1)-th configuration of the present invention." In the semiconductor light emitting device according to the ((I)-5-B-1)-th configuration of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, and the impurity in the third compound semiconductor layer) is 2×3×4×4×2=192.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group IV impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

In addition, the semiconductor light emitting device according to the ((I)-5-B)-th configuration of the present invention may have the following configuration. Specifically, the impurity for causing the 1A-th compound semiconductor layer and the third compound semiconductor layer to be the p-type as the first conductivity type is a group II impurity, the impurity for causing the 1B-th compound semiconductor layer to be the p-type as the first conductivity type is carbon (C), and the impurity for causing the second compound semiconductor layer and the fourth compound semiconductor layer to be the n-type as the second conductivity type is a group IV impurity. For convenience, this configuration will be referred to as "the semiconductor light emitting device according to the ((I)-5-B-2)-th configuration of the present invention." In the semiconductor light emitting device according to the ((I)-5-B-2)-th configuration of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, and the impurity in the third compound semiconductor layer) is 4×1×2×2×4=64.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group II impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

Furthermore, the following configuration may be employed. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the 1B-th compound semiconductor layer is the site occupied by a group III atom. For convenience, this configuration will be referred to as "the semiconductor light emitting device according to the ((I)-5-b)-th configuration of the present invention."

The semiconductor light emitting device according to the ((I)-5-b)-th configuration of the present invention may have the following configuration. Specifically, the impurity for causing the 1A-th compound semiconductor layer and the third compound semiconductor layer to be the n-type as the first conductivity type is a group VI impurity, the impurity for causing the 1B-th compound semiconductor layer to be the n-type as the first conductivity type is a group IV impurity, and the impurity for causing the second compound semiconductor layer and the fourth compound semiconductor layer to be the p-type as the second conductivity type is carbon (C). For convenience, this configuration will be referred to as "the semiconductor light emitting device according to the ((I)-5-b-1)-th configuration of the present invention." In the semiconductor light emitting device according to the ((I)-5-b-1)-th configuration of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, and the impurity in the third compound semiconductor layer) is 3×2×1×1×3=18.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group VI impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

In addition, the semiconductor light emitting device according to the ((I)-5-b)-th configuration of the present invention may have the following configuration. Specifically, the impurity for causing the 1A-th compound semiconductor layer and the third compound semiconductor layer to be the p-type as the first conductivity type is carbon (C), the impurity for causing the 1B-th compound semiconductor layer to be the p-type as the first conductivity type is a group II impurity, and the impurity for causing the second compound semiconductor layer and the fourth compound semiconductor layer to be the n-type as the second conductivity type is a group VI impurity. For convenience, this configuration will be referred to as "the semiconductor light emitting device according to the ((I)-5-b-2)-th configuration of the pre2sent invention." In the semiconductor light emitting device according to the ((I)-5-b-2)-th configuration of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, and the impurity in the third compound semiconductor layer) is 1×4×3×3×1=36.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is carbon (C), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

Furthermore, the following configuration may be employed. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group III atom. The substitution site of the impurity in the 2B-th compound semiconductor layer is the site occupied by a group V atom. For convenience, this configuration will be referred to as "the semiconductor light emitting device according to the ((I)-5-C)-th configuration of the present invention."

The semiconductor light emitting device according to the ((I)-5-C)-th configuration of the present invention may have the following configuration. Specifically, the impurity for causing the first compound semiconductor layer and the third compound semiconductor layer to be the n-type as the first conductivity type is a group IV impurity, the impurity for causing the 2A-th compound semiconductor layer and the fourth compound semiconductor layer to be the p-type as the second conductivity type is a group II impurity, and the impurity for causing the 2B-th compound semiconductor layer to be the p-type as the second conductivity type is carbon (C). For convenience, this configuration will be referred to as "the semiconductor light emitting device according to the ((I)-5-C-1)-th configuration of the present invention." In the semiconductor light emitting device according to the ((I)-5-C-1)-th configuration of the present invention, the number of combinations of (the impurity in the first compound semiconductor layer, the impurity in the 2A-th compound semiconductor layer, the impurity in the 2B-th compound semiconductor layer, the impurity in the fourth compound semiconductor layer, and the impurity in the third compound semiconductor layer) is $2 \times 4 \times 1 \times 4 \times 2 = 64$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group II impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, the semiconductor light emitting device according to the ((I)-5-C)-th configuration of the present invention may have the following configuration. Specifically, the impurity for causing the first compound semiconductor layer and the third compound semiconductor layer to be the p-type as the first conductivity type is a group II impurity, the impurity for causing the 2A-th compound semiconductor layer and the fourth compound semiconductor layer to be the n-type as the second conductivity type is a group IV impurity, and the impurity for causing the 2B-th compound semiconductor layer to be the n-type as the second conductivity type is a group VI impurity. For convenience, this configuration will be referred to as "the semiconductor light emitting device according to the ((I)-5-C-2)-th configuration of the present invention." In the semiconductor light emitting device according to the ((I)-5-C-2)-th configuration of the present invention, the number of combinations of (the impurity in the first compound semiconductor layer, the impurity in the 2A-th compound semiconductor layer, the impurity in the 2B-th compound semiconductor layer, the impurity in the fourth compound semiconductor layer, and the impurity in the third compound semiconductor layer) is $4 \times 2 \times 3 \times 2 \times 4 = 192$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group IV impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

Furthermore, the following configuration may be employed. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group V atom. The substitution site of the impurity in the 2B-th compound semiconductor layer is the site occupied by a group III atom. For convenience, this configuration will be referred to as "the semiconductor light emitting device according to the ((I)-5-c)-th configuration of the present invention."

The semiconductor light emitting device according to the ((I)-5-c)-th configuration of the present invention may have the following configuration. Specifically, the impurity for causing the first compound semiconductor layer and the third compound semiconductor layer to be the n-type as the first conductivity type is a group VI impurity, the impurity for causing the 2A-th compound semiconductor layer and the fourth compound semiconductor layer to be the p-type as the second conductivity type is carbon (C), and the impurity for causing the 2B-th compound semiconductor layer to be the p-type as the second conductivity type is a group II impurity. For convenience, this configuration will be referred to as "the semiconductor light emitting device according to the ((I)-5-c-1)-th configuration of the present invention." In the semiconductor light emitting device according to the ((I)-5-c-1)-th configuration of the present invention, the number of combinations of (the impurity in the first compound semiconductor layer, the impurity in the 2A-th compound semiconductor layer, the impurity in the 2B-th compound semiconductor layer, the impurity in the fourth compound semiconductor layer, and the impurity in the third compound semiconductor layer) is $3 \times 1 \times 4 \times 1 \times 3 = 36$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is carbon (C), and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, the semiconductor light emitting device according to the ((I)-5-c)-th configuration of the present invention may have the following configuration. Specifically, the impurity for causing the first compound semiconductor layer and the third compound semiconductor layer to be the p-type as the first conductivity type is carbon (C), the impurity for causing the 2A-th compound semiconductor layer and the fourth compound semiconductor layer to be the n-type as the second conductivity type is a group VI impurity, and the impurity for causing the 2B-th compound semiconductor layer to be the n-type as the second conductivity type is a group IV impurity. For convenience, this configuration will be referred to as "the semiconductor light emitting device according to the ((I)-5-c-2)-th configuration of the present invention." In the semiconductor light emitting device according to the ((I)-5-c-2)-th configuration of the present invention, the number of combinations of (the impurity in the first compound semiconductor layer, the impurity in the 2A-th compound semiconductor layer, the impurity in the 2B-th compound semiconductor layer, the impurity in the fourth compound semiconductor layer, and the impurity in the third compound semiconductor layer) is $1 \times 3 \times 2 \times 3 \times 1 = 18$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group VI impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, in the semiconductor light emitting device according to the ((I)-5)-th configuration of the present invention, a plurality of compound semiconductor layers may be provided between the fourth compound semiconductor layer and the third compound semiconductor layer of the current block layer. Specifically, it is also possible to employ a configuration in which at least a compound semiconductor layer of the first conductivity type and a compound semiconductor layer of the second conductivity type are further sequentially stacked between the fourth compound semiconductor layer and the third compound semiconductor layer. More specifically, if the first conductivity type is the n-type and the second conductivity type is the p-type, the current block layer may be formed based on a four-layer structure composed of the p-type fourth compound semiconductor layer, an n-type compound semiconductor layer, a p-type compound semiconductor layer, and the n-type third compound semiconductor layer. Alternatively, the current block layer may be formed based on a six-layer structure composed of the p-type fourth compound semiconductor layer, an n-type compound semiconductor layer, a p-type compound semiconductor layer, an n-type compound semiconductor layer, a p-type compound semiconductor layer, and the n-type third compound semiconductor layer. More alternatively, the current block layer may be formed based on an eight-layer structure composed of the p-type fourth compound semiconductor layer, an n-type compound semiconductor layer, a p-type compound semiconductor layer, an n-type compound semiconductor layer, a p-type compound semiconductor layer, an n-type compound semiconductor layer, a p-type compound semiconductor layer, and the n-type third compound semiconductor layer. Such a multilayer structure will be often represented as "the p-type fourth compound semiconductor layer, (n-type compound semiconductor layer, p-type compound semiconductor layer) m, and the n-type third compound semiconductor layer (m=1, 2, 3, . . . )." In addition, if the first conductivity type is the p-type and the second conductivity type is the n-type, the current block layer may be formed based on a multilayer structure composed of the n-type fourth compound semiconductor layer, (p-type compound semiconductor layer, n-type compound semiconductor layer)$_m$, and the p-type third compound semiconductor layer (m=1, 2, 3, . . . ). By thus forming the current block layer based on a multilayer structure, the phenomenon that a current leakage path from the bypass channel is formed can be prevented more surely even if a relative positional error between the light emitting part and the current block layer occurred. It is desirable that the thickness of the current block layer be not increased even when the current block layer is formed based on a multilayer structure. Furthermore, it is more desirable that at least one pn interface (or np interface) between the compound semiconductor layers included in the current block layer be in contact with the side surface of the active layer. This feature decreases the area of the contact part with the side surface of the light emitting part per one compound semiconductor layer included in the current block layer, which results in an increase in the electric resistance. Consequently, leakage current is further suppressed and thus the light output can be improved.

Moreover, as a more desirable form regarding the contact surface with the side surface of the light emitting part per one compound semiconductor layer included in the current block layer, it is desirable that the width of the contact surface (the length of the contact surface along the vertical direction of the side surface of the light emitting part) per one compound semiconductor layer included in the current block layer be equal to or smaller than the total thickness of the active layer (the length of the active layer along the vertical direction of the side surface of the light emitting part) sandwiched between the first compound semiconductor layer (or the 1B-th compound semiconductor layer) and the second compound semiconductor layer. In addition, if the active layer has a quantum well structure, it is desirable that the width of the contact surface per one compound semiconductor layer included in the current block layer be equal to or smaller than the width of one well layer of the quantum well structure (the length of the well layer along the vertical direction of the side surface of the light emitting part). Such a form involves the necessity that the thicknesses of the respective compound semiconductor layers included in the current block layer are set to very small values. Therefore, the related art has a problem that a part of the current block layer formed of the {311}B plane or a higher-order crystal plane is annihilated or, conversely, the thickness of this part is abnormally increased because of conductivity type neutralization due to impurity mutual diffusion across the interface of n-type compound semiconductor layer/p-type compound semiconductor layer (or p-type compound semiconductor layer/n-type compound semiconductor layer) as described above. Consequently, according to the semiconductor light emitting device of the present invention, in achievement of desired conductivity types of the respective compound semiconductor layers included in the current block layer, the impurity combination in consideration of the competition relationship of the impurity substitution site is comprehensively determined from the viewpoint of current leakage suppression. This makes it possible to realize a structure that allows suppression of conductivity type neutralization due to impurity mutual diffusion, enhancement in the current block quality of the current block layer itself, and ensured suppression of leakage current from the side surface of the light emitting part, even when the thicknesses of the respective compound semiconductor layers included in the current block layer are set to very small values.

In the semiconductor light emitting device according to the ((I)-1)-th configuration of the present invention, the impurity for causing the third compound semiconductor layer to have the first conductivity type included in the current block layer is such that the substitution site of the impurity in the third compound semiconductor layer competes with the substitution site of the impurity in the fourth compound semiconductor layer for causing the fourth compound semiconductor layer to have the second conductivity type. Thus, impurity mutual diffusion hardly occurs between the n-type compound semiconductor layer and the p-type compound semiconductor layer of the current block layer. This allows avoidance of the occurrence of a problem that the effect of the current block layer is unstable and thus leakage current is increased due to annihilation or thinning of the current block layer. Furthermore, the impurity for causing the first compound semiconductor layer to have the first conductivity type is such that the substitution site of the impurity in the first compound semiconductor layer does not compete with the substitution site of the impurity in the second compound semiconductor layer for causing the second compound semiconductor layer to have the second conductivity type. Thus, the pn junction control, designed through intentional impurity mutual diffusion between the first compound semiconductor layer and the second compound semiconductor layer, can be finely designed easily through adjustment of the concentrations and doping positions of the impurities in the respective layers. This allows enhancement in the light emission characteristic.

In the semiconductor light emitting device according to the ((I)-2-A)-th configuration of the present invention or the ((I)-2-B)-th configuration of the present invention, the impurity for causing the first compound semiconductor layer or the 1B-th compound semiconductor layer to be the n-type as the first conductivity type is a group VI impurity, and the impurity for causing the third compound semiconductor layer to be the n-type as the first conductivity type is a group IV impurity. Furthermore, in the semiconductor light emitting device according to the ((I)-2-C)-th configuration of the present invention or the ((I)-2-D)-th configuration of the present invention, the impurity for causing the first compound semiconductor layer or the 1B-th compound semiconductor layer to be the p-type as the second conductivity type is a group II impurity, and the impurity for causing the third compound semiconductor layer to be the p-type as the second conductivity type is carbon (C). Furthermore, in the semiconductor light emitting device according to the ((I)-3-a)-th configuration of the present invention or the ((I)-3-b)-th configuration of the present invention, the impurity for causing the second compound semiconductor layer or the 2B-th compound semiconductor layer to be the p-type as the second conductivity type is a group II impurity, and the impurity for causing the fourth compound semiconductor layer to be the p-type as the second conductivity type is carbon (C). In addition, in the semiconductor light emitting device according to the ((I)-3-c)-th configuration of the present invention or the ((I)-3-d)-th configuration of the present invention, the impurity for causing the second compound semiconductor layer or the 2B-th compound semiconductor layer to be the n-type as the second conductivity type is a group VI impurity, and the impurity for causing the fourth compound semiconductor layer to be the n-type as the second conductivity type is a group IV impurity. Moreover, in the semiconductor light emitting device according to the ((I)-4-A)-th configuration of the present invention, the impurity for causing the first compound semiconductor layer to have the first conductivity type is different from the impurity for causing the third compound semiconductor layer to have the first conductivity type. In the semiconductor light emitting device according to the ((I)-4-a)-th configuration of the present invention, the impurity for causing the second compound semiconductor layer to have the second conductivity type is different from the impurity for causing the fourth compound semiconductor layer to have the second conductivity type. Employing these configurations and structures makes it possible to achieve configuration and structure in which impurity mutual diffusion hardly occurs between the n-type compound semiconductor layer and the p-type compound semiconductor layer of the current block layer. As a result, it is possible to avoid the occurrence of a problem that the effect of the current block layer is unstable and thus leakage current is increased due to annihilation or thinning of the current block layer.

Furthermore, in the semiconductor light emitting device according to the ((I)-5)-th configuration of the present invention, when a bypass channel that passes through the first compound semiconductor layer, the current block layer, and the second compound semiconductor layer is assumed, at least three pn junction interfaces formed of the interfaces between the compound semiconductor layers exist in the bypass channel In addition, the impurity for causing a respective one of the compound semiconductor layers to have a predetermined conductivity type is such that the substitution site of the impurity in the respective one of the compound semiconductor layers competes with the substitution site of the impurity in the adjacent compound semiconductor layer for causing the adjacent compound semiconductor layer to have a predetermined conductivity type. Thus, impurity mutual diffusion hardly occurs between the n-type compound semiconductor layer and the p-type compound semiconductor layer of the current block layer. In addition, impurity mutual diffusion hardly occurs between the n-type compound semiconductor layer and the p-type compound semiconductor layer of the current block layer and the p-type compound semiconductor layer and the n-type compound semiconductor layer of the light emitting part. As a result, it is possible to avoid the occurrence of a problem that the effect of the current block layer is unstable and thus leakage current is increased due to annihilation or thinning of the current block layer.

[Step-10]

Figure 60A:
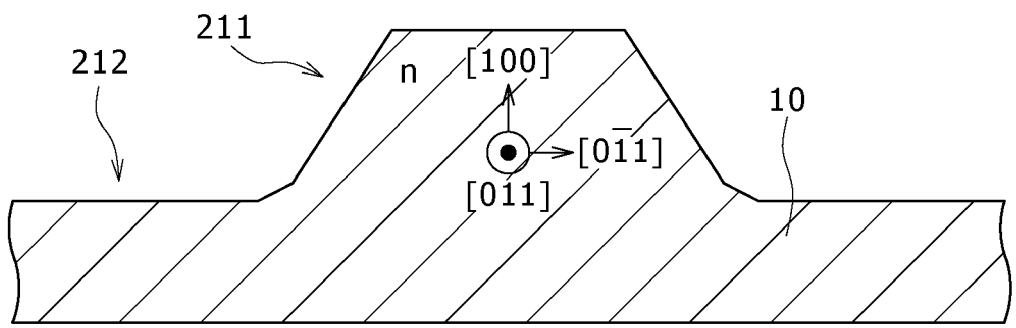
FIG. 60A is a schematic partial sectional view of a substrate and so on, for explaining a related-art method for manufacturing a semiconductor light emitting device.
Figure 60B:
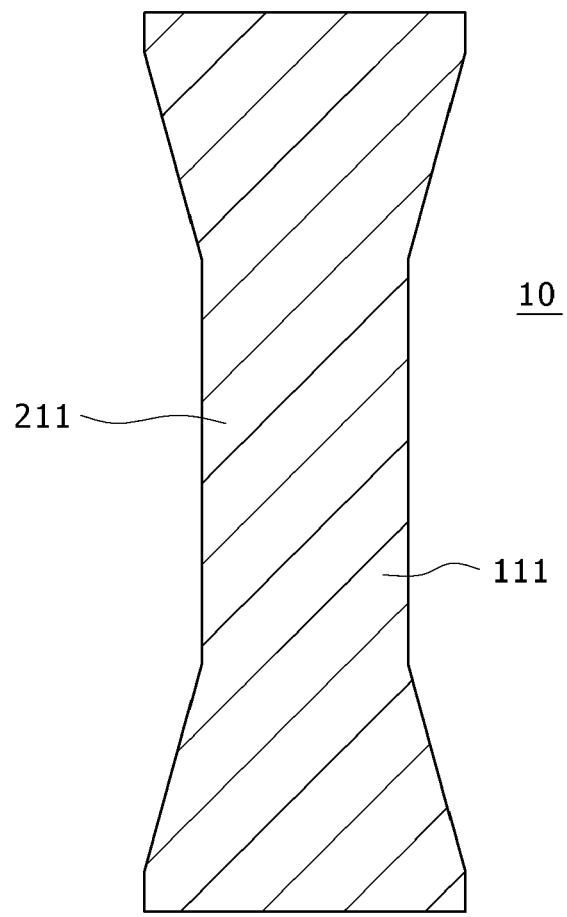
FIG. 60B is a schematic plan view of a projection part or an underlying layer for manufacturing a semiconductor light emitting device having a flare-stripe structure.

Initially, on the {100} crystal plane, e.g. the (100) crystal plane, of an n-GaAs substrate 10 as its major surface, a projection part 211 that has a predetermined width and a substantially-stripe shape and extends along the [011]A direction is formed. The width direction of the projection part 211 is parallel to the [0-11]B direction. In this way, the structure shown in FIG. 60A can be obtained. The projection part 211 has the oblique surfaces (side surfaces) corresponding to the {111}B plane. The planar shape of the projection part 211 is schematically shown in FIG. 60B. The projection part 211 has a strip shape in which the width of the center part is smaller than that of both the end parts. In FIG. 60B, the projection part 211 is hatched for clearly showing it.

[Step-20]

Subsequently, based on normal MOCVD, specifically, MOCVD with use of an organic metal and a hydrogen compound as the source gas, a buffer layer 12, an n-type first compound semiconductor layer 21, an active layer 23, a p-type second compound semiconductor layer 22 are epitaxially grown over the projection part 211 and recess surface 212. At this time, the oblique surfaces (side surfaces) of the compound semiconductor layers above the projection part 211 correspond to the {111}B plane. As described above, the {111}B plane is a non-growth surface. Therefore, the multilayer structure formed by the buffer layer 12, the first compound semiconductor layer 21, the active layer 23, and the second compound semiconductor layer 22 (so-called double heterostructure) is so formed (stacked) that the double heterostructure in the region above the projection part 211 is separated from that in the region above the recess surface 212 (i.e., a separated double heterostructure is obtained).

[Step-30]

Thereafter, continuously with the formation of the second compound semiconductor layer 22, a layer 30 for adjustment of the current block layer position (hereinafter, referred to simply as the adjustment layer 30), formed of a p-type compound semiconductor layer, is formed across the entire surface based on MOCVD. Furthermore, for example, a current block layer 40 formed of a multilayer structure composed of a p-type compound semiconductor layer and an n-type compound semiconductor layer is formed based on MOCVD. The current block layer 40 is not grown on the {111}B plane. The current block layer 40 is so formed that the end surfaces of the current block layer 40 cover at least the side surfaces of the active layer 23. Such configuration and structure can be achieved by properly selecting the thickness of the adjustment layer 30. In this way, the sectional structure shown in FIG. 61 can be obtained at the center part of the projection part 211. On the other hand, at both the end parts of the projection part 211, the sectional structure shown in FIG. 62 can be obtained at this moment.

Here, at the center part of the projection part 211, the current block layer 40 is formed only on the side surfaces of the light emitting part 20 (see FIG. 61). At this moment, at both the end parts of the projection part 211, in addition to the formation of the current block layer 40 on the side surfaces of the light emitting part 20, the same multilayer structure as that of the current block layer 40 is formed above the top surface ({100} plane) of the multilayer structure of the light emitting part 20 in such a way that the {111}B facet planes (side surfaces) are gradually formed and thus the width of the top surface is gradually decreased. The same multilayer structure as that of the current block layer 40, formed above the top surface of the multilayer structure of the light emitting part 20, will be referred to as a deposited layer 40", for convenience. Between the deposited layer 40" and the top surface of the multilayer structure of the light emitting part 20, a compound semiconductor layer 30' having the same configuration as that of the adjustment layer 30 is formed.

[Step-40]

Figure 63:
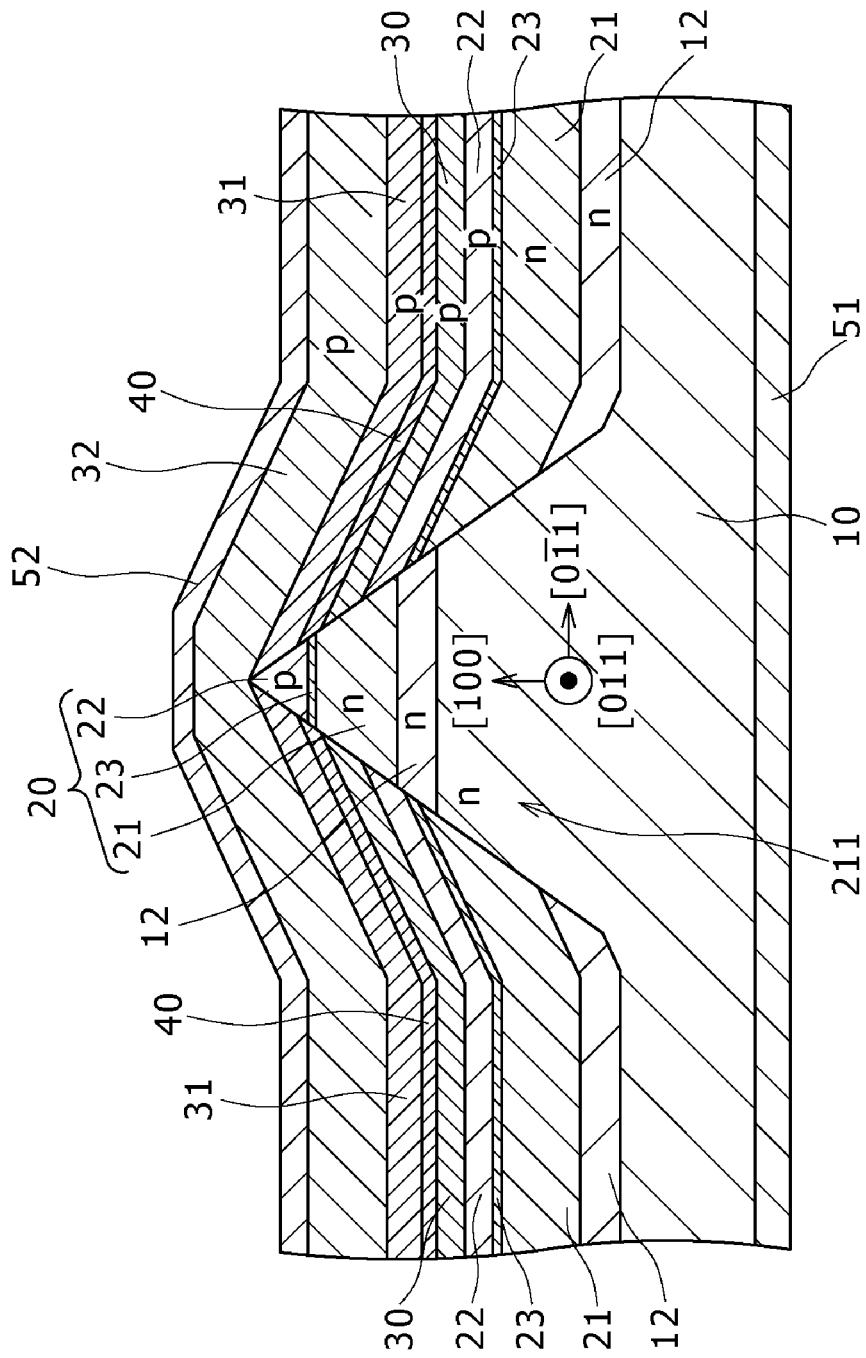
FIG. 63 is a schematic partial sectional view of the substrate and so on (at the center part of the semiconductor light emitting device), subsequent to FIG. 61, for explaining the method for manufacturing a semiconductor light emitting device having the flare-stripe structure.
Figure 64:
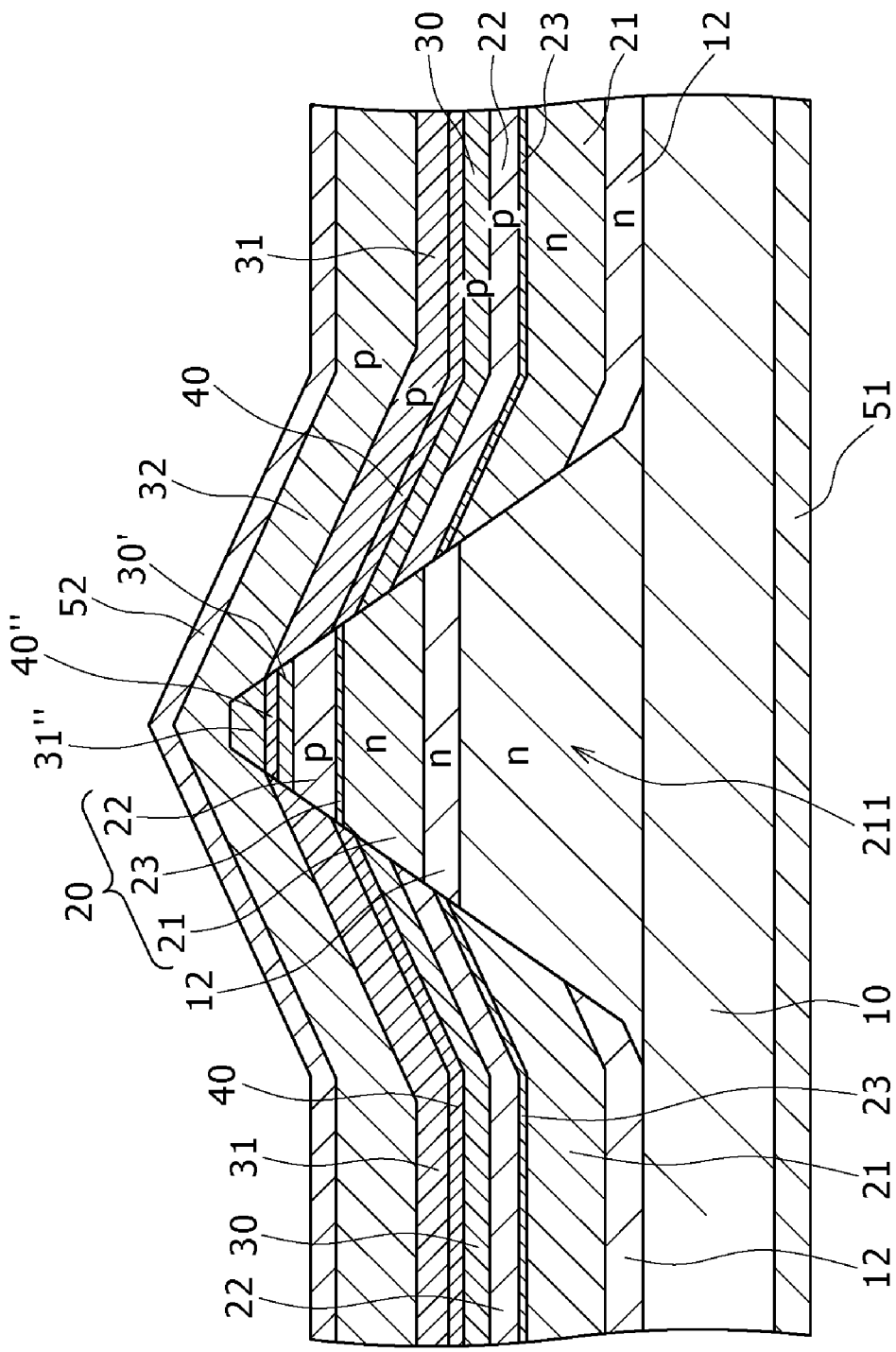
FIG. 64 is a schematic partial sectional view of the substrate and so on (at both the end parts of the semiconductor light emitting device), subsequent to FIG. 62, for explaining the method for manufacturing a semiconductor light emitting device having the flare-stripe structure.

Subsequently, a burying layer 31 and a contact layer (cap layer) 32 are sequentially formed across the entire surface based on MOCVD. At this moment, at both the end parts of the projection part 211, the burying layer is formed on the top surface ({100} plane) of the deposited layer 40" in such a way that the {111}B facet planes (side surfaces) are gradually formed and thus the width of the top surface is gradually decreased. Furthermore, if the width of the top surface is sufficiently large, the same multilayer structure as that of the contact layer (cap layer) 32 is formed. The burying layer on the deposited layer 40" will be represented as a burying layer 31". Thereafter, a second electrode 52 is formed based on vacuum evaporation on the contact layer 32 formed as the outermost layer. Furthermore, the substrate 10 is lapped to a proper thickness from the backside thereof, and then a first electrode 51 is formed based on vacuum evaporation (see FIGS. 63 and 64).

In the above-described [Step-30], at both the end parts of the projection part 211, the deposited layer 40" having the same multilayer structure as that of the current block layer 40 is formed above the top surface of the multilayer structure of the light emitting part 20. This deposited layer 40" is formed of the multilayer structure composed of the p-type compound semiconductor layer and the n-type compound semiconductor layer, and therefore does not allow the passage of current therethrough. Thus, the current supplied from the second electrode 52 reaches the contact layer (cap layer) 32 and the burying layer 31, and then flows from the periphery of the deposited layer 40" into the second compound semiconductor layer 22 via the {111}B side surfaces (contact surfaces) in contact with the burying layer 31. That is, the current injection path to the active layer is limited to the {111}B side surfaces (contact surfaces). This results in a problem that the electric resistance is increased and thus the heat generation and the current consumption are increased, and hence a problem that the light emission efficiency of the semiconductor light emitting device is decreased. For convenience in the following description, these problems will be referred to as a third need.

According to an embodiment of the present invention, there is provided a semiconductor light emitting device to meet the above-described third need. In this semiconductor light emitting device, the planar shape of the active layer is a strip shape in which the width of a center part is smaller than the width of both end parts, the current block layer is composed of a third compound semiconductor layer of the first conductivity type and a fourth compound semiconductor layer of the second conductivity type in contact with the third compound semiconductor layer, the burying layer has the second conductivity type and is formed of a multilayer structure arising from sequential stacking of a first burying layer and a second burying layer, and in the burying layer located above the current block layer, the impurity for causing the second burying layer to have the second conductivity type is such that the substitution site of the impurity in the second burying layer does not compete with the substitution site of the impurity in the third compound semiconductor layer for causing the third compound semiconductor layer to have the first conductivity type. The semiconductor light emitting device according to the embodiment of the present invention has a so-called flare-stripe structure.

In the semiconductor light emitting device according to the (II)-th configuration of the present invention, it is preferable that, in the burying layer located above the current block layer, the impurity for causing the first burying layer to have the second conductivity type be such that the substitution site of the impurity in the first burying layer competes with the substitution site of the impurity in the third compound semiconductor layer for causing the third compound semiconductor layer to have the first conductivity type. Furthermore, it is preferable that, in the burying layer located above the current block layer, the impurity for causing the first burying layer to have the second conductivity type be such that the substitution site of the impurity in the first burying layer competes with the substitution site of the impurity in the fourth compound semiconductor layer for causing the fourth compound semiconductor layer to have the second conductivity type. Hereinafter, The semiconductor light emitting device according to the (II)-th configuration of the present invention including these preferred configurations will be often referred to as "The semiconductor light emitting device according to the (II)-th configuration of the present invention including the above-described preferred configuration."

The semiconductor light emitting device according to the (II)-th configuration of the present invention including the above-described preferred configuration may have the following configuration. Specifically, the impurity for causing the first compound semiconductor layer to have the first conductivity type is such that the substitution site of the impurity in the first compound semiconductor layer does not compete with the substitution site of the impurity in the second compound semiconductor layer for causing the second compound semiconductor layer to have the second conductivity type, and the impurity for causing the third compound semiconductor layer to have the first conductivity type is such that the substitution site of the impurity in the third compound semiconductor layer competes with the substitution site of the impurity in the fourth compound semiconductor layer for causing the fourth compound semiconductor layer to have the second conductivity type. For convenience, this configuration will be referred to as "the semiconductor light emitting device according to the ((II)-1)-th configuration of the present invention." In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

The semiconductor light emitting device according to the ((II)-1)-th configuration of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is the site occupied by a group V atom, the substitution site of the impurity in the second compound semiconductor layer is the site occupied by a group III atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom. For convenience, this configuration will be referred to as "the semiconductor light emitting device according to the ((II)-1-A)-th configuration of the present invention."

In addition, the semiconductor light emitting device according to the ((II)-1)-th configuration of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom. For convenience, this configuration will be referred to as "the semiconductor light emitting device according to the ((II)-1-B)-th configuration of the present invention."

In addition, the semiconductor light emitting device according to the ((II)-1)-th configuration of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is the site occupied by a group V atom, the substitution site of the impurity in the second compound semiconductor layer is the site occupied by a group III atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom. For convenience, this configuration will be referred to as "the semiconductor light emitting device according to the ((II)-1-a)-th configuration of the present invention."

In addition, the semiconductor light emitting device according to the ((II)-1)-th configuration of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is a site occupied by a group V atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom. For convenience, this configuration will be referred to as "the semiconductor light emitting device according to the ((II)-1-b)-th configuration of the present invention."

In addition, the semiconductor light emitting device according to the ((II)-1)-th configuration of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is the site occupied by a group III atom, the substitution site of the impurity in the second compound semiconductor layer is the site occupied by a group V atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom. For convenience, this configuration will be referred to as "the semiconductor light emitting device according to the ((II)-1-C)-th configuration of the present invention."

In addition, the semiconductor light emitting device according to the ((II)-1)-th configuration of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom. For convenience, this configuration will be referred to as "the semiconductor light emitting device according to the ((II)-1-D)-th configuration of the present invention."

In addition, the semiconductor light emitting device according to the ((II)-1)-th configuration of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is the site occupied by a group III atom, the substitution site of the impurity in the second compound semiconductor layer is the site occupied by a group V atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom. For convenience, this configuration will be referred to as "the semiconductor light emitting device according to the ((II)-1-c)-th configuration of the present invention."

In addition, the semiconductor light emitting device according to the ((II)-1)-th configuration of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom. For convenience, this configuration will be referred to as "the semiconductor light emitting device according to the ((II)-1-d)-th configuration of the present invention."

The above-described semiconductor light emitting devices according to the ((II)-1-A)-th configuration, ((II)-1-a)-th configuration, ((II)-1-B)-th configuration, ((II)-1-b)-th configuration, ((II)-1-C)-th configuration, ((II)-1-c)-th configuration, ((II)-1-D)-th configuration, and ((II)-1-d)-th configuration of the present invention, may have the following configuration. Specifically, the current block layer further includes a fifth compound semiconductor layer of the second conductivity type, the third compound semiconductor layer is sandwiched by the fourth compound semiconductor layer and the fifth compound semiconductor layer, and the impurity for causing the third compound semiconductor layer to have the first conductivity type is such that the substitution site of the impurity in the third compound semiconductor layer competes with the substitution site of the impurity in the fifth compound semiconductor layer for causing the fifth compound semiconductor layer to have the second conductivity type. In this configuration, the multilayer structure composed of the fourth compound semiconductor layer, the third compound semiconductor layer, and the fifth compound semiconductor layer stacked in that order from the lower side may be employed. Alternatively, the multilayer structure composed of the fifth compound semiconductor layer, the third compound semiconductor layer, and the fourth compound semiconductor layer stacked in that order from the lower side may be employed. In addition, the following configuration is also available. Specifically, the current block layer further includes a sixth compound semiconductor layer of the first conductivity type, the fourth compound semiconductor layer is sandwiched by the third compound semiconductor layer and the sixth compound semiconductor layer, and the impurity for causing the fourth compound semiconductor layer to have the second conductivity type is such that the substitution site of the impurity in the fourth compound semiconductor layer competes with the substitution site of the impurity in the sixth compound semiconductor layer for causing the sixth compound semiconductor layer to have the first conductivity type. In this configuration, the multilayer structure composed of the third compound semiconductor layer, the fourth compound semiconductor layer, and the sixth compound semiconductor layer stacked in that order from the lower side may be employed. Alternatively, the multilayer structure composed of the sixth compound semiconductor layer, the fourth compound semiconductor layer, and the third compound semiconductor layer stacked in that order from the lower side may be employed.

In order to meet the above-described third need, the semiconductor light emitting device according to the (II)-th configuration of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the impurity for causing the first compound semiconductor layer to be the n-type as the first conductivity type is a group VI impurity, the impurity for causing the third compound semiconductor layer to be the n-type as the first conductivity type is a group IV impurity, the impurity for causing the first burying layer to be the p-type as the second conductivity type is a group II impurity, and the impurity for causing the second burying layer to be the p-type as the second conductivity type is carbon (C). For convenience, this configuration will be referred to as "the semiconductor light emitting device according to the ((II)-2-A)-th configuration of the present invention." In the semiconductor light emitting device according to the ((II)-2-A)-th configuration of the present invention, the number of combinations of (the impurity in the first compound semiconductor layer, the impurity in the third compound semiconductor layer, the impurity in the first burying layer, and the impurity in the second burying layer) is $3 \times 2 \times 4 \times 1 = 24$.

The first compound semiconductor layer containing a group VI impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

In addition, in order to meet the above-described third need, the semiconductor light emitting device according to the (II)-th configuration of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group IV impurity, the impurity for causing the fourth compound semiconductor layer to be the p-type as the second conductivity type is a group II impurity, the impurity for causing the first burying layer to be the p-type as the second conductivity type is a group II impurity, and the impurity for causing the second burying layer to be the p-type as the second conductivity type is carbon (C). For convenience, this configuration will be referred to as "the semiconductor light emitting device according to the ((II)-2-B)-th configuration of the present invention." In the semiconductor light emitting device according to the ((II)-2-B)-th configuration of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is 2×3×4×1×4×2×4×1=768.

In addition, in order to meet the above-described third need, the semiconductor light emitting device according to the (II)-th configuration of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the impurity for causing the first compound semiconductor layer to be the p-type as the first conductivity type is a group II impurity, the impurity for causing the third compound semiconductor layer to be the p-type as the first conductivity type is carbon (C), the impurity for causing the first burying layer to be the n-type as the second conductivity type is a group VI impurity, and the impurity for causing the second burying layer to be the n-type as the second conductivity type is a group IV impurity. For convenience, this configuration will be referred to as "the semiconductor light emitting device according to the ((II)-2-C)-th configuration of the present invention." In the semiconductor light emitting device according to the ((II)-2-C)-th configuration of the present invention, the number of combinations of (the impurity in the first compound semiconductor layer, the impurity in the third compound semiconductor layer, the impurity in the first burying layer, and the impurity in the second burying layer) is 4×1×3×2=24.

The first compound semiconductor layer containing a group II impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

In addition, in order to meet the above-described third need, the semiconductor light emitting device according to the (II)-th configuration of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is carbon (C), the impurity for causing the fourth compound semiconductor layer to be the n-type as the second conductivity type is a group VI impurity, the impurity for causing the first burying layer to be the n-type as the second conductivity type is a group VI impurity, and the impurity for causing the second burying layer to be the n-type as the second conductivity type is a group IV impurity. For convenience, this configuration will be referred to as "the semiconductor light emitting device according to the ((II)-2-D)-th configuration of the present invention." In the semiconductor light emitting device according to the ((II)-2-D)-th configuration of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the third compound semiconductor layer, the impurity in the fourth compound semiconductor layer, the impurity in the first burying layer, and the impurity in the second burying layer) is 1×4×3×2×1×3×3×2=432.

In addition, in order to meet the above-described third need, the semiconductor light emitting device according to the (II)-th configuration of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the impurity for causing the second compound semiconductor layer to be the p-type as the second conductivity type is a group II impurity, the impurity for causing the fourth compound semiconductor layer to be the p-type as the second conductivity type is carbon (C), the impurity for causing the first burying layer to be the p-type as the second conductivity type is carbon (C), and the impurity for causing the second burying layer to be the p-type as the second conductivity type is a group II impurity. For convenience, this configuration will be referred to as "the semiconductor light emitting device according to the ((II)-3-a)-th configuration of the present invention." In the semiconductor light emitting device according to the ((II)-3-a)-th configuration of the present invention, the number of combinations of (the impurity in the second compound semiconductor layer, the impurity in the fourth compound semiconductor layer, the impurity in the first burying layer, and the impurity in the second burying layer) is $4 \times 1 \times 1 \times 4 = 16$.

The second compound semiconductor layer containing a group II impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

In addition, in order to meet the above-described third need, the semiconductor light emitting device according to the (II)-th configuration of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group VI impurity, the impurity for causing the fourth compound semiconductor layer to be the p-type as the second conductivity type is carbon (C), the impurity for causing the first burying layer to be the p-type as the second conductivity type is carbon (C), and the impurity for causing the second burying layer to be the p-type as the second conductivity type is a group II impurity. For convenience, this configuration will be referred to as "the semiconductor light emitting device according to the ((II)-3-b)-th configuration of the present invention." In the semiconductor light emitting device according to the ((II)-3-b)-th configuration of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $2 \times 3 \times 4 \times 1 \times 1 \times 3 \times 1 \times 4 = 288$.

In addition, in order to meet the above-described third need, the semiconductor light emitting device according to the (II)-th configuration of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the impurity for causing the second compound semiconductor layer to be the n-type as the second conductivity type is a group VI impurity, the impurity for causing the fourth compound semiconductor layer to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity. For convenience, this configuration will be referred to as "the semiconductor light emitting device according to the ((II)-3-c)-th configuration of the present invention." In the semiconductor light emitting device according to the ((II)-3-c)-th configuration of the present invention, the number of combinations of (the impurity in the second compound semiconductor layer, the impurity in the third compound semiconductor layer, the impurity in the first burying layer, and the impurity in the second burying layer) is $3 \times 2 \times 2 \times 3 = 36$.

The second compound semiconductor layer containing a group VI impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

In addition, in order to meet the above-described third need, the semiconductor light emitting device according to the (II)-th configuration of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is a group II impurity, the impurity for causing the fourth compound semiconductor layer to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity. For convenience, this configuration will be referred to as "the semiconductor light emitting device according to the ((II)-3-d)-th configuration of the present invention." In the semiconductor light emitting device according to the ((II)-3-d)-th configuration of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the third compound semiconductor layer, the impurity in the fourth compound semiconductor layer, the impurity in the first burying layer, and the impurity in the second burying layer) is $1 \times 4 \times 3 \times 2 \times 2 \times 4 \times 2 \times 3 = 1152$.

In addition, in order to meet the above-described third need, the semiconductor light emitting device according to the (II)-th configuration of the present invention including the above-described preferred configuration may have a configuration in which the impurity for causing the first compound semiconductor layer (or the 1B-th compound semiconductor layer) to have the first conductivity type is different from the impurity for causing the third compound semiconductor layer to have the first conductivity type. For convenience, this configuration will be referred to as "the semiconductor light emitting device according to the ((II)-4-A)-th configuration of the present invention."

The first compound semiconductor layer (or the 1B-th compound semiconductor layer) containing the impurity different from the impurity for causing the third compound semiconductor layer to have the first conductivity type is the part that is in contact with at least the active layer, specifically. The active layer with which the first compound semiconductor layer is in contact encompasses well layers and confinement layers. This applies also to the following description. The provision of the confinement layer allows light confinement and/or carrier confinement. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

In addition, in order to meet the above-described third need, the semiconductor light emitting device according to the (II)-th configuration of the present invention including the above-described preferred configuration may have a configuration in which the impurity for causing the second compound semiconductor layer (or the 2B-th compound semiconductor layer) to have the second conductivity type is different from the impurity for causing the fourth compound semiconductor layer to have the second conductivity type. For convenience, this configuration will be referred to as "the semiconductor light emitting device according to the ((II)-4-a)-th configuration of the present invention."

The second compound semiconductor layer (or the 2B-th compound semiconductor layer) containing the impurity different from the impurity for causing the fourth compound semiconductor layer to have the second conductivity type is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed.

In addition, in order to meet the above-described third need, the semiconductor light emitting device according to the (II)-th configuration of the present invention including the above-described preferred configuration may have the following configuration. Specifically, the current block layer is formed of a multilayer structure arising from sequential stacking of at least the fourth compound semiconductor layer of the second conductivity type and the third compound semiconductor layer of the first conductivity type, the impurity for causing the fourth compound semiconductor layer to have the second conductivity type is such that the substitution site of the impurity in the fourth compound semiconductor layer competes with the substitution site of the impurity in the third compound semiconductor layer for causing the third compound semiconductor layer to have the first conductivity type, and competes with the substitution site of the impurity in the first compound semiconductor layer for causing the first compound semiconductor layer to have the first conductivity type, the impurity for causing the second compound semiconductor layer to have the second conductivity type is such that the substitution site of the impurity in the second compound semiconductor layer competes with the substitution site of the impurity in the third compound semiconductor layer for causing the third compound semiconductor layer to have the first conductivity type, and if a bypass channel that passes through the first compound semiconductor layer, the current block layer, and the second compound semiconductor layer is assumed, at least three pn junction interfaces formed of the interfaces between the compound semiconductor layers exist in the bypass channel. For convenience, this configuration will be referred to as "the semiconductor light emitting device according to the ((II)-5)-th configuration of the present invention."

It is possible for the semiconductor light emitting device according to the ((II)-5)-th configuration of the present invention to have a form in which the fourth compound semiconductor layer is in contact with the side surface of the first compound semiconductor layer and the third compound semiconductor layer is in contact with the side surface of the second compound semiconductor layer. In this case, the bypass channel is composed of the first compound semiconductor layer, the fourth compound semiconductor layer, the third compound semiconductor layer, and the second compound semiconductor layer. The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the side surface of the second compound semiconductor layer.

The semiconductor light emitting device according to the ((II)-5)-th configuration of the present invention may have the following configuration. Specifically, the first compound semiconductor layer is composed of a 1A-th compound semiconductor layer and a 1B-th compound semiconductor layer that is provided on the 1A-th compound semiconductor layer and is in contact with the active layer, and the impurity for causing the 1B-th compound semiconductor layer to have the first conductivity type is such that the substitution site of the impurity in the 1B-th compound semiconductor layer does not compete with the substitution site of the impurity in the 1A-th compound semiconductor layer for causing the 1A-th compound semiconductor layer to have the first conductivity type, and does not compete with the substitution site of the impurity in the second compound semiconductor layer for causing the second compound semiconductor layer to have the second conductivity type. In this case, the impurity for causing the 1A-th compound semiconductor layer to have the first conductivity type is such that the substitution site of the impurity in the 1A-th compound semiconductor layer competes with the substitution site of the impurity in the fourth compound semiconductor layer for causing the fourth compound semiconductor layer to have the second conductivity type.

In the case of the configuration in which the 1B-th compound semiconductor layer is used, the relationship between the 1B-th compound semiconductor layer and the fourth compound semiconductor layer in contact with the side surface of the 1B-th compound semiconductor layer is such that their impurity substitution sites do not compete with each other in some cases. In such a case, initially impurity diffusion between the 1B-th compound semiconductor layer and the fourth compound semiconductor layer will occur across this side surface part, and then the impurity diffusion will reach the third compound semiconductor layer included in the current block layer, so that a current leakage path is possibly formed.

Therefore, for this case, the following configuration may be employed. Specifically, a sixth compound semiconductor layer of the first conductivity type is provided under the fourth compound semiconductor layer, the impurity for causing the sixth compound semiconductor layer to have the first conductivity type is such that the substitution site of the impurity in the sixth compound semiconductor layer competes with the substitution site of the impurity in the first compound semiconductor layer (or the 1A-th compound semiconductor layer) for causing the first compound semiconductor layer (or the 1A-th compound semiconductor layer) to have the first conductivity type, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. Employing such a configuration eliminates the contact between the 1B-th compound semiconductor layer and the fourth compound semiconductor layer, whose impurity substitution sites do not compete with each other, and thus can prevent the impurity diffusion. In this case, the bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

In addition, in such a case, it is desirable to provide an impurity diffusion barrier layer in the current block layer in order to prevent the occurrence of current leakage attributed to impurity diffusion from the 1B-th compound semiconductor layer into the current block layer. Specifically, a seventh compound semiconductor layer of the second conductivity type whose impurity substitution site is different from that of the fourth compound semiconductor layer of the second conductivity type is provided as the "impurity diffusion barrier layer." More specifically, in the fourth compound semiconductor layer that is included in the current block layer and has the second conductivity type, at least one impurity diffusion barrier layer having the second conductivity type (e.g. the seventh compound semiconductor layer) is provided. Furthermore, impurities are so selected that the substitution site of the impurity in the fourth compound semiconductor layer is different from that of the impurity in the impurity diffusion barrier layer (e.g. the seventh compound semiconductor layer if the number of impurity diffusion barrier layers is one). Employing such a configuration allows further-ensured prevention of the phenomenon that a current leakage path from the bypass channel is formed due to impurity diffusion into the current block layer.

Furthermore, the semiconductor light emitting device according to the ((II)-5)-th configuration of the present invention may have the following configuration. Specifically, the second compound semiconductor layer is composed of a 2B-th compound semiconductor layer in contact with the active layer and a 2A-th compound semiconductor layer provided on the 2B-th compound semiconductor layer, and the impurity for causing the 2B-th compound semiconductor layer to have the second conductivity type is such that the substitution site of the impurity in the 2B-th compound semiconductor layer does not compete with the substitution site of the impurity in the 2A-th compound semiconductor layer for causing the 2A-th compound semiconductor layer to have the second conductivity type, and does not compete with the substitution site of the impurity in the first compound semiconductor layer for causing the first compound semiconductor layer to have the first conductivity type. In this case, the impurity for causing the 2A-th compound semiconductor layer to have the second conductivity type is such that the substitution site of the impurity in the 2A-th compound semiconductor layer competes with the substitution site of the impurity in the third compound semiconductor layer for causing the third compound semiconductor layer to have the first conductivity type.

In the case of the configuration in which the 2B-th compound semiconductor layer is used, the relationship between the 2B-th compound semiconductor layer and the third compound semiconductor layer in contact with the side surface of the 2B-th compound semiconductor layer is such that their impurity substitution sites do not compete with each other in some cases. In such a case, initially impurity diffusion between the 2B-th compound semiconductor layer and the third compound semiconductor layer will occur across this side surface part, and then the impurity diffusion will reach the fourth compound semiconductor layer included in the current block layer, so that a current leakage path is possibly formed.

Therefore, for this case, the following configuration may be employed. Specifically, a fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the second compound semiconductor layer (or the 2A-th compound semiconductor layer) for causing the second compound semiconductor layer (or the 2A-th compound semiconductor layer) to have the second conductivity type, and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). Employing such a configuration eliminates the contact between the 2B-th compound semiconductor layer and the third compound semiconductor layer, whose impurity substitution sites do not compete with each other, and thus can prevent the impurity diffusion. In this case, the bypass channel is composed of the first compound semiconductor layer, the fourth compound semiconductor layer, the third compound semiconductor layer, the fifth compound semiconductor layer, and the second compound semiconductor layer (the 2B-th compound semiconductor layer and the 2A-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

In addition, in such a case, it is desirable to provide an impurity diffusion barrier layer in the current block layer in order to prevent the occurrence of current leakage attributed to impurity diffusion from the 2B-th compound semiconductor layer into the current block layer. Specifically, an eighth compound semiconductor layer of the first conductivity type whose impurity substitution site is different from that of the third compound semiconductor layer of the first conductivity type is provided as the "impurity diffusion barrier layer."

More specifically, in the third compound semiconductor layer that is included in the current block layer and has the first conductivity type, at least one impurity diffusion barrier layer having the first conductivity type (e.g. the eighth compound semiconductor layer) is provided. Furthermore, impurities are so selected that the substitution site of the impurity in the third compound semiconductor layer is different from that of the impurity in the impurity diffusion barrier layer (e.g. the eighth compound semiconductor layer if the number of impurity diffusion barrier layers is one). Employing such a configuration allows further-ensured prevention of the phenomenon that a current leakage path from the bypass channel is formed due to impurity diffusion into the current block layer.

In the semiconductor light emitting device according to the ((II)-5)-th configuration of the present invention, the first compound semiconductor layer, the second compound semiconductor layer, the fourth compound semiconductor layer, and the third compound semiconductor layer are composed of a III-V compound semiconductor. Alternatively, the 1A-th compound semiconductor layer, the 1B-th compound semiconductor layer, the second compound semiconductor layer, the fourth compound semiconductor layer, and the third compound semiconductor layer are composed of a III-V compound semiconductor. Alternatively, the first compound semiconductor layer, the 2B-th compound semiconductor layer, the 2A-th compound semiconductor layer, the fourth compound semiconductor layer, and the third compound semiconductor layer are composed of a III-V compound semiconductor.

Furthermore, the following configuration can be employed. Specifically, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. The substitution site of the impurity in the first burying layer is the site occupied by a group III atom. The substitution site of the impurity in the second burying layer is the site occupied by a group V atom. For convenience, this configuration will be referred to as "the semiconductor light emitting device according to the ((II)-5-A)-th configuration of the present invention." It is possible to employ a form in which the fourth compound semiconductor layer is in contact with the side surface of the first compound semiconductor layer and the third compound semiconductor layer is in contact with the side surface of the second compound semiconductor layer.

The semiconductor light emitting device according to the ((II)-5-A)-th configuration of the present invention may have the following configuration. Specifically, the impurity for causing the first compound semiconductor layer and the third compound semiconductor layer to be the n-type as the first conductivity type is a group IV impurity, the impurity for causing the second compound semiconductor layer and the fourth compound semiconductor layer to be the p-type as the second conductivity type is a group II impurity, the impurity for causing the first burying layer to be the p-type as the second conductivity type is a group II impurity, and the impurity for causing the second burying layer to be the p-type as the second conductivity type is carbon (C). For convenience, this configuration will be referred to as "the semiconductor light emitting device according to the ((II)-5-A-1)-th configuration of the present invention." In the semiconductor light emitting device according to the ((II)-5-A-1)-th configuration of the present invention, the number of combinations of (the impurity in the first compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 2×4×4×2×4×1=256.

In addition, the semiconductor light emitting device according to the ((II)-5-A)-th configuration of the present invention may have the following configuration. Specifically, the impurity for causing the first compound semiconductor layer and the third compound semiconductor layer to be the p-type as the first conductivity type is a group II impurity, the impurity for causing the second compound semiconductor layer and the fourth compound semiconductor layer to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity. For convenience, this configuration will be referred to as "the semiconductor light emitting device according to the ((II)-5-A-2)-th configuration of the present invention." In the semiconductor light emitting device according to the ((II)-5-A-2)-th configuration of the present invention, the number of combinations of (the impurity in the first compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 4×2×2×4×2×3=384.

Furthermore, the following configuration can be employed. Specifically, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the first burying layer is the site occupied by a group V atom. The substitution site of the impurity in the second burying layer is the site occupied by a group III atom. For convenience, this configuration will be referred to as "the semiconductor light emitting device according to the ((II)-5-a)-th configuration of the present invention." It is possible to employ a form in which the fourth compound semiconductor layer is in contact with the side surface of the first compound semiconductor layer and the third compound semiconductor layer is in contact with the side surface of the second compound semiconductor layer.

The semiconductor light emitting device according to the ((II)-5-a)-th configuration of the present invention may have the following configuration. Specifically, the impurity for causing the first compound semiconductor layer and the third compound semiconductor layer to be the n-type as the first conductivity type is a group VI impurity, the impurity for causing the second compound semiconductor layer and the fourth compound semiconductor layer to be the p-type as the second conductivity type is carbon (C), and the impurity for causing the first burying layer to be the p-type as the second conductivity type is carbon (C), and the impurity for causing the second burying layer to be the p-type as the second conductivity type is a group II impurity. For convenience, this configuration will be referred to as "the semiconductor light emitting device according to the ((II)-5-a-1)-th configuration of the present invention." In the semiconductor light emitting device according to the ((II)-5-a-1)-th configuration of the present invention, the number of combinations of (the impurity in the first compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 3×1×1×3×1×4=36.

In addition, the semiconductor light emitting device according to the ((II)-5-a)-th configuration of the present invention may have the following configuration. Specifically, the impurity for causing the first compound semiconductor layer and the third compound semiconductor layer to be the p-type as the first conductivity type is carbon (C), the impurity for causing the second compound semiconductor layer and the fourth compound semiconductor layer to be the n-type as the second conductivity type is a group VI impurity, and the impurity for causing the first burying layer to be the n-type as the second conductivity type is a group VI impurity, and the impurity for causing the second burying layer to be the n-type as the second conductivity type is a group IV impurity. For convenience, this configuration will be referred to as "the semiconductor light emitting device according to the ((II)-5-a-2)-th configuration of the present invention." In the semiconductor light emitting device according to the ((II)-5-a-2)-th configuration of the present invention, the number of combinations of (the impurity in the first compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 1×3×3×1×3×2=54.

Furthermore, the following configuration may be employed. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. The substitution site of the impurity in the 1B-th compound semiconductor layer is the site occupied by a group V atom. The substitution site of the impurity in the first burying layer is the site occupied by a group III atom. The substitution site of the impurity in the second burying layer is the site occupied by a group V atom. For convenience, this configuration will be referred to as "the semiconductor light emitting device according to the ((II)-5-B)-th configuration of the present invention."

The semiconductor light emitting device according to the ((II)-5-B)-th configuration of the present invention may have the following configuration. Specifically, the impurity for causing the 1A-th compound semiconductor layer and the third compound semiconductor layer to be the n-type as the first conductivity type is a group IV impurity, the impurity for causing the 1B-th compound semiconductor layer to be the n-type as the first conductivity type is a group VI impurity, the impurity for causing the second compound semiconductor layer and the fourth compound semiconductor layer to be the p-type as the second conductivity type is a group II impurity, and the impurity for causing the first burying layer to be the p-type as the second conductivity type is a group II impurity, and the impurity for causing the second burying layer to be the p-type as the second conductivity type is carbon (C). For convenience, this configuration will be referred to as "the semiconductor light emitting device according to the ((II)-5-B-1)-th configuration of the present invention." In the semiconductor light emitting device according to the ((II)-5-B-1)-th configuration of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 2×3×4×4×2× 4×1=768.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group IV impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

In addition, the semiconductor light emitting device according to the ((II)-5-B)-th configuration of the present invention may have the following configuration. Specifically, the impurity for causing the 1A-th compound semiconductor layer and the third compound semiconductor layer to be the p-type as the first conductivity type is a group II impurity, the impurity for causing the 1B-th compound semiconductor layer to be the p-type as the first conductivity type is carbon (C), the impurity for causing the second compound semiconductor layer and the fourth compound semiconductor layer to be the n-type as the second conductivity type is a group IV impurity, and the impurity for causing the first burying layer to be the n-type as the second conductivity type is a group IV impurity, and the impurity for causing the second burying layer to be the n-type as the second conductivity type is a group VI impurity. For convenience, this configuration will be referred to as "the semiconductor light emitting device according to the ((II)-5-B-2)-th configuration of the present invention." In the semiconductor light emitting device according to the ((II)-5-B-2)-th configuration of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 4×1×2×2×4× 2×3=384.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group II impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

Furthermore, the following configuration may be employed. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the 1B-th compound semiconductor layer is the site occupied by a group III atom. The substitution site of the impurity in the first burying layer is the site occupied by a group V atom. The substitution site of the impurity in the second burying layer is the site occupied by a group III atom. For convenience, this configuration will be referred to as "the semiconductor light emitting device according to the ((II)-5-b)-th configuration of the present invention."

The semiconductor light emitting device according to the ((II)-5-b)-th configuration of the present invention may have the following configuration. Specifically, the impurity for causing the 1A-th compound semiconductor layer and the third compound semiconductor layer to be the n-type as the first conductivity type is a group VI impurity, the impurity for causing the 1B-th compound semiconductor layer to be the n-type as the first conductivity type is a group IV impurity, the impurity for causing the second compound semiconductor layer and the fourth compound semiconductor layer to be the p-type as the second conductivity type is carbon (C), and the impurity for causing the first burying layer to be the p-type as the second conductivity type is carbon (C), and the impurity for causing the second burying layer to be the p-type as the second conductivity type is a group II impurity. For convenience, this configuration will be referred to as "the semiconductor light emitting device according to the ((II)-5-b-1)-th configuration of the present invention." In the semiconductor light emitting device according to the ((II)-5-b-1)-th configuration of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 3×2×1×1×3× 1×4=72.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group VI impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

In addition, the semiconductor light emitting device according to the ((II)-5-b)-th configuration of the present invention may have the following configuration. Specifically, the impurity for causing the 1A-th compound semiconductor layer and the third compound semiconductor layer to be the p-type as the first conductivity type is carbon (C), the impurity for causing the 1B-th compound semiconductor layer to be the p-type as the first conductivity type is a group II impurity, the impurity for causing the second compound semiconductor layer and the fourth compound semiconductor layer to be the n-type as the second conductivity type is a group VI impurity, and the impurity for causing the first burying layer to be the n-type as the second conductivity type is a group VI impurity, and the impurity for causing the second burying layer to be the n-type as the second conductivity type is a group IV impurity. For convenience, this configuration will be referred to as "the semiconductor light emitting device according to the ((II)-5-b-2)-th configuration of the present invention." In the semiconductor light emitting device according to the ((II)-5-b-2)-th configuration of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, the impurity in the third compound semiconductor layer, the impurity in the first burying layer, and the impurity in the second burying layer) is $1 \times 4 \times 3 \times 3 \times 1 \times 3 \times 2 = 216$.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is carbon (C), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

Furthermore, the following configuration may be employed. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group III atom. The substitution site of the impurity in the 2B-th compound semiconductor layer is the site occupied by a group V atom. The substitution site of the impurity in the first burying layer is the site occupied by a group III atom. The substitution site of the impurity in the second burying layer is the site occupied by a group V atom. For convenience, this configuration will be referred to as "the semiconductor light emitting device according to the ((II)-5-C)-th configuration of the present invention."

The semiconductor light emitting device according to the ((II)-5-C)-th configuration of the present invention may have the following configuration. Specifically, the impurity for causing the first compound semiconductor layer and the third compound semiconductor layer to be the n-type as the first conductivity type is a group IV impurity, the impurity for causing the 2A-th compound semiconductor layer and the fourth compound semiconductor layer to be the p-type as the second conductivity type is a group II impurity, the impurity for causing the 2B-th compound semiconductor layer to be the p-type as the second conductivity type is carbon (C), and the impurity for causing the first burying layer to be the p-type as the second conductivity type is a group II impurity, and the impurity for causing the second burying layer to be the p-type as the second conductivity type is carbon (C). For convenience, this configuration will be referred to as "the semiconductor light emitting device according to the ((II)-5-C-1)-th configuration of the present invention." In the semiconductor light emitting device according to the ((II)-5-C-1)-th configuration of the present invention, the number of combinations of (the impurity in the first compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $2 \times 1 \times 4 \times 4 \times 2 \times 4 \times 1 = 256$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group II impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, the semiconductor light emitting device according to the ((II)-5-C)-th configuration of the present invention may have the following configuration. Specifically, the impurity for causing the first compound semiconductor layer and the third compound semiconductor layer to be the p-type as the first conductivity type is a group II impurity, the impurity for causing the 2A-th compound semiconductor layer and the fourth compound semiconductor layer to be the n-type as the second conductivity type is a group IV impurity, the impurity for causing the 2B-th compound semiconductor layer to be the n-type as the second conductivity type is a group VI impurity, the impurity for causing the first burying layer to be the n-type as the second conductivity type is a group IV impurity, and the impurity for causing the second burying layer to be the n-type as the second conductivity type is a group VI impurity. For convenience, this configuration will be referred to as "the semiconductor light emitting device according to the ((II)-5-C-2)-th configuration of the present invention." In the semiconductor light emitting device according to the ((II)-5-C-2)-th configuration of the present invention, the number of combinations of (the impurity in the first compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $4\times3\times2\times2\times4\times2\times3=1152$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group IV impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

Furthermore, the following configuration may be employed. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group V atom. The substitution site of the impurity in the 2B-th compound semiconductor layer is the site occupied by a group III atom. The substitution site of the impurity in the first burying layer is the site occupied by a group V atom. The substitution site of the impurity in the second burying layer is the site occupied by a group III atom. For convenience, this configuration will be referred to as "the semiconductor light emitting device according to the ((II)-5-c)-th configuration of the present invention."

The semiconductor light emitting device according to the ((II)-5-c)-th configuration of the present invention may have the following configuration. Specifically, the impurity for causing the first compound semiconductor layer and the third compound semiconductor layer to be the n-type as the first conductivity type is a group VI impurity, the impurity for causing the 2A-th compound semiconductor layer and the fourth compound semiconductor layer to be the p-type as the second conductivity type is carbon (C), the impurity for causing the 2B-th compound semiconductor layer to be the p-type as the second conductivity type is a group II impurity, the impurity for causing the first burying layer to be the p-type as the second conductivity type is carbon (C), and the impurity for causing the second burying layer to be the p-type as the second conductivity type is a group II impurity. For convenience, this configuration will be referred to as "the semiconductor light emitting device according to the ((II)-5-c-1)-th configuration of the present invention." In the semiconductor light emitting device according to the ((II)-5-c-1)-th configuration of the present invention, the number of combinations of (the impurity in the first compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $3\times4\times1\times1\times3\times1\times4=144$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is carbon (C), and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, the semiconductor light emitting device according to the ((II)-5-c)-th configuration of the present invention may have the following configuration. Specifically, the impurity for causing the first compound semiconductor layer and the third compound semiconductor layer to be the p-type as the first conductivity type is carbon (C), the impurity for causing the 2A-th compound semiconductor layer and the fourth compound semiconductor layer to be the n-type as the second conductivity type is a group VI impurity, the impurity for causing the 2B-th compound semiconductor layer to be the n-type as the second conductivity type is a group IV impurity, and the impurity for causing the first burying layer to be the n-type as the second conductivity type is a group VI impurity, and the impurity for causing the second burying layer to be the n-type as the second conductivity type is a group IV impurity. For convenience, this configuration will be referred to as "the semiconductor light emitting device according to the ((II)-5-c-2)-th configuration of the present invention." In the semiconductor light emitting device according to the ((II)-5-c-2)-th configuration of the present invention, the number of combinations of (the impurity in the first compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $1\times2\times3\times3\times1\times3\times2=108$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group VI impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, in the semiconductor light emitting device according to the ((II)-5)-th configuration of the present invention, a plurality of compound semiconductor layers may be provided between the fourth compound semiconductor layer and the third compound semiconductor layer of the current block layer. Specifically, it is also possible to employ a configuration in which at least a compound semiconductor layer of the first conductivity type and a compound semiconductor layer of the second conductivity type are further sequentially stacked between the fourth compound semiconductor layer and the third compound semiconductor layer. More specifically, if the first conductivity type is the n-type and the second conductivity type is the p-type, the current block layer may be formed based on a four-layer structure composed of the p-type fourth compound semiconductor layer, an n-type compound semiconductor layer, a p-type compound semiconductor layer, and the n-type third compound semiconductor layer. Alternatively, the current block layer may be formed based on a six-layer structure composed of the p-type fourth compound semiconductor layer, an n-type compound semiconductor layer, a p-type compound semiconductor layer, an n-type compound semiconductor layer, a p-type compound semiconductor layer, and the n-type third compound semiconductor layer. More alternatively, the current block layer may be formed based on an eight-layer structure composed of the p-type fourth compound semiconductor layer, an n-type compound semiconductor layer, a p-type compound semiconductor layer, an n-type compound semiconductor layer, a p-type compound semiconductor layer, an n-type compound semiconductor layer, a p-type compound semiconductor layer, and the n-type third compound semiconductor layer. Such a multilayer structure will be often represented as "the p-type fourth compound semiconductor layer, (n-type compound semiconductor layer, p-type compound semiconductor layer)$_m$, and the n-type third compound semiconductor layer (m=1, 2, 3, . . . )." In addition, if the first conductivity type is the p-type and the second conductivity type is the n-type, the current block layer may be formed based on a multilayer structure composed of the n-type fourth compound semiconductor layer, (p-type compound semiconductor layer, n-type compound semiconductor layer)$_m$, and the p-type third compound semiconductor layer (m=1, 2, 3, . . . ). By thus forming the current block layer based on a multilayer structure, the phenomenon that a current leakage path from the bypass channel is formed can be prevented more surely even if a relative positional error between the light emitting part and the current block layer occurred. It is desirable that the thickness of the current block layer be not increased even when the current block layer is formed based on a multilayer structure. Furthermore, it is more desirable that at least one pn interface (or np interface) between the compound semiconductor layers included in the current block layer be in contact with the side surface of the active layer. This feature decreases the area of the contact part with the side surface of the light emitting part per one compound semiconductor layer included in the current block layer, which results in an increase in the electric resistance. Consequently, leakage current is further suppressed and thus the light output can be improved.

In the semiconductor light emitting device according to the ((II)-1)-th to ((II)-5)-th configurations including the semiconductor light emitting devices according to the first to ((II)-5)-th configurations of the present invention (including the above-described various preferred configurations and forms) (hereinafter, these semiconductor light emitting devices will be often referred to simply as "the semiconductor light emitting device of the present invention" generically), it is desirable for the first burying layer to have such a thickness or a smaller thickness that the first burying layer grown on the current block layer reaches the edge line composed of the top surface and the side surfaces of the light emitting part at the center part or both the end parts of the light emitting part at which the sectional shape of the light emitting part obtained when the light emitting part is cut along a virtual plane perpendicular to the axis line is composed of the top surface and both the side surfaces. That is, it is desirable for the first burying layer to have such a thickness or a smaller thickness as to cover the side surfaces of the light emitting part. On the other hand, it is preferable for the second burying layer to have such a thickness as to cover at least the side surfaces of the deposited layer formed on the top surface at both the end parts of the light emitting part at the same timing as that of the current block layer. Furthermore, it is more preferable that these layers be so deposited to a large thickness that the top surface (apex) is sufficiently covered by the multilayer structure composed of the first burying layer and the second burying layer with a thickness corresponding to such a distance that light generated by the active layer is not absorbed. In addition, it is preferable to select materials having lower refractive indexes as the materials of the first burying layer and the second burying layer.

Moreover, as a more desirable form regarding the contact surface with the side surface of the light emitting part per one compound semiconductor layer included in the current block layer, it is desirable that the width of the contact surface (the length of the contact surface along the vertical direction of the side surface of the light emitting part) per one compound semiconductor layer included in the current block layer be equal to or smaller than the total thickness of the active layer (the length of the active layer along the vertical direction of the side surface of the light emitting part) sandwiched between the first compound semiconductor layer (or the 1B-th compound semiconductor layer) and the second compound semiconductor layer (or the 2B-th compound semiconductor layer). In addition, if the active layer has a quantum well structure, it is desirable that the width of the contact surface per one compound semiconductor layer included in the current block layer be equal to or smaller than the width of one well layer of the quantum well structure (the length of the well layer along the vertical direction of the side surface of the light emitting part). Such a form involves the necessity that the thicknesses of the respective compound semiconductor layers included in the current block layer are set to very small values. Therefore, the related art has a problem that a part of the current block layer formed of the {311}B plane or a higher-order crystal plane is annihilated or, conversely, the thickness of this part is abnormally increased because of conductivity type neutralization due to impurity mutual diffusion across the interface of n-type compound semiconductor layer/p-type compound semiconductor layer (or p-type compound semiconductor layer/n-type compound semiconductor layer) as described above. Consequently, according to the semiconductor light emitting device of the ((II)-1)-th to ((II)-5)-th configurations, in achievement of desired conductivity types of the respective compound semiconductor layers included in the current block layer, the impurity combination in consideration of the competition relationship of the impurity substitution site is comprehensively determined from the viewpoint of current leakage suppression. This makes it possible to realize a structure that allows suppression of conductivity type neutralization due to impurity mutual diffusion, enhancement in the current block quality of the current block layer itself, and ensured suppression of leakage current from the side surface of the light emitting part, even when the thicknesses of the respective compound semiconductor layers included in the current block layer are set to very small values.

In the semiconductor light emitting device of the above-described preferred configurations of the ((I)-1)-th to ((I)-5)-th configurations and ((II)-1)-th to ((II)-5)-th configurations, the third compound semiconductor layer may be composed of a {311}B crystal plane region that extends from the side surface of the light emitting part; a {100} crystal plane region that extends along the major surface of the substrate; and a {h11}B crystal plane region (h is an integer equal to or larger than four) located between the {311}B crystal plane region and the {100} crystal plane region. In addition, the fourth compound semiconductor layer may be composed of a {311}B crystal plane region that extends from the side surface of the light emitting part; a {100} crystal plane region that extends along the major surface of the substrate; and a {h11}B crystal plane region (h is an integer equal to or larger than four) located between the {311}B crystal plane region and the {100} crystal plane region.

According to the semiconductor light emitting device of (II)-th configuration, in the burying layer located above the current block layer, the impurity for causing the second burying layer to have the second conductivity type is such that the substitution site of the impurity in the second burying layer does not compete with the substitution site of the impurity in the third compound semiconductor layer for causing the third compound semiconductor layer to have the first conductivity type. Therefore, the impurity for causing the second burying layer to have the second conductivity type diffuses into the compound semiconductor layer of the first conductivity type in the deposited layer formed of the multilayer structure that is formed above the top surface at both the end parts of the light emitting part and has the same composition as that of the current block layer. This diffusion turns the compound semiconductor layer of the first conductivity type to a compound semiconductor layer of the second conductivity type. As a result, all of the compound semiconductor layers located above the light emitting part have the second conductivity type. Consequently, the deposited layer having the same multilayer structure as that of the current block layer does not exist above the top surface of the multilayer structure of the light emitting part, and thus it is possible to surely avoid the occurrence of a problem that the light emission efficiency of the semiconductor light emitting device is decreased and a problem that the heat generation and the current consumption are increased due to an increase in the electric resistance.

In the semiconductor light emitting device according to the ((II)-1)-th configuration of the present invention, the impurity for causing the third compound semiconductor layer to have the first conductivity type included in the current block layer is such that the substitution site of the impurity in the third compound semiconductor layer competes with the substitution site of the impurity in the fourth compound semiconductor layer for causing the fourth compound semiconductor layer to have the second conductivity type. Thus, impurity mutual diffusion hardly occurs between the n-type compound semiconductor layer and the p-type compound semiconductor layer of the current block layer. This allows avoidance of the occurrence of a problem that the effect of the current block layer is unstable and thus leakage current is increased due to annihilation or thinning of the current block layer. Furthermore, the impurity for causing the first compound semiconductor layer to have the first conductivity type is such that the substitution site of the impurity in the first compound semiconductor layer does not compete with the substitution site of the impurity in the second compound semiconductor layer for causing the second compound semiconductor layer to have the second conductivity type. Thus, the pn junction control, designed through intentional impurity mutual diffusion between the first compound semiconductor layer and the second compound semiconductor layer, can be finely designed easily through adjustment of the concentrations and doping positions of the impurities in the respective layers. This allows enhancement in the light emission characteristic.

In the semiconductor light emitting device according to the ((II)-2-A)-th configuration of the present invention or the ((II)-2-B)-th configuration of the present invention, the impurity for causing the first compound semiconductor layer or the 1B-th compound semiconductor layer to be the n-type as the first conductivity type is a group VI impurity, and the impurity for causing the third compound semiconductor layer to be the n-type as the first conductivity type is a group IV impurity. Furthermore, in the semiconductor light emitting device according to the ((II)-2-C)-th configuration of the present invention or the ((II)-2-D)-th configuration of the present invention, the impurity for causing the first compound semiconductor layer or the 1B-th compound semiconductor layer to be the p-type as the second conductivity type is a group II impurity, and the impurity for causing the third compound semiconductor layer to be the p-type as the second conductivity type is carbon (C). Furthermore, in the semiconductor light emitting device according to the ((II)-3-a)-th configuration of the present invention or the ((II)-3-b)-th configuration of the present invention, the impurity for causing the second compound semiconductor layer or the 2B-th compound semiconductor layer to be the p-type as the second conductivity type is a group II impurity, and the impurity for causing the fourth compound semiconductor layer to be the p-type as the second conductivity type is carbon (C). In addition, in the semiconductor light emitting device according to the ((II)-3-c)-th configuration of the present invention or the ((II)-3-d)-th configuration of the present invention, the impurity for causing the second compound semiconductor layer or the 2B-th compound semiconductor layer to be the n-type as the second conductivity type is a group VI impurity, and the impurity for causing the fourth compound semiconductor layer to be the n-type as the second conductivity type is a group IV impurity. Moreover, in the semiconductor light emitting device according to the ((II)-4-A)-th configuration of the present invention, the impurity for causing the first compound semiconductor layer to have the first conductivity type is different from the impurity for causing the third compound semiconductor layer to have the first conductivity type. In the semiconductor light emitting device according to the ((II)-4-a)-th configuration of the present invention, the impurity for causing the second compound semiconductor layer to have the second conductivity type is different from the impurity for causing the fourth compound semiconductor layer to have the second conductivity type. Employing these configurations and structures makes it possible to achieve configuration and structure in which impurity mutual diffusion hardly occurs between the n-type compound semiconductor layer and the p-type compound semiconductor layer of the current block layer. As a result, it is possible to avoid the occurrence of a problem that the effect of the current block layer is unstable and thus leakage current is increased due to annihilation or thinning of the current block layer.

Furthermore, in the semiconductor light emitting device according to the ((II)-5)-th configuration of the present invention, when a bypass channel that passes through the first compound semiconductor layer, the current block layer, and the second compound semiconductor layer is assumed, at least three pn junction interfaces formed of the interfaces between the compound semiconductor layers exist in the bypass channel In addition, the impurity for causing a respective one of the compound semiconductor layers to have a predetermined conductivity type is such that the substitution site of the impurity in the respective one of the compound semiconductor layers competes with the substitution site of the impurity in the adjacent compound semiconductor layer for causing the adjacent compound semiconductor layer to have a predetermined conductivity type. Thus, impurity mutual diffusion hardly occurs between the n-type compound semiconductor layer and the p-type compound semiconductor layer of the current block layer. In addition, impurity mutual diffusion hardly occurs between the n-type compound semiconductor layer and the p-type compound semiconductor layer of the current block layer and the p-type compound semiconductor layer and the n-type compound semiconductor layer of the light emitting part. As a result, it is possible to avoid the occurrence of a problem that the effect of the current block layer is unstable and thus leakage current is increased due to annihilation or thinning of the current block layer.

The semiconductor light emitting devices in the fifth to twenty-second embodiments will be described in the followings.

Fifth Embodiment

Figure 7A:
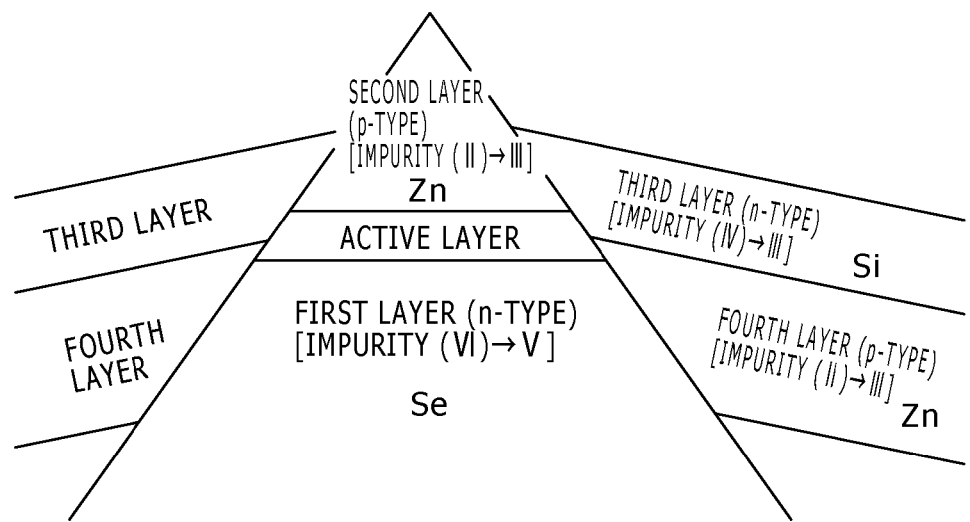
FIGS. 7A and 7B are conceptual diagrams of semiconductor light emitting devices according to a fifth embodiment and a ninth embodiment, respectively, of the present invention.

The fifth embodiment relates to the ((I)-1)-th configuration, in particular, ((I)-1-A)-th configuration of the present invention, the ((I)-2-A)-th configuration of the present invention, and the ((I)-4-A)-th configuration of the present invention. The conceptual diagram of the semiconductor light emitting devide of the fifth embodiment is shown in FIG. 7A. The schematic partial sectional view is shown in FIGS. 1A and 1B. In FIGS. 7A to 48B, "compound semiconductor layer" is represented simply as "layer." That is, for example, "first layer" means a first compound semiconductor layer. FIGS. 21A, 22A, 23A, 24A, 25A, 26A, 27A, 28A, 29A, 30A, 31A, 32A, 33A, 34A, 35A, 36A, 37A, 38A, 39A, 40A, 41A, 42A, 43A, 44A, 45A, 46A, 47A, and 48A are conceptual diagrams of both the end parts of semiconductor light emitting devices. FIGS. 21B, 22B, 23B, 24B, 25B, 26B, 27B, 28B, 29B, 30B, 31B, 32B, 33B, 34B, 35B, 36B, 37B, 38B, 39B, 40B, 41B, 42B, 43B, 44B, 45B, 46B, 47B, and 48B are conceptual diagrams of the center part of semiconductor light emitting devices.

As shown in FIGS. 1A and 1B, the third compound semiconductor layer 43 is formed on the fourth compound semiconductor layer 44. The pn junction interface between the fourth compound semiconductor layer 44 (p-type) and the third compound semiconductor layer 43 (n-type) thereon extends along the {311}B crystal plane, and the end part thereof is in contact with the light emitting part 20 (in particular, the side surface of the active layer 23). This forms two new junction interfaces. Specifically, a current path formed of the pnpn junction structure including the following junction interfaces is formed: the pn junction interface between the second compound semiconductor layers 22A and 22B and the third compound semiconductor layer 43; the np junction interface between the third compound semiconductor layer 43 and the fourth compound semiconductor layer 44; and the pn junction interface between the fourth compound semiconductor layer 44 and the first compound semiconductor layer 21. This is a desirable design as the current block structure.

Inversely with this multilayer structure, the positional relationship between the third compound semiconductor layer 43 (n-type) and the fourth compound semiconductor layer 44 (p-type) may be reversed. In this case, the pn junction interface between the fourth compound semiconductor layer 44 (p-type) and the third compound semiconductor layer 43 (n-type) thereunder extends along the {311}B crystal plane, and the end part thereof is in contact with the light emitting part 20 (in particular, the side surface of the active layer 23). This forms two new junction interfaces. As a result, the following junction interfaces exist: the pp junction interface between the second compound semiconductor layers 22A and 22B and the fourth compound semiconductor layer 44; the pn junction interface between the fourth compound semiconductor layer 44 and the third compound semiconductor layer 43; and the nn junction interface between the third compound semiconductor layer 43 and the first compound semiconductor layer 21. Thus, a ppnn junction structure arises due to the second compound semiconductor layers 22A and 22B/the fourth compound semiconductor layer 44/the third compound semiconductor layer 43/the first compound semiconductor layer 21. However, by decreasing the junction area between the current block layer 40 and the light emitting part 20 (in particular, the nn junction area), a desired design as the current block structure can be obtained through an increase in the resistance of the contact area.

Moreover, the impurity for causing the first compound semiconductor layer 21 to have the first conductivity type (n-type) is such that the substitution site of the impurity in the first compound semiconductor layer 21 does not compete with the substitution site of the impurity in the second compound semiconductor layers 22A and 22B for causing the second compound semiconductor layers 22A and 22B to have the second conductivity type (p-type). Furthermore, the impurity for causing the third compound semiconductor layer 43 to have the first conductivity type (n-type) is such that the substitution site of the impurity in the third compound semiconductor layer 43 competes with the substitution site of the impurity in the fourth compound semiconductor layer 44 for causing the fourth compound semiconductor layer 44 in contact with the third compound semiconductor layer 43 to have the second conductivity type (p-type). This applies also to the fourteenth embodiment to be described later.

Specifically, when the semiconductor light emitting device of the fifth embodiment is represented based on the ((I)-1-A)-th configuration of the present invention, in the semiconductor light emitting device of the fifth embodiment, the first compound semiconductor layer 21, the second compound semiconductor layers 22A and 22B, the third compound semiconductor layer 43, and the fourth compound semiconductor layer 44 are composed of a III-V compound semiconductor, the substitution site of the impurity in the first compound semiconductor layer 21 is the site occupied by a group V atom, the substitution site of the impurity in the second compound semiconductor layers 22A and 22B is the site occupied by a group III atom, the substitution site of the impurity in the third compound semiconductor layer 43 and the substitution site of the impurity in the fourth compound semiconductor layer 44 are the site occupied by a group III atom.

Furthermore, when the semiconductor light emitting device of the fifth embodiment is represented based on the ((I)-2-A)-th configuration of the present invention, in the semiconductor light emitting device of the fifth embodiment, the first compound semiconductor layer 21, the second compound semiconductor layers 22A and 22B, the third compound semiconductor layer 43, and the fourth compound semiconductor layer 44 are composed of a III-V compound semiconductor, the impurity for causing the first compound semiconductor layer 21 to be the n-type as the first conductivity type is a group VI impurity, the impurity for causing the third compound semiconductor layer 43 to be the n-type as the first conductivity type is a group IV impurity.

In addition, when the semiconductor light emitting device of the fifth embodiment is represented based on the ((I)-4-A)-th configuration of the present invention, in the semiconductor light emitting device of the fifth embodiment, the impurity for causing the first compound semiconductor layer 21 to have the first conductivity type (n-type) is different from the impurity for causing the third compound semiconductor layer 43 to have the first conductivity type (n-type).

Specifically, in the semiconductor light emitting device of the fifth embodiment, the respective layers have the configuration shown in Table 1A or Table 1B shown below. The compound semiconductors of the first compound semiconductor layer 21, the second compound semiconductor layers 22A and 22B, and the current block layer 40 have wider band gaps, i.e., lower refractive indexes, compared with the compound semiconductors of the active layer 23. In the example shown in Table 1A, the third compound semiconductor layer 43 is stacked on the fourth compound semiconductor layer 44. In the example shown in Table 1B, the fourth compound semiconductor layer 44 is stacked on the third compound semiconductor layer 43. In the multilayer structures shown in Table 1A and Table 1B, and Table 2A, Table 2B, Table 3A, Table 3B, Table 4A, Table 4B, Table 5A, Table 5B, Table 6A, Table 6B, Table 7A, Table 7B, Table 8A, Table 8B, Tables 9A to 9L, Table 11A, Table 11B, Table 12A, Table 12B, Table 13A, Table 13B, Table 14A, Table 14B, Table 15A, Table 15B, Table 16A, Table 16B, Table 17A, Table 17B, Table 18A, Table 18B, and Tables 19A to 19L, which will be described later, an upper layer corresponds to a layer shown on an upper row in the table.

The active layer having the structure shown in the following table will be represented as [Active layer -A] in Table 1A, Table 1B, Table 2A, Table 2B, Table 5A, Table 5B, Table 6A, Table 6B, Table 9A, Table 9C, Table 9E, Table 9G, Table 9I, Table 9K, Table 11A, Table 11B, Table 12A, Table 12B, Table 15A, Table 15B, Table 16A, Table 16B, Table 19A, Table 19C, Table 19E, Table 19G, Table 19I, and Table 19K. In this multilayer structure, an upper layer corresponds to a layer shown on an upper row in the table.

[Active Layer -A]

Confinement layer . . . p-$Al_{0.3}Ga_{0.7}As$: Zn

Confinement layer . . . i-$Al_{0.3}Ga_{0.7}As$

Multiple quantum well structure . . .

i-$Al_{0.1}Ga_{0.9}As$ (well layer)

i-$Al_{0.3}Ga_{0.7}As$ (barrier layer), and i-$Al_{0.1}Ga_{0.9}As$ (well layer)

Confinement layer . . . i-$Al_{0.3}Ga_{0.7}As$

Confinement layer . . . n-$Al_{0.3}Ga_{0.7}As$: Se

The active layer having the structure shown in the following table will be represented as [Active layer -B] in Table 3A, Table 3B, Table 4A, Table 4B, Table 7A, Table 7B, Table 8A, Table 8B, Table 9B, Table 9D, Table 9F, Table 9H, Table 9J, Table 9L, Table 13A, Table 13B, Table 14A, Table 14B, Table 17A, Table 17B, Table 18A, Table 18B, Table 19B, Table 19D, Table 19F, Table 19H, Table 19J, and Table 19L. In this multilayer structure, an upper layer corresponds to a layer shown on an upper row in the table.

[Active Layer -B]

Confinement layer . . . n-$Al_{0.3}Ga_{0.7}As$: Se

Confinement layer . . . i-$Al_{0.3}Ga_{0.7}As$

Multiple quantum well structure . . .

i-$Al_{0.1}Ga_{0.9}As$ (well layer)

i-$Al_{0.3}Ga_{0.7}As$ (barrier layer), and i-$Al_{0.1}Ga_{0.9}As$ (well layer)

Confinement layer . . . i-$Al_{0.3}Ga_{0.7}As$

Confinement layer . . . p-$Al_{0.3}Ga_{0.7}As$: Zn

TABLE 1A (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer-A] |
| First compound semiconductor layer 21 | n-$Al_{0.4}Ga_{0.6}As$: Se |
| (Current block layer) | |
| Burying layer 31A | p-$Al_{0.47}Ga_{0.53}As$: Zn |
| Third compound semiconductor layer 43 | n-$Al_{0.47}Ga_{0.53}As$: Si |
| Fourth compound semiconductor layer 44 | p-$Al_{0.47}Ga_{0.53}As$: Zn |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.

(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.

(Note 3)
It is also possible to consider that a fifth compound semiconductor layer composed of p-$Al_{0.47}Ga_{0.53}As$: Zn is formed between the third compound semiconductor layer 43 and the burying layer 31 (the partial portion of the burying layer 31 in the vicinity of the interface with the third compound semiconductor layer 43 corresponds to this fifth compound semiconductor layer).

TABLE 1B (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer-A] |
| First compound semiconductor layer 21 | n-$Al_{0.4}Ga_{0.6}As$: Se |
| (Current block layer) | |
| Burying layer 31 | p-$Al_{0.47}Ga_{0.53}As$: Zn |
| Fourth compound semiconductor layer 44 | p-$Al_{0.47}Ga_{0.53}As$: Zn |
| Third compound semiconductor layer 43 | n-$Al_{0.47}Ga_{0.53}As$: Si |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.

(Note 2)
The burying layer 31 is formed subsequently to the fourth compound semiconductor layer 44 in a continuous manner, and a boundary does not exist between the burying layer 31 and the fourth compound semiconductor layer 44 substantially.

(Note 3)
It is also possible to consider that a fifth compound semiconductor layer composed of p-$Al_{0.47}Ga_{0.53}As$: Zn is formed between the third compound semiconductor layer 43 and the adjustment layer 30 (the partial portion of the adjustment layer 30 in the vicinity of the interface with the third compound semiconductor layer 43 corresponds to this fifth compound semiconductor layer).

The third compound semiconductor layer 43 as a part of the current block layer is composed of the {311}B crystal plane region (specifically, the (31-1)B plane and the ((II)-3-11)B plane) that extends from the side surface of the light emitting part 20, the {100} crystal plane region that extends along the major surface of the substrate 10, and the {h11}B crystal plane region (specifically, the (h1-1)B plane and the (h-11)B plane, h is an integer equal to or larger than four) that is located between the {311}B crystal plane region and the {100} crystal plane region. The {h11}B crystal plane region (h is an integer equal to or larger than four) will be referred to as a high-order crystal plane region, for convenience.

Furthermore, the fourth compound semiconductor layer 44 formed under the third compound semiconductor layer 43 is also composed of similarly to the third compound semiconductor layer 43, the {311}B crystal plane region that extends from the side surface of the light emitting part 20, the {100} crystal plane region that extends along the major surface of the substrate 10, and the high-order crystal plane region that is located between the {311}B crystal plane region and the {100} crystal plane region.

Also in the semiconductor light emitting devices of the sixth to twenty-second embodiments to be described later, the third compound semiconductor layer 43 and the fourth compound semiconductor layer 44 have the same structures as the above-described structures basically, except for the vertical positional relationship between the layers.

In [Step-120] of the first embodiment, the current block layer 40 composed of the fourth compound semiconductor layer 44 and the third compound semiconductor layer 43 is formed based on MOCVD. The fourth compound semiconductor layer 44 is composed of p-$Al_{0.47}Ga_{0.53}As$: Zn, and the third compound semiconductor layer 43 is composed of n-$Al_{0.47}Ga_{0.53}As$: Si. Specifically, the substitution site of the impurity (Si) for causing the third compound semiconductor layer 43 to have the first conductivity type (n-type) in the third compound semiconductor layer 43 is the site occupied by a group III atom. Furthermore, the substitution site of the impurity (Zn) for causing the fourth compound semiconductor layer 44 to have the second conductivity type (p-type) in the fourth compound semiconductor layer 44 is also the site occupied by a group III atom. That is, the impurity for causing the third compound semiconductor layer 43 to have the first conductivity type is such that the substitution site of the impurity in the third compound semiconductor layer 43 competes with the substitution site of the impurity in the fourth compound semiconductor layer 44 for causing the fourth compound semiconductor layer 44 to have the second conductivity type. This applies also to the fourteenth embodiment to be described later.

Therefore, when the fourth compound semiconductor layer 44 and the burying layer 31 are deposited after the deposition of the third compound semiconductor layer 43, impurity mutual diffusion between the third compound semiconductor layer 43 and the fourth compound semiconductor layer 44 of the current block layer 40 hardly occurs. In addition, impurity mutual diffusion between the current block layer 40 and the upper and lower layers in contact with the current block layer 40 also hardly occurs. This allows avoidance of the occurrence of a problem that the effect of the current block layer 40 is unstable and thus leakage current is increased due to annihilation or thinning of the current block layer 40. This applies also to the fourteenth embodiment to be described later.

Moreover, the impurity for causing the first compound semiconductor layer 21 to have the first conductivity type (n-type) is such that the substitution site of the impurity in the first compound semiconductor layer 21 (the site occupied by a group V atom) does not compete with the substitution site of the impurity in the second compound semiconductor layers 22A and 22B (the site occupied by a group III atom) for causing the second compound semiconductor layers 22A and 22B to have the second conductivity type (p-type). Thus, the pn junction control, designed through intentional impurity mutual diffusion between the first compound semiconductor layer 21 and the second compound semiconductor layers 22A and 22B, can be finely designed easily through adjustment of the concentrations and doping positions of the impurities in the respective layers. This allows enhancement in the light emission characteristic. This applies also to the fourteenth embodiment to be described later.

In the semiconductor light emitting device of the fifth embodiment, the side parts (side surfaces) of the active layer 23 formed above the underlying layer 11 are covered by the current block layer 40, whose refractive index is lower than that of the active layer 23. Furthermore, the active layer 23 is vertically sandwiched by the first compound semiconductor layer 21 and the second compound semiconductor layers 22A and 22B, whose refractive indexes are lower than that of the active layer 23. Consequently, the upper and lower regions and the side regions of the active layer 23 provide a complete light confinement structure. Moreover, above the exposed surface of the substrate 10, in the vicinity of the side surface of the active layer 23, a so-called thyristor structure is formed due to the p-n-p-n structure (the p-type burying layer 31-the n-type third compound semiconductor layer 43-the p-type fourth compound semiconductor layer 44, the p-type adjustment layer 30 (the p-type second compound semiconductor layer 22B), and the p-type second compound semiconductor layer 22A-the n-type first compound semiconductor layer 21). Therefore, current flowing above the exposed surface of the substrate 10 is prevented, which focuses the current on the active layer 23 and thus allows lower threshold current. It is also possible to regard the p-type adjustment layer 30 as the p-type fourth compound semiconductor layer 44 or the p-type second compound semiconductor layer 22B. This applies also to the sixth, ninth, tenth, fourteenth, fifteenth, eighteenth, and nineteenth embodiments to be described later.

Although FIGS. 49 and 50 or FIGS. 55 and 56 described later show the structure in which the end surfaces of the current block layer 40 are in contact with the side surfaces of the active layer 23, the end surfaces of the current block layer 40 may be in contact with the side surfaces of the second compound semiconductor layers 22A and 22B, or may be in contact with the side surfaces of the first compound semiconductor layer 21. Also with this structure, leakage current can be suppressed in practical use. However, regarding the positions of the end surfaces of the current block layer 40 in contact with the light emitting part 20, it is desirable that at least a part of the current block layer 40 be in contact with the side surface of the active layer 23. This applies also to the sixth to twenty-second embodiments to be described later.

The third compound semiconductor layer 43, which is composed of the {311}B crystal plane region that extends from the side surface of the light emitting part 20, the {100} crystal plane region that extends along the major surface of the substrate 10, and the high-order crystal plane region located between the {311}B crystal plane region and the {100} crystal plane region is formed. As a result, the third compound semiconductor layer 43 having stable (uniform) impurity concentration can be formed (stacked), which makes it easy to adjust the concentration balance with respective to the layer that is in contact with the third compound semiconductor layer 43 and has the different conductivity type. Thus, the current block layer 40 having high current block capability can be obtained. Moreover, because the third compound semiconductor layer 43 having stable impurity concentration can be formed (stacked), when the third compound semiconductor layer 43 is formed on the fourth compound semiconductor layer 44, or when the fourth compound semiconductor layer 44 is formed on the third compound semiconductor layer 43, it is possible to more surely avoid the occurrence of a problem that the effect of the current block layer 40 is unstable and thus leakage current is increased due to annihilation or thinning of the current block layer 40.

Sixth Embodiment

The sixth embodiment is a modification of the fifth embodiment, and relates to the ((I)-1-B)-th configuration of the present invention and the ((I)-2-B)-th configuration of the present invention.

Figure 8A:
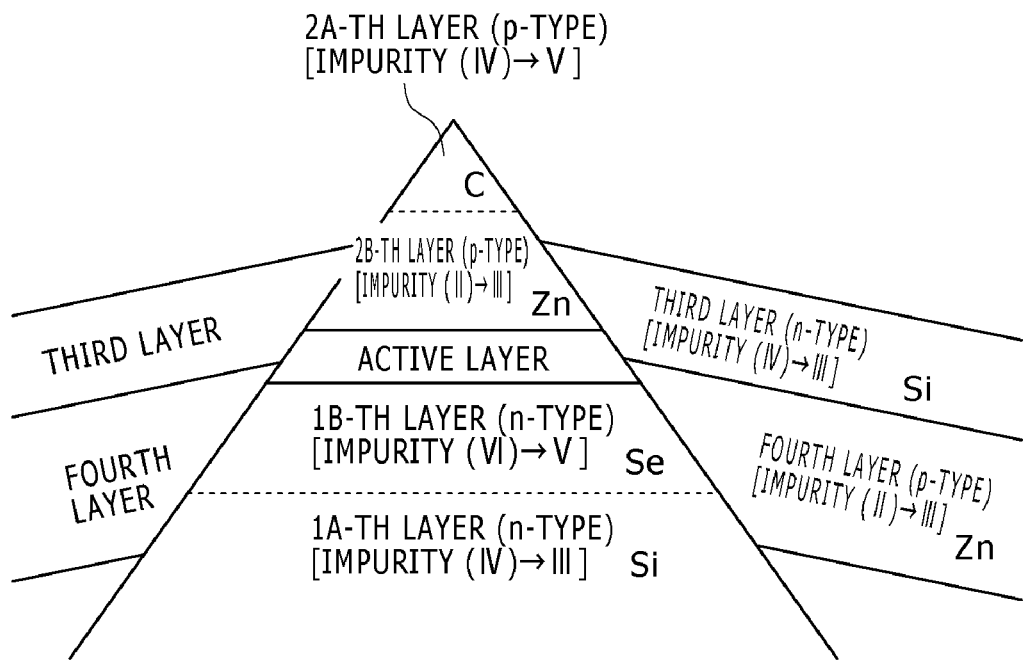
FIGS. 8A and 8B are conceptual diagrams of semiconductor light emitting devices according to a sixth embodiment and a tenth embodiment, respectively, of the present invention.

Specifically, as shown in FIG. 8A as a conceptual diagram, when the semiconductor light emitting device of the sixth embodiment is represented based on the ((I)-1-B)-th configuration of the present invention, in the semiconductor light emitting device of the sixth embodiment, a first compound semiconductor layer, a second compound semiconductor layer, a third compound semiconductor layer, and a fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, the substitution site of the impurity in the third compound semiconductor layer and the substitution site of the impurity in the fourth compound semiconductor layer are the site occupied by a group III atom.

Furthermore, when the semiconductor light emitting device of the sixth embodiment is represented based on the ((I)-2-B)-th configuration of the present invention, in the semiconductor light emitting device of the sixth embodiment, the first compound semiconductor layer, the second compound semiconductor layer, the third compound semiconductor layer, and the fourth compound semiconductor layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group IV impurity, the impurity for causing the fourth compound semiconductor layer to be the p-type as the second conductivity type is a group II impurity.

More specifically, in the semiconductor light emitting device of the sixth embodiment, the respective layers have the configuration shown in Table 2A or Table 2B shown below. In the example shown in Table 2A, the third compound semiconductor layer is stacked on the fourth compound semiconductor layer. In the example shown in Table 2B, the fourth compound semiconductor layer is stacked on the third compound semiconductor layer.

TABLE 2A

| (Configuration of light emitting part) | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer-A] |
| 1B-th compound semiconductor layer | n-$Al_{0.4}Ga_{0.6}As$: Se |
| 1A-th compound semiconductor layer (Current block layer) | n-$Al_{0.4}Ga_{0.6}As$: Si |
| Burying layer | p-$Al_{0.47}Ga_{0.53}As$: Zn |
| Third compound semiconductor layer | n-$Al_{0.47}Ga_{0.53}As$: Si |
| Fourth compound semiconductor layer | p-$Al_{0.47}Ga_{0.53}As$: Zn |
| Adjustment layer (Whole) | p-$Al_{0.47}Ga_{0.53}As$: Zn |
| Contact layer | p-GaAs: Zn (or C) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of p-$Al_{0.47}Ga_{0.53}As$: Zn is formed between the third compound semiconductor layer and the burying layer.

TABLE 2B

| (Configuration of light emitting part) | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer-A] |
| 1B-th compound semiconductor layer | n-$Al_{0.4}Ga_{0.6}As$: Se |
| 1A-th compound semiconductor layer (Current block layer) | n-$Al_{0.4}Ga_{0.6}As$: Si |
| Burying layer | p-$Al_{0.47}Ga_{0.53}As$: Zn |
| Fourth compound semiconductor layer | p-$Al_{0.47}Ga_{0.53}As$: Zn |
| Third compound semiconductor layer | n-$Al_{0.47}Ga_{0.53}As$: Si |
| Adjustment layer (Whole) | p-$Al_{0.47}Ga_{0.53}As$: Zn |
| Contact layer | p-GaAs: Zn (or C) |

(Note 1)
The adjustment layer is formed subsequently to the 2A-th compound semiconductor layer.
(Note 2)
The burying layer is formed subsequently to the fourth compound semiconductor layer in a continuous manner, and a boundary does not exist between the burying layer and the fourth compound semiconductor layer substantially.
(Note 3)
It is also possible to consider that a fifth compound semiconductor layer composed of p-$Al_{0.47}Ga_{0.53}As$: Zn is formed between the third compound semiconductor layer and the adjustment layer (the partial portion of the adjustment layer in the vicinity of the interface with the third compound semiconductor layer corresponds to this fifth compound semiconductor layer).

In the sixth embodiment, the substitution site of the impurity in the 1A-th compound semiconductor layer is the site occupied by a group III atom, and the substitution site of the impurity in the fourth compound semiconductor layer is also the site occupied by a group III atom. Furthermore, the substitution site of the impurity in the third compound semiconductor layer in contact with the fourth compound semiconductor layer is also the site occupied by a group III atom. Specifically, the impurity for causing the 1A-th compound semiconductor layer to have the first conductivity type (n-type) is such that the substitution site of the impurity in the 1A-th compound semiconductor layer (the site occupied by a group III atom) competes with the substitution site of the impurity in the fourth compound semiconductor layer (the site occupied by a group III atom) for causing the fourth compound semiconductor layer to have the second conductivity type (p-type), and competes also with the substitution site of the impurity for causing the third compound semiconductor layer in contact with the fourth compound semiconductor layer to have the first conductivity type (n-type) (the site occupied by a group III atom). Therefore, when the fourth compound semiconductor layer is deposited, impurity mutual diffusion hardly occurs between the fourth compound semiconductor layer of the current block layer and the 1A-th compound semiconductor layer, and between the fourth compound semiconductor layer and the third compound semiconductor layer. Thus, the current block layer having high reliability can be formed. The suppression of the impurity mutual diffusion in the current block layer composed of the fourth compound semiconductor layer and the third compound semiconductor layer is effective for the {311}B plane and the high-order plane. On the other hand, the suppression of the impurity mutual diffusion across the interface between the fourth compound semiconductor layer and the 1A-th compound semiconductor layer is effective for the {111}B plane interface. This applies also to the fifteenth embodiment described later.

Seventh Embodiment

The seventh embodiment is also a modification of the fifth embodiment, and relates to the ((I)-1-C)-th configuration of the present invention, the ((I)-2-C)-th configuration of the present invention, and the ((I)-4-A)-th configuration of the present invention. In the seventh embodiment and the eighth embodiment to be described later, the conductivity types are reversed from those in the fifth embodiment. That is, in the seventh embodiment and the eighth embodiment to be described later, the first conductivity type is the p-type and the second conductivity type is the n-type. The schematic partial sectional view is shown in FIGS. 6A and 6B.

Figure 9A:
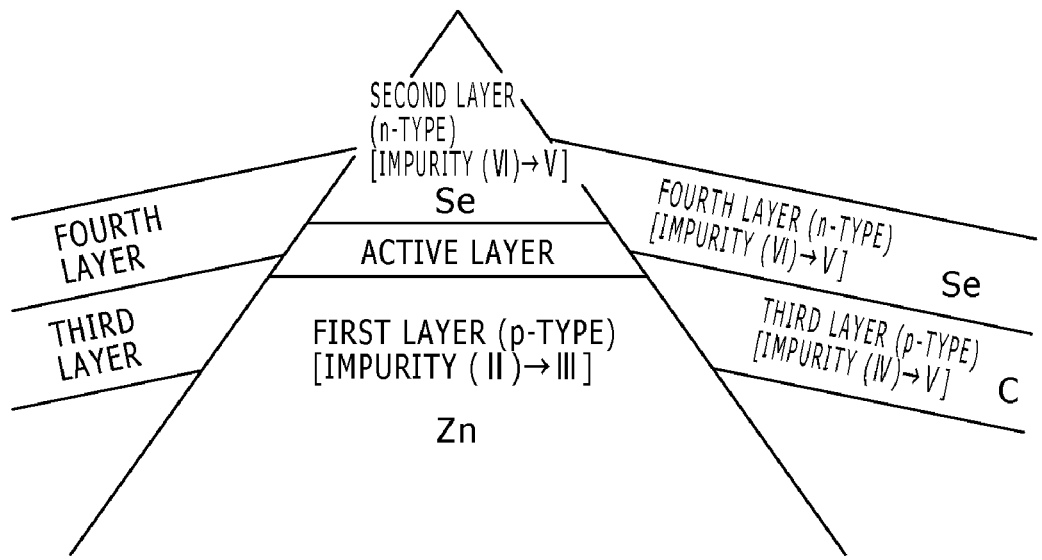
FIGS. 9A and 9B are conceptual diagrams of semiconductor light emitting devices according to a seventh embodiment and an eleventh embodiment, respectively, of the present invention.

Specifically, as shown in FIG. 9A as a conceptual diagram, when the semiconductor light emitting device of the seventh embodiment is represented based on the ((I)-1-C)-th configuration of the present invention, in the semiconductor light emitting device of the seventh embodiment, a first compound semiconductor layer 21, second compound semiconductor layers 22A and 22B, and a current block layer 40 (a third compound semiconductor layer 43 and a fourth compound semiconductor layer 44) are composed of a III-V compound semiconductor, the substitution site of the impurity in the first compound semiconductor layer 21 is the site occupied by a group III atom, the substitution site of the impurity in the second compound semiconductor layers 22A and 22B is the site occupied by a group V atom, the substitution site of the impurity in the third compound semiconductor layer 43 and the substitution site of the impurity in the fourth compound semiconductor layer 44 are the site occupied by a group V atom.

Furthermore, when the semiconductor light emitting device of the seventh embodiment is represented based on the ((I)-2-C)-th configuration of the present invention, in the semiconductor light emitting device of the seventh embodiment, the first compound semiconductor layer 21, the second compound semiconductor layers 22A and 22B, and the current block layer 40 (the third compound semiconductor layer 43 and the fourth compound semiconductor layer 44) are composed of a III-V compound semiconductor, the impurity for causing the first compound semiconductor layer 21 to be the p-type as the first conductivity type is a group II impurity, the impurity for causing the third compound semiconductor layer 43 to be the p-type as the first conductivity type is carbon (C).

Furthermore, when the semiconductor light emitting device of the seventh embodiment is represented based on the ((I)-4-A)-th configuration of the present invention, in the semiconductor light emitting device of the seventh embodiment, the impurity for causing the first compound semiconductor layer 21 to have the first conductivity type (p-type) is different from the impurity for causing the third compound semiconductor layer 43 to have the first conductivity type (p-type).

More specifically, in the semiconductor light emitting device of the seventh embodiment, the respective layers have the configuration shown in Table 3A or Table 3B shown below. In the example shown in Table 3A, the third compound semiconductor layer 43 is stacked on the fourth compound semiconductor layer 44. In the example shown in Table 3B, the fourth compound semiconductor layer 44 is stacked on the third compound semiconductor layer 43.

TABLE 3A (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer - B] |
| First compound semiconductor layer 21 (Current block layer) | p-$Al_{0.4}Ga_{0.6}As$: Zn |
| Burying layer 31A | n-$Al_{0.47}Ga_{0.53}As$: Se |
| Third compound semiconductor layer 43 | p-$Al_{0.47}Ga_{0.53}As$: C |
| Fourth compound semiconductor layer 44 | n-$Al_{0.47}Ga_{0.53}As$: Se |
| Adjustment layer 30 (Whole) | n-$Al_{0.47}Ga_{0.53}As$: Se |
| Contact layer 32 | n-GaAs: Se (or Si) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of n-$Al_{0.47}Ga_{0.53}As$: Zn is formed between the third compound semiconductor layer 43 and the burying layer 31 (the partial portion of the burying layer 31 in the vicinity of the interface with the third compound semiconductor layer 43 corresponds to this fifth compound semiconductor layer).

TABLE 3B (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer - B] |
| First compound semiconductor layer 21 (Current block layer) | p-$Al_{0.4}Ga_{0.6}As$: Zn |
| Burying layer 31 | n-$Al_{0.47}Ga_{0.53}As$: Se |
| Fourth compound semiconductor layer 44 | n-$Al_{0.47}Ga_{0.53}As$: Se |

TABLE 3B-continued

| | |
|---|---|
| Third compound semiconductor layer 43 | p-Al$_{0.47}$Ga$_{0.53}$As: C |
| Adjustment layer 30 (Whole) | n-Al$_{0.47}$Ga$_{0.53}$As: Se |
| Contact layer 32 | n-GaAs: Se (or Si) |

(Note 1)
The adjustment layer 30 is formed subsequently to the second compound semiconductor layer 22B.
(Note 2)
The burying layer 31 is formed subsequently to the fourth compound semiconductor layer 44 in a continuous manner, and a boundary does not exist between the burying layer 31 and the fourth compound semiconductor layer 44 substantially.
(Note 3)
It is also possible to consider that a fifth compound semiconductor layer composed of n-Al$_{0.47}$Ga$_{0.53}$As: Zn is formed between the third compound semiconductor layer 43 and the adjustment layer 30 (the partial portion of the adjustment layer 30 in the vicinity of the interface with the third compound semiconductor layer 43 corresponds to this fifth compound semiconductor layer).

Also in the seventh embodiment, in a step similar to [Step-130] of the first embodiment, e.g. the adjustment layer 30 and the current block layer 40 composed of the fourth compound semiconductor layer 44 and the third compound semiconductor layer 43 are sequentially formed based on MOCVD. The third compound semiconductor layer 43 is composed of p-Al$_{0.47}$Ga$_{0.53}$As: C, and the fourth compound semiconductor layer 44 is composed of n-Al$_{0.47}$Ga$_{0.53}$As: Se. Specifically, the substitution site of the impurity (C) for causing the third compound semiconductor layer 43 to have the first conductivity type (p-type) in the third compound semiconductor layer 43 is the site occupied by a group V atom. Furthermore, the substitution site of the impurity (Se) for causing the fourth compound semiconductor layer 44 to have the second conductivity type (n-type) in the fourth compound semiconductor layer 44 is also the site occupied by a group V atom. That is, the impurity for causing the third compound semiconductor layer 43 to have the first conductivity type is such that the substitution site of the impurity in the third compound semiconductor layer 43 competes with the substitution site of the impurity in the fourth compound semiconductor layer 44 for causing the fourth compound semiconductor layer 44 to have the second conductivity type. This applies also to the sixteenth embodiment described later.

Therefore, when the fourth compound semiconductor layer 44 is deposited after the deposition of the third compound semiconductor layer 43, or when the third compound semiconductor layer 43 is deposited after the deposition of the fourth compound semiconductor layer 44, impurity mutual diffusion between the third compound semiconductor layer 43 and the fourth compound semiconductor layer 44 of the current block layer 40 hardly occurs. This allows avoidance of the occurrence of a problem that the effect of the current block layer 40 is unstable and thus leakage current is increased due to annihilation or thinning of the current block layer 40. This applies also to the sixteenth embodiment described later.

Moreover, the impurity for causing the first compound semiconductor layer 21 to have the first conductivity type (p-type) is such that the substitution site of the impurity in the first compound semiconductor layer 21 (the site occupied by a group III atom) does not compete with the substitution site of the impurity in the second compound semiconductor layers 22A and 22B (the site occupied by a group V atom) for causing the second compound semiconductor layers 22A and 22B to have the second conductivity type (n-type). Thus, the pn junction control, designed through intentional impurity mutual diffusion between the first compound semiconductor layer 21 and the second compound semiconductor layers 22A and 22B, can be finely designed easily through adjustment of the concentrations and doping positions of the impurities in the respective layers. This allows enhancement in the light emission characteristic. This applies also to the sixteenth embodiment described later.

Also in the semiconductor light emitting device of the seventh embodiment, the side parts (side surfaces) of the active layer 23 formed above the underlying layer 11 are covered by the current block layer 40, whose refractive index is lower than that of the active layer 23. Furthermore, the active layer 23 is vertically sandwiched by the first compound semiconductor layer 21 and the second compound semiconductor layers 22A and 22B, whose refractive indexes are lower than that of the active layer 23. Consequently, the upper and lower regions and the side regions of the active layer 23 provide a complete light confinement structure. Moreover, above the exposed surface of the substrate 10, in the vicinity of the side surface of the active layer 23, a so-called thyristor structure is formed due to the n-p-n-p structure (the n-type burying layer 31-the p-type third compound semiconductor layer 43-the n-type fourth compound semiconductor layer 44-the n-type adjustment layer 30 (the n-type second compound semiconductor layer 22B) and the n-type second compound semiconductor layer 22A-the p-type first compound semiconductor layer 21). Therefore, current flowing above the exposed surface of the substrate 10 is prevented, which focuses the current on the active layer 23 and thus allows lower threshold current. It is also possible to regard the n-type adjustment layer 30 as the n-type fourth compound semiconductor layer 44 or the n-type second compound semiconductor layer 22B. This applies also to the eighth, eleventh, twelfth, sixteenth, seventeenth, twentieth, and twenty-first embodiments to be described later.

In the MOCVD at the time of the deposition of the third compound semiconductor layer 43, a methyl group or an ethyl group obtained through decomposition of the source gas for a group III atom may be intentionally used as the source gas for the addition of carbon (C). Alternatively, in the MOCVD at the time of the deposition of the third compound semiconductor layer 43, a CBr$_4$ or a CCl$_4$ gas may be added. This applies also to the sixteenth embodiment described later.

Eighth Embodiment

The eighth embodiment is a modification of the fifth embodiment and the seventh embodiment, and relates to the ((I)-1-D)-th configuration of the present invention and the ((I)-2-D)-th configuration of the present invention.

Figure 10A:
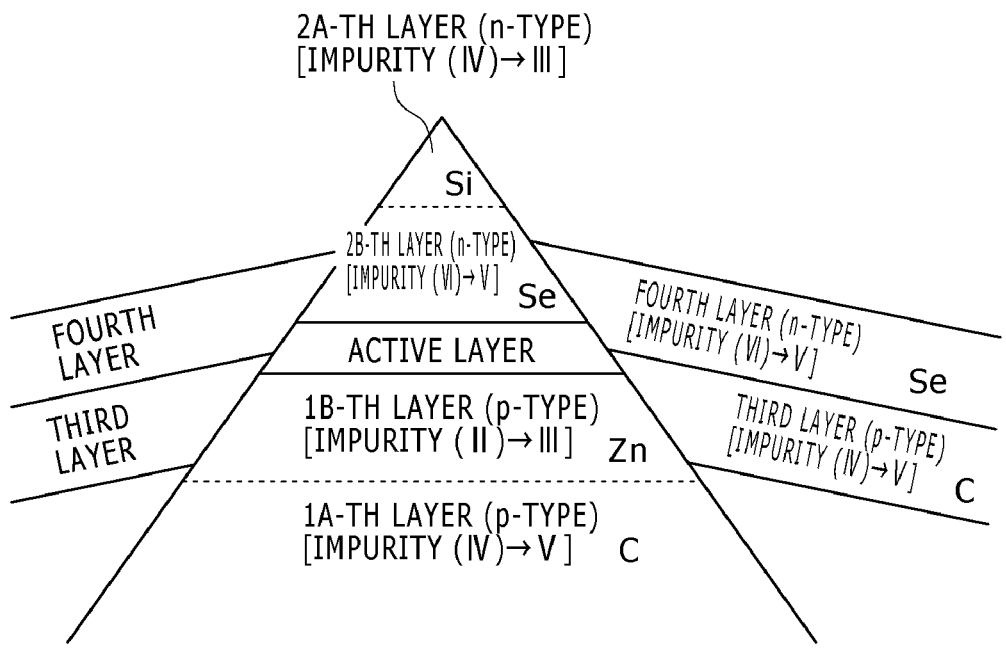
FIGS. 10A and 10B are conceptual diagrams of semiconductor light emitting devices according to an eighth embodiment and a twelfth embodiment, respectively, of the present invention.

Specifically, as shown in FIG. 10A as a conceptual diagram, when the semiconductor light emitting device of the eighth embodiment is represented based on the ((I)-1-D)-th configuration of the present invention, in the semiconductor light emitting device of the eighth embodiment, a first compound semiconductor layer, a second compound semiconductor layer, a third compound semiconductor layer, and a fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group V atom.

Furthermore, when the semiconductor light emitting device of the eighth embodiment is represented based on the ((I)-2-D)-th configuration of the present invention, in the semiconductor light emitting device of the eighth embodiment, the first compound semiconductor layer, the second compound semiconductor layer, the third compound semiconductor layer, and the fourth compound semiconductor layer, are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is carbon (C), the impurity for causing the fourth compound semiconductor layer to be the n-type as the second conductivity type is a group VI impurity.

More specifically, in the semiconductor light emitting device of the eighth embodiment, the respective layers have the configuration shown in Table 4A or Table 4B shown below. In the example shown in Table 4A, the third compound semiconductor layer is stacked on the fourth compound semiconductor layer. In the example shown in Table 4B, the fourth compound semiconductor layer is stacked on the third compound semiconductor layer.

TABLE 4A (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer - B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |

TABLE 4A-continued (Whole)

| | |
|---|---|
| Contact layer | n-GaAs: Se (or Si) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of n-$Al_{0.47}Ga_{0.53}As$: Zn is formed between the third compound semiconductor layer and the burying layer (the partial portion of the burying layer in the vicinity of the interface with the third compound semiconductor layer corresponds to this fifth compound semiconductor layer).

TABLE 4B (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer - B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Burying layer | n-$Al_{0.47}Ga_{0.53}As$: Se |
| Fourth compound semiconductor layer | n-$Al_{0.47}Ga_{0.53}As$: Se |
| Third compound semiconductor layer | p-$Al_{0.47}Ga_{0.53}As$: C |
| Adjustment layer | n-$Al_{0.47}Ga_{0.53}As$: Se |
| (Whole) | |
| Contact layer | n-GaAs: Se (or Si) |

(Note 1)
The adjustment layer is formed subsequently to the 2A-th compound semiconductor layer.
(Note 2)
The burying layer is formed subsequently to the fourth compound semiconductor layer in a continuous manner, and a boundary does not exist between the burying layer and the fourth compound semiconductor layer substantially.
(Note 3)
It is also possible to consider that a fifth compound semiconductor layer composed of n-$Al_{0.47}Ga_{0.53}As$: Zn is formed between the third compound semiconductor layer and the adjustment layer (the partial portion of the adjustment layer in the vicinity of the interface with the third compound semiconductor layer corresponds to this fifth compound semiconductor layer).

In the eighth embodiment and the seventeenth embodiment described later, if a multilayer structure that includes the fourth compound semiconductor layer as the lower layer and the third compound semiconductor layer as the upper layer as shown in Table 4B or Table 14B is formed unlike the examples shown in FIG. 10A or FIGS. 24A and 24B, the substitution site of the impurity in the 1A-th compound semiconductor layer is the site occupied by a group V atom, and the substitution site of the impurity in the fourth compound semiconductor layer is also the site occupied by a group V atom. Furthermore, the substitution site of the impurity in the third compound semiconductor layer in contact with the fourth compound semiconductor layer is also the site occupied by a group V site. That is, the impurity for causing the 1A-th compound semiconductor layer to have the first conductivity type (p-type) is such that the substitution site of the impurity in the 1A-th compound semiconductor layer (the site occupied by a group V atom) competes with the substitution site of the impurity in the fourth compound semiconductor layer (the site occupied by a group V atom) for causing the fourth compound semiconductor layer to have the second conductivity type (n-type), and competes also with the substitution site of the impurity for causing the third compound semiconductor layer in contact with the fourth compound semiconductor layer to have the first conductivity type (p-type) (the site occupied by a group V atom). Therefore, when the fourth compound semiconductor layer is deposited, impurity mutual diffusion hardly occurs between the fourth compound semiconductor layer of the current block layer and the 1A-th compound semiconductor layer, and between the fourth compound semiconductor layer and the third compound semiconductor layer. Thus, the current block layer having high reliability can be formed. This allows more effective avoidance of the occurrence of a problem that the effect of the current block layer 40 is unstable and thus leakage current is increased due to annihilation or thinning of the current block layer 40.

Ninth Embodiment

The ninth embodiment relates to the ((I)-1-a)-th configuration of the present invention, the ((I)-3-a)-th configuration of the present invention, and the ((I)-4-a)-th configuration of the present invention.

Figure 7B:
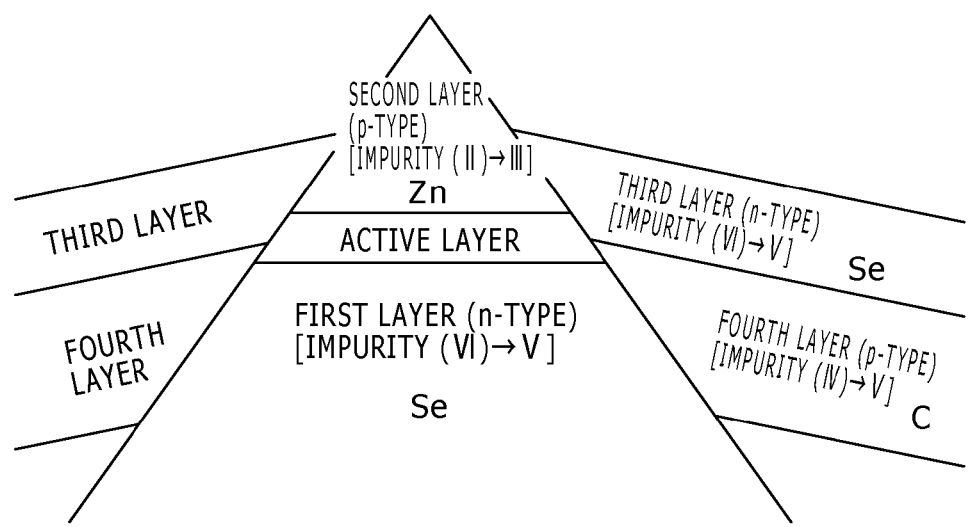

Specifically, as shown in FIG. 7B as a conceptual diagram, when the semiconductor light emitting device of the ninth embodiment is represented based on the ((I)-1-a)-th configuration of the present invention, in the semiconductor light emitting device of the ninth embodiment, a first compound semiconductor layer 21, second compound semiconductor layers 22A and 22B, and a current block layer 40 (a fourth compound semiconductor layer 44 and a third compound semiconductor layer 43) are composed of a III-V compound semiconductor, the substitution site of the impurity in the first compound semiconductor layer 21 is the site occupied by a group V atom, the substitution site of the impurity in the second compound semiconductor layers 22A and 22B is the site occupied by a group III atom, the substitution site of the impurity in the third compound semiconductor layer 43 and the substitution site of the impurity in the fourth compound semiconductor layer 44 are the site occupied by a group V atom. Schematic partial sectional views of the semiconductor light emitting device of the ninth embodiment are the same as those shown in FIGS. 1A and 1B.

When the semiconductor light emitting device of the ninth embodiment is represented based on the ((I)-3-a)-th configuration of the present invention, in the semiconductor light emitting device of the ninth embodiment, the first compound semiconductor layer 21, the second compound semiconductor layers 22A and 22B, and the current block layer 40 (the fourth compound semiconductor layer 44 and the third compound semiconductor layer 43) are composed of a III-V compound semiconductor, the impurity for causing the second compound semiconductor layers 22A and 22B to be the p-type as the second conductivity type is a group II impurity, the impurity for causing the fourth compound semiconductor layer 44 to be the p-type as the second conductivity type is carbon (C).

Furthermore, when the semiconductor light emitting device of the ninth embodiment is represented based on the ((I)-4-a)-th configuration of the present invention, in the semiconductor light emitting device of the ninth embodiment, the impurity for causing the second compound semiconductor layers 22A and 22B to have the second conductivity type (p-type) is different from the impurity for causing the fourth compound semiconductor layer 44 to have the second conductivity type (p-type).

More specifically, in the semiconductor light emitting device of the ninth embodiment, the respective layers have the configuration shown in Table 5A or Table 5B shown below. In the example shown in Table 5A, the third compound semiconductor layer 43 is stacked on the fourth compound semiconductor layer 44. In the example shown in Table 5B, the fourth compound semiconductor layer 44 is stacked on the third compound semiconductor layer 43.

TABLE 5A (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer - A] |
| First compound semiconductor layer 21 | n-$Al_{0.4}Ga_{0.6}As$: Se |
| (Current block layer) | |
| Burying layer 31 | p-$Al_{0.47}Ga_{0.53}As$: Zn |
| Third compound semiconductor layer 43 | n-$Al_{0.47}Ga_{0.53}As$: Se |
| Fourth compound semiconductor layer 44 | p-$Al_{0.47}Ga_{0.53}As$: C |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of p-$Al_{0.47}Ga_{0.53}As$: Zn is formed between the third compound semiconductor layer 43 and the burying layer 31 (the partial portion of the burying layer 31 in the vicinity of the interface with the third compound semiconductor layer 43 corresponds to this fifth compound semiconductor layer).

TABLE 5B (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer - A] |
| First compound semiconductor layer 21 | n-$Al_{0.4}Ga_{0.6}As$: Se |
| (Current block layer) | |
| Burying layer 31 | p-$Al_{0.47}Ga_{0.53}As$: Zn |
| Fourth compound semiconductor layer 44 | p-$Al_{0.47}Ga_{0.53}As$: C |
| Third compound semiconductor layer 43 | n-$Al_{0.47}Ga_{0.53}As$: Se |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The burying layer 31 is formed subsequently to the fourth compound semiconductor layer 44 in a continuous manner, and a boundary does not exist between the burying layer 31 and the fourth compound semiconductor layer 44 substantially.
(Note 3)
It is also possible to consider that a fifth compound semiconductor layer composed of p-$Al_{0.47}Ga_{0.53}As$: Zn is formed between the third compound semiconductor layer 43 and the adjustment layer 30 (the partial portion of the adjustment layer 30 in the vicinity of the interface with the third compound semiconductor layer 43 corresponds to this fifth compound semiconductor layer).

Also in the ninth embodiment, in a step similar to of the first embodiment, e.g. the adjustment layer 30 and the current block layer 40 composed of the fourth compound semiconductor layer 44 and the third compound semiconductor layer 43 are sequentially formed based on MOCVD. The fourth compound semiconductor layer 44 is composed of p-$Al_{0.47}Ga_{0.53}As$: C, and the third compound semiconductor layer 43 is composed of n-$Al_{0.47}Ga_{0.53}As$: Se. Specifically, the substitution site of the impurity (Se) for causing the third compound semiconductor layer 43 to have the first conductivity type (n-type) in the third compound semiconductor layer 43 is the site occupied by a group V atom. Furthermore, the substitution site of the impurity (C) for causing the fourth compound semiconductor layer 44 to have the second conductivity type (p-type) in the fourth compound semiconductor layer 44 is also the site occupied by a group V atom. That is, the impurity for causing the third compound semiconductor layer 43 to have the first conductivity type is such that the substitution site of the impurity in the third compound semiconductor layer 43 competes with the substitution site of the impurity in the fourth compound semiconductor layer for causing the fourth compound semiconductor layer 44 to have the second conductivity type. This applies also to the eighteenth embodiment described later.

Therefore, when the third compound semiconductor layer 43 is deposited after the deposition of the fourth compound semiconductor layer 44, or when the fourth compound semiconductor layer 44 is deposited after the deposition of the third compound semiconductor layer 43, impurity mutual diffusion between the third compound semiconductor layer 43 and the fourth compound semiconductor layer 44 of the current block layer 40 hardly occurs. This allows avoidance of the occurrence of a problem that the effect of the current block layer 40 is unstable and thus leakage current is increased due to annihilation or thinning of the current block layer 40. This applies also to the eighteenth embodiment described later.

Moreover, the impurity for causing the first compound semiconductor layer 21 to have the first conductivity type (n-type) is such that the substitution site of the impurity in the first compound semiconductor layer 21 (the site occupied by a group V atom) does not compete with the substitution site of the impurity in the second compound semiconductor layers 22A and 22B (the site occupied by a group III atom) for causing the second compound semiconductor layers 22A and 22B to have the second conductivity type (p-type). Thus, the pn junction control, designed through intentional impurity mutual diffusion between the first compound semiconductor layer 21 and the second compound semiconductor layers 22A and 22B, can be finely designed easily through adjustment of the concentrations and doping positions of the impurities in the respective layers. This allows enhancement in the light emission characteristic. This applies also to the eighteenth embodiment described later.

Also in the semiconductor light emitting device of the ninth embodiment, the side parts (side surfaces) of the active layer 23 formed above the underlying layer 11 are covered by the current block layer 40, whose refractive index is lower than that of the active layer 23. Furthermore, the active layer 23 is vertically sandwiched by the first compound semiconductor layer 21 and the second compound semiconductor layers 22A and 22B, whose refractive indexes are lower than that of the active layer 23. Consequently, the upper and lower regions and the side regions of the active layer 23 provide a complete light confinement structure. Moreover, above the exposed surface of the substrate 10, in the vicinity of the side surface of the active layer 23, a so-called thyristor structure is formed due to the p-n-p-n structure (the p-type burying layer 31-the n-type third compound semiconductor layer 43-the p-type fourth compound semiconductor layer 44, the p-type adjustment layer 30 (the p-type second compound semiconductor layer 22B), and the p-type second compound semiconductor layer 22A-the n-type first compound semiconductor layer 21). Therefore, current flowing above the exposed surface of the substrate 10 is prevented, which focuses the current on the active layer 23 and thus allows lower threshold current. This applies also to the eighteenth embodiment described later.

Tenth Embodiment

The tenth embodiment is a modification of the ninth embodiment, and relates to the ((I)-1-b)-th configuration of the present invention and the ((I)-3-b)-th configuration of the present invention.

Figure 8B:
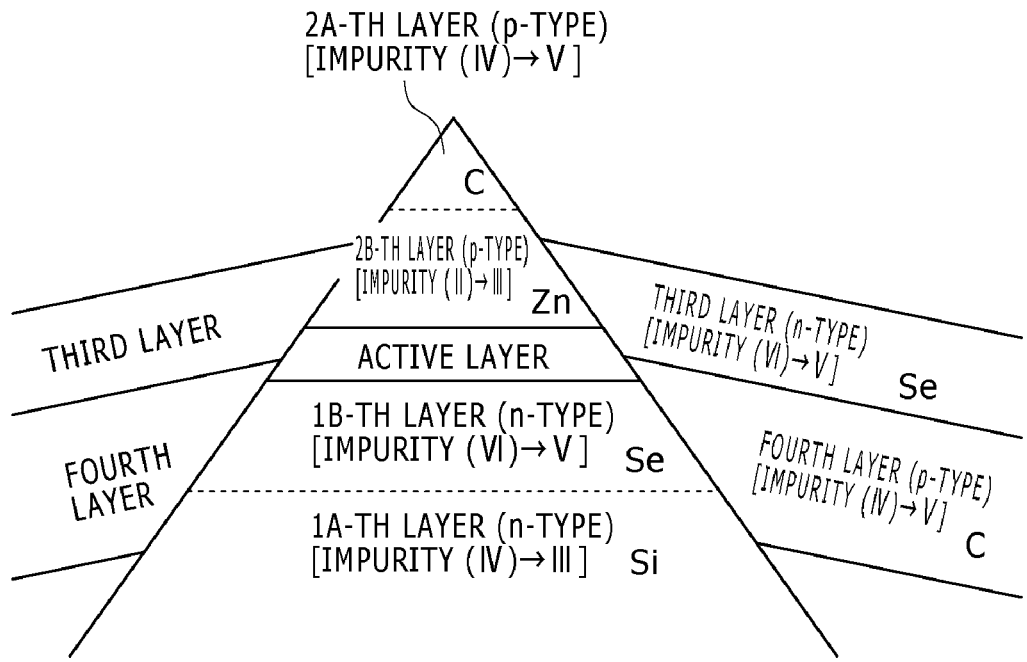

Specifically, as shown in FIG. 8B as a conceptual diagram, when the semiconductor light emitting device of the tenth embodiment is represented based on the ((I)-1-b)-th configuration of the present invention, in the semiconductor light emitting device of the tenth embodiment, a first compound semiconductor layer, a second compound semiconductor layer, a third compound semiconductor layer, and a fourth compound semiconductor layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, the substitution site of the impurity in the third compound semiconductor layer and the substitution site of the impurity in the fourth compound semiconductor layer are the site occupied by a group V atom.

Furthermore, when the semiconductor light emitting device of the tenth embodiment is represented based on the ((I)-3-b)-th configuration of the present invention, in the semiconductor light emitting device of the tenth embodiment, the first compound semiconductor layer, the second compound semiconductor layer, the third compound semiconductor layer, and the fourth compound semiconductor layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group VI impurity, the impurity for causing the fourth compound semiconductor layer to be the p-type as the second conductivity type is carbon (C).

More specifically, in the semiconductor light emitting device of the tenth embodiment, the respective layers have the configuration shown in Table 6A or Table 6B shown below. In the example shown in Table 6A, the third compound semiconductor layer is stacked on the fourth compound semiconductor layer. In the example shown in Table 6B, the fourth compound semiconductor layer is stacked on the third compound semiconductor layer.

TABLE 6A (Configuration of light emitting part)

| | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer - A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer | p-$Al_{0.47}Ga_{0.53}As$: C |
| (Whole) | |
| Contact layer | p-GaAs: C (or Zn) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of p-$Al_{0.47}Ga_{0.53}As$: Zn is formed between the third compound semiconductor layer and the burying layer.

TABLE 6B (Configuration of light emitting part)

| | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer - A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Burying layer | p-$Al_{0.47}Ga_{0.53}As$: C |
| Fourth compound semiconductor layer | p-$Al_{0.47}Ga_{0.53}As$: C |
| Third compound semiconductor layer | n-$Al_{0.47}Ga_{0.53}As$: Se |
| Adjustment layer | p-$Al_{0.47}Ga_{0.53}As$: C |
| (Whole) | |
| Contact layer | p-GaAs: C (or Zn) |

(Note 1)
The adjustment layer is formed subsequently to the 2A-th compound semiconductor layer.
(Note 2)
The burying layer is formed subsequently to the fourth compound semiconductor layer in a continuous manner, and a boundary does not exist between the burying layer and the fourth compound semiconductor layer substantially.
(Note 3)
It is also possible to consider that a fifth compound semiconductor layer composed of p-$Al_{0.47}Ga_{0.53}As$: Zn is formed between the third compound semiconductor layer and the adjustment layer (the partial portion of the adjustment layer in the vicinity of the interface with the third compound semiconductor layer corresponds to this fifth compound semiconductor layer).

Eleventh Embodiment

The eleventh embodiment is also a modification of the ninth embodiment, and relates to the ((I)-1-c)-th configuration of the present invention, the ((I)-3-c)-th configuration of the present invention, and the ((I)-4-a)-th configuration of the present invention. In the eleventh embodiment and the twelfth embodiment to be described later, the conductivity types are reversed from those in the ninth embodiment. That is, in the eleventh embodiment and the twelfth embodiment to be described later, the first conductivity type is the p-type and the second conductivity type is the n-type.

Figure 9B:
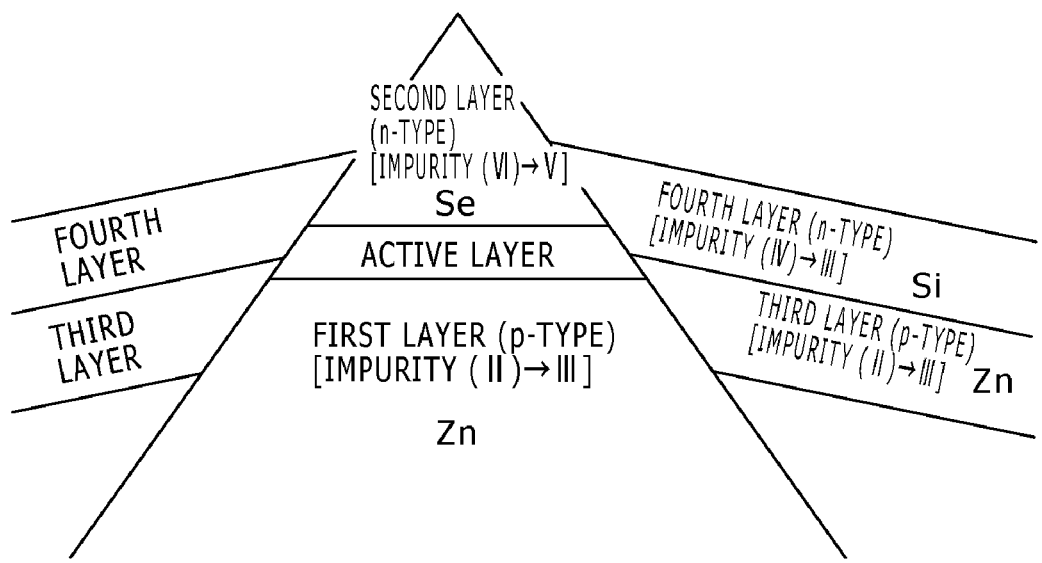

Specifically, as shown in FIG. 9B as a conceptual diagram, when the semiconductor light emitting device of the eleventh embodiment is represented based on the ((I)-1-c)-th configuration of the present invention, in the semiconductor light emitting device of the eleventh embodiment, a first compound semiconductor layer 21, second compound semiconductor layers 22A and 22B, and a current block layer 40 (a third compound semiconductor layer 43 and a fourth compound semiconductor layer 44) are composed of a III-V compound semiconductor, the substitution site of the impurity in the first compound semiconductor layer 21 is the site occupied by a group III atom, the substitution site of the impurity in the second compound semiconductor layers 22A and 22B is the site occupied by a group V atom, the substitution site of the impurity in the third compound semiconductor layer 43 and the substitution site of the impurity in the fourth compound semiconductor layer 44 are the site occupied by a group III atom. Schematic partial sectional views of the semiconductor light emitting device of the eleventh embodiment are the same as those shown in FIGS. 6A and 6B.

Furthermore, when the semiconductor light emitting device of the eleventh embodiment is represented based on the ((I)-3-c)-th configuration of the present invention, in the semiconductor light emitting device of the eleventh embodiment, the first compound semiconductor layer 21, the second compound semiconductor layers 22A and 22B, and the current block layer 40 (the third compound semiconductor layer 43 and the fourth compound semiconductor layer 44) are composed of a III-V compound semiconductor, the impurity for causing the second compound semiconductor layers 22A and 22B to be the n-type as the second conductivity type is a group VI impurity, the impurity for causing the fourth compound semiconductor layer 44 to be the n-type as the second conductivity type is a group IV impurity.

Furthermore, when the semiconductor light emitting device of the eleventh embodiment is represented based on the ((I)-4-a)-th configuration of the present invention, in the semiconductor light emitting device of the eleventh embodiment, the impurity for causing the second compound semiconductor layers 22A and 22B to have the second conductivity type (n-type) is different from the impurity for causing the fourth compound semiconductor layer 44 to have the second conductivity type (n-type).

More specifically, in the semiconductor light emitting device of the eleventh embodiment, the respective layers have the configuration shown in Table 7A or Table 7B shown below. In the example shown in Table 7A, the third compound semiconductor layer 43 is stacked on the fourth compound semiconductor layer 44. In the example shown in Table 7B, the fourth compound semiconductor layer 44 is stacked on the third compound semiconductor layer 43.

TABLE 7A (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer - B] |
| First compound semiconductor layer 21 | p-$Al_{0.4}Ga_{0.6}As$: Zn |
| (Current block layer) | |
| Burying layer 31 | n-$Al_{0.47}Ga_{0.53}As$: Si |
| Third compound semiconductor layer 43 | p-$Al_{0.47}Ga_{0.53}As$: Zn |

TABLE 7A-continued

| | |
|---|---|
| Fourth compound semiconductor layer 44 | n-$Al_{0.47}Ga_{0.53}As$: Si |
| Adjustment layer 30 | n-$Al_{0.47}Ga_{0.53}As$: Si |
| (Whole) | |
| Contact layer 32 | n-GaAs: Si (or Se) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of n-$Al_{0.47}Ga_{0.53}As$: Zn is formed between the third compound semiconductor layer 43 and the burying layer 31 (the partial portion of the burying layer 31 in the vicinity of the interface with the third compound semiconductor layer 43 corresponds to this fifth compound semiconductor layer).

TABLE 7B (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer - B] |
| First compound semiconductor layer 21 | p-$Al_{0.4}Ga_{0.6}As$: Zn |
| (Current block layer) | |
| Burying layer 31 | n-$Al_{0.47}Ga_{0.53}As$: Si |
| Fourth compound semiconductor layer 44 | n-$Al_{0.47}Ga_{0.53}As$: Si |
| Third compound semiconductor layer 43 | p-$Al_{0.47}Ga_{0.53}As$: Zn |
| Adjustment layer 30 | n-$Al_{0.47}Ga_{0.53}As$: Si |
| (Whole) | |
| Contact layer 32 | n-GaAs: Si (or Se) |

(Note 1)
The adjustment layer 30 is formed subsequently to the second compound semiconductor layer 22B.
(Note 2)
The burying layer 31 is formed subsequently to the fourth compound semiconductor layer 44 in a continuous manner, and a boundary does not exist between the burying layer 31 and the fourth compound semiconductor layer 44 substantially.
(Note 3)
It is also possible to consider that a fifth compound semiconductor layer composed of n-$Al_{0.47}Ga_{0.53}As$: Zn is formed between the third compound semiconductor layer 43 and the adjustment layer 30 (the partial portion of the adjustment layer 30 in the vicinity of the interface with the third compound semiconductor layer 43 corresponds to this fifth compound semiconductor layer).

Also in the eleventh embodiment, in a step similar to [Step-130] of the first embodiment, e.g. the adjustment layer 30 and the current block layer 40 composed of the fourth compound semiconductor layer 44 and the third compound semiconductor layer 43 are sequentially formed based on MOCVD. The third compound semiconductor layer 43 is composed of p-$Al_{0.47}Ga_{0.53}As$: Zn, and the fourth compound semiconductor layer 44 is composed of n-$Al_{0.47}Ga_{0.53}As$: Si. Specifically, the substitution site of the impurity (Zn) for causing the third compound semiconductor layer 43 to have the first conductivity type (p-type) in the third compound semiconductor layer 43 is the site occupied by a group III atom. Furthermore, the substitution site of the impurity (Si) for causing the fourth compound semiconductor layer 44 to have the second conductivity type (n-type) in the fourth compound semiconductor layer 44 is also the site occupied by a group III atom. That is, the impurity for causing the third compound semiconductor layer 43 to have the first conductivity type is such that the substitution site of the impurity in the third compound semiconductor layer 43 competes with the substitution site of the impurity in the fourth compound semiconductor layer for causing the fourth compound semiconductor layer 44 to have the second conductivity type. This applies also to the twentieth embodiment described later.

Therefore, when the fourth compound semiconductor layer 44 is deposited after the deposition of the third compound semiconductor layer 43, or when the third compound semiconductor layer 43 is deposited after the deposition of the fourth compound semiconductor layer 44, impurity mutual diffusion between the third compound semiconductor layer 43 and the fourth compound semiconductor layer 44 of the current block layer 40 hardly occurs. This allows avoidance of the occurrence of a problem that the effect of the current block layer 40 is unstable and thus leakage current is increased due to annihilation or thinning of the current block layer 40. This applies also to the twentieth embodiment described later.

Moreover, the impurity for causing the first compound semiconductor layer 21 to have the first conductivity type (p-type) is such that the substitution site of the impurity in the first compound semiconductor layer 21 (the site occupied by a group III atom) does not compete with the substitution site of the impurity in the second compound semiconductor layers 22A and 22B (the site occupied by a group V atom) for causing the second compound semiconductor layers 22A and 22B to have the second conductivity type (n-type). Thus, the pn junction control, designed through intentional impurity mutual diffusion between the first compound semiconductor layer 21 and the second compound semiconductor layers 22A and 22B, can be finely designed easily through adjustment of the concentrations and doping positions of the impurities in the respective layers. This allows enhancement in the light emission characteristic. This applies also to the twentieth embodiment described later.

Also in the semiconductor light emitting device of the eleventh embodiment, the side parts (side surfaces) of the active layer 23 formed above the underlying layer 11 are covered by the current block layer 40, whose refractive index is lower than that of the active layer 23. Furthermore, the active layer 23 is vertically sandwiched by the first compound semiconductor layer 21 and the second compound semiconductor layers 22A and 22B, whose refractive indexes are lower than that of the active layer 23. Consequently, the upper and lower regions and the side regions of the active layer 23 provide a complete light confinement structure. Moreover, above the exposed surface of the substrate 10, in the vicinity of the side surface of the active layer 23, a so-called thyristor structure is formed due to the n-p-n-p structure (the n-type burying layer 31-the p-type third compound semiconductor layer 43-the n-type fourth compound semiconductor layer 44-the n-type adjustment layer 30 (the n-type second compound semiconductor layer 22B) and the n-type second compound semiconductor layer 22A-the p-type first compound semiconductor layer 21). Therefore, current flowing above the exposed surface of the substrate 10 is prevented, which focuses the current on the active layer 23 and thus allows lower threshold current. This applies also to the twentieth embodiment described later.

The third compound semiconductor layer 43, which is composed of the {311}B crystal plane region that extends from the side surface of the light emitting part 20, the {100} crystal plane region that extends along the major surface of the substrate 10, and the high-order crystal plane region located between the {311}B crystal plane region and the {100} crystal plane region is formed. As a result, the third compound semiconductor layer 43 having stable (uniform) impurity concentration can be formed (stacked), which makes it easy to adjust the concentration balance with respective to the layer that is in contact with the third compound semiconductor layer 43 and has the different conductivity type. Thus, the current block layer 40 having high current block capability can be obtained. Moreover, because the third compound semiconductor layer 43 having stable impurity concentration can be formed (stacked), when the fourth compound semiconductor layer 44 is formed on the third compound semiconductor layer 43, or when the third compound semiconductor layer 43 is formed on the fourth compound semiconductor layer 44, it is possible to more surely avoid the occurrence of a problem that the effect of the current block layer 40 is unstable and thus leakage current is increased due to annihilation or thinning of the current block layer 40. This applies also to the twentieth embodiment described later.

Twelfth Embodiment

The twelfth embodiment is a modification of the ninth embodiment and the eleventh embodiment, and relates to the ((I)-1-d)-th configuration of the present invention and the ((I)-3-d)-th configuration of the present invention.

Figure 10B:
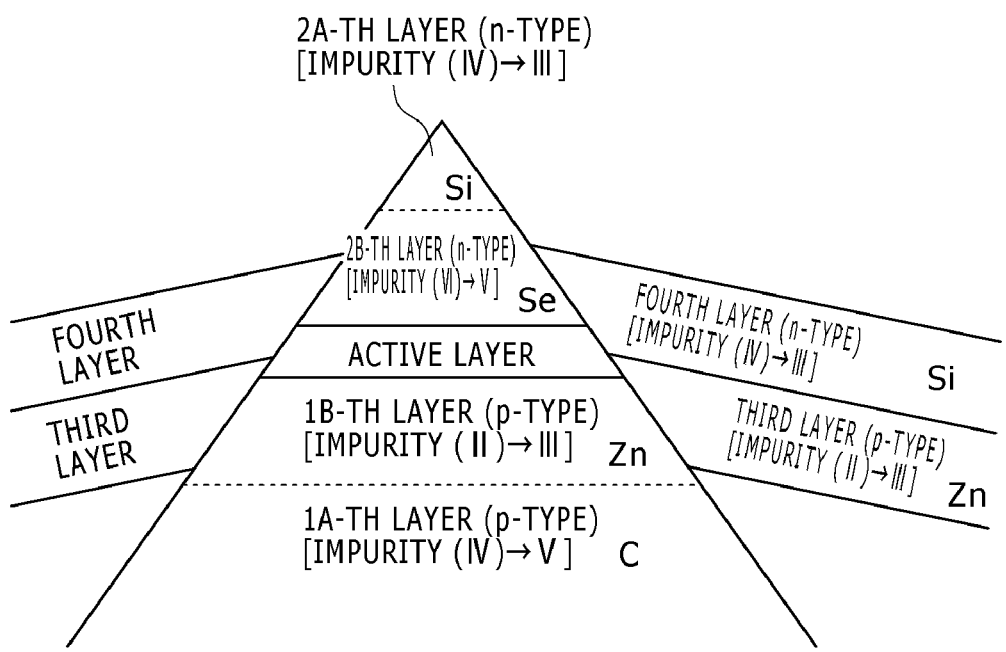

Specifically, as shown in FIG. 10B as a conceptual diagram, when the semiconductor light emitting device of the twelfth embodiment is represented based on the ((I)-1-d)-th configuration of the present invention, in the semiconductor light emitting device of the twelfth embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group III atom.

Furthermore, when the semiconductor light emitting device of the twelfth embodiment is represented based on the ((I)-3-d)-th configuration of the present invention, in the semiconductor light emitting device of the twelfth embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is a group II impurity, the impurity for causing the fourth compound semiconductor layer to be the n-type as the second conductivity type is a group IV impurity.

More specifically, in the semiconductor light emitting device of the twelfth embodiment, the respective layers have the configuration shown in Table 8A or Table 8B shown below. In the example shown in Table 8A, the third compound semiconductor layer is stacked on the fourth compound semiconductor layer. In the example shown in Table 8B, the fourth compound semiconductor layer is stacked on the third compound semiconductor layer.

TABLE 8A (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer - B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Burying layer | n-$Al_{0.47}Ga_{0.53}As$: Si |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Si |
| (Whole) | |
| Contact layer | n-GaAs: Si (or Se) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of n-$Al_{0.47}Ga_{0.53}As$: Zn is formed between the third compound semiconductor layer and the burying layer (the partial portion of the burying layer in the vicinity of the interface with the third compound semiconductor layer corresponds to this fifth compound semiconductor layer).

TABLE 8B (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer - B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Burying layer | n-$Al_{0.47}Ga_{0.53}As$: Si |
| Fourth compound semiconductor layer | n-$Al_{0.47}Ga_{0.53}As$: Si |
| Third compound semiconductor layer | p-$Al_{0.47}Ga_{0.53}As$: Zn |
| Adjustment layer | n-$Al_{0.47}Ga_{0.53}As$: Si |

TABLE 8B-continued (Whole)

| | |
|---|---|
| Contact layer | n-GaAs: Si (or Se) |

(Note 1)
The adjustment layer is formed subsequently to the 2A-th compound semiconductor layer.
(Note 2)
The burying layer is formed subsequently to the fourth compound semiconductor layer in a continuous manner, and a boundary does not exist between the burying layer and the fourth compound semiconductor layer substantially.
(Note 3)
It is also possible to consider that a fifth compound semiconductor layer composed of n-$Al_{0.47}Ga_{0.53}As$: Zn is formed between the third compound semiconductor layer and the adjustment layer (the partial portion of the adjustment layer in the vicinity of the interface with the third compound semiconductor layer corresponds to this fifth compound semiconductor layer).

Thirteenth Embodiment

Figure 11A:
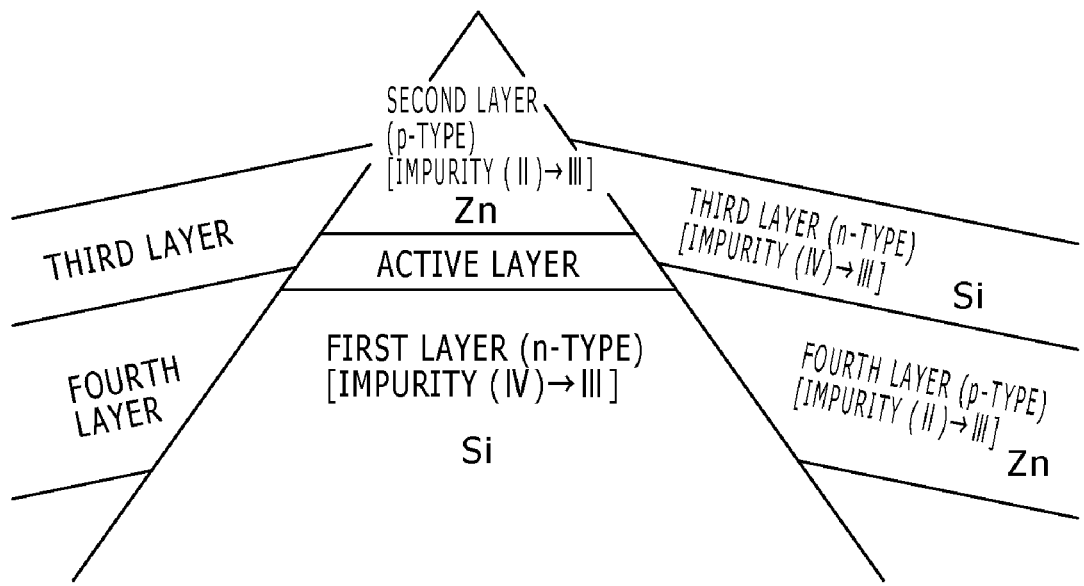
FIGS. 11A to 20B are conceptual diagrams of a semiconductor light emitting device according to a thirteenth embodiment of the present invention.

The thirteenth embodiment relates to the semiconductor light emitting device according to the ((I)-5)-th configuration (specifically, the ((I)-5-A-1)-th configuration) of the present invention. As shown in FIG. 11A as a conceptual diagram, in FIG. 1A as a schematic partial sectional view, and in FIG. 1B as an enlarged schematic partial sectional view, the semiconductor light emitting device of the thirteenth embodiment includes (A) a light emitting part 20 formed of a multilayer structure arising from sequential stacking of a first compound semiconductor layer 21 of a first conductivity type (n-type, in the thirteenth embodiment), an active layer 23, and a second compound semiconductor layer 22 of a second conductivity type (p-type, in the thirteenth embodiment), and (B) a current block layer 40 provided in contact with the side surface of the light emitting part 20.

The current block layer 40 is formed of a multilayer structure arising from sequential stacking of at least a fourth compound semiconductor layer 44 of the second conductivity type and a third compound semiconductor layer 43 of the first conductivity type. The impurity for causing the fourth compound semiconductor layer 44 to have the second conductivity type is such that the substitution site of the impurity in the fourth compound semiconductor layer 44 competes with the substitution site of the impurity in the third compound semiconductor layer 43 for causing the third compound semiconductor layer 43 to have the first conductivity type, and competes with the substitution site of the impurity in the first compound semiconductor layer 21 for causing the first compound semiconductor layer 21 to have the first conductivity type. Furthermore, the impurity for causing the second compound semiconductor layer 22 to have the second conductivity type is such that the substitution site of the impurity in the second compound semiconductor layer 22 competes with the substitution site of the impurity in the third compound semiconductor layer 43 for causing the third compound semiconductor layer 43 to have the first conductivity type. In addition, when a bypass channel that passes through the first compound semiconductor layer 21, the current block layer 40, and the second compound semiconductor layer 22 is assumed, at least three pn junction interfaces formed of the interfaces between the respective compound semiconductor layers exist in the bypass channel.

The fourth compound semiconductor layer 44 is in contact with the side surface of the first compound semiconductor layer 21, and the third compound semiconductor layer 43 is in contact with the side surface of the second compound semiconductor layer 22. Specifically, the bypass channel is composed of the first compound semiconductor layer 21, the fourth compound semiconductor layer 44, the third compound semiconductor layer 43, and the second compound semiconductor layer 22. The pn junction interfaces are formed of the following three interfaces: the interface between the side surface of the first compound semiconductor layer 21 and the fourth compound semiconductor layer 44; the interface between the fourth compound semiconductor layer 44 and the third compound semiconductor layer 43; and the interface between the third compound semiconductor layer 43 and the side surface of the second compound semiconductor layer 22.

Also in the semiconductor light emitting device of the thirteenth embodiment, the first compound semiconductor layer 21, the second compound semiconductor layer 22, the fourth compound semiconductor layer 44, and the third compound semiconductor layer 43 are composed of a III-V compound semiconductor. Furthermore, as described later, a 1A-th compound semiconductor layer 21A, a 1B-th compound semiconductor layer 21B, the second compound semiconductor layer 22, the fourth compound semiconductor layer 44, and the third compound semiconductor layer 43 are composed of a III-V compound semiconductor. In addition, the first compound semiconductor layer 21, a 2A-th compound semiconductor layer 22A, a 2B-th compound semiconductor layer 22B, the fourth compound semiconductor layer 44, and the third compound semiconductor layer 43 are composed of a III-V compound semiconductor.

In the thirteenth embodiment, the substitution site of the impurity in the first compound semiconductor layer 21, the substitution site of the impurity in the second compound semiconductor layer 22, the substitution site of the impurity in the fourth compound semiconductor layer 44, and the substitution site of the impurity in the third compound semiconductor layer 43 are the site occupied by a group III atom. The impurity for causing the first compound semiconductor layer 21 and the third compound semiconductor layer 43 to be the n-type as the first conductivity type is a group IV impurity (specifically, silicon, Si). The impurity for causing the second compound semiconductor layer 22 and the fourth compound semiconductor layer 44 to be the p-type as the second conductivity type is a group II impurity (specifically, zinc, Zn).

More specifically, in the semiconductor light emitting device of the thirteenth embodiment, the respective layers have the configuration shown in Table 9A shown below.

TABLE 9A

| (Configuration of light emitting part) | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer -A] |
| First compound semiconductor layer 21 | n-$Al_{0.4}Ga_{0.6}As$: Si |
| (Current block layer) | |
| Burying layer 31 | p-$Al_{0.47}Ga_{0.53}As$: Zn |
| Third compound semiconductor layer 43 | n-$Al_{0.47}Ga_{0.53}As$: Si |
| Fourth compound semiconductor layer 44 | p-$Al_{0.47}Ga_{0.53}As$: Zn |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the adjustment layer 30 and the fourth compound semiconductor layer 44 substantially.

In the example shown in FIG. 1B, the third compound semiconductor layer 43 is formed on the fourth compound semiconductor layer 44. The pn junction interface between the third compound semiconductor layer 43 (n-type) and the fourth compound semiconductor layer 44 (p-type) thereunder extends along the {311}B crystal plane, and the end part thereof is in contact with the light emitting part 20 (in particular, the side surface of the active layer 23). This forms two new junction interfaces. Specifically, a current path formed of the pnpn junction structure including the following junction interfaces is formed: the pn junction interface between the second compound semiconductor layers 22A and 22B and the third compound semiconductor layer 43; the np junction interface between the third compound semiconductor layer 43 and the fourth compound semiconductor layer 44; and the pn junction interface between the fourth compound semiconductor layer 44 and the first compound semiconductor layer 21. This is a desirable design as the current block structure. This applies also to the twenty-second embodiment described later.

Moreover, in the thirteenth embodiment, the substitution site of the impurity in the first compound semiconductor layer 21, the substitution site of the impurity in the fourth compound semiconductor layer 44, the substitution site of the impurity in the third compound semiconductor layer 43, and the substitution site of the impurity in the second compound semiconductor layer 22 are the site occupied by a group III atom. That is, the impurity for causing the first compound semiconductor layer 21 to have the first conductivity type (n-type) is such that the substitution site of the impurity in the first compound semiconductor layer 21 (the site occupied by a group III atom) competes with the substitution site of the impurity in the fourth compound semiconductor layer 44 (the site occupied by a group III atom) for causing the fourth compound semiconductor layer 44 to have the second conductivity type (p-type). Furthermore, the impurity for causing the third compound semiconductor layer 43 to have the first conductivity type (n-type) is such that the substitution site of the impurity in the third compound semiconductor layer 43 (the site occupied by a group III atom) competes with the substitution site of the impurity in the fourth compound semiconductor layer 44 (the site occupied by a group III atom) for causing the fourth compound semiconductor layer 44 to have the second conductivity type (p-type). In addition, the impurity for causing the second compound semiconductor layer 22 to have the second conductivity type (p-type) is such that the substitution site of the impurity in the second compound semiconductor layer 22 (the site occupied by a group III atom) competes with the substitution site of the impurity in the third compound semiconductor layer 43 (the site occupied by a group III atom) for causing the third compound semiconductor layer 43 to have the first conductivity type (n-type). Therefore, when the fourth compound semiconductor layer 44 is deposited, impurity mutual diffusion hardly occurs between the fourth compound semiconductor layer 44 of the current block layer 40 and the first compound semiconductor layer 21. Furthermore, when the third compound semiconductor layer 43 is deposited, impurity mutual diffusion hardly occurs between the third compound semiconductor layer 43 and the fourth compound semiconductor layer 44 of the current block layer 40, and between the third compound semiconductor layer 43 and the second compound semiconductor layer 22. Thus, the current block layer 40 having high reliability can be formed. Specifically, it is possible to surely avoid the occurrence of a problem that the effect of the current block layer 40 is unstable and thus leakage current is increased due to annihilation or thinning of the current block layer 40. This applies also to the twenty-second embodiment described later.

Except for the above-described points, the semiconductor light emitting device of the thirteenth embodiment has the same configuration and structure as those of the semiconductor light emitting device of the fifth embodiment basically, and therefore the detailed description thereof is omitted.

Modification examples of the semiconductor light emitting device of the thirteenth embodiment will be described below.

Figure 11B:
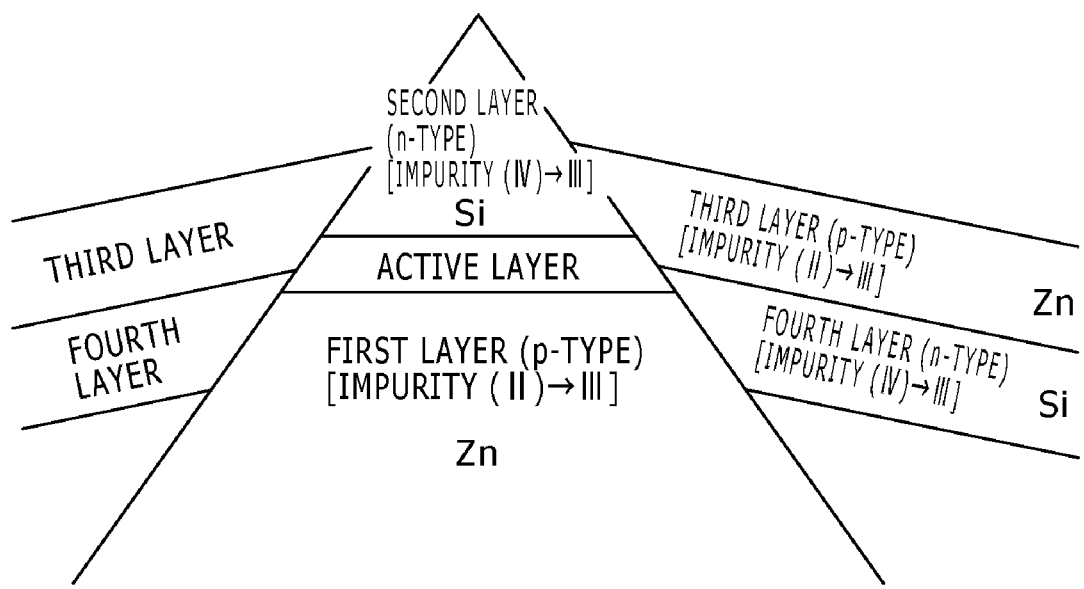

A modification example of the semiconductor light emitting device of the thirteenth embodiment shown in FIG. 11B corresponds to the semiconductor light emitting device according to the ((I)-5-A-2)-th configuration of the present invention. Specifically, in this semiconductor light emitting device, the impurity for causing the first compound semiconductor layer and the third compound semiconductor layer to be the p-type as the first conductivity type is a group II impurity (specifically, Zn), the impurity for causing the second compound semiconductor layer and the fourth compound semiconductor layer to be the n-type as the second conductivity type is a group IV impurity (specifically, Si).

More specifically, in this modification example of the semiconductor light emitting device of the thirteenth embodiment, the respective layers have the configuration shown in Table 9B shown below. Table 9B is given the same notes as (Note 1) and (Note 2) of Table 9A (this applies also to Tables 9C to 9J to be described later).

TABLE 9B

| (Configuration of light emitting part) | |
|---|---|
| Second compound semiconductor layer | n-$Al_{0.47}Ga_{0.53}As$: Si |
| Second compound semiconductor layer | n-$Al_{0.4}Ga_{0.6}As$: Si |
| Active layer | [Active layer -B] |
| First compound semiconductor laye (Current block layer) | p-$Al_{0.4}Ga_{0.6}As$: Zn |
| Burying layer | n-$Al_{0.47}Ga_{0.53}As$: Se |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer (Whole) | n-$Al_{0.47}Ga_{0.53}As$: Se |
| Contact layer | p-GaAs: Zn (or C) |

Figure 12A:
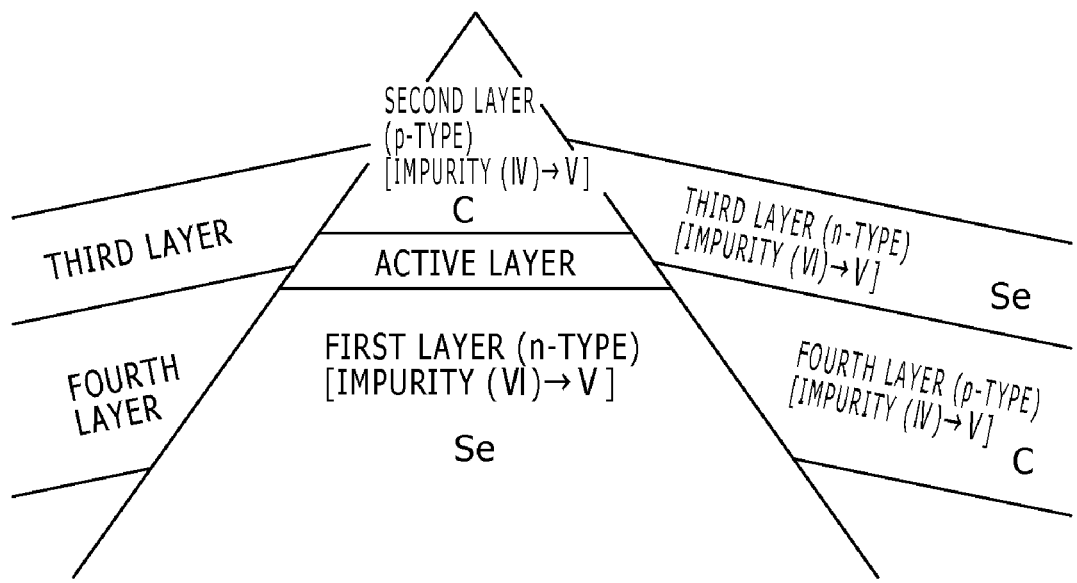
Figure 12B:
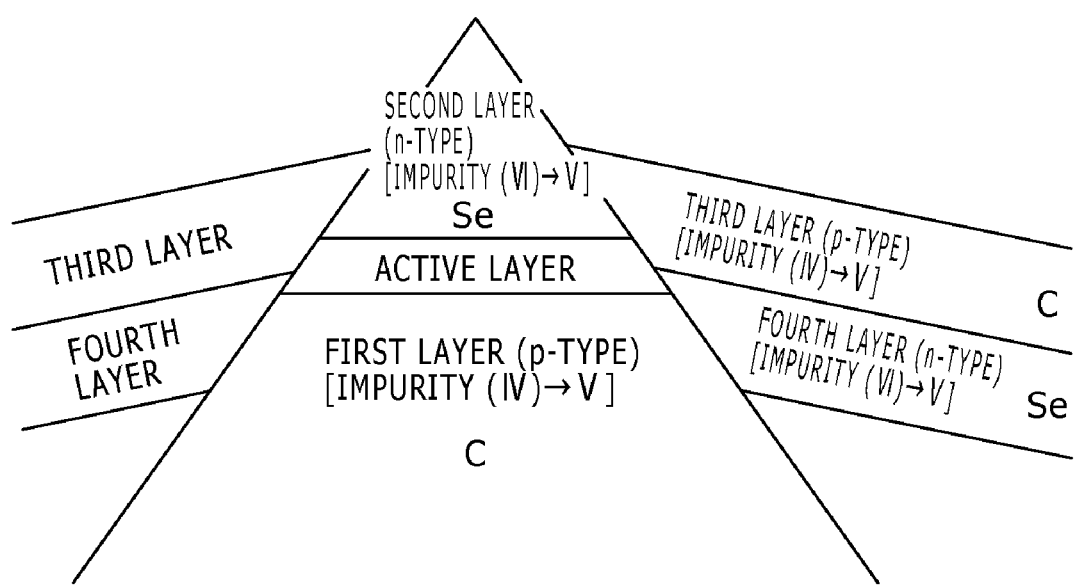

A modification example of the semiconductor light emitting device of the thirteenth embodiment shown in FIGS. 12A and 12B corresponds to the semiconductor light emitting device according to the ((I)-5-a)-th configuration of the present invention. In this semiconductor light emitting device, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom.

The modification example of the semiconductor light emitting device of the thirteenth embodiment whose conceptual diagrams are shown in FIG. 12A corresponds to the semiconductor light emitting device according to the ((I)-5-a-1)-th configuration of the present invention. In this semiconductor light emitting device, the impurity for causing the first compound semiconductor layer and the third compound semiconductor layer to be the n-type as the first conductivity type is a group VI impurity (specifically, Se), the impurity for causing the second compound semiconductor layer and the fourth compound semiconductor layer to be the p-type as the second conductivity type is carbon (C).

More specifically, in this modification example of the semiconductor light emitting device of the thirteenth embodiment, the respective layers have the configuration shown in Table 9C shown below.

TABLE 9C (Configuration of light emitting part)

| | |
|---|---|
| Second compound semiconductor layer | p-$Al_{0.47}Ga_{0.53}As$: C |
| Second compound semiconductor layer | p-$Al_{0.4}Ga_{0.6}As$: C |
| Active layer | [Active layer -A] |
| First compound semiconductor layer | n-$Al_{0.4}Ga_{0.6}As$: Se |
| (Current block layer) | |
| Burying layer | p-$Al_{0.47}Ga_{0.53}As$: Zn |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer | p-$Al_{0.47}Ga_{0.53}As$: Zn |
| (Whole) | |
| Contact layer 32 | p-GaAs: Zn (or C) |

The modification example of the semiconductor light emitting device of the thirteenth embodiment whose conceptual diagrams are shown in FIG. 12B corresponds to the semiconductor light emitting device according to the ((I)-5-a-2)-th configuration of the present invention. In this semiconductor light emitting device, the impurity for causing the first compound semiconductor layer and the third compound semiconductor layer to be the p-type as the first conductivity type is carbon (C), the impurity for causing the second compound semiconductor layer and the fourth compound semiconductor layer to be the n-type as the second conductivity type is a group VI impurity (specifically, Se).

More specifically, in this modification example of the semiconductor light emitting device of the thirteenth embodiment, the respective layers have the configuration shown in Table 9D shown below.

TABLE 9D (Configuration of light emitting part)

| | |
|---|---|
| Second compound semiconductor layer | n-$Al_{0.47}Ga_{0.53}As$: Se |
| Second compound semiconductor layer | n-$Al_{0.4}Ga_{0.6}As$: Se |
| Active layer | [Active layer -B] |
| First compound semiconductor layer | p-$Al_{0.4}Ga_{0.6}As$: C |
| (Current block layer) | |
| Burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |
| (Whole) | |
| Contact layer | p-GaAs: Zn (or C) |

Figure 13A:
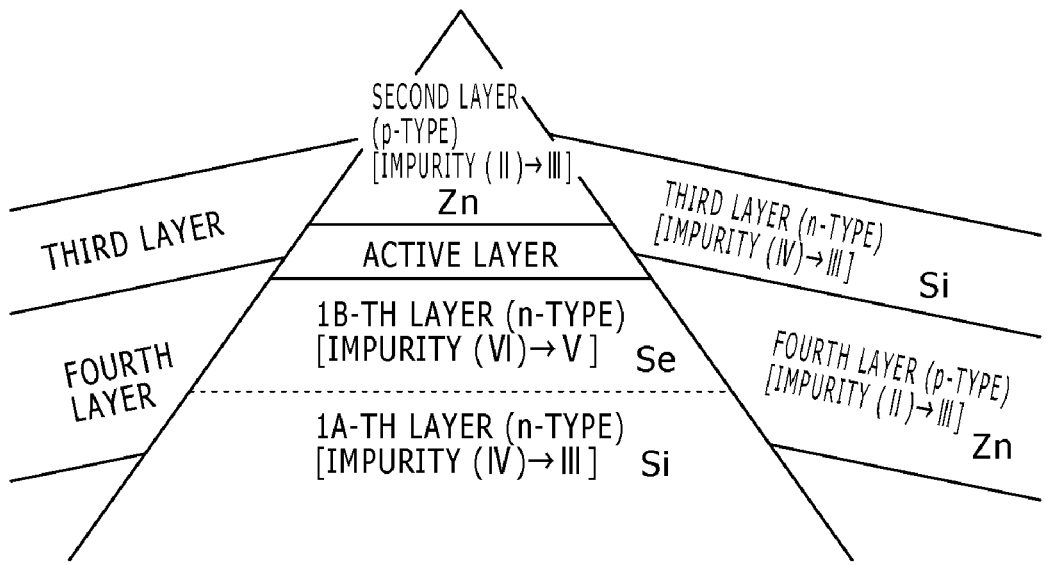
Figure 13B:
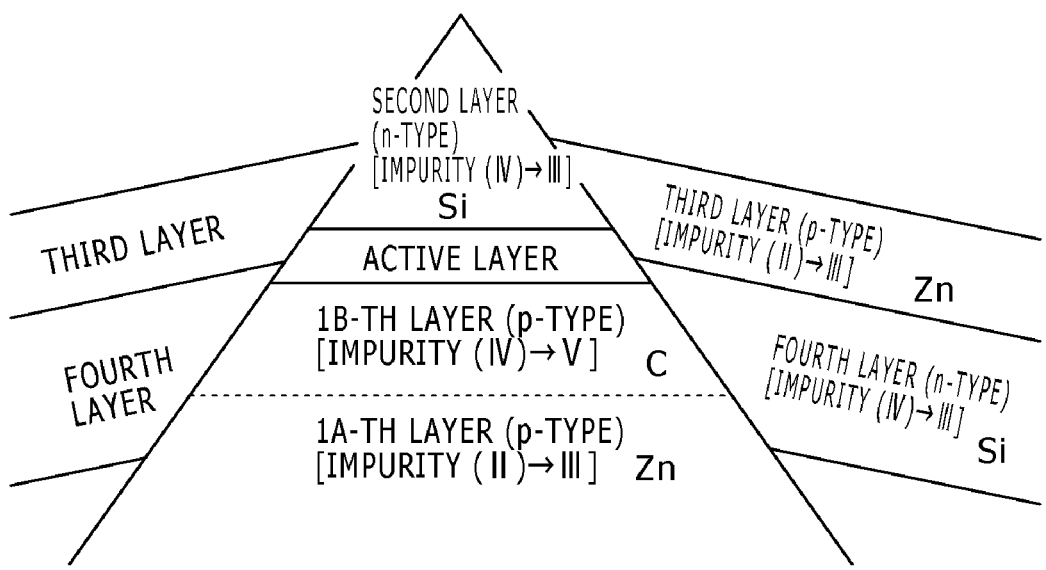

A modification example of the semiconductor light emitting device of the thirteenth embodiment whose conceptual diagrams are shown in FIGS. 13A and 13B corresponds to the semiconductor light emitting device according to the ((I)-5-B)-th configuration of the present invention. In this semiconductor light emitting device, the first compound semiconductor layer is composed of a 1A-th compound semiconductor layer and a 1B-th compound semiconductor layer that is provided on the 1A-th compound semiconductor layer and is in contact with an active layer, and the impurity for causing the 1B-th compound semiconductor layer to have the first conductivity type is such that the substitution site of the impurity in the 1B-th compound semiconductor layer does not compete with the substitution site of the impurity in the 1A-th compound semiconductor layer for causing the 1A-th compound semiconductor layer to have the first conductivity type, and does not compete with the substitution site of the impurity in the second compound semiconductor layer for causing the second compound semiconductor layer to have the second conductivity type. The impurity for causing the 1A-th compound semiconductor layer to have the first conductivity type is such that the substitution site of the impurity in the 1A-th compound semiconductor layer competes with the substitution site of the impurity in the fourth compound semiconductor layer for causing the fourth compound semiconductor layer to have the second conductivity type. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. The substitution site of the impurity in the 1B-th compound semiconductor layer is the site occupied by a group V atom.

The modification example of the semiconductor light emitting device of the thirteenth embodiment whose conceptual diagrams are shown in FIG. 13A corresponds to the semiconductor light emitting device according to the ((I)-5-B-1)-th configuration of the present invention. In this semiconductor light emitting device, the impurity for causing the 1A-th compound semiconductor layer and the third compound semiconductor layer to be the n-type as the first conductivity type is a group IV impurity (specifically, Si), the impurity for causing the 1B-th compound semiconductor layer to be the n-type as the first conductivity type is a group VI impurity (specifically, Se), the impurity for causing the second compound semiconductor layer and the fourth compound semiconductor layer to be the p-type as the second conductivity type is a group II impurity (specifically, Zn).

More specifically, in this modification example of the semiconductor light emitting device of the thirteenth embodiment, the respective layers have the configuration shown in Table 9E shown below.

TABLE 9E (Configuration of light emitting part)

| | |
|---|---|
| Second compound semiconductor layer | p-$Al_{0.47}Ga_{0.53}As$: Zn |
| Second compound semiconductor layer | p-$Al_{0.4}Ga_{0.6}As$: Zn |
| Active layer | [Active layer -A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Burying layer | p-$Al_{0.47}Ga_{0.53}As$: Zn |
| Third compound semiconductor layer | n-$Al_{0.47}Ga_{0.53}As$: Si |
| Fourth compound semiconductor layer | p-$Al_{0.47}Ga_{0.53}As$: Zn |
| Adjustment layer | p-$Al_{0.47}Ga_{0.53}As$: Zn |
| (Whole) | |
| Contact layer | p-GaAs: Zn (or C) |

A modification example of the semiconductor light emitting device of the thirteenth embodiment whose conceptual diagrams are shown in FIG. 13B corresponds to the semiconductor light emitting device according to the ((I)-5-B-2)-th configuration of the present invention. In this semiconductor light emitting device, the impurity for causing the 1A-th compound semiconductor layer and the third compound semiconductor layer to be the p-type as the first conductivity type is a group II impurity (specifically, Zn), the impurity for causing the 1B-th compound semiconductor layer to be the p-type as the first conductivity type is carbon (C), the impurity for causing the second compound semiconductor layer and the fourth compound semiconductor layer to be the n-type as the second conductivity type is a group IV impurity (specifically, Si).

More specifically, in this modification example of the semiconductor light emitting device of the thirteenth embodiment, the respective layers have the configuration shown in Table 9F shown below.

TABLE 9F

| (Configuration of light emitting part) | |
|---|---|
| Second compound semiconductor layer | n-$Al_{0.47}Ga_{0.53}As$: Si |
| Second compound semiconductor layer | n-$Al_{0.4}Ga_{0.6}As$: Si |
| Active layer | [Active layer -B] |
| 1B-th compound semiconductor layer | p-$Al_{0.4}Ga_{0.6}As$: C |
| 1A-th compound semiconductor layer | p-$Al_{0.4}Ga_{0.6}As$: Zn |
| (Current block layer) | |
| Burying layer | n-$Al_{0.47}Ga_{0.53}As$: Se |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Se |
| (Whole) | |
| Contact layer | p-GaAs: Zn (or C) |

Figure 14A:
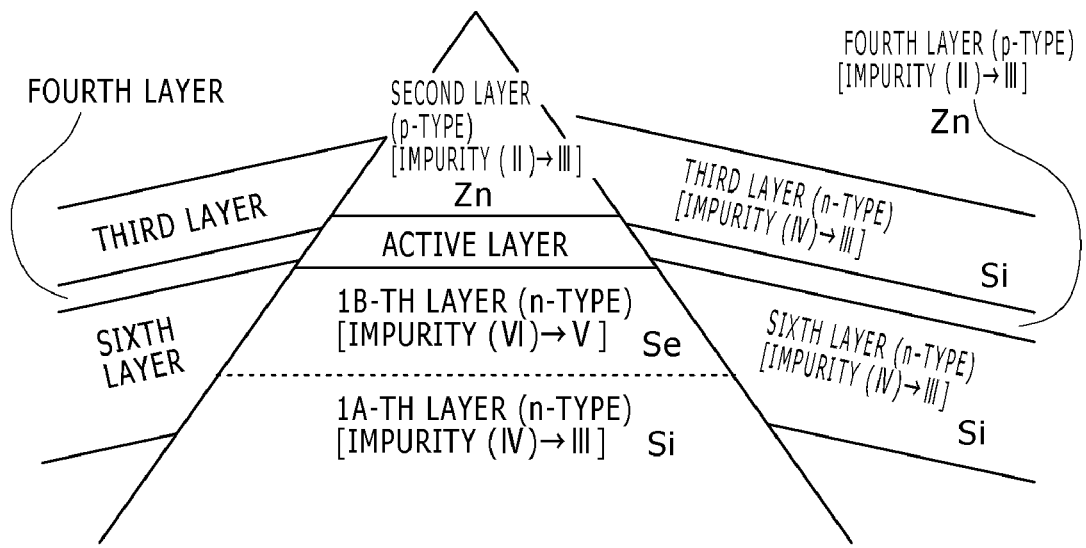
Figure 14B:
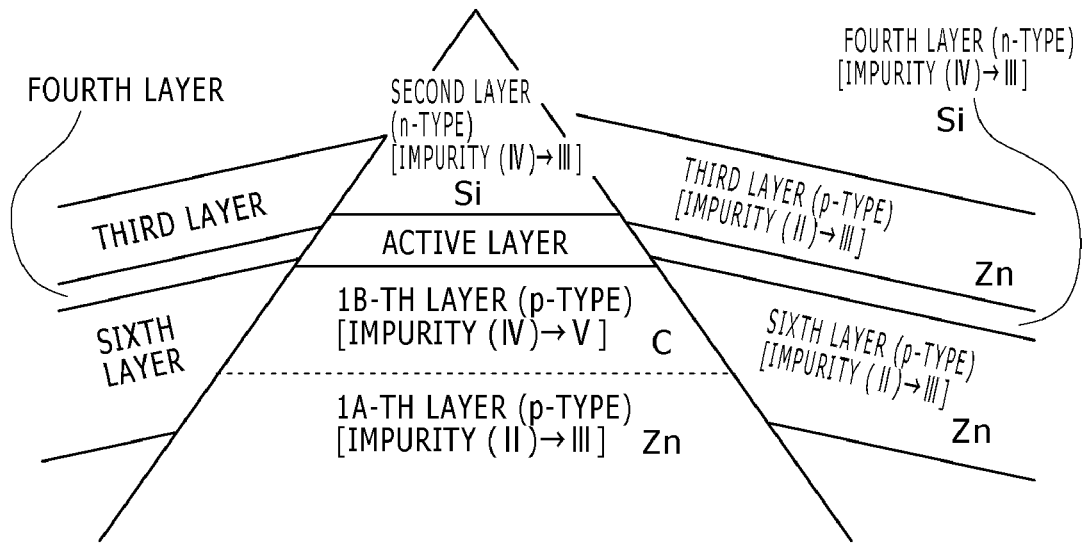

Conceptual diagrams of further-modified examples of the modification examples of the semiconductor light emitting device of the thirteenth embodiment whose conceptual diagrams are shown in FIGS. 13A and 13B are shown in FIGS. 14A and 14B. In these further-modified examples, a sixth compound semiconductor layer of the first conductivity type is provided under the fourth compound semiconductor layer, the impurity for causing the sixth compound semiconductor layer to have the first conductivity type is such that the substitution site of the impurity in the sixth compound semiconductor layer competes with the substitution site of the impurity in the 1A-th compound semiconductor layer for causing the 1A-th compound semiconductor layer to have the first conductivity type (specifically, a group IV impurity, Si, in FIG. 14A, and a group II impurity, Zn, in FIG. 14B), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. The bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

Figure 15A:
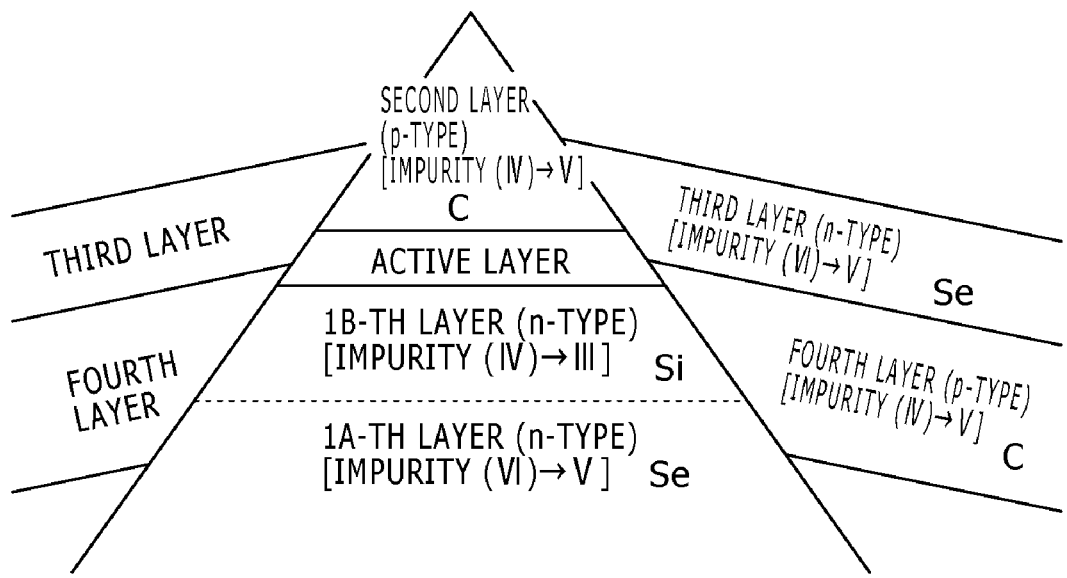
Figure 15B:
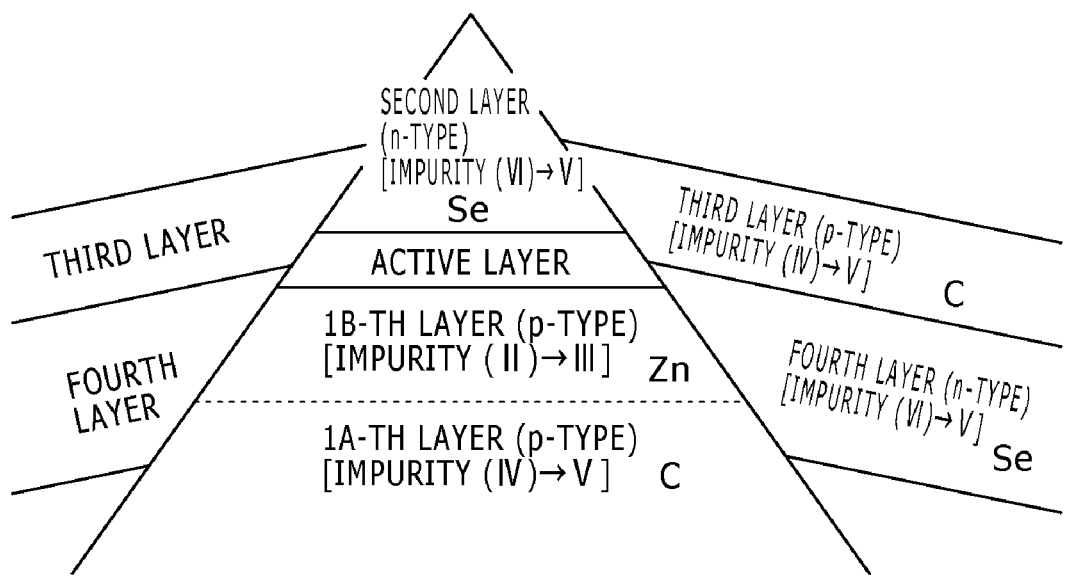

The modification example of the semiconductor light emitting device of the thirteenth embodiment whose conceptual diagrams are shown in FIGS. 15A and 15B corresponds to the semiconductor light emitting device according to the ((I)-5-b)-th configuration of the present invention. In this semiconductor light emitting device, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the 1B-th compound semiconductor layer is the site occupied by a group III atom. The substitution site of the impurity in the first burying layer is the site occupied by a group V atom, and the substitution site of the impurity in the second burying layer is the site occupied by a group III atom.

The modification example of the semiconductor light emitting device of the thirteenth embodiment whose conceptual diagrams are shown in FIG. 15A corresponds to the semiconductor light emitting device according to the ((I)-5-b-1)-th configuration of the present invention. In this semiconductor light emitting device, the impurity for causing the 1A-th compound semiconductor layer and the third compound semiconductor layer to be the n-type as the first conductivity type is a group VI impurity (specifically, Se), the impurity for causing the 1B-th compound semiconductor layer to be the n-type as the first conductivity type is a group IV impurity (specifically, Si), the impurity for causing the second compound semiconductor layer and the fourth compound semiconductor layer to be the p-type as the second conductivity type is carbon (C).

More specifically, in this modification example of the semiconductor light emitting device of the thirteenth embodiment, the respective layers have the configuration shown in Table 9G shown below.

TABLE 9G

| (Configuration of light emitting part) | |
|---|---|
| Second compound semiconductor layer | p-$Al_{0.47}Ga_{0.53}As$: C |
| Second compound semiconductor layer | p-$Al_{0.4}Ga_{0.6}As$: C |
| Active layer | [Active layer -A] |
| 1B-th compound semiconductor layer | n-$Al_{0.4}Ga_{0.6}As$: Si |
| 1A-th compound semiconductor layer | n-$Al_{0.4}Ga_{0.6}As$: Se |
| (Current block layer) | |
| Burying layer | p-$Al_{0.47}Ga_{0.53}As$: Zn |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer | p-$Al_{0.47}Ga_{0.53}As$: Zn |
| (Whole) | |
| Contact layer | p-GaAs: Zn (or C) |

The modification example of the semiconductor light emitting device of the thirteenth embodiment whose conceptual diagrams are shown in FIG. 15B correspond to the semiconductor light emitting device according to the ((I)-5-b-2)-th configuration of the present invention. In this semiconductor light emitting device, the impurity for causing the 1A-th compound semiconductor layer and the third compound semiconductor layer to be the p-type as the first conductivity type is carbon (C), the impurity for causing the 1B-th compound semiconductor layer to be the p-type as the first conductivity type is a group II impurity (specifically, Zn), the impurity for causing the second compound semiconductor layer and the fourth compound semiconductor layer to be the n-type as the second conductivity type is a group VI impurity (specifically, Se).

More specifically, in this modification example of the semiconductor light emitting device of the thirteenth embodiment, the respective layers have the configuration shown in Table 9H shown below.

TABLE 9H (Configuration of light emitting part)

| | |
|---|---|
| Second compound semiconductor layer | n-$Al_{0.47}Ga_{0.53}As$: Se |
| Second compound semiconductor layer | n-$Al_{0.4}Ga_{0.6}As$: Se |
| Active layer | [Active layer -B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |
| (Whole) | |
| Contact layer | p-GaAs: Zn (or C) |

Figure 16A:
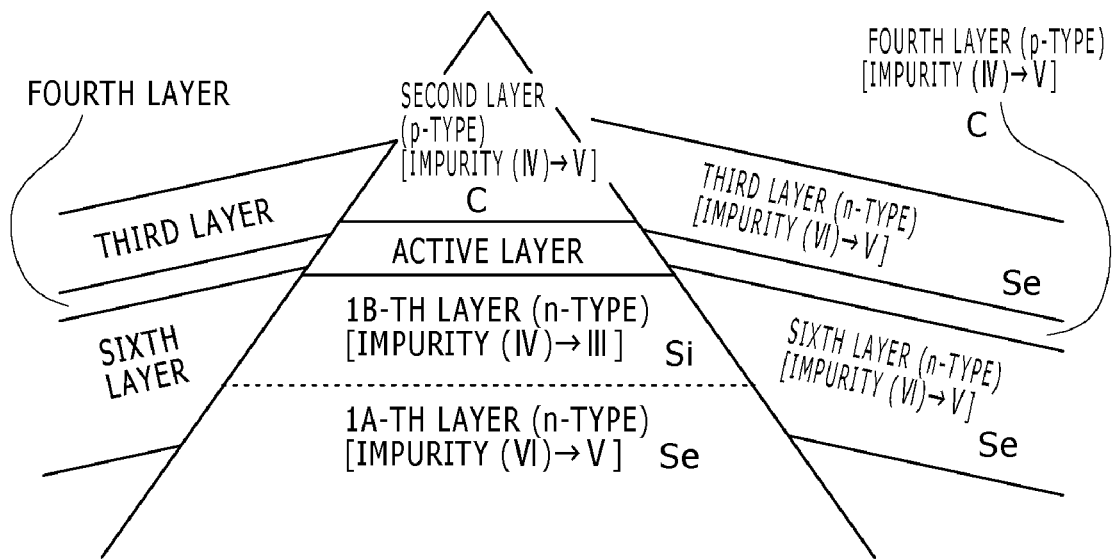
Figure 16B:
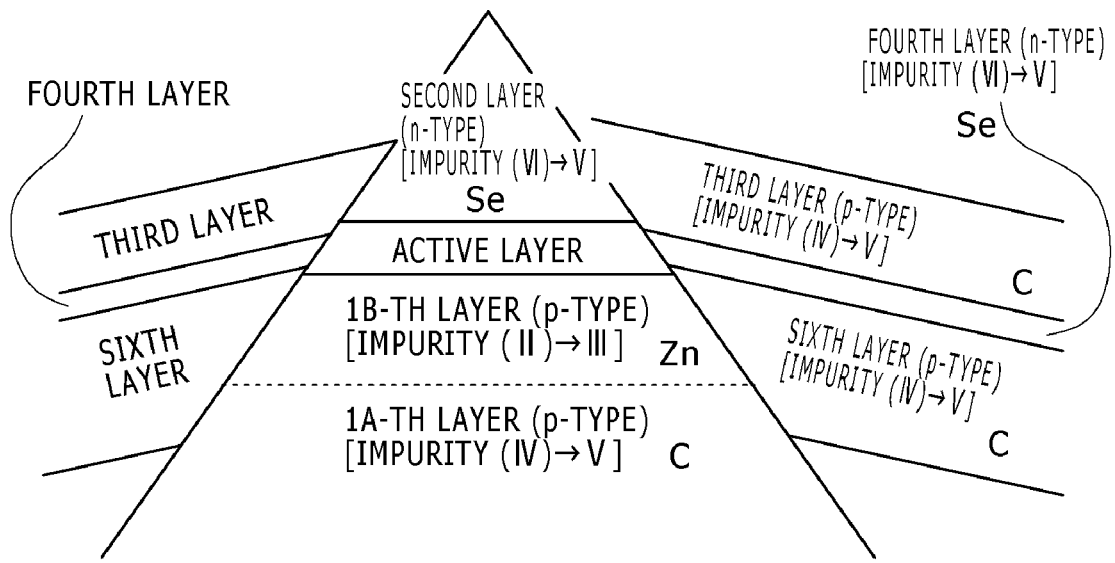

Conceptual diagrams of further-modified examples of the modification examples of the semiconductor light emitting device of the thirteenth embodiment whose conceptual diagrams are shown in FIGS. 15A and 15B are shown in FIGS. 16A and 16B. Also in these further-modified examples, the sixth compound semiconductor layer of the first conductivity type is provided under the fourth compound semiconductor layer, the impurity for causing the sixth compound semiconductor layer to have the first conductivity type is such that the substitution site of the impurity in the sixth compound semiconductor layer competes with the substitution site of the impurity in the 1A-th compound semiconductor layer for causing the 1A-th compound semiconductor layer to have the first conductivity type (specifically, a group VI impurity, Se, in FIG. 16A, and carbon (C) in FIG. 16B), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. The bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

Figure 17A:
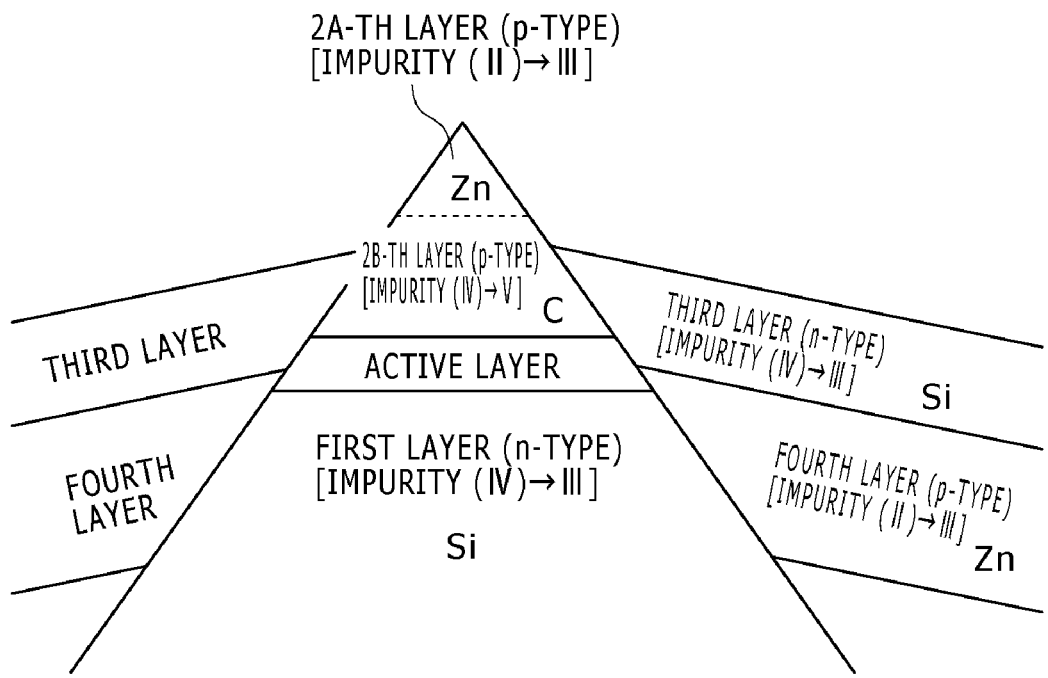
Figure 17B:
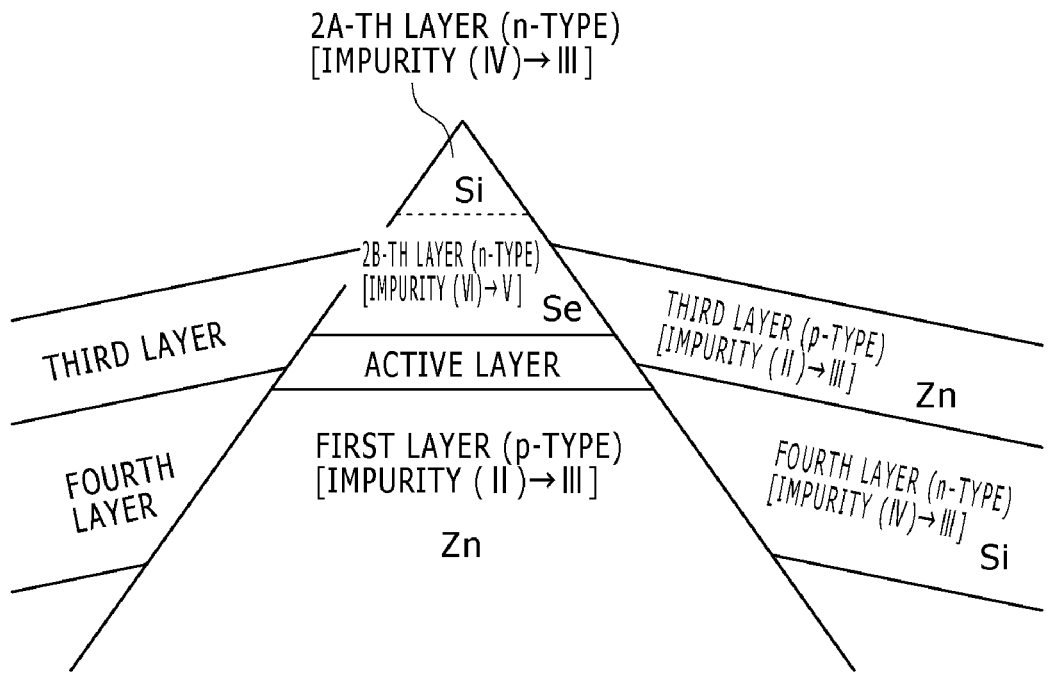

A modification example of the semiconductor light emitting device of the thirteenth embodiment shown in FIGS. 17A and 17B is the semiconductor light emitting device according to the ((I)-5-C)-th configuration of the present invention. In this semiconductor light emitting device, the second compound semiconductor layer is composed of a 2B-th compound semiconductor layer in contact with the active layer and a 2A-th compound semiconductor layer provided on the 2B-th compound semiconductor layer, and the impurity for causing the 2B-th compound semiconductor layer to have the second conductivity type is such that the substitution site of the impurity in the 2B-th compound semiconductor layer does not compete with the substitution site of the impurity in the 2A-th compound semiconductor layer for causing the 2A-th compound semiconductor layer to have the second conductivity type, and does not compete with the substitution site of the impurity in the first compound semiconductor layer for causing the first compound semiconductor layer to have the first conductivity type. The impurity for causing the 2A-th compound semiconductor layer to have the second conductivity type is such that the substitution site of the impurity in the 2A-th compound semiconductor layer competes with the substitution site of the impurity in the third compound semiconductor layer for causing the third compound semiconductor layer to have the first conductivity type. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group III atom. The substitution site of the impurity in the 2B-th compound semiconductor layer is the site occupied by a group V atom.

The modification example of the semiconductor light emitting device of the thirteenth embodiment whose conceptual diagrams are shown in FIG. 17A correspond to the semiconductor light emitting device according to the ((I)-5-C-1)-th configuration of the present invention. In this semiconductor light emitting device, the impurity for causing the first compound semiconductor layer and the third compound semiconductor layer to be the n-type as the first conductivity type is a group IV impurity (specifically, Si), the impurity for causing the 2A-th compound semiconductor layer and the fourth compound semiconductor layer to be the p-type as the second conductivity type is a group II impurity (specifically, Zn), the impurity for causing the 2B-th compound semiconductor layer to be the p-type as the second conductivity type is carbon (C).

More specifically, in this modification example of the semiconductor light emitting device of the thirteenth embodiment, the respective layers have the configuration shown in Table 9I shown below.

TABLE 9I (Configuration of light emitting part)

| | |
|---|---|
| 2B-th compound semiconductor layer | p-$Al_{0.4}Ga_{0.6}As$: Zn |
| 2A-th compound semiconductor layer | p-$Al_{0.4}Ga_{0.6}As$: C |
| Active layer | [Active layer -A] |
| First compound semiconductor layer | n-$Al_{0.4}Ga_{0.6}As$: Si |
| (Current block layer) | |
| Burying layer | p-$Al_{0.47}Ga_{0.53}As$: Zn |
| Third compound semiconductor layer | n-$Al_{0.47}Ga_{0.53}As$: Si |

TABLE 9I-continued

| Fourth compound semiconductor layer | p-Al$_{0.47}$Ga$_{0.53}$As: Zn |
|---|---|
| Adjustment layer | p-Al$_{0.47}$Ga$_{0.53}$As: Zn |
| (Whole) | |
| Contact layer | p-GaAs: Zn (or C) |

The modification example of the semiconductor light emitting device of the thirteenth embodiment whose conceptual diagrams are shown in FIG. 17B correspond to the semiconductor light emitting device according to the ((I)-5-C-2)-th configuration of the present invention. In this semiconductor light emitting device, the impurity for causing the first compound semiconductor layer and the third compound semiconductor layer to be the p-type as the first conductivity type is a group II impurity (specifically, Zn), the impurity for causing the 2A-th compound semiconductor layer and the fourth compound semiconductor layer to be the n-type as the second conductivity type is a group IV impurity (specifically, Si), the impurity for causing the 2B-th compound semiconductor layer to be the n-type as the second conductivity type is a group VI impurity (specifically, Se).

More specifically, in this modification example of the semiconductor light emitting device of the thirteenth embodiment, the respective layers have the configuration shown in Table 9J shown below.

TABLE 9J

| (Configuration of light emitting part) | |
|---|---|
| 2B-th compound semiconductor layer | n-Al$_{0.4}$Ga$_{0.6}$As: Si |
| 2A-th compound semiconductor layer | n-Al$_{0.4}$Ga$_{0.6}$As: Se |
| Active layer | [Active layer -B] |
| First compound semiconductor layer | p-Al$_{0.4}$Ga$_{0.6}$As: Zn |
| (Current block layer) | |
| Burying layer | n-Al$_{0.47}$Ga$_{0.53}$As: Se |
| Third compound semiconductor layer | p-Al$_{0.47}$Ga$_{0.53}$As: Zn |
| Fourth compound semiconductor layer | n-Al$_{0.47}$Ga$_{0.53}$As: Si |
| Adjustment layer | n-Al$_{0.47}$Ga$_{0.53}$As: Se |
| (Whole) | |
| Contact layer | p-GaAs: Zn (or C) |

Figure 18A:
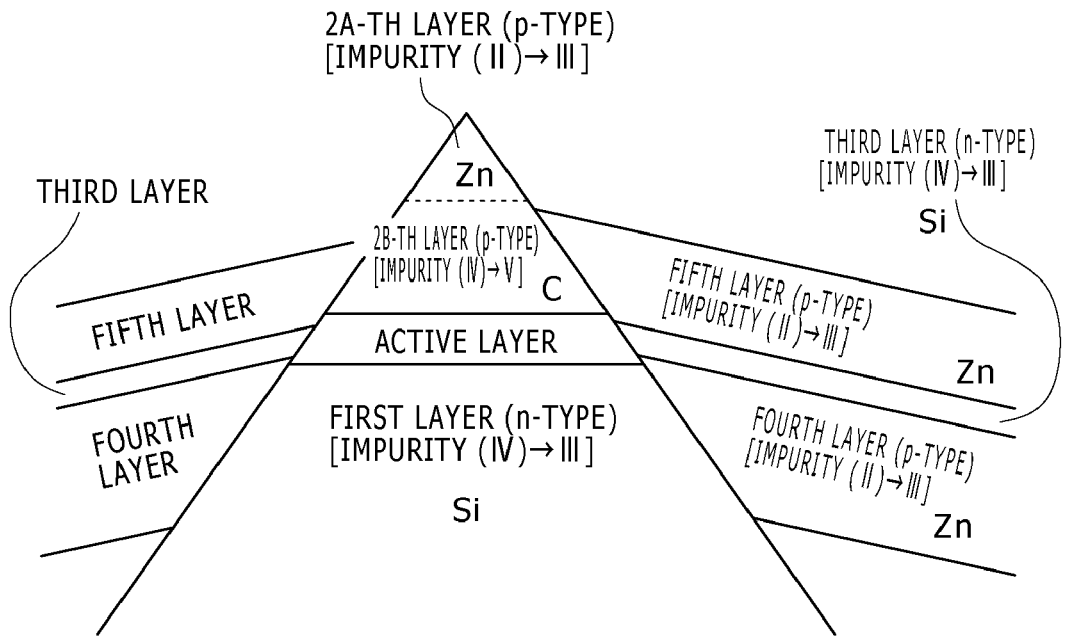
Figure 18B:
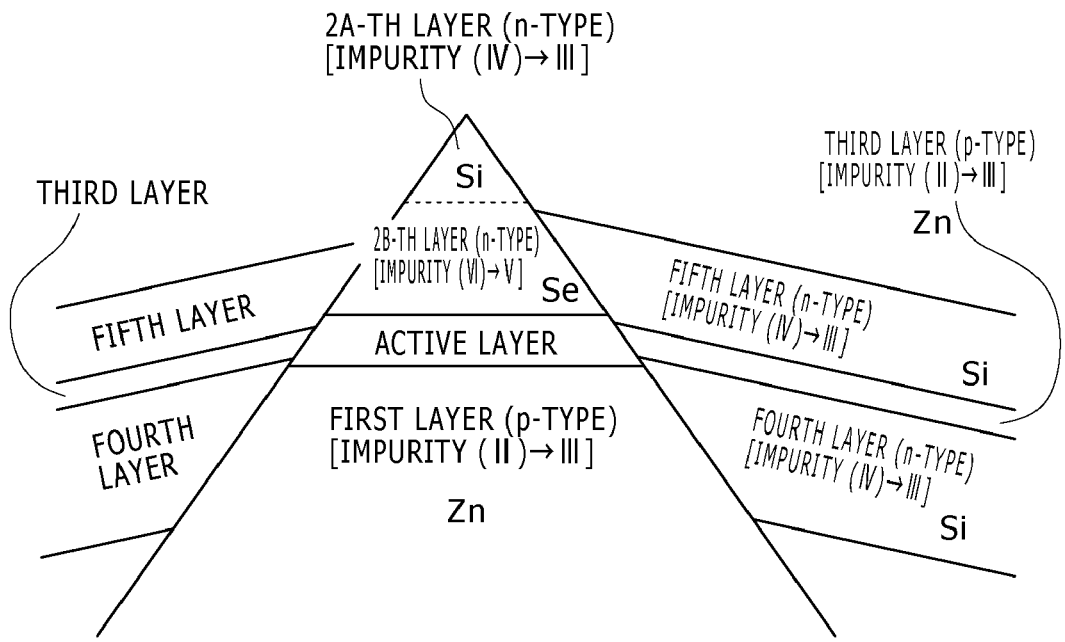

Conceptual diagrams of further-modified examples of the modification examples of the semiconductor light emitting device of the thirteenth embodiment whose conceptual diagrams are shown in FIGS. 17A and 17B are shown in FIGS. 18A and 18B. In these further-modified examples, a fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the 2A-th compound semiconductor layer for causing the 2A-th compound semiconductor layer to have the second conductivity type (specifically, a group II impurity, Zn, in FIG. 18A, and a group IV impurity, Si, in FIG. 18B), and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). The bypass channel is composed of the first compound semiconductor layer, the fourth compound semiconductor layer, the third compound semiconductor layer, the fifth compound semiconductor layer, and the second compound semiconductor layer (the 2A-th compound semiconductor layer and the 2B-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

Figure 19A:
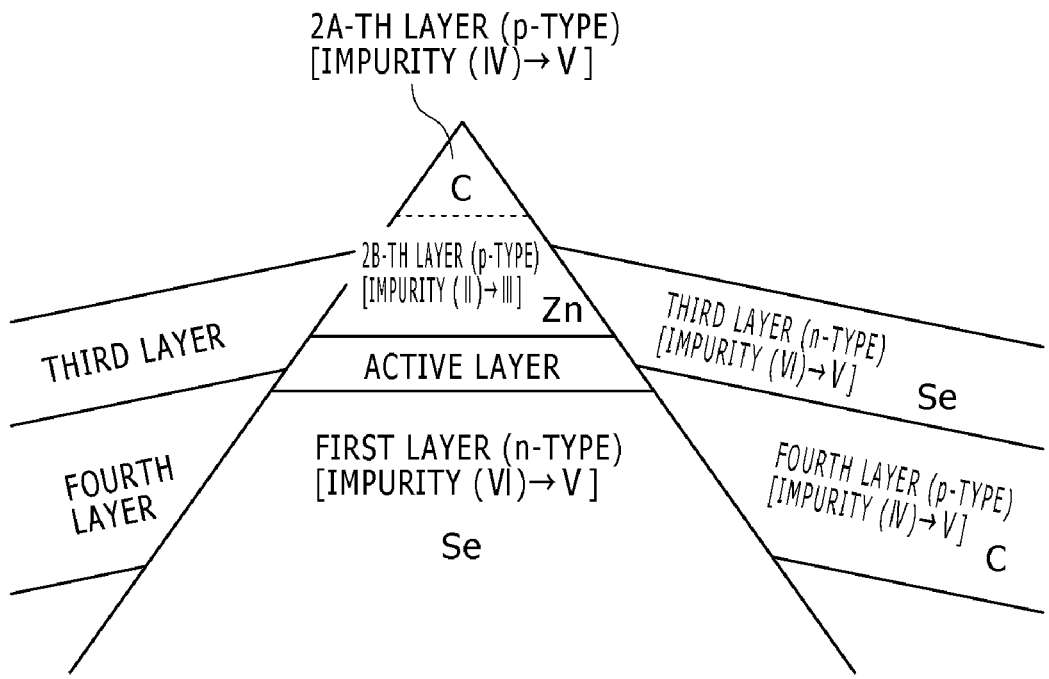
Figure 19B:
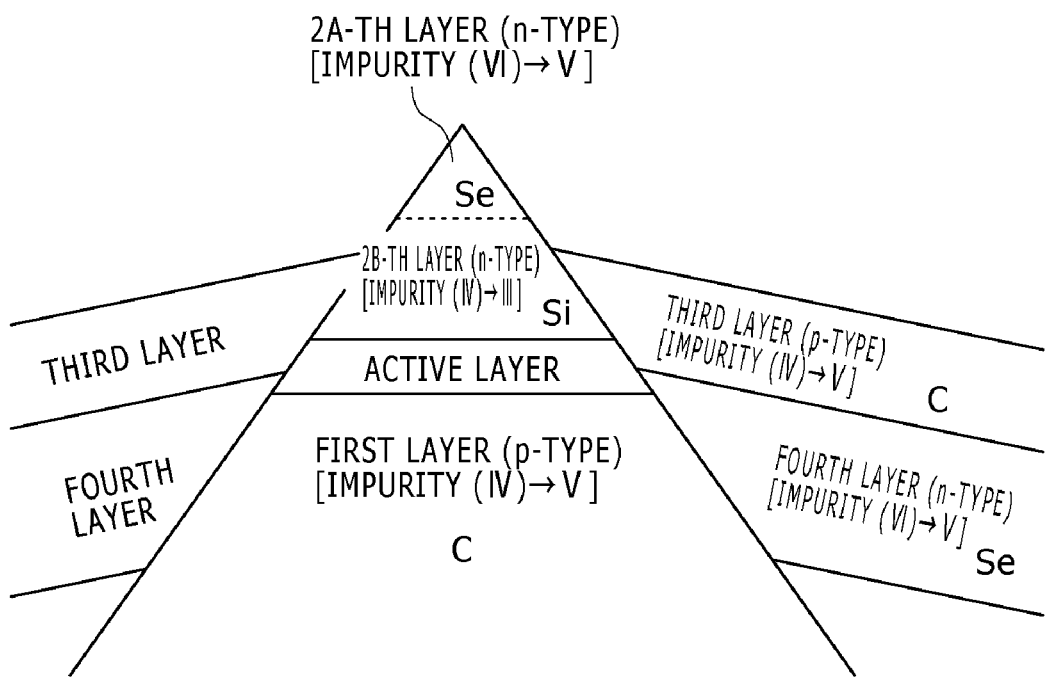

A modification example of the semiconductor light emitting device of the thirteenth embodiment shown in FIGS. 19A and 19B as a conceptual diagram is the semiconductor light emitting device according to the ((I)-5-c)-th configuration of the present invention. In this semiconductor light emitting device, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group V atom. The substitution site of the impurity in the 2B-th compound semiconductor layer is the site occupied by a group III atom.

The modification example of the semiconductor light emitting device of the thirteenth embodiment whose conceptual diagrams are shown in FIG. 19A correspond to the semiconductor light emitting device according to the ((I)-5-c-1)-th configuration of the present invention. In this semiconductor light emitting device, the impurity for causing the first compound semiconductor layer and the third compound semiconductor layer to be the n-type as the first conductivity type is a group VI impurity (specifically, Se), the impurity for causing the 2A-th compound semiconductor layer and the fourth compound semiconductor layer to be the p-type as the second conductivity type is carbon (C), the impurity for causing the 2B-th compound semiconductor layer to be the p-type as the second conductivity type is a group II impurity (specifically, Zn).

More specifically, in this modification example of the semiconductor light emitting device of the thirteenth embodiment, the respective layers have the configuration shown in Table 9K shown below.

TABLE 9K

| (Configuration of light emitting part) | |
|---|---|
| 2A-th compound semiconductor layer | p-Al$_{0.4}$Ga$_{0.6}$As: C |
| 2B-th compound semiconductor layer | p-Al$_{0.4}$Ga$_{0.6}$As: Zn |
| Active layer | [Active layer -A] |
| First compound semiconductor layer | n-Al$_{0.4}$Ga$_{0.6}$As: Se |
| (Current block layer) | |
| Burying layer | p-Al$_{0.47}$Ga$_{0.53}$As: Zn |
| Third compound semiconductor layer | n-Al$_{0.47}$Ga$_{0.53}$As: Se |
| Fourth compound semiconductor layer | p-Al$_{0.47}$Ga$_{0.53}$As: C |
| Adjustment layer | p-Al$_{0.47}$Ga$_{0.53}$As: Zn |
| (Whole) | |
| Contact layer | p-GaAs: Zn (or C) |

The modification example of the semiconductor light emitting device of the thirteenth embodiment whose conceptual diagrams are shown in FIG. 19B correspond to the semiconductor light emitting device according to the ((I)-5-c-2)-th configuration of the present invention. In this semiconductor light emitting device, the impurity for causing the first compound semiconductor layer and the third compound semiconductor layer to be the p-type as the first conductivity type is carbon (C), the impurity for causing the 2A-th compound semiconductor layer and the fourth compound semiconductor layer to be the n-type as the second conductivity type is a group VI impurity (specifically, Se), the impurity for causing the 2B-th compound semiconductor layer to be the n-type as the second conductivity type is a group IV impurity (specifically, Si).

More specifically, in this modification example of the semiconductor light emitting device of the thirteenth embodiment, the respective layers have the configuration shown in Table 9L shown below.

TABLE 9L (Configuration of light emitting part)

| 2A-th compound semiconductor layer | n-$Al_{0.4}Ga_{0.6}As$: Se |
|---|---|
| 2B-th compound semiconductor layer | n-$Al_{0.4}Ga_{0.6}As$: Si |
| Active layer | [Active layer -B] |
| First compound semiconductor layer | p-$Al_{0.4}Ga_{0.6}As$: C |
| (Current block layer) | |
| Burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |
| (Whole) | |
| Contact layer | p-GaAs: Zn (or C) |

Figure 20A:
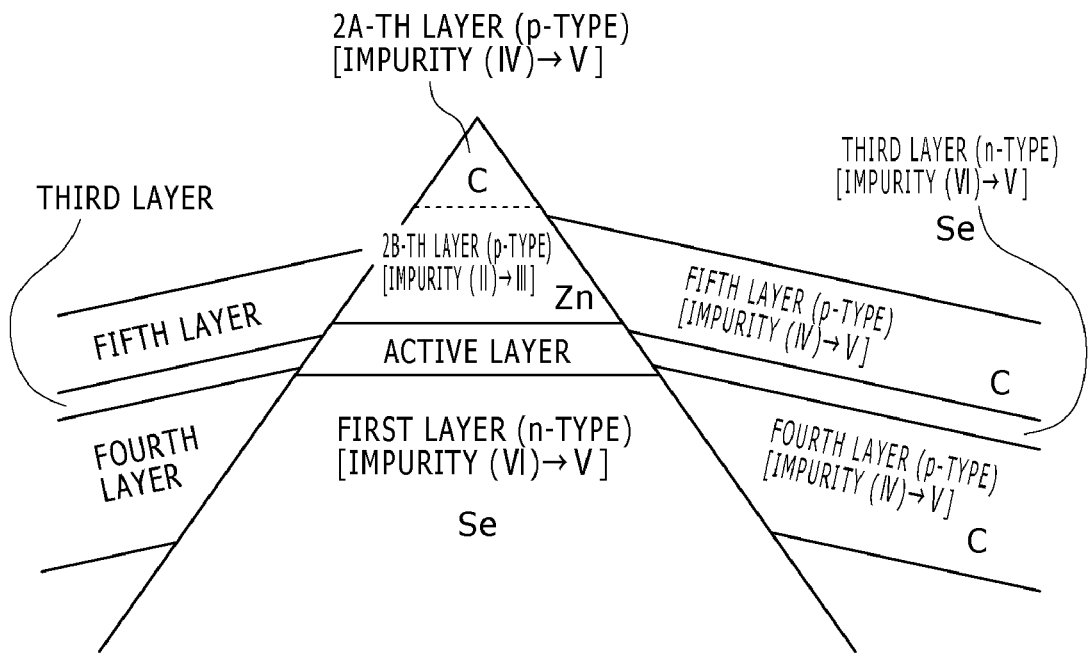
Figure 20B:
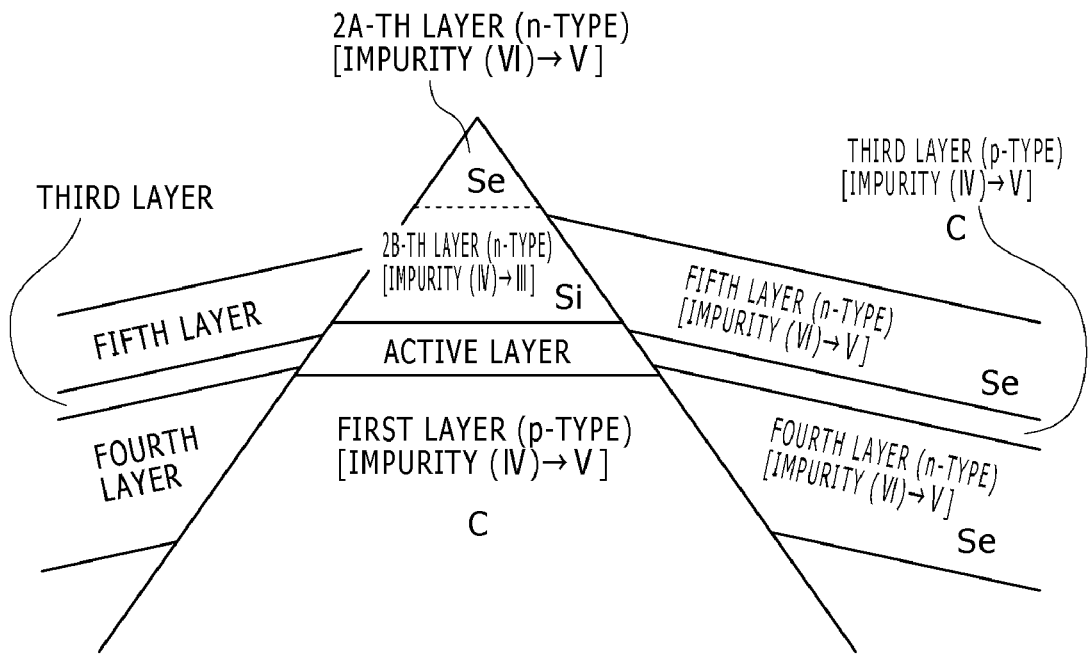

Conceptual diagrams of further-modified examples of the modification examples of the semiconductor light emitting device of the thirteenth embodiment whose conceptual diagrams are shown in FIGS. 19A and 19B are shown in FIGS. 20A and 20B. Also in these further-modified examples, the fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the 2A-th compound semiconductor layer for causing the 2A-th compound semiconductor layer to have the second conductivity type (specifically, carbon in FIG. 20A, and a group VI impurity, Se, in FIG. 20B), and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). The bypass channel is composed of the first compound semiconductor layer, the fourth compound semiconductor layer, the third compound semiconductor layer, the fifth compound semiconductor layer, and the second compound semiconductor layer (the 2A-th compound semiconductor layer and the 2B-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

An impurity diffusion barrier layer may be provided in the current block layer. Specifically, in the fourth compound semiconductor layer that is included in the current block layer and has the second conductivity type, at least one impurity diffusion barrier layer having the second conductivity type (e.g. a seventh compound semiconductor layer) is provided. Furthermore, impurities are so selected that the substitution site of the impurity in the fourth compound semiconductor layer is different from that of the impurity in the impurity diffusion barrier layer (e.g. the seventh compound semiconductor layer if the number of impurity diffusion barrier layers is one). More specifically, e.g. in the structure shown in FIG. 13A or FIG. 14A, or in the structure shown in FIGS. 33A and 33B or FIGS. 34A and 34B, a configuration can be employed in which the impurity in the fourth compound semiconductor layer is zinc (Zn) and the impurity in the impurity diffusion barrier layer (the seventh compound semiconductor layer) of the second conductivity type provided in the fourth compound semiconductor layer is carbon (C). That is, the configuration including the following layers can be employed.

n-type third compound semiconductor layer (impurity: Si)
p-type fourth compound semiconductor layer (impurity: Zn)
p-type seventh compound semiconductor layer (impurity: C)
p-type fourth compound semiconductor layer (impurity: Zn)

In addition, e.g. in the structure shown in FIG. 13B or FIG. 14B, or in the structure shown in FIGS. 35A and 35B or FIGS. 36A and 36B described later, a configuration can be employed in which the impurity in the fourth compound semiconductor layer is silicon (Si) and the impurity in the impurity diffusion barrier layer (the seventh compound semiconductor layer) of the second conductivity type provided in the fourth compound semiconductor layer is selenium (Se). That is, the configuration including the following layers can be employed.

p-type third compound semiconductor layer (impurity: Zn)
n-type fourth compound semiconductor layer (impurity: Si)
n-type seventh compound semiconductor layer (impurity: Se)
n-type fourth compound semiconductor layer (impurity: Si)

In such a configuration, if a group VI impurity (Se) or carbon (C) diffuses from the 1B-th compound semiconductor layer into the current block layer (Zn-doped layer or Si-doped layer) for example, this diffused impurity can not diffuse in the seventh compound semiconductor layer including the impurity (carbon or selenium) whose substitution site competes with the substitution site of this diffused impurity. Thus, the current block layer having high reliability can be formed.

Similarly, in the third compound semiconductor layer that is included in the current block layer and has the first conductivity type, at least one impurity diffusion barrier layer having the first conductivity type (e.g. an eighth compound semiconductor layer) is provided. Furthermore, impurities are so selected that the substitution site of the impurity in the third compound semiconductor layer is different from that of the impurity in the impurity diffusion barrier layer (e.g. the eighth compound semiconductor layer if the number of impurity diffusion barrier layers is one). For example, in the structure shown in FIG. 17A or FIG. 18A, or in the structure shown in FIGS. 41A and 41B or FIGS. 42A and 42B described later, a configuration can be employed in which the impurity in the third compound semiconductor layer is silicon (Si) and the impurity in the impurity diffusion barrier layer (the eighth compound semiconductor layer) of the first conductivity type provided in the third compound semiconductor layer is selenium (Se). That is, the configuration including the following layers can be employed.

n-type third compound semiconductor layer (impurity: Si)
n-type eighth compound semiconductor layer (impurity: Se)
n-type third compound semiconductor layer (impurity: Si)
p-type fourth compound semiconductor layer (impurity: Zn)

In addition, in the structure shown in FIG. 17B or FIG. 18B, or in the structure shown in FIGS. 43A and 43B or FIGS. 44A and 44B described later, a configuration can be employed in which the impurity in the third compound semiconductor layer is zinc (Zn) and the impurity in the impurity diffusion barrier layer (the eighth compound semiconductor layer) of the first conductivity type provided in the third compound semiconductor layer is carbon (C). That is, the configuration including the following layers can be employed.

p-type third compound semiconductor layer (impurity: Zn)
p-type eighth compound semiconductor layer (impurity: C)
p-type third compound semiconductor layer (impurity: Zn)
n-type fourth compound semiconductor layer (impurity: Si)

Also in such a configuration, if carbon (C) or selenium (Se) diffuses from the 2B-th compound semiconductor layer into the current block layer (Si-doped layer or Zn-doped layer) for example, this diffused impurity can not diffuse in the eighth compound semiconductor layer including the impurity (group VI impurity, Se, or carbon) whose substitution site competes with the substitution site of this diffused impurity. Thus, the current block layer having high reliability can be formed.

The same feature can be employed also for other semiconductor light emitting devices in which the first compound semiconductor layer is composed of the 1A-th compound semiconductor layer and the 1B-th compound semiconductor layer and other semiconductor light emitting devices in which the second compound semiconductor layer is composed of the 2A-th compound semiconductor layer and the 2B-th compound semiconductor layer.

The effect of the impurity diffusion barrier in the form in which the impurity diffusion barrier layer (seventh compound semiconductor layer or eighth compound semiconductor layer) is provided is readily obtained in the structures of FIGS. 14A and 14B, 16A and 16B, 18A and 18B, and 20A and 20B, and FIGS. 34A and 34B, 36A and 36B, 38A and 38B, 40A and 40B, 42A and 42B, 44A and 44B, 46A and 46B, and 48A and 48B described later in particular. Therefore, the examples are cited as above in which one seventh compound semiconductor layer or one eighth compound semiconductor layer as the impurity diffusion barrier layer is provided in the compound semiconductor layer (fourth compound semiconductor layer or third compound semiconductor layer) having the same conductivity type as that of the seventh compound semiconductor layer or the eighth compound semiconductor layer. However, the number of impurity diffusion barrier layers for the purpose of impurity diffusion barrier may be two or larger as long as the impurity diffusion barrier layers are formed of compound semiconductor layers having the same substitution site of the impurity as that of the impurity that diffuses into the current block layer from the first compound semiconductor layer (or the 1B-th compound semiconductor layer) or the second compound semiconductor layer (or the 2B-th compound semiconductor layer). Furthermore, the position of the impurity diffusion barrier layer is not limited to the inside of a compound semiconductor layer having the same conductivity type as that of the impurity diffusion barrier layer, but one or more impurity diffusion barrier layers may be provided in a compound semiconductor layer having the different conductivity type.

In addition, the current block layer may have a multilayer structure. Specifically, e.g. in the structure shown in FIG. 14A, or in the structure shown in FIGS. 34A and 34B described later, instead of using the current block layer having the multilayer structure of the n-type third compound semiconductor layer/the p-type fourth compound semiconductor layer/the n-type sixth compound semiconductor layer, the current block layer having the following five-layer structure may be used without changing the thickness of the entire current block layer.

(1) n-type third compound semiconductor layer (impurity: Si)
(2) p-type compound semiconductor layer (impurity: Zn)
(3) n-type compound semiconductor layer (impurity: Si)
(4) p-type fourth compound semiconductor layer (impurity: Zn)
(5) n-type sixth compound semiconductor layer (impurity: Si)

Alternatively, the current block layer having the following seven-layer structure may be used.

(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type fourth compound semiconductor layer (impurity: Zn)
(7) n-type sixth compound semiconductor layer (impurity: Si)

Alternatively, the current block layer having the following nine-layer structure may be used.

(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type compound semiconductor layer (impurity: Zn)
(7) n-type compound semiconductor layer (impurity: Si)
(8) p-type fourth compound semiconductor layer (impurity: Zn)
(9) n-type sixth compound semiconductor layer (impurity: Si)

Alternatively, the current block layer having the following eleven-layer structure may be used.

(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type compound semiconductor layer (impurity: Zn)
(7) n-type compound semiconductor layer (impurity: Si)
(8) p-type compound semiconductor layer (impurity: Zn)
(9) n-type compound semiconductor layer (impurity: Si)
(10) p-type fourth compound semiconductor layer (impurity: Zn)
(11) n-type sixth compound semiconductor layer (impurity: Si)

Figure 38A:
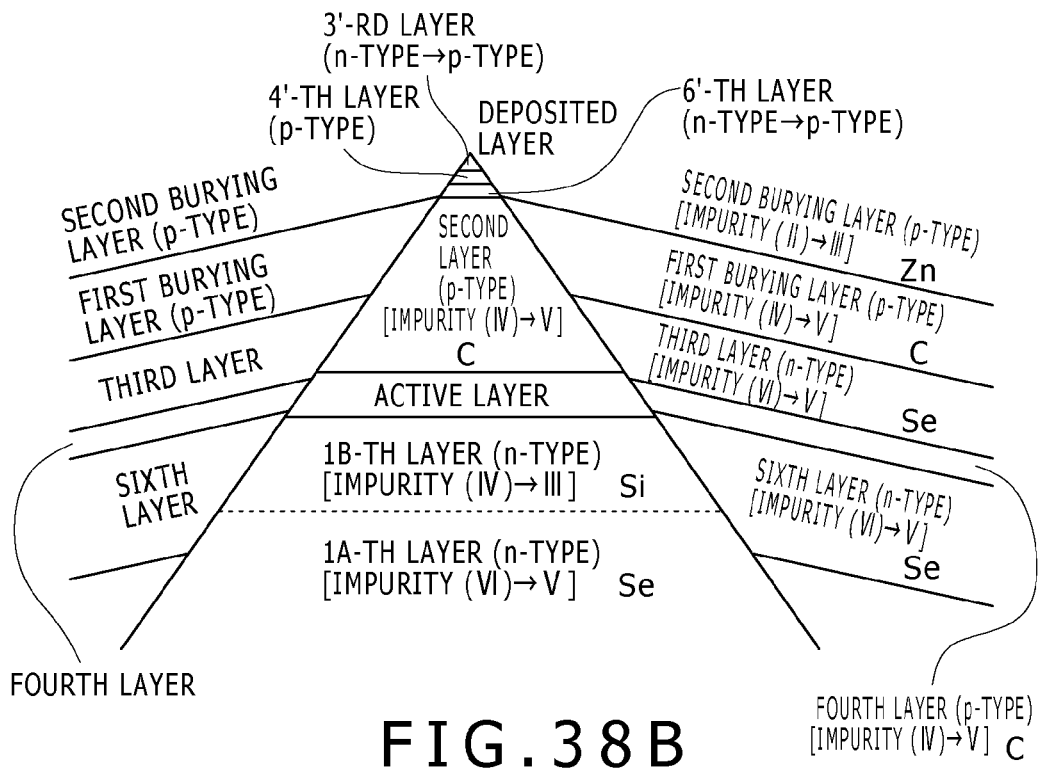
Figure 38B:
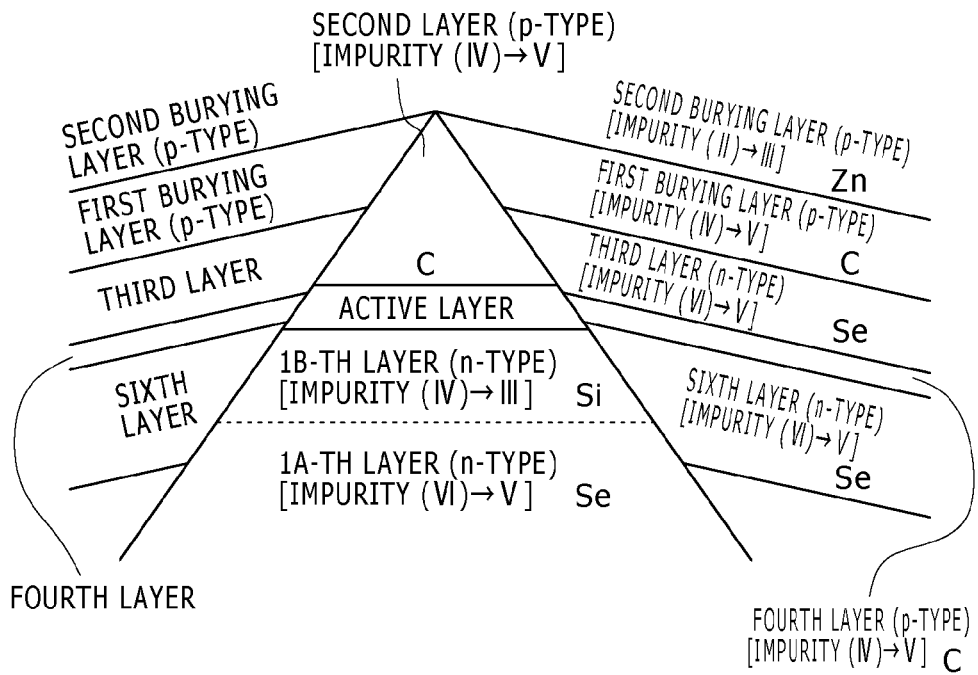

Similarly, in the structure shown in FIG. 16A, or in the structure shown in FIGS. 38A and 38B described later, instead of using the current block layer having the multilayer structure of the n-type third compound semiconductor layer/the p-type fourth compound semiconductor layer/the n-type sixth compound semiconductor layer, the current block layer having the following five-layer structure may be used without changing the thickness of the entire current block layer.

(1) n-type third compound semiconductor layer (impurity: Se)
(2) p-type compound semiconductor layer (impurity: C)
(3) n-type compound semiconductor layer (impurity: Se)
(4) p-type fourth compound semiconductor layer (impurity: C)
(5) n-type sixth compound semiconductor layer (impurity: Se)

Alternatively, the current block layer having the following seven-layer structure may be used.
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type fourth compound semiconductor layer (impurity: C)
(7) n-type sixth compound semiconductor layer (impurity: Se)

Alternatively, the current block layer having the following nine-layer structure may be used.
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type compound semiconductor layer (impurity: C)
(7) n-type compound semiconductor layer (impurity: Se)
(8) p-type fourth compound semiconductor layer (impurity: C)
(9) n-type sixth compound semiconductor layer (impurity: Se)

Alternatively, the current block layer having the following eleven-layer structure may be used.
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type compound semiconductor layer (impurity: C)
(7) n-type compound semiconductor layer (impurity: Se)
(8) p-type compound semiconductor layer (impurity: C)
(9) n-type compound semiconductor layer (impurity: Se)
(10) p-type fourth compound semiconductor layer (impurity: C)
(11) n-type sixth compound semiconductor layer (impurity: Se)

Figure 36A:
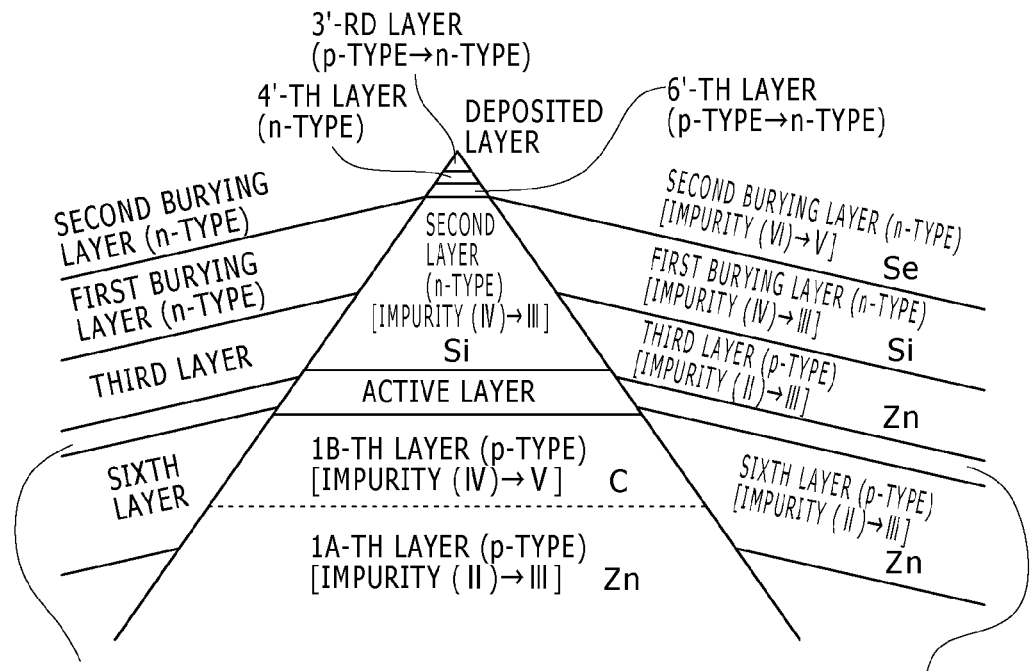
Figure 36B:
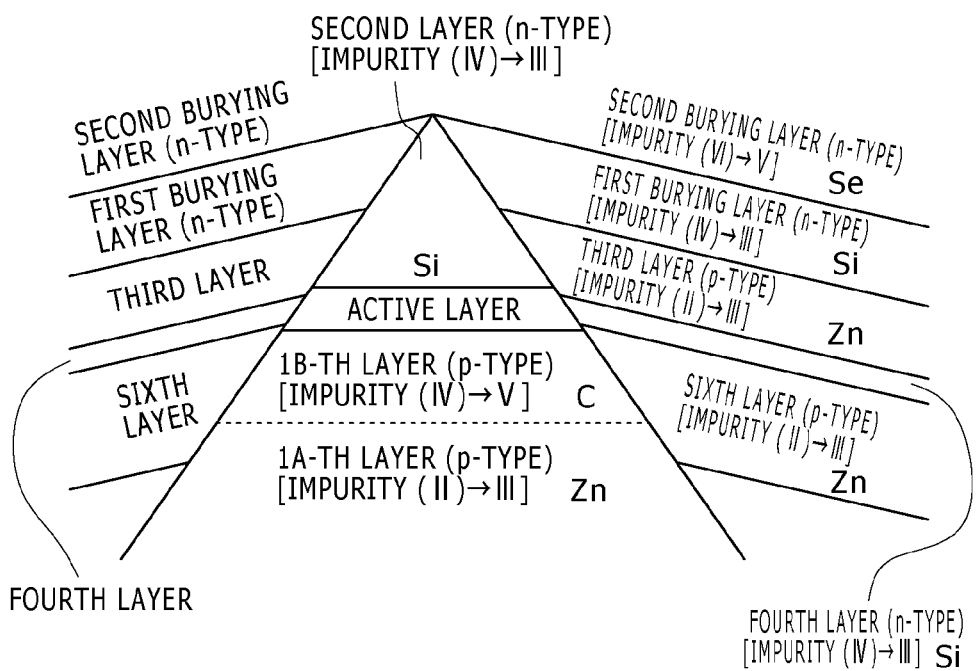

Furthermore, in the structure shown in FIG. 14B, or in the structure shown in FIGS. 36A and 36B described later, instead of using the current block layer having the multilayer structure of the p-type third compound semiconductor layer/the n-type fourth compound semiconductor layer/the p-type sixth compound semiconductor layer, the current block layer having the following five-layer structure may be used without changing the thickness of the entire current block layer.
(1) p-type third compound semiconductor layer (impurity: Zn)
(2) n-type compound semiconductor layer (impurity: Si)
(3) p-type compound semiconductor layer (impurity: Zn)
(4) n-type fourth compound semiconductor layer (impurity: Si)
(5) p-type sixth compound semiconductor layer (impurity: Zn)

Alternatively, the current block layer having the following seven-layer structure may be used.
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type fourth compound semiconductor layer (impurity: Si)
(7) p-type sixth compound semiconductor layer (impurity: Zn)

Alternatively, the current block layer having the following nine-layer structure may be used.
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type compound semiconductor layer (impurity: Si)
(7) p-type compound semiconductor layer (impurity: Zn)
(8) n-type fourth compound semiconductor layer (impurity: Si)
(9) p-type sixth compound semiconductor layer (impurity: Zn)

Alternatively, the current block layer having the following eleven-layer structure may be used.
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type compound semiconductor layer (impurity: Si)
(7) p-type compound semiconductor layer (impurity: Zn)
(8) n-type compound semiconductor layer (impurity: Si)
(9) p-type compound semiconductor layer (impurity: Zn)
(10) n-type fourth compound semiconductor layer (impurity: Si)
(11) p-type sixth compound semiconductor layer (impurity: Zn)

Figure 40A:
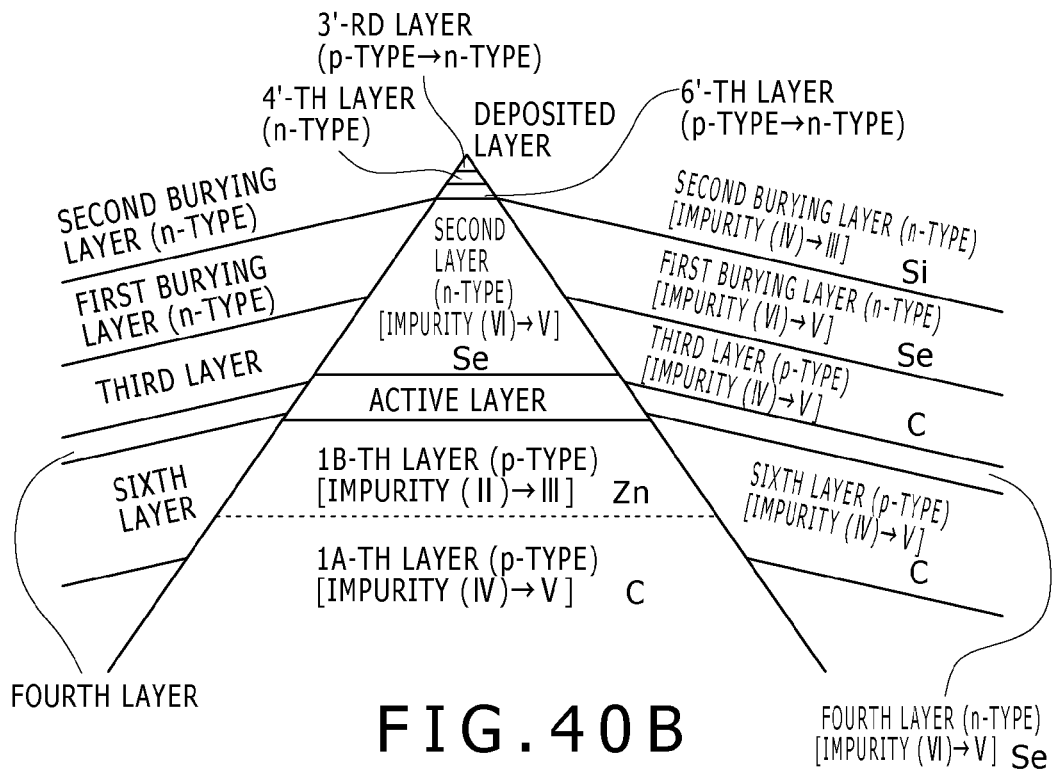
Figure 40B:
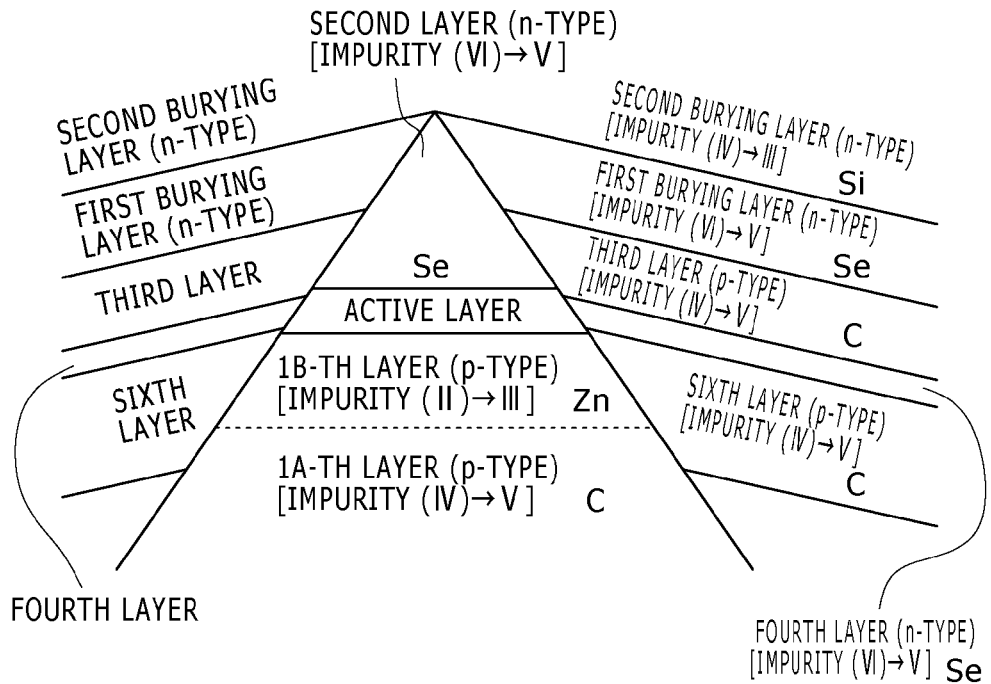

Similarly, in the structure shown in FIG. 16B, or in the structure shown in FIGS. 40A and 40B described later, instead of using the current block layer having the multilayer structure of the p-type third compound semiconductor layer/the n-type fourth compound semiconductor layer/the p-type sixth compound semiconductor layer, the current block layer having the following five-layer structure may be used without changing the thickness of the entire current block layer.
(1) p-type third compound semiconductor layer (impurity: C)
(2) n-type compound semiconductor layer (impurity: Se)
(3) p-type compound semiconductor layer (impurity: C)
(4) n-type fourth compound semiconductor layer (impurity: Se)
(5) p-type sixth compound semiconductor layer (impurity: C)

Alternatively, the current block layer having the following seven-layer structure may be used.
(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type fourth compound semiconductor layer (impurity: Se)
(7) p-type sixth compound semiconductor layer (impurity: C)

Alternatively, the current block layer having the following nine-layer structure may be used.

(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type compound semiconductor layer (impurity: Se)
(7) p-type compound semiconductor layer (impurity: C)
(8) n-type fourth compound semiconductor layer (impurity: Se)
(9) p-type sixth compound semiconductor layer (impurity: C)

Alternatively, the current block layer having the following eleven-layer structure may be used.

(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type compound semiconductor layer (impurity: Se)
(7) p-type compound semiconductor layer (impurity: C)
(8) n-type compound semiconductor layer (impurity: Se)
(9) p-type compound semiconductor layer (impurity: C)
(10) n-type fourth compound semiconductor layer (impurity: Se)
(11) p-type sixth compound semiconductor layer (impurity: C)

By thus employing the current block layer having a multilayer structure without increasing the total thickness of the current block layer, it is possible to select the design in which the thicknesses of the respective compound semiconductor layers included in the current block layer (at least one compound semiconductor layer of all the above-described compound semiconductor layers from the third compound semiconductor layer to the sixth compound semiconductor layer, or at least one compound semiconductor layer of all of the compound semiconductor layers from the fifth compound semiconductor layer to the fourth compound semiconductor layer in the structures of FIGS. 18A and 18B and FIGS. 20A and 20B, or in the structures of FIGS. 42A and 42B, FIGS. 44A and 44B, FIGS. 46A and 46B, and FIGS. 48A and 48B described later similarly to the above description) are set small optionally. Thus, the contact area of the surface in contact with the side surface of the light emitting part per one layer included in the current block layer can be decreased. If the thicknesses of the respective compound semiconductor layers included in the current block layer are so adjusted that the contact area of the contact surface is further decreased, it becomes possible to avoid the state in which the entire side surface of the active layer (or well layer) is covered by the contact surface of only one layer included in the current block layer, which allows further-ensured prevention of the phenomenon that a current leakage path from the bypass channel is formed.

In the thirteenth embodiment or thirteenth embodiment described later, it is also possible to employ the configuration that includes both the first compound semiconductor layer composed of the 1A-th compound semiconductor layer and the 1B-th compound semiconductor layer and the second compound semiconductor layer composed of the 2A-th compound semiconductor layer and the 2B-th compound semiconductor layer.

Fourteenth Embodiment

A fourteenth embodiment of the present invention relates to the semiconductor light emitting device according to ((II)-1)-th configuration (specifically, the ((II)-1-A)-th configuration), the ((II)-2-A)-th configuration, and the ((II)-4-A)-th configuration of the present invention.

Figure 21A:
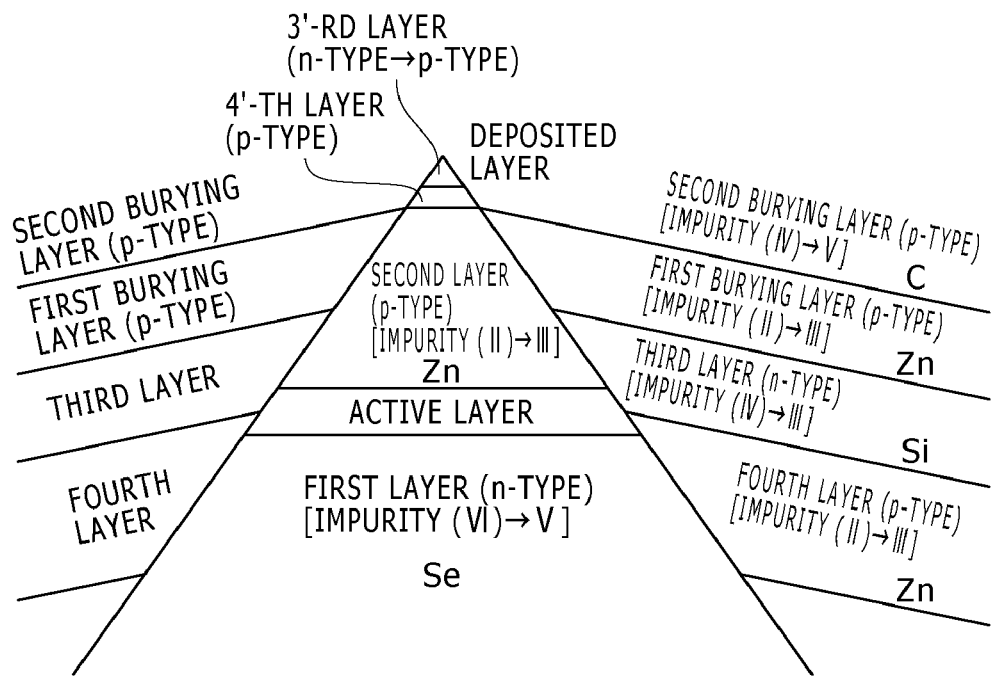
FIGS. 21A and 21B are conceptual diagrams of a semiconductor light emitting device according to a fourteenth embodiment of the present invention.
Figure 21B:
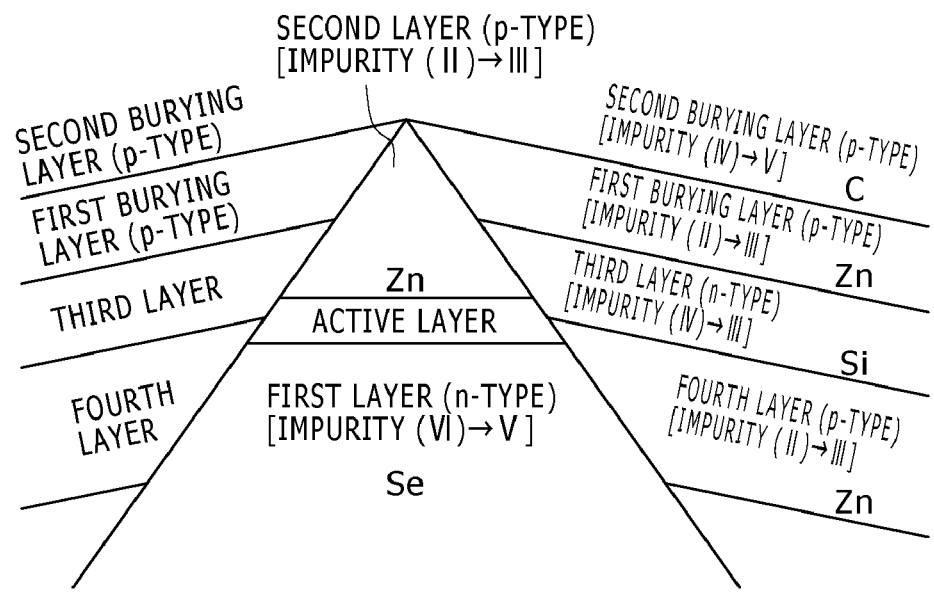
Figure 49:
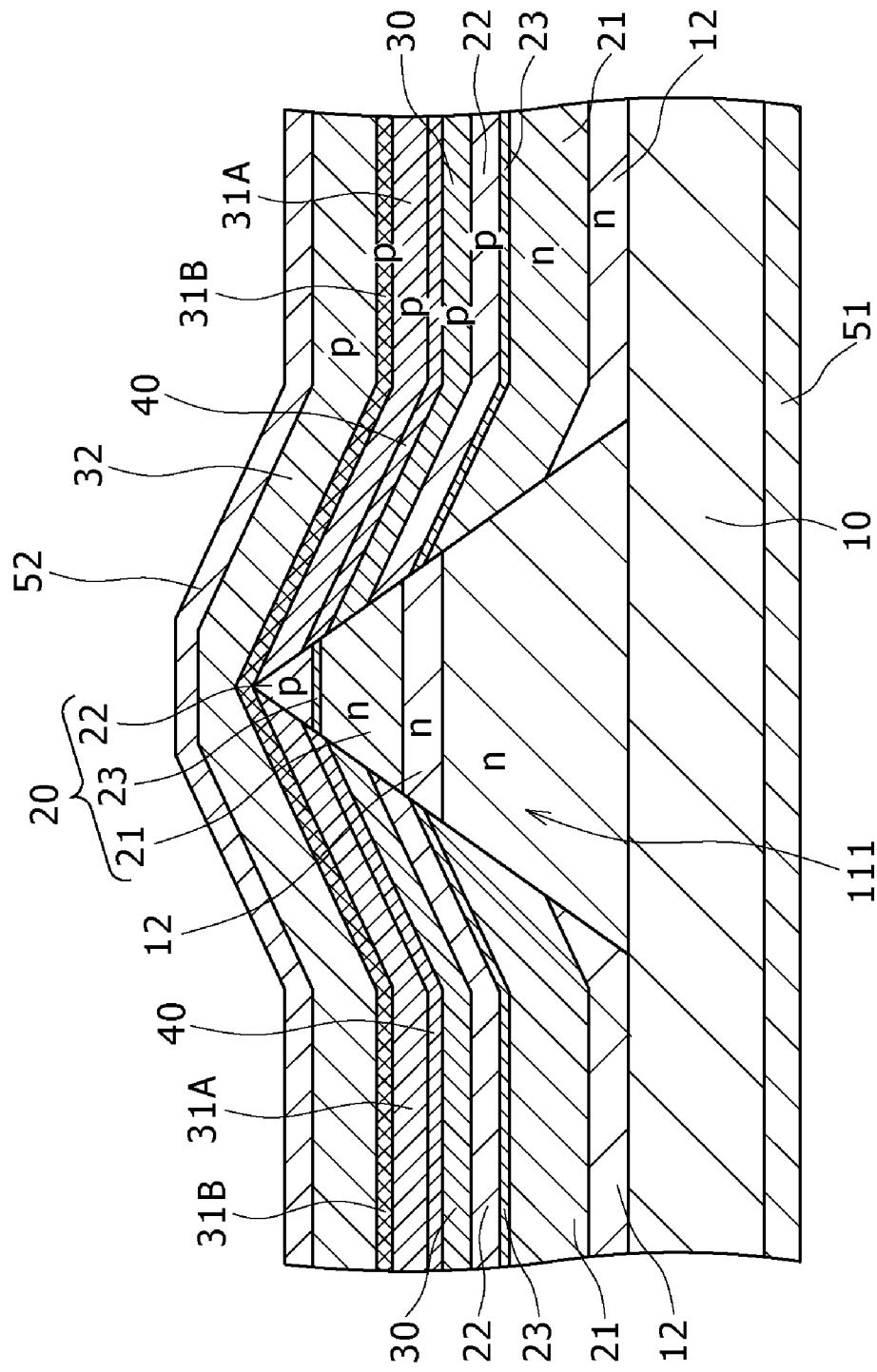
FIG. 49 is a schematic partial sectional view of the center part of the semiconductor light emitting device according to the fourteenth embodiment.
Figure 50:
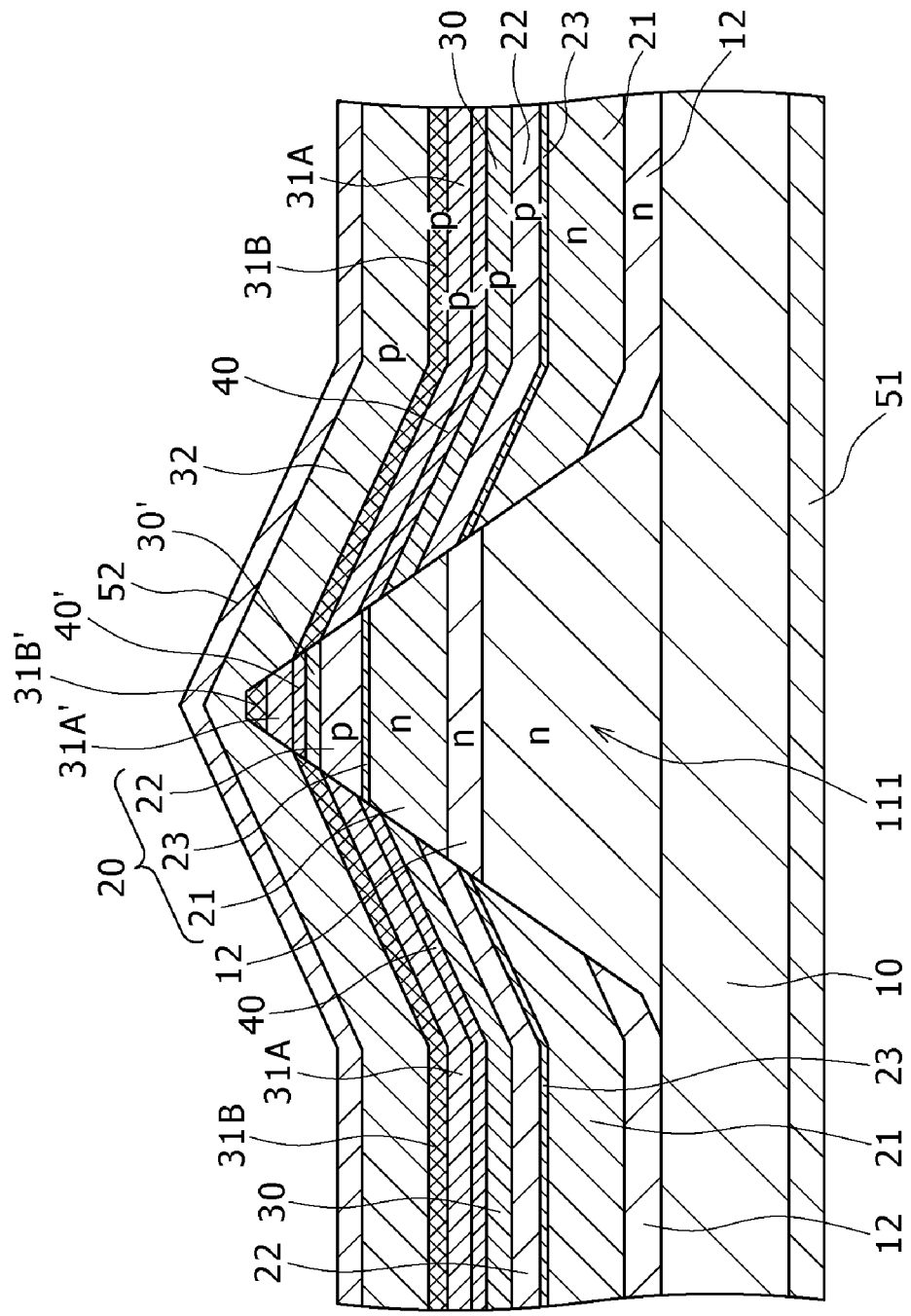
FIG. 50 is a schematic partial sectional view of both the end parts of the semiconductor light emitting device according to the fourteenth embodiment.
Figure 51A:
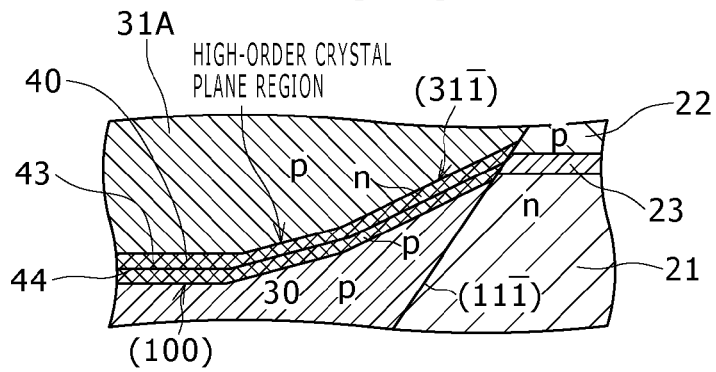
FIGS. 51A to 51C are enlarged schematic partial sectional views of the semiconductor light emitting device according to the fourteenth embodiment.
Figure 51B:
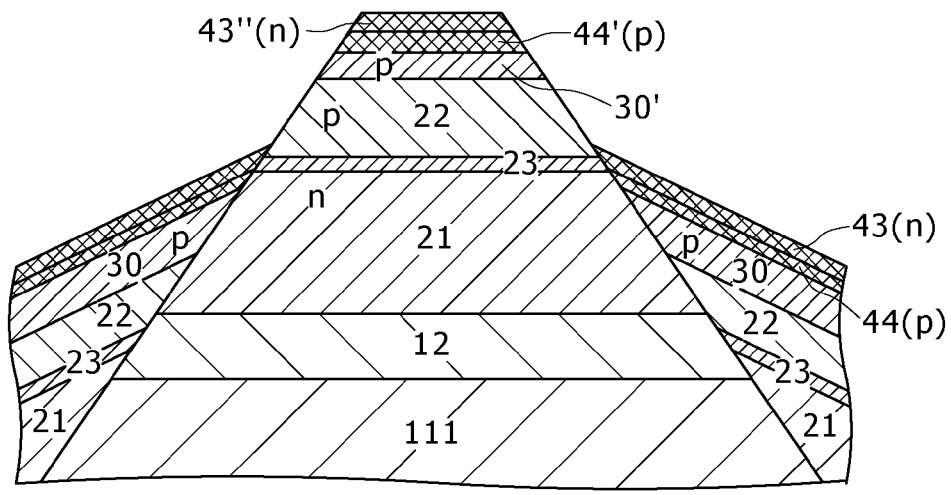
Figure 51C:
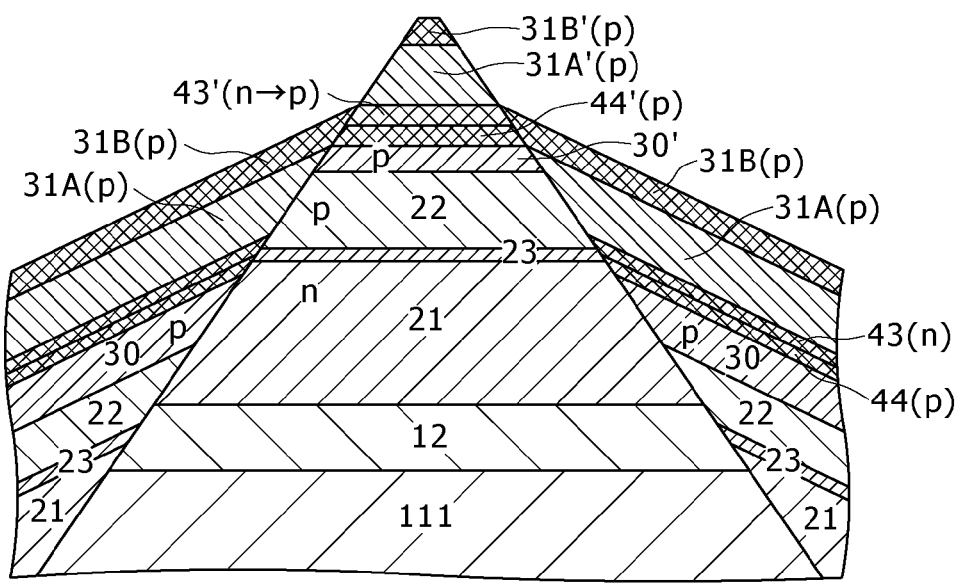

Conceptual diagrams of the semiconductor light emitting device of the fourteenth embodiment are shown in FIGS. 21A and 21B. Schematic partial sectional views of the semiconductor light emitting device are shown in FIGS. 49 and 50. Enlarged schematic partial sectional views of the semiconductor light emitting device are shown in FIGS. 51A to 51C. FIG. 21A is a conceptual diagram of the end parts of the semiconductor light emitting device. FIG. 21B is a conceptual diagram of the center part of the semiconductor light emitting device. FIG. 49 is a schematic partial sectional view of the center part of the semiconductor light emitting device. FIG. 50 is a schematic partial sectional view of the end parts of the semiconductor light emitting device. FIG. 51A is an enlarged schematic partial sectional view of a current block layer and the periphery thereof. FIGS. 51B and 51C are enlarged schematic partial sectional views of a light emitting part and the periphery thereof at the end parts of the semiconductor light emitting device. In the drawings, the thicknesses of some compound semiconductor layers in the sectional structure of the semiconductor light emitting device at the center part thereof shown in FIG. 49 look different from those of the same compound semiconductor layers in the sectional structure of the semiconductor light emitting device at both the end parts thereof shown in FIG. 50. However, the same layer actually has the same thickness.

The semiconductor light emitting device of the fourteenth embodiment further includes a burying layer 31 formed over the current block layer 40 and the light emitting part 20. The active layer 23 is stacked above the underlying layer 111 having the planar shape (so-called mesa structure) as with the projection part 211 schematically shown in FIG. 60B. Thus, the active layer 23 has a strip planar shape in which the width of the center part is smaller than that of both the end parts. That is, the semiconductor light emitting devices of the fourteenth embodiment and the fifteenth to twenty-second embodiments to be described later have a so-called flare-stripe structure.

The burying layer 31 of the second conductivity type is formed of a multilayer structure arising from sequential stacking of a first burying layer 31A and a second burying layer 31B. In the burying layer 31 located above the current block layer 40, the impurity for causing the second burying layer 31B to have the second conductivity type is such that the substitution site of the impurity in the second burying layer 31B does not compete with the substitution site of the impurity in the third compound semiconductor layer 43 for causing the third compound semiconductor layer 43 to have the first conductivity type. Furthermore, in the burying layer 31 located above the current block layer 40, the impurity for causing the first burying layer 31A to have the second conductivity type is such that the substitution site of the impurity in the first burying layer 31A competes with the substitution site of the impurity in the third compound semiconductor layer 43 for causing the third compound semiconductor layer 43 to have the first conductivity type. In addition, in the burying layer 31 located above the current block layer 40, the impurity for causing the first burying layer 31A to have the second conductivity type is such that the substitution site of the impurity in the first burying layer 31A competes with the substitution site of the impurity in the fourth compound semiconductor layer 44 for causing the fourth compound semiconductor layer 44 to have the second conductivity type. These features apply also to the fifteenth to twenty-second embodiments to be described later.

In the example shown in FIGS. 49 and 50, as explained in the fifth embodiment, the third compound semiconductor layer 43 is formed on the fourth compound semiconductor layer 44. Alternatively, as explained in the fifth embodiment, the positional relationship between the third compound semiconductor layer 43 (n-type) and the fourth compound semiconductor layer 44 (p-type) may be reversed.

Specifically, when the semiconductor light emitting device of the fourteenth embodiment is represented based on the ((II)-1-A)-th configuration of the present invention, in the semiconductor light emitting device of the fourteenth embodiment, the first compound semiconductor layer 21, the second compound semiconductor layers 22A and 22B, the third compound semiconductor layer 43, the fourth compound semiconductor layer 44, the first burying layer 31A, and the second burying layer 31B are composed of a III-V compound semiconductor, the substitution site of the impurity in the first compound semiconductor layer 21 is the site occupied by a group V atom, the substitution site of the impurity in the second compound semiconductor layers 22A and 22B is the site occupied by a group III atom, the substitution site of the impurity in the third compound semiconductor layer 43 and the substitution site of the impurity in the fourth compound semiconductor layer 44 are the site occupied by a group III atom, the substitution site of the impurity in the first burying layer 31A is the site occupied by a group III atom, and the substitution site of the impurity in the second burying layer 31B is the site occupied by a group V atom.

Furthermore, when the semiconductor light emitting device of the fourteenth embodiment is represented based on the ((II)-2-A)-th configuration of the present invention, in the semiconductor light emitting device of the fourteenth embodiment, the first compound semiconductor layer 21, the second compound semiconductor layers 22A and 22B, the third compound semiconductor layer 43, the fourth compound semiconductor layer 44, the first burying layer 31A, and the second burying layer 31B are composed of a III-V compound semiconductor, the impurity for causing the first compound semiconductor layer 21 to be the n-type as the first conductivity type is a group VI impurity, the impurity for causing the third compound semiconductor layer 43 to be the n-type as the first conductivity type is a group IV impurity, the impurity for causing the first burying layer 31A to be the p-type as the second conductivity type is a group II impurity, and the impurity for causing the second burying layer 31B to be the p-type as the second conductivity type is carbon (C).

In addition, when the semiconductor light emitting device of the fourteenth embodiment is represented based on the ((II)-4-A)-th configuration of the present invention, in the semiconductor light emitting device of the fourteenth embodiment, the impurity for causing the first compound semiconductor layer 21 to have the first conductivity type (n-type) is different from the impurity for causing the third compound semiconductor layer 43 to have the first conductivity type (n-type).

Specifically, in the semiconductor light emitting device of the fourteenth embodiment, the respective layers have the configuration shown in Table 11A or Table 11B shown below. The compound semiconductors of the first compound semiconductor layer 21, the second compound semiconductor layers 22A and 22B, and the current block layer 40 have wider band gaps, i.e., lower refractive indexes, compared with the compound semiconductors of the active layer 23. In the example shown in Table 11A, the third compound semiconductor layer 43 is stacked on the fourth compound semiconductor layer 44. In the example shown in Table 11B, the fourth compound semiconductor layer 44 is stacked on the third compound semiconductor layer 43.

TABLE 11A (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer -A] |
| First compound semiconductor layer 21 | n-$Al_{0.4}Ga_{0.6}As$: Se |
| (Current block layer) | |
| Second burying layer 31B | p-$Al_{0.47}Ga_{0.53}As$: C |
| First burying layer 31A | p-$Al_{0.47}Ga_{0.53}As$: Zn |
| Third compound semiconductor layer 43 | n-$Al_{0.47}Ga_{0.53}As$: Si |
| Fourth compound semiconductor layer 44 | p-$Al_{0.47}Ga_{0.53}As$: Zn |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of p-$Al_{0.47}Ga_{0.53}As$: Zn is formed between the third compound semiconductor layer 43 and the first burying layer 31A (the partial portion of the first burying layer 31A in the vicinity of the interface with the third compound semiconductor layer 43 corresponds to this fifth compound semiconductor layer).

TABLE 11B (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer -A] |
| First compound semiconductor layer 21 | n-$Al_{0.4}Ga_{0.6}As$: Se |
| (Current block layer) | |
| Second burying layer 31B | p-$Al_{0.47}Ga_{0.53}As$: C |
| First burying layer 31A | p-$Al_{0.47}Ga_{0.53}As$: Zn |
| Fourth compound semiconductor layer 44 p-$Al_{0.47}Ga_{0.53}As$: Zn | |
| Third compound semiconductor layer 43 | n-$Al_{0.47}Ga_{0.53}As$: Si |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The first burying layer 31A is formed subsequently to the fourth compound semiconductor layer 44 in a continuous manner, and a boundary does not exist between the first burying layer 31A and the fourth compound semiconductor layer 44 substantially.

In the manufacturing process of the semiconductor light emitting device of the fourteenth embodiment, at the timing when the formation of the light emitting part is completed, the sectional shape of the light emitting part 20 obtained when the center part of the light emitting part 20 is cut along a virtual plane perpendicular to the axis line of the light emitting part 20 is a triangle. At this time, the sectional shape of the light emitting part 20 obtained when the end part of the light emitting part 20 is cut along a virtual plane perpendicular to the axis line of the light emitting part 20 is a trapezoid.

Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a layer (deposited layer 40") having the same multilayer structure as that of the current block layer 40 is formed above the top surface of the light emitting part 20 (see FIG. 51B). The fourth compound semiconductor layer included in the deposited layer 40" at the timing when the deposited layer 40" is formed will be referred to as a deposited layer 44' of the fourth compound semiconductor layer, and the third compound semiconductor layer included in the deposited layer 40" at the same timing will be referred to as a deposited layer 43" of the third compound semiconductor layer. Between the deposited layer 40" and the top surface of the multilayer structure of the light emitting part 20, a compound semiconductor layer 30' having the same configuration as that of the adjustment layer 30 is formed.

Subsequently to the formation of the current block layer 40, the first burying layer 31A is so formed as to cover the side surfaces of the light emitting part 20 and the side surfaces of at least one layer of the deposited layer 40" stacked above the light emitting part 20, at both the end parts in particular. Subsequently, at the timing of the completion of the covering of at least the side surfaces of the light emitting part 20 and the side surfaces of the compound semiconductor layer 30' by the first burying layer 31A, the formation of the second burying layer 31B is started, so that the entire surface is covered by the second burying layer 31B. At this time, the impurity for causing the second burying layer 31B to have the second conductivity type is such that the substitution site of the impurity in the second burying layer 31B (the site occupied by a group V atom, in the fourteenth embodiment) does not compete with the substitution site of the impurity in the third compound semiconductor layer (the site occupied by a group III atom, in the fourteenth embodiment) for causing the third compound semiconductor layer 43 to have the first conductivity type (see Table 11A or Table 11B). Therefore, e.g. the impurity for causing the second burying layer 31B that is deposited to a large thickness so that the apex may be finally covered to have the second conductivity type diffuses into the deposited layer 43" of the third compound semiconductor layer, formed above the top surface at both the end parts of the light emitting part 20. This diffusion turns the deposited layer 43" of the third compound semiconductor layer to a deposited layer 43' of the third compound semiconductor layer, having the second conductivity type (see FIG. 51C). The deposited layer that has become such a state will be referred to as a deposited layer vestige 40'. Furthermore, the first burying layer and the second burying layer formed above the deposited layer vestige 40' will be referred to as a first burying layer 31A' and a second burying layer 31B,' respectively. In FIGS. 21A, 22A, 23A, 24A, 25A, 26A, 27A, 28A, 29A, 30A, 31A, 32A, 33A, 34A, 35A, 36A, 37A, 38A, 39A, 40A, 41A, 42A, 43A, 44A, 45A, 46A, 47A and 48A, the deposited layer 43' of the third compound semiconductor layer is indicated as "3'-rd layer," and the deposited layer 44' of the fourth compound semiconductor layer is indicated as "4'-th layer." In particular, if a compound semiconductor layer of the first conductivity type is included in the deposited layer 40", it is desirable that the burying layer 31 of the second conductivity type whose impurity substitution site does not compete with the impurity substitution site in this compound semiconductor layer of the first conductivity type included in the deposited layer 40" be in contact with at least a part of the side surface of the deposited layer 40". This structure allows the impurity of the second conductivity type in the burying layer 31 (e.g. the burying layer 31B) to diffuse from the at least a part of the side surface of the deposited layer 40". As a result, it is possible to initially carry out conductivity type compensation for the compound semiconductor layer of the first conductivity type that is included in the deposited layer 40" and causes the current blocking, and thus turn this compound semiconductor layer of the first conductivity type to a layer of the second conductivity type.

The semiconductor light emitting device of the fourteenth embodiment can be manufactured based on a method described below for example. That is, based on the similar steps of [Step-100] to [Step-110] in the first embodiment, the underlying layer 111 having the planar shape shown in FIG. 60B is formed. In FIG. 60B, the underlying layer 111 is hatched for clearly showing it.

Subsequently, in the same manner as [Step-120] in the first embodiment, above the top surface of the underlying layer 111, the light emitting part 20 is formed arising from sequential stacking of the first compound semiconductor layer 21 of the first conductivity type, an active layer 23, and the second compound semiconductor layer 22 of the second conductivity type, and, on an exposed major surface of the substrate 10, the multilayer structure is formed arising from sequential stacking of the first compound semiconductor layer 21 of the first conductivity type, the active layer 23, and the second compound semiconductor layer 22 of the second conductivity type. By properly selecting the width and thickness of the underlying layer 111 (projection surface) and properly selecting the thicknesses of the buffer layer 12, the first compound semiconductor layer 21, the active layer 23, and the second compound semiconductor layers 22A and 22B, a multilayer structure of the light emitting part 20 having a triangular sectional shape can be obtained above the center part of the underlying layer 111 (projection surface). At this time, at both the end parts of the underlying layer 111, a multilayer structure of the light emitting part 20 having a trapezoidal sectional shape can be obtained simultaneously. Thereafter, in the process of the continuation of the growth of the layers subsequent to the second compound semiconductor layer 22, at the center part, the side surfaces of the triangle in the growth stop state are gradually covered, so that the apex of the triangle is also completely covered by the second burying layer finally. On the other hand, at both the end parts, the growth of the compound semiconductor layer continues on the top surface ({100} plane) of the trapezoid in the process of the continuation of the growth of the layers subsequent to the second compound semiconductor layer 22. Thus, for example, a triangle (apex) having a larger sectional area compared with the triangle of the center part is eventually formed. Furthermore, the side surfaces of this triangle are gradually covered, so that the apex is also completely covered by the second burying layer finally.

Figure 52:
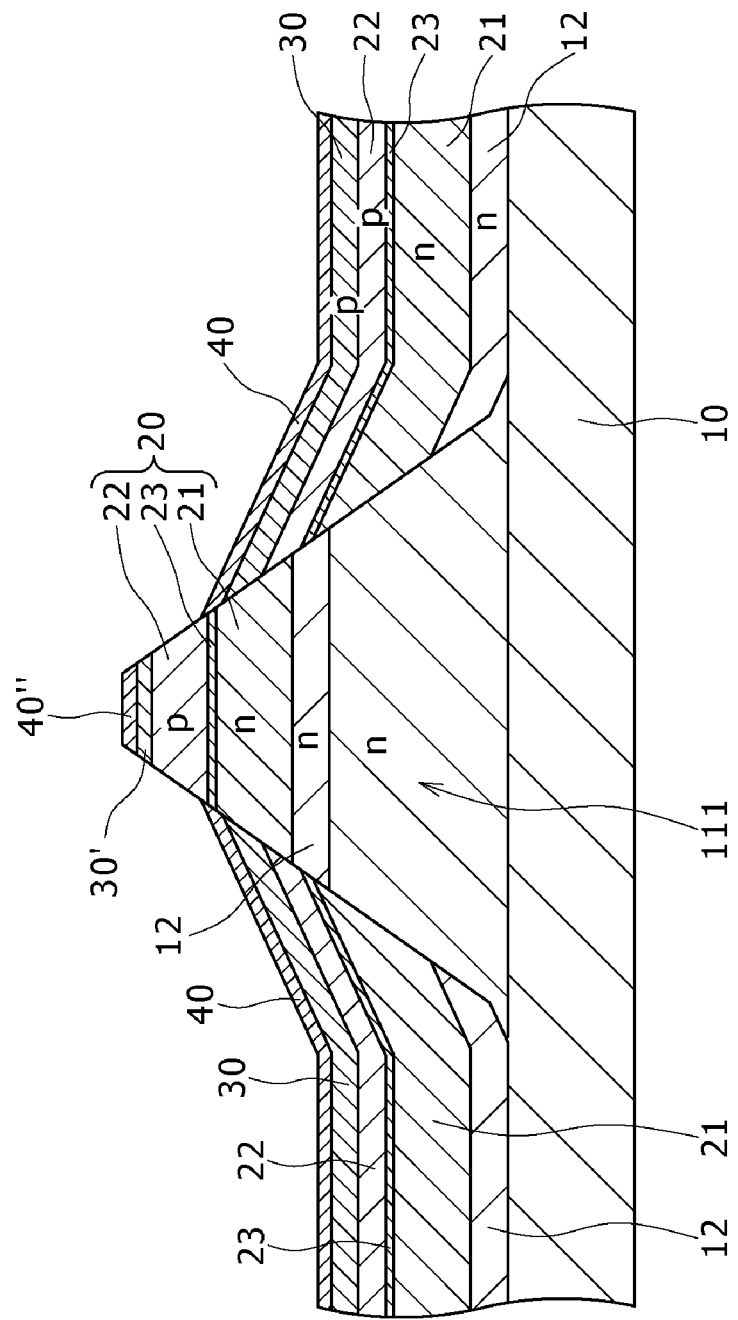
FIG. 52 is a schematic partial sectional view of a substrate and so on (at both the end parts of the semiconductor light emitting device), for explaining a method for manufacturing a semiconductor light emitting device according to the fourteenth embodiment.

Specifically, continuously with the formation of the second compound semiconductor layer 22B, the adjustment layer 30 is formed across the entire surface based on MOCVD. Subsequently, for example, the current block layer 40 formed of the multilayer structure composed of the fourth compound semiconductor layer 44 and the third compound semiconductor layer 43 is formed based on MOCVD. In this way, the sectional structure shown in FIG. 5 can be obtained at the center part of the underlying layer 111. At both the end parts of the underlying layer 111, the sectional structure shown in FIG. 52 can be obtained. The current block layer 40 is not grown on the {111}B plane. The current block layer 40 is so formed that the end surfaces of the current block layer 40 cover at least the side surfaces of the active layer 23. Such configuration and structure can be achieved by properly selecting the width of the top surface of the underlying layer 111 and the height of the underlying layer 111 and by properly selecting the thickness of the adjustment layer 30. The configurations and structures of the third compound semiconductor layer 43 and the fourth compound semiconductor layer 44 are as described above.

Figure 53:
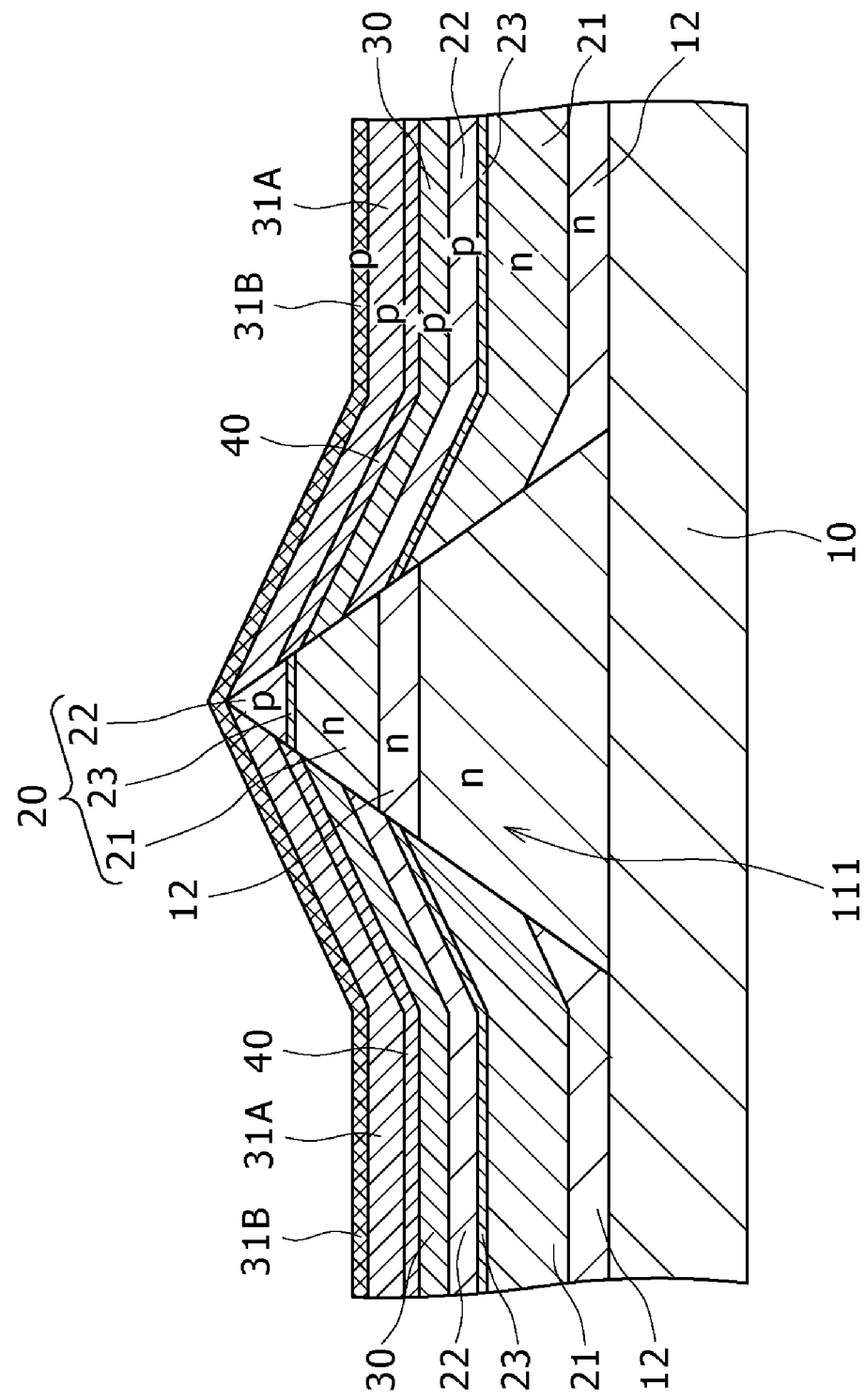
FIG. 53 is a schematic partial sectional view of the substrate and so on (at both the end parts of the semiconductor light emitting device), for explaining the method for manufacturing a semiconductor light emitting device according to the fourteenth embodiment.
Figure 54:
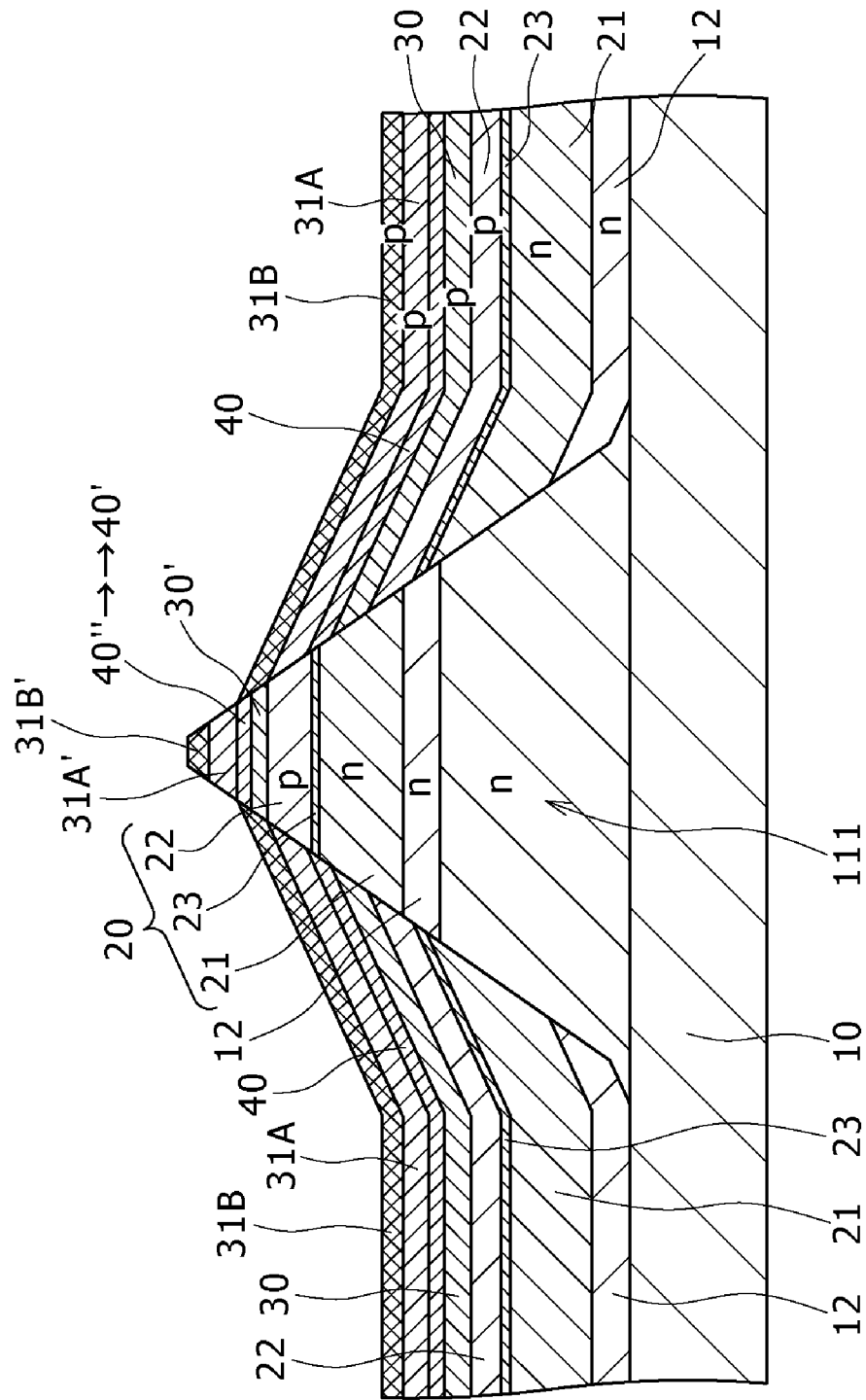
FIG. 54 is a schematic partial sectional view of the substrate and so on (at both the end parts of the semiconductor light emitting device), for explaining the method for manufacturing a semiconductor light emitting device according to the fourteenth embodiment.

Subsequently, the first burying layer 31A, the second burying layer 31B, and the contact layer (cap layer) 32 are sequentially formed across the entire surface based on MOCVD. Specifically, if the MOCVD is continued, the first burying layer 31A composed of the compound semiconductor arising from the crystal growth from the exposed surface of the substrate 10 will, in time, completely cover the side surfaces of the light emitting part 20 in the self growth stop state, and, at both the end parts, at least the side surfaces of one layer of the deposited layer 40" stacked above the light emitting part 20. In this state, the growth of the first burying layer 31A is stopped. Subsequently, the second burying layer 31B is grown, so that the entire surface is completely buried by the second burying layer 31B. In this way, the sectional structure shown in FIG. 53 can be obtained at the center part of the underlying layer 111. At both the end parts of the underlying layer 111, the sectional structure shown in FIG. 54 can be obtained. Thereafter, the second electrode 52 is formed on the contact layer 32 based on the vacuum evaporation. Furthermore, the substrate 10 is lapped to a proper thickness from the backside thereof, and then the first electrode 51 is formed based on vacuum evaporation. In this way, the sectional structure shown in FIG. 49 can be obtained at the center part of the underlying layer 111. At both the end parts of the underlying layer 111, the sectional structure shown in FIG. 50 can be obtained.

Thereafter, the respective semiconductor light emitting devices are separated from each other, so that the semiconductor light emitting devices can be obtained. The semiconductor light emitting devices of the fifteenth to twenty-second embodiments to be described later can also be manufactured based on a method similar to the above-described method basically.

In the burying layer 31 located above the current block layer 40, the impurity for causing the first burying layer 31A to have the second conductivity type is such that the substitution site of the impurity in the first burying layer 31A competes with the substitution site of the impurity in the fourth compound semiconductor layer 44 for causing the fourth compound semiconductor layer 44 to have the second conductivity type. This feature allows ensured prevention of the diffusion of the impurity in the first burying layer 31A into the fourth compound semiconductor layer 44. On the other hand, the impurity for causing the second burying layer 31B to have the second conductivity type is such that the substitution site of the impurity in the second burying layer 31B does not compete with the substitution site of the impurity in the third compound semiconductor layer 43 for causing the third compound semiconductor layer 43 to have the first conductivity type. Therefore, the impurity for causing the second burying layer 31B to have the second conductivity type diffuses into the deposited layer 43" of the third compound semiconductor layer, having the first conductivity type, in the deposited layer 40" formed above the top surface at both the end parts of the light emitting part 20 at the same timing as that of the current block layer. This impurity diffusion turns the deposited layer 43" of the third compound semiconductor layer to the deposited layer 43' of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer 23 is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased. This basic principle applies also to the fifteenth to twenty-second embodiments to be described later.

Fifteenth Embodiment

The fifteenth embodiment is a modification of the fourteenth embodiment, and relates to the ((II)-1-B)-th configuration of the present invention and the ((II)-2-B)-th configuration of the present invention.

Figure 22A:
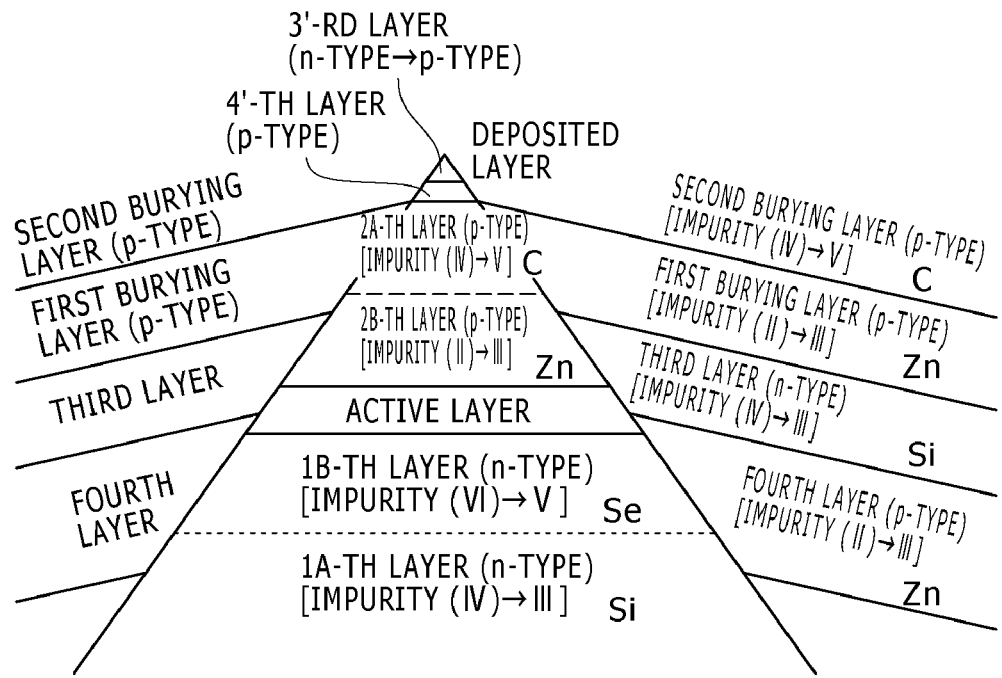
FIGS. 22A and 22B are conceptual diagrams of a semiconductor light emitting device according to a fifteenth embodiment of the present invention.
Figure 22B:
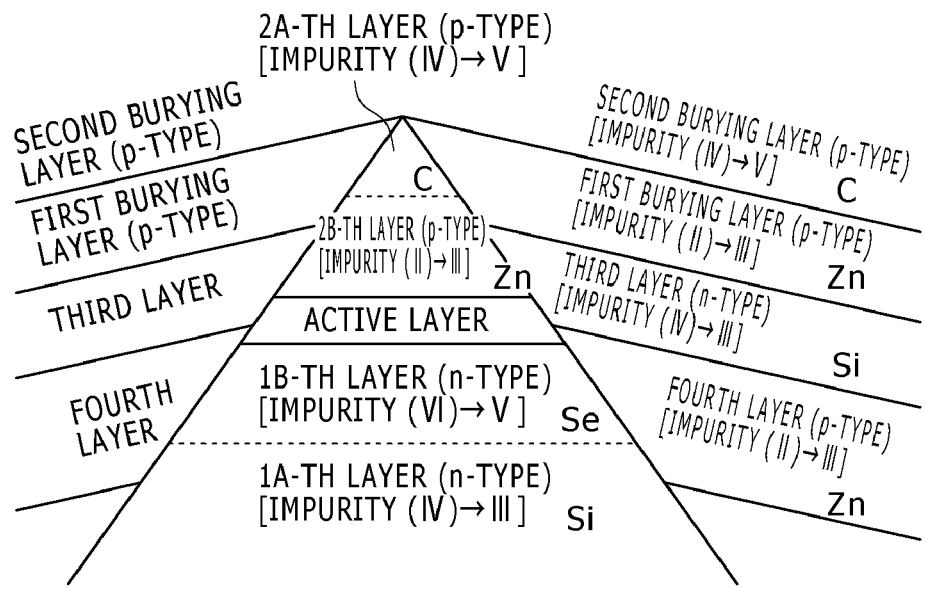

Specifically, as shown in FIG. 22A as a conceptual diagram of the end parts of the light emitting part and FIG. 22B as a conceptual diagram of the center part of the light emitting part, when the semiconductor light emitting device of the fifteenth embodiment is represented based on the ((II)-1-B)-th configuration of the present invention, in the semiconductor light emitting device of the fifteenth embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom.

Furthermore, when the semiconductor light emitting device of the fifteenth embodiment is represented based on the ((II)-2-B)-th configuration of the present invention, in the semiconductor light emitting device of the fifteenth embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group IV impurity, the impurity for causing the fourth compound semiconductor layer to be the p-type as the second conductivity type is a group II impurity, the impurity for causing the first burying layer to be the p-type as the second conductivity type is a group II impurity, and the impurity for causing the second burying layer to be the p-type as the second conductivity type is carbon (C).

More specifically, in the semiconductor light emitting device of the fifteenth embodiment, the respective layers have the configuration shown in Table 12A or Table 12B shown below. In the example shown in Table 12A, the third compound semiconductor layer is stacked on the fourth compound semiconductor layer. In the example shown in Table 12B, the fourth compound semiconductor layer is stacked on the third compound semiconductor layer.

TABLE 12A (Configuration of light emitting part)

| 2A-th compound semiconductor layer | p-$Al_{0.4}Ga_{0.6}As$: C |
|---|---|
| 2B-th compound semiconductor layer | p-$Al_{0.4}Ga_{0.6}As$: Zn |
| Active layer | [Active layer-A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: C |
| First burying layer | p-$Al_{0.47}Ga_{0.53}As$: Zn |
| Third compound semiconductor layer | n-$Al_{0.47}Ga_{0.53}As$: Si |
| Fourth compound semiconductor layer | p-$Al_{0.47}Ga_{0.53}As$: Zn |
| Adjustment layer | p-$Al_{0.47}Ga_{0.53}As$: Zn |

TABLE 12A-continued (Whole)

| Contact layer | p-GaAs: Zn (or C) |
|---|---|

(Note 1)
The adjustment layer is formed subsequently to the 2A-th compound semiconductor layer.

(Note 2)
The fourth compound semiconductor layer is formed subsequently to the adjustment layer in a continuous manner, and a boundary does not exist between the fourth compound semiconductor layer and the adjustment layer substantially.

(Note 3)
It is also possible to consider that a fifth compound semiconductor layer composed of p-$Al_{0.47}Ga_{0.53}As$: Zn is formed between the third compound semiconductor layer and the first burying layer (the partial portion of the first burying layer in the vicinity of the interface with the third compound semiconductor layer corresponds to this fifth compound semiconductor layer).

TABLE 12B (Configuration of light emitting part)

| 2A-th compound semiconductor layer | p-$Al_{0.4}Ga_{0.6}As$: C |
|---|---|
| 2B-th compound semiconductor layer | p-$Al_{0.4}Ga_{0.6}As$: Zn |
| Active layer | [Active layer-A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: C |
| First burying layer | p-$Al_{0.47}Ga_{0.53}As$: Zn |
| Fourth compound semiconductor layer | p-$Al_{0.47}Ga_{0.53}As$: Zn |
| Third compound semiconductor layer | n-$Al_{0.47}Ga_{0.53}As$: Si |
| Adjustment layer | p-$Al_{0.47}Ga_{0.53}As$: Zn |
| (Whole) | |
| Contact layer | p-GaAs: Zn (or C) |

(Note 1)
The adjustment layer is formed subsequently to the 2A-th compound semiconductor layer.

(Note 2)
The first burying layer is formed subsequently to the fourth compound semiconductor layer in a continuous manner, and a boundary does not exist between the first burying layer and the fourth compound semiconductor layer substantially.

Sixteenth Embodiment

The sixteenth embodiment is also a modification of the fourteenth embodiment, and relates to the ((II)-1-C)-th configuration of the present invention, the ((II)-2-C)-th configuration of the present invention, and the ((II)-4-A)-th configuration of the present invention. In the sixteenth embodiment and the seventeenth embodiment to be described later, the conductivity types are reversed from those in the fourteenth embodiment. That is, in the sixteenth embodiment and the seventeenth embodiment to be described later, the first conductivity type is the p-type and the second conductivity type is the n-type.

Figure 23A:
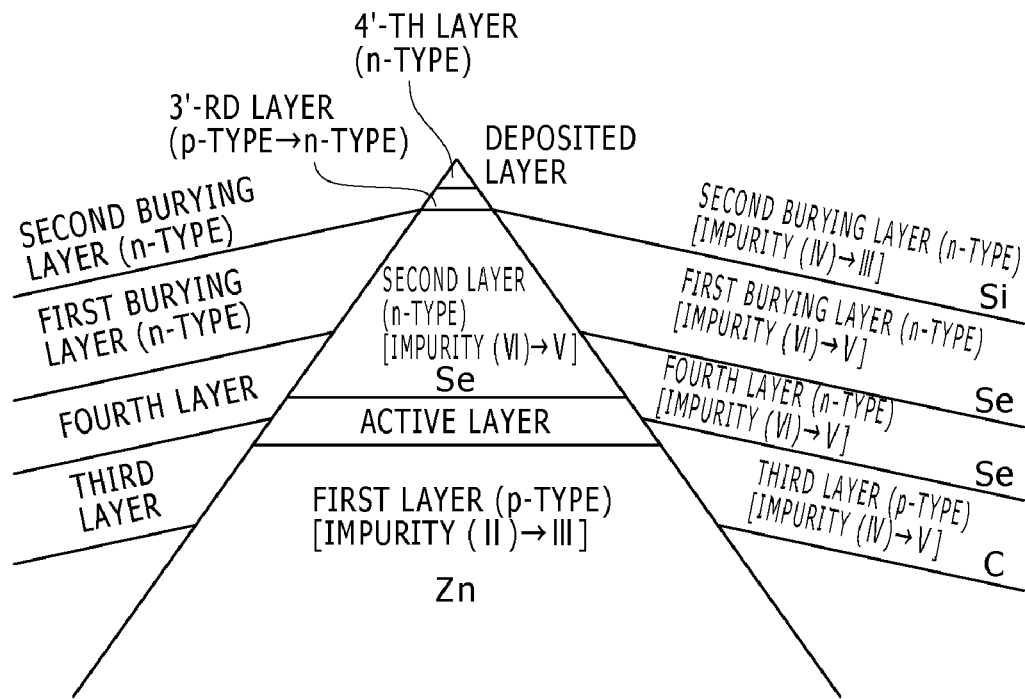
FIGS. 23A and 23B are conceptual diagrams of a semiconductor light emitting device according to a sixteenth embodiment of the present invention.
Figure 23B:
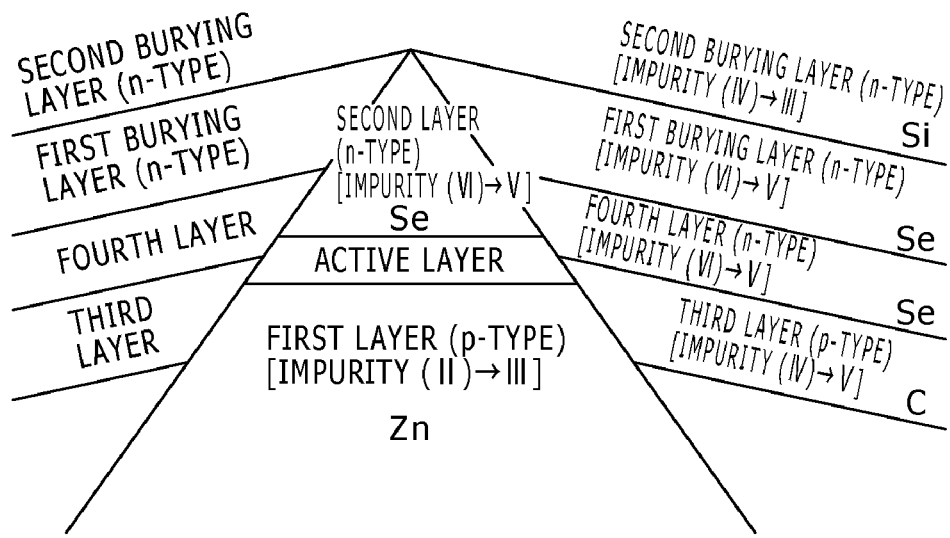
Figure 55:
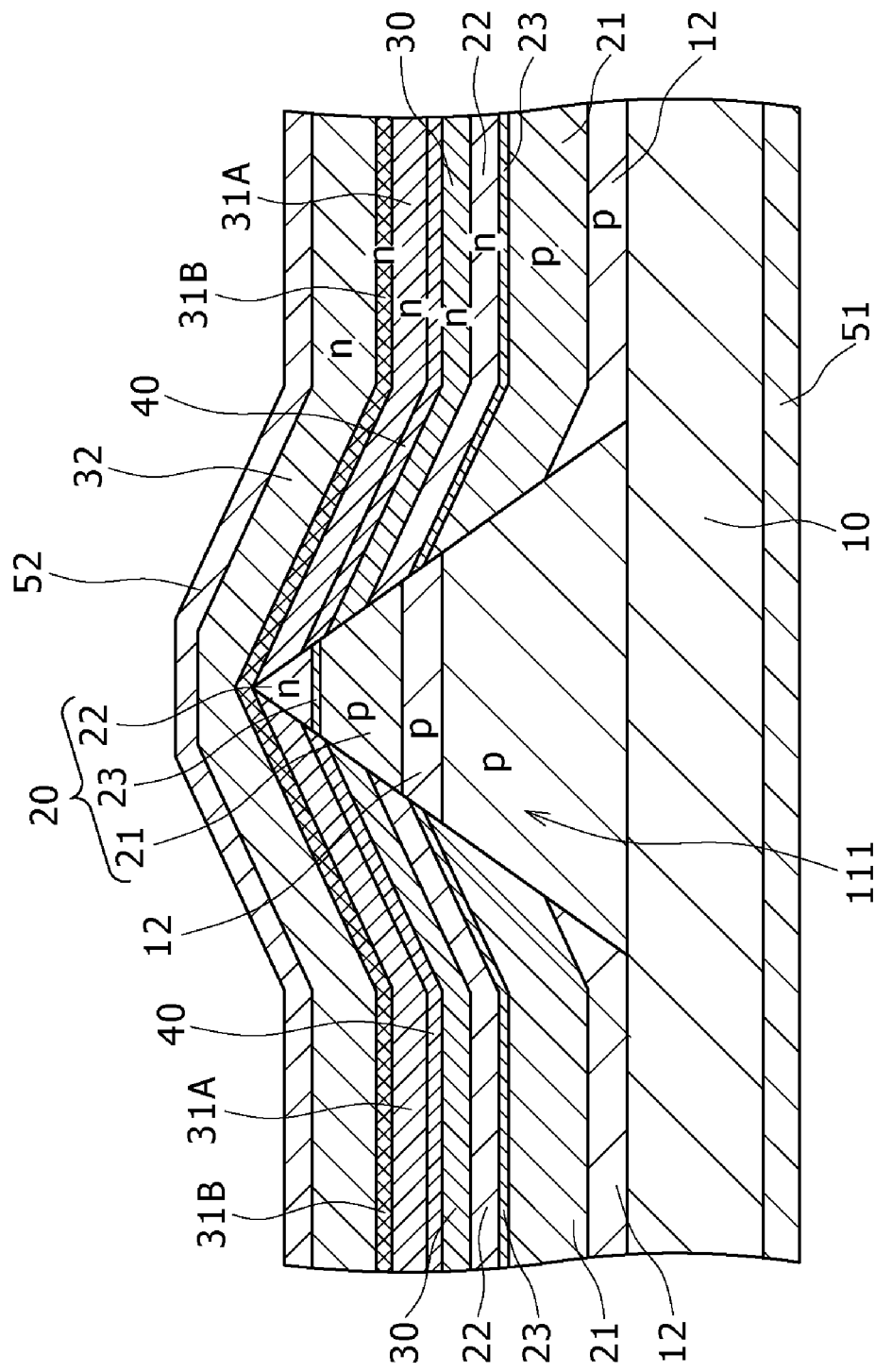
FIG. 55 is a schematic partial sectional view of the center part of the semiconductor light emitting device according to the sixteenth embodiment.
Figure 56:
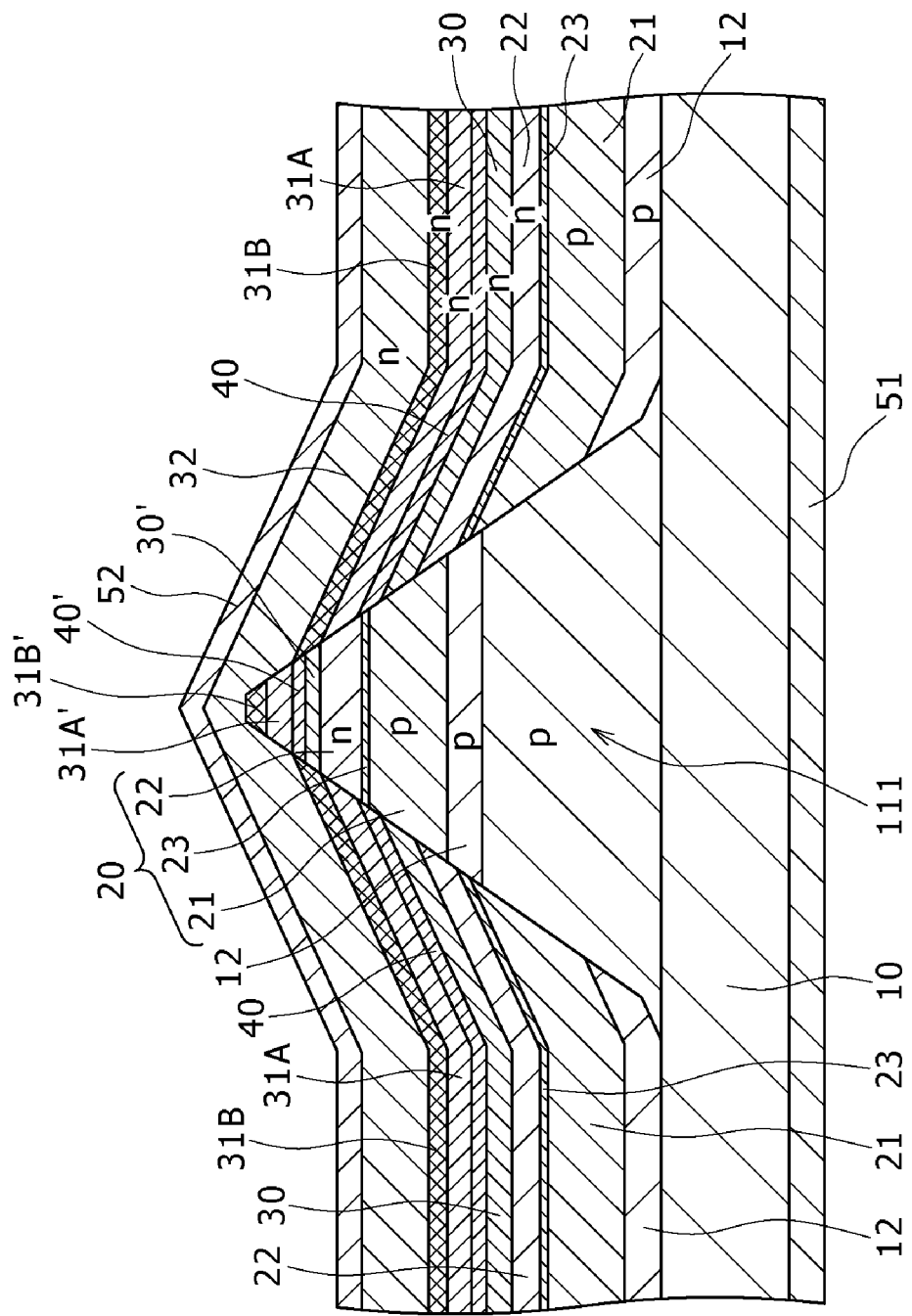
FIG. 56 is a schematic partial sectional view of both the end parts of the semiconductor light emitting device according to the sixteenth embodiment.
Figure 57A:
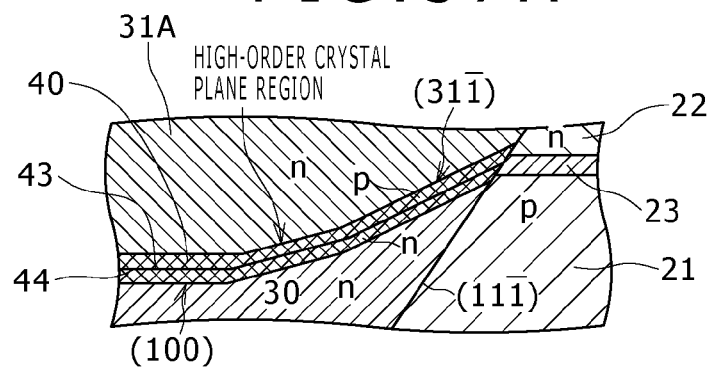
FIGS. 57A to 57C are enlarged schematic partial sectional views of the semiconductor light emitting device according to the sixteenth embodiment.
Figure 57B:
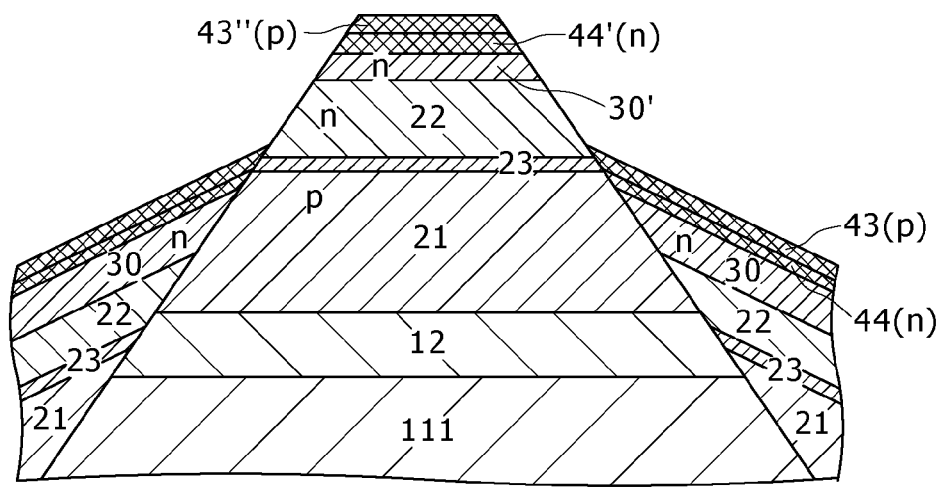
Figure 57C:
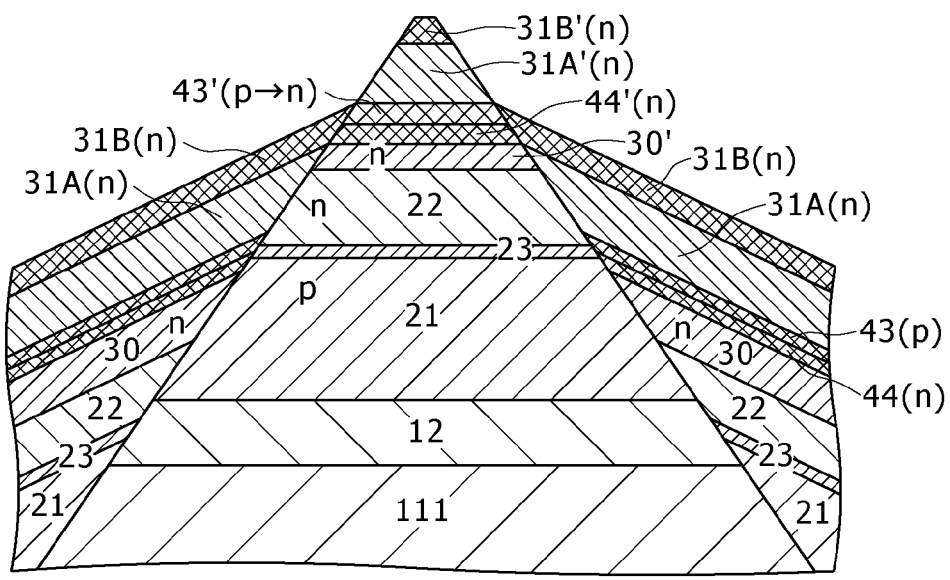
Figure 58A:
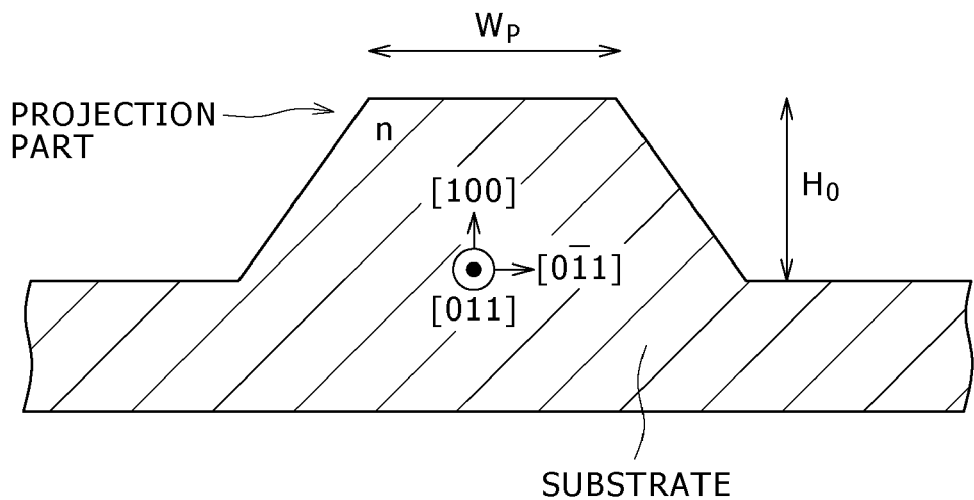
FIGS. 58A and 58B are schematic partial sectional views of a substrate and so on, for explaining a problem in a related-art semiconductor light emitting device.
Figure 58B:
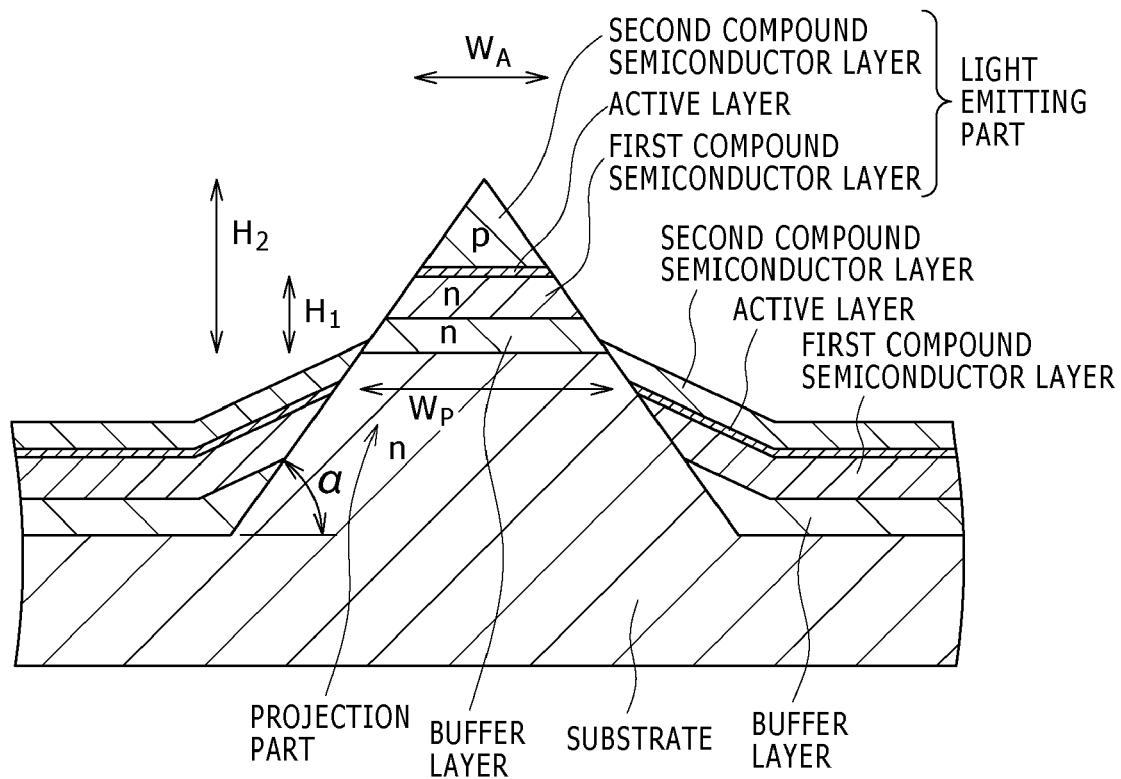
Figure 59A:
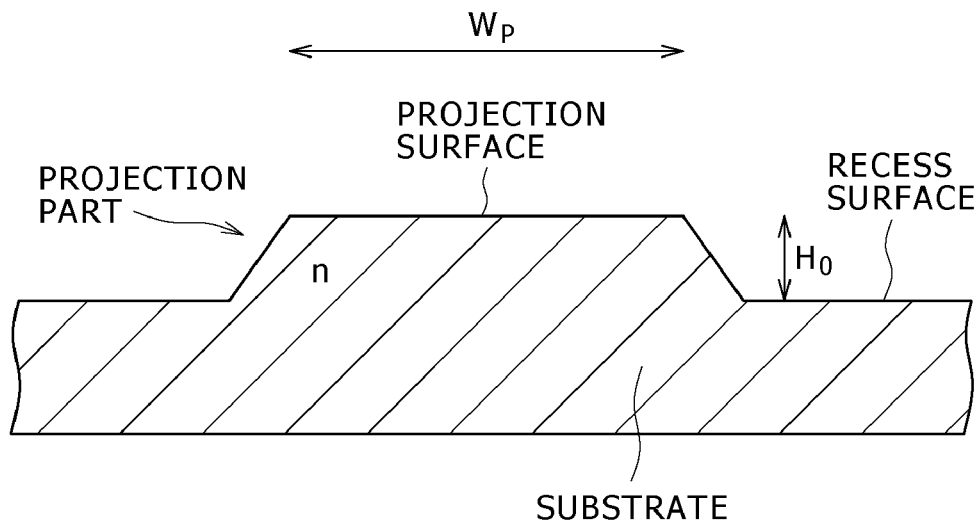
FIGS. 59A and 59B are schematic partial sectional views of the substrate and so on, for explaining another problem in the related-art semiconductor light emitting device.
Figure 59B:
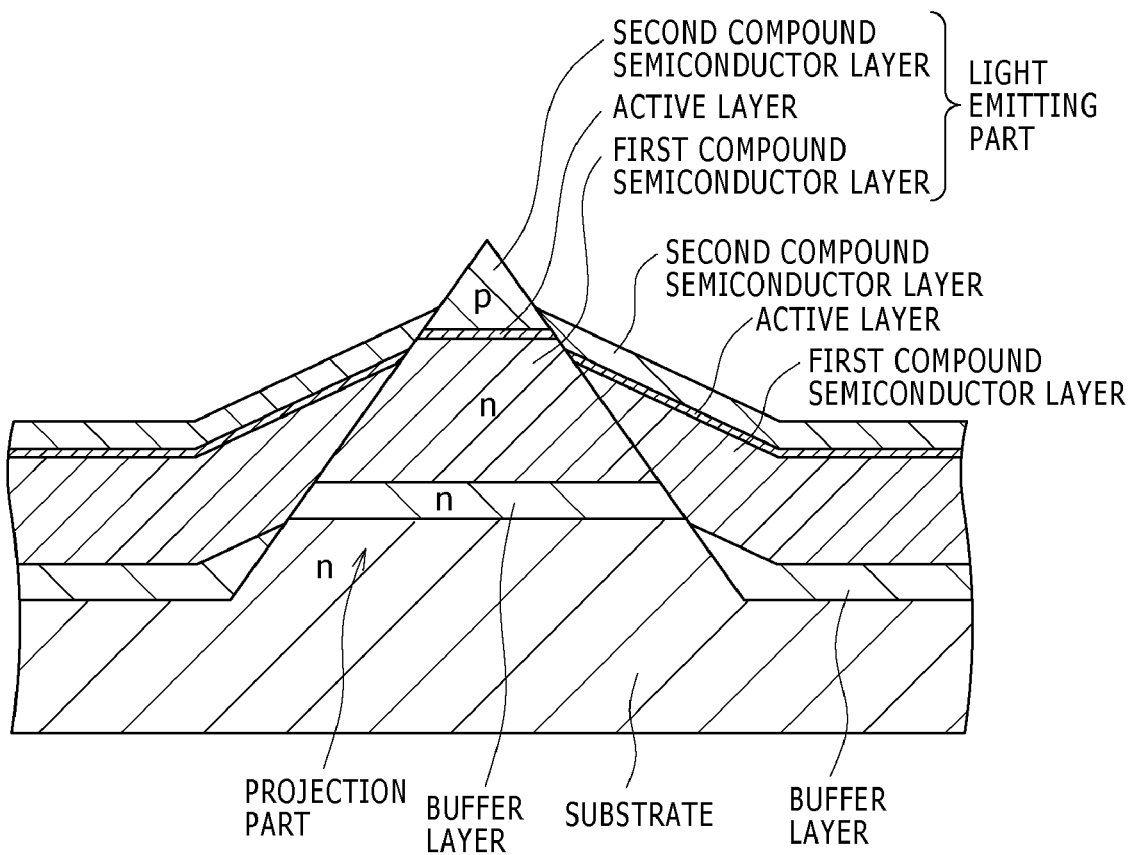

Specifically, a conceptual diagram of the light emitting part at the end parts is shown in FIG. 23A. A conceptual diagram of the light emitting part at the center part is shown in FIG. 23B. Schematic partial sectional views are shown in FIGS. 55 and 56. Enlarged schematic partial sectional views are shown in FIGS. 57A to 57C. FIG. 55 is a schematic partial sectional view of the center part of the semiconductor light emitting device. FIG. 56 is a schematic partial sectional view of the end parts of the semiconductor light emitting device. FIG. 57A is an enlarged schematic partial sectional view of a current block layer and the periphery thereof. FIGS. 57B and 57C are enlarged schematic partial sectional views of the light emitting part and the periphery thereof at the end parts of the semiconductor light emitting device.

When the semiconductor light emitting device of the sixteenth embodiment is represented based on the ((II)-1-C)-th configuration of the present invention, in the semiconductor light emitting device of the sixteenth embodiment, a first compound semiconductor layer 21, second compound semiconductor layers 22A and 22B, a current block layer 40 (a third compound semiconductor layer 43 and a fourth compound semiconductor layer 44), a first burying layer, and a second burying layer are composed of a III-V compound semiconductor, the substitution site of the impurity in the first compound semiconductor layer 21 is the site occupied by a group III atom, the substitution site of the impurity in the second compound semiconductor layers 22A and 22B is the site occupied by a group V atom, the substitution site of the impurity in the third compound semiconductor layer 43 and the substitution site of the impurity in the fourth compound semiconductor layer 44 are the site occupied by a group V atom, the substitution site of the impurity in the first burying layer is the site occupied by a group V atom, and the substitution site of the impurity in the second burying layer is the site occupied by a group III atom.

Furthermore, when the semiconductor light emitting device of the sixteenth embodiment is represented based on the ((II)-2-C)-th configuration of the present invention, in the semiconductor light emitting device of the sixteenth embodiment, the first compound semiconductor layer 21, the second compound semiconductor layers 22A and 22B, the current block layer 40 (the third compound semiconductor layer 43 and the fourth compound semiconductor layer 44), the first burying layer, and the second burying layer are composed of a III-V compound semiconductor, the impurity for causing the first compound semiconductor layer 21 to be the p-type as the first conductivity type is a group II impurity, the impurity for causing the third compound semiconductor layer 43 to be the p-type as the first conductivity type is carbon (C), the impurity for causing the first burying layer to be the n-type as the second conductivity type is a group VI impurity, and the impurity for causing the second burying layer to be the n-type as the second conductivity type is a group IV impurity.

Furthermore, when the semiconductor light emitting device of the sixteenth embodiment is represented based on the ((II)-4-A)-th configuration of the present invention, in the semiconductor light emitting device of the sixteenth embodiment, the impurity for causing the first compound semiconductor layer 21 to have the first conductivity type (p-type) is different from the impurity for causing the third compound semiconductor layer 43 to have the first conductivity type (p-type).

More specifically, in the semiconductor light emitting device of the sixteenth embodiment, the respective layers have the configuration shown in Table 13A or Table 13B shown below. In the example shown in Table 13A, the third compound semiconductor layer 43 is stacked on the fourth compound semiconductor layer 44. In the example shown in Table 13B, the fourth compound semiconductor layer 44 is stacked on the third compound semiconductor layer 43.

TABLE 13A (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer-B] |
| First compound semiconductor layer 21 | p-$Al_{0.4}Ga_{0.6}As$: Zn |
| (Current block layer) | |
| Second burying layer 31B | n-$Al_{0.47}Ga_{0.53}As$: Si |
| First burying layer 31A | n-$Al_{0.47}Ga_{0.53}As$: Se |
| Third compound semiconductor layer 43 | p-$Al_{0.47}Ga_{0.53}As$: C |
| Fourth compound semiconductor layer 44 | n-$Al_{0.47}Ga_{0.53}As$: Se |
| Adjustment layer 30 | n-$Al_{0.47}Ga_{0.53}As$: Se |
| (Whole) | |
| Contact layer 32 | n-GaAs: Se (or Si) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of n-$Al_{0.47}Ga_{0.53}As$: Se is formed between the third compound semiconductor layer 43 and the first burying layer 31A (the partial portion of the first burying layer 31A in the vicinity of the interface with the third compound semiconductor layer 43 corresponds to this fifth compound semiconductor layer).

TABLE 13B (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer-B] |
| First compound semiconductor layer 21 | p-$Al_{0.4}Ga_{0.6}As$: Zn |
| (Current block layer) | |
| Second burying layer 31B | n-$Al_{0.47}Ga_{0.53}As$: Si |
| First burying layer 31A | n-$Al_{0.47}Ga_{0.53}As$: Se |
| Fourth compound semiconductor layer 44 | n-$Al_{0.47}Ga_{0.53}As$: Se |
| Third compound semiconductor layer 43 | p-$Al_{0.47}Ga_{0.53}As$: C |
| Adjustment layer 30 | n-$Al_{0.47}Ga_{0.53}As$: Se |
| (Whole) | |
| Contact layer 32 | n-GaAs: Se (or Si) |

(Note 1)
The adjustment layer 30 is formed subsequently to the second compound semiconductor layer 22B.
(Note 2)
The first burying layer 31A is formed subsequently to the fourth compound semiconductor layer 44 in a continuous manner, and a boundary does not exist between the first burying layer 31A and the fourth compound semiconductor layer 44 substantially.

Also in the sixteenth embodiment, at the timing when the formation of a light emitting part 20 is completed in a step similar to [Step-120] of the first embodiment, the sectional shape of the light emitting part 20 obtained when the center part of the light emitting part 20 is cut along a virtual plane perpendicular to the axis line of the light emitting part is a triangle. At this time, the sectional shape of the light emitting part 20 obtained when the end part of the light emitting part 20 is cut along a virtual plane perpendicular to the axis line of the light emitting part is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a deposited layer 40" having the same multilayer structure as that of the current block layer 40 is formed above the top surface of the light emitting part 20. Subsequently to the formation of the current block layer 40, the first burying layer 31A is so formed as to cover the side surfaces of the light emitting part 20 and the side surfaces of at least one layer of the deposited layer 40" stacked above the light emitting part 20, at both the end parts in particular. Subsequently, at the timing of the completion of the covering of at least the side surfaces of the light emitting part 20 and the side surfaces of a compound semiconductor layer 30' by the first burying layer 31A, the formation of the second burying layer 31B is started, so that the entire surface is covered by the second burying layer 31B. If a compound semiconductor layer of the first conductivity type is included in the deposited layer 40" particularly as above, it is desirable that the burying layer 31 of the second conductivity type (e.g. the burying layer 31B) whose impurity substitution site does not compete with the impurity substitution site in this compound semiconductor layer of the first conductivity type included in the deposited layer 40" be in contact with at least a part of the side surface of the deposited layer 40". This structure allows the impurity of the second conductivity type in the burying layer 31 (e.g. the burying layer 31B) to diffuse from the at least a part of the side surface of the deposited layer 40". This makes it possible to initially carry out conductivity type compensation for the compound semiconductor layer of the first conductivity type that is included in the deposited layer 40" and causes the current blocking, and thus turn this compound semiconductor layer of the first conductivity type to a layer of the second conductivity type. At this time, the impurity for causing the second burying layer 31B to have the second conductivity type is such that the substitution site of the impurity in the second burying layer 31B (the site occupied by a group III atom, in the sixteenth embodiment) does not compete with the substitution site of the impurity in the third compound semiconductor layer (the site occupied by a group V atom, in the sixteenth embodiment) for causing the third compound semiconductor layer 43 to have the first conductivity type (see Table 13A or Table 13B). Therefore, e.g. the impurity for causing the second burying layer 31B that is deposited to a large thickness so that the apex may be finally covered to have the second conductivity type diffuses into a deposited layer 43" of the third compound semiconductor layer, having the first conductivity type and formed above the top surface at both the end parts of the light emitting part 20. This diffusion turns the deposited layer 43" of the third compound semiconductor layer to a deposited layer 43' of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased.

Seventeenth Embodiment

The seventeenth embodiment is a modification of the fourteenth embodiment and the sixteenth embodiment, and relates to the ((II)-1-D)-th configuration of the present invention and the ((II)-2-D)-th configuration of the present invention.

Figure 24A:
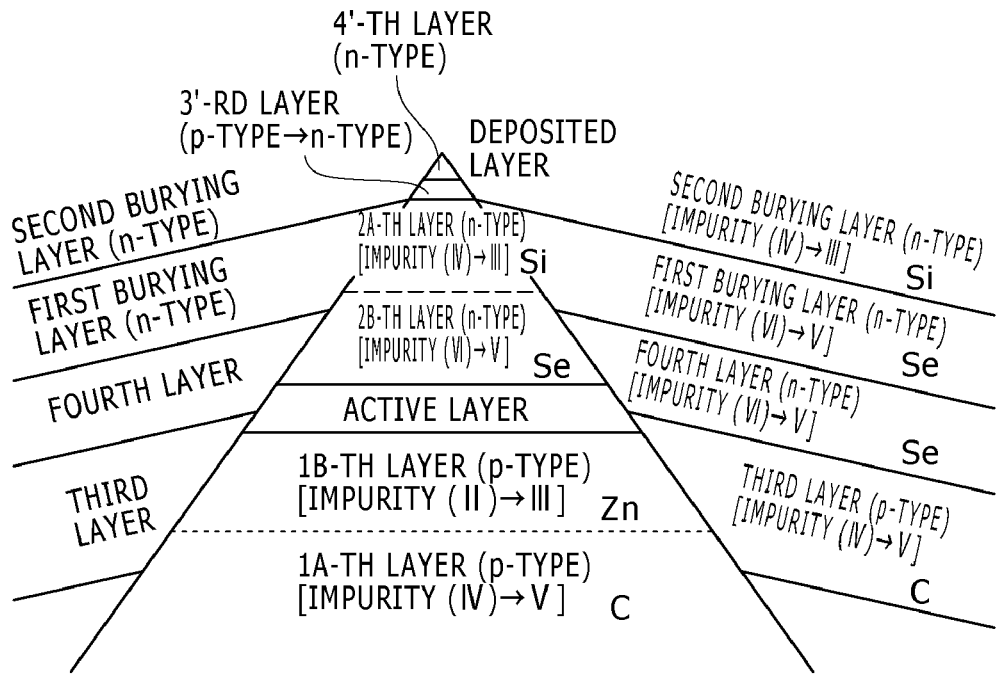
FIGS. 24A and 24B are conceptual diagrams of a semiconductor light emitting device according to a seventeenth embodiment of the present invention.
Figure 24B:
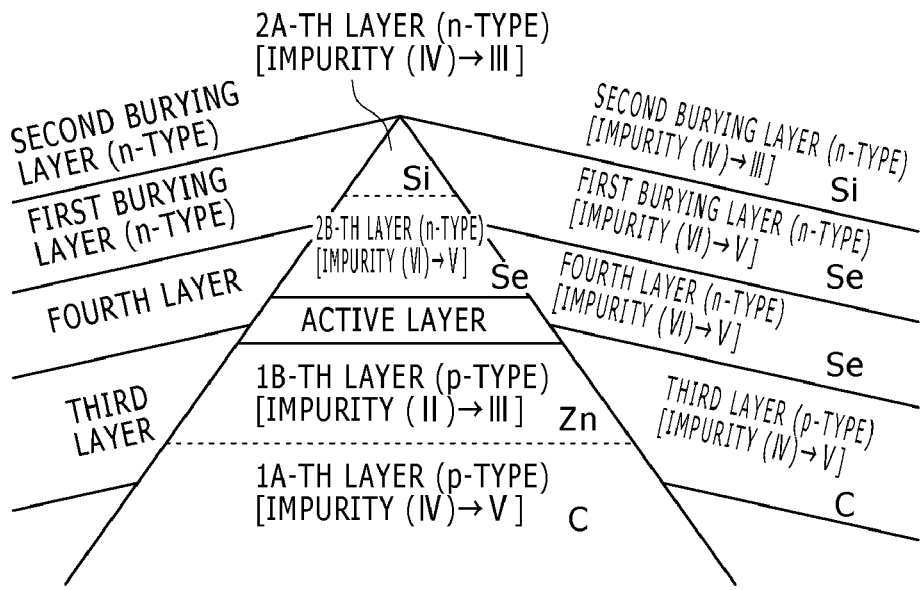

Specifically, as shown in FIG. 24A as a conceptual diagram of the end parts of the light emitting part and FIG. 24B as a conceptual diagram of the center part of the light emitting part, when the semiconductor light emitting device of the seventeenth embodiment is represented based on the ((II)-1-D)-th configuration of the present invention, in the semiconductor light emitting device of the seventeenth embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom.

Furthermore, when the semiconductor light emitting device of the seventeenth embodiment is represented based on the ((II)-2-D)-th configuration of the present invention, in the semiconductor light emitting device of the seventeenth embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is carbon (C), the impurity for causing the fourth compound semiconductor layer to be the n-type as the second conductivity type is a group VI impurity, the impurity for causing the first burying layer to be the n-type as the second conductivity type is a group VI impurity, and the impurity for causing the second burying layer to be the n-type as the second conductivity type is a group IV impurity.

More specifically, in the semiconductor light emitting device of the seventeenth embodiment, the respective layers have the configuration shown in Table 14A or Table 14B shown below. In the example shown in Table 14A, the third compound semiconductor layer is stacked on the fourth compound semiconductor layer. In the example shown in Table 14B, the fourth compound semiconductor layer is stacked on the third compound semiconductor layer.

TABLE 14A (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer-B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Si |
| First burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |
| (Whole) | |
| Contact layer | n-GaAs: Se (or Si) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of n-$Al_{0.47}Ga_{0.53}As$: Se is formed between the third compound semiconductor layer and the first burying layer (the partial portion of the first burying layer in the vicinity of the interface with the third compound semiconductor layer corresponds to this fifth compound semiconductor layer).

TABLE 14B (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer-B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Si |
| First burying layer | n-$Al_{0.47}Ga_{0.53}As$: Se |
| Fourth compound semiconductor layer | n-$Al_{0.47}Ga_{0.53}As$: Se |
| Third compound semiconductor layer | p-$Al_{0.47}Ga_{0.53}As$: C |
| Adjustment layer | n-$Al_{0.47}Ga_{0.53}As$: Se |
| (Whole) | |
| Contact layer | n-GaAs: Se (or Si) |

(Note 1) The adjustment layer is formed subsequently to the 2A-th compound semiconductor layer.
(Note 2) The first burying layer is formed subsequently to the fourth compound semiconductor layer in a continuous manner, and a boundary does not exist between the first burying layer and the fourth compound semiconductor layer substantially.

Eighteenth Embodiment

The eighteenth embodiment relates to the ((II)-1-a)-th configuration of the present invention, the ((II)-3-a)-th configuration of the present invention, and the ((II)-4-a)-th configuration of the present invention.

Figure 25A:
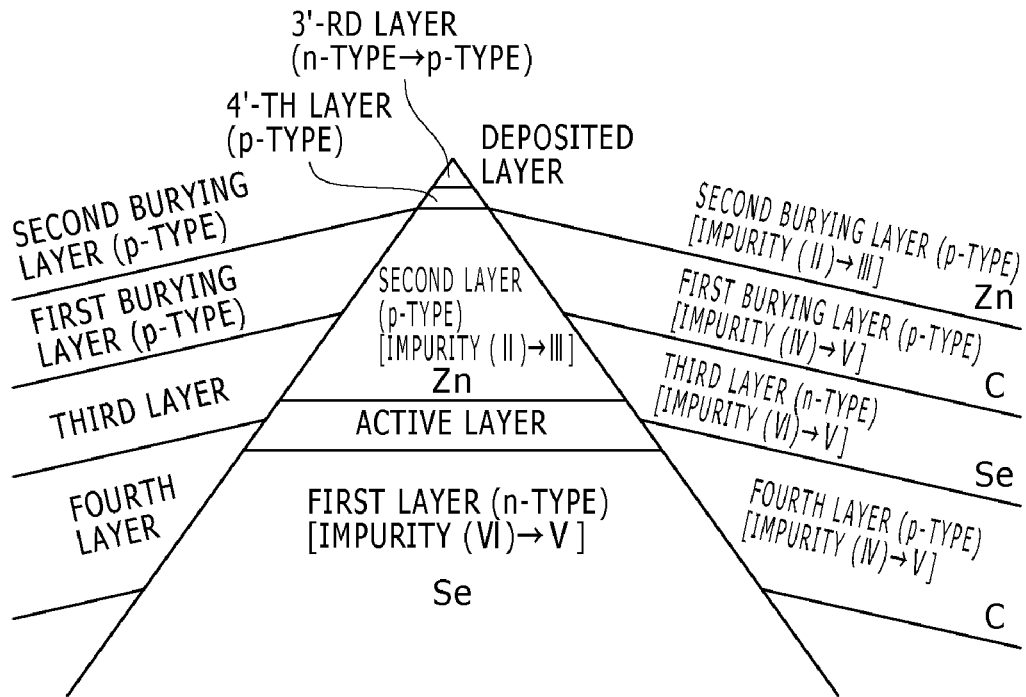
FIGS. 25A and 25B are conceptual diagrams of a semiconductor light emitting device according to an eighteenth embodiment of the present invention.
Figure 25B:
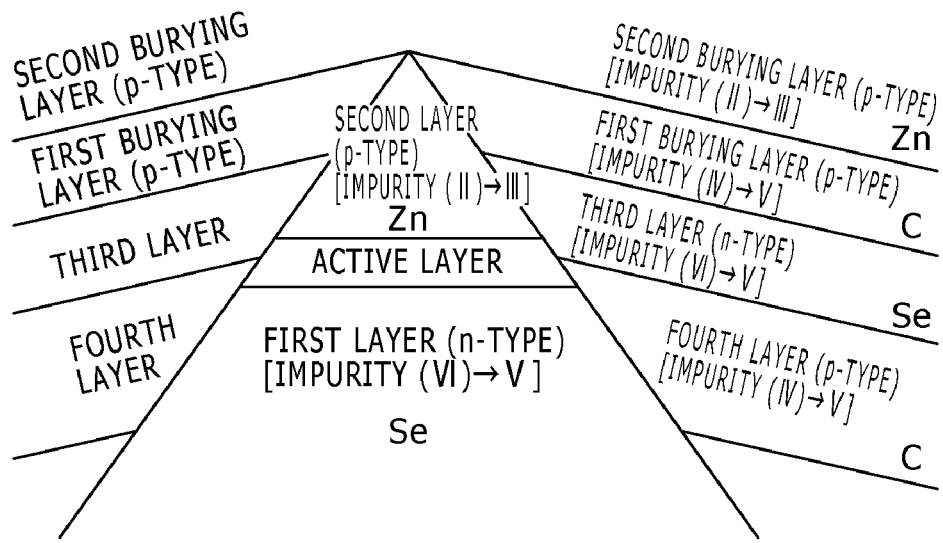

Specifically, as shown in FIG. 25A as a conceptual diagram of the end parts of the light emitting part and FIG. 25B as a conceptual diagram of the center part of the light emitting part, when the semiconductor light emitting device of the eighteenth embodiment is represented based on the ((II)-1-a)-th configuration of the present invention, in the semiconductor light emitting device of the eighteenth embodiment, a first compound semiconductor layer 21, second compound semiconductor layers 22A and 22B, a current block layer 40 (a fourth compound semiconductor layer 44 and a third compound semiconductor layer 43), a first burying layer, and a second burying layer are composed of a III-V compound semiconductor, the substitution site of the impurity in the first compound semiconductor layer 21 is the site occupied by a group V atom, the substitution site of the impurity in the second compound semiconductor layers 22A and 22B is the site occupied by a group III atom, the substitution site of the impurity in the third compound semiconductor layer 43 and the substitution site of the impurity in the fourth compound semiconductor layer 44 are the site occupied by a group V atom, the substitution site of the impurity in the first burying layer is the site occupied by a group V atom, and the substitution site of the impurity in the second burying layer is the site occupied by a group III atom. Schematic partial sectional views of the semiconductor light emitting device of the eighteenth embodiment are the same as those shown in FIGS. 49 and 50.

When the semiconductor light emitting device of the eighteenth embodiment is represented based on the ((II)-3-a)-th configuration of the present invention, in the semiconductor light emitting device of the eighteenth embodiment, the first compound semiconductor layer 21, the second compound semiconductor layers 22A and 22B, the current block layer 40 (the fourth compound semiconductor layer 44 and the third compound semiconductor layer 43), the first burying layer, and the second burying layer are composed of a III-V compound semiconductor, the impurity for causing the second compound semiconductor layers 22A and 22B to be the p-type as the second conductivity type is a group II impurity, the impurity for causing the fourth compound semiconductor layer 44 to be the p-type as the second conductivity type is carbon (C), the impurity for causing the first burying layer to be the p-type as the second conductivity type is carbon (C), and the impurity for causing the second burying layer to be the p-type as the second conductivity type is a group II impurity.

Furthermore, when the semiconductor light emitting device of the eighteenth embodiment is represented based on the ((II)-4-a)-th configuration of the present invention, in the semiconductor light emitting device of the eighteenth embodiment, the impurity for causing the second compound semiconductor layers 22A and 22B to have the second conductivity type (p-type) is different from the impurity for causing the fourth compound semiconductor layer 44 to have the second conductivity type (p-type).

More specifically, in the semiconductor light emitting device of the eighteenth embodiment, the respective layers have the configuration shown in Table 15A or Table 15B shown below. In the example shown in Table 15A, the third compound semiconductor layer 43 is stacked on the fourth compound semiconductor layer 44. In the example shown in Table 15B, the fourth compound semiconductor layer 44 is stacked on the third compound semiconductor layer 43.

TABLE 15A (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer-A] |
| First compound semiconductor layer 21 | n-$Al_{0.4}Ga_{0.6}As$: Se |
| (Current block layer) | |
| Second burying layer 31B | p-$Al_{0.47}Ga_{0.53}As$: Zn |
| First burying layer 31A | p-$Al_{0.47}Ga_{0.53}As$: C |
| Third compound semiconductor layer 43 | n-$Al_{0.47}Ga_{0.53}As$: Se |
| Fourth compound semiconductor layer 44 | p-$Al_{0.47}Ga_{0.53}As$: C |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of p-$Al_{0.47}Ga_{0.53}As$: C is formed between the third compound semiconductor layer 43 and the first burying layer 31A (the partial portion of the first burying layer 31A in the vicinity of the interface with the third compound semiconductor layer 43 corresponds to this fifth compound semiconductor layer).

TABLE 15B (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer-A] |
| First compound semiconductor layer 21 | n-$Al_{0.4}Ga_{0.6}As$: Se |
| (Current block layer) | |
| Second burying layer 31B | p-$Al_{0.47}Ga_{0.53}As$: Zn |
| First burying layer 31A | p-$Al_{0.47}Ga_{0.53}As$: C |
| Fourth compound semiconductor layer 44 | p-$Al_{0.47}Ga_{0.53}As$: C |
| Third compound semiconductor layer 43 | n-$Al_{0.47}Ga_{0.53}As$: Se |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The first burying layer 31A is formed subsequently to the fourth compound semiconductor layer 44 in a continuous manner, and a boundary does not exist between the first burying layer 31A and the fourth compound semiconductor layer 44 substantially.

Also in the eighteenth embodiment, at the timing when the formation of a light emitting part 20 is completed in a step similar to [Step-120] of the first embodiment, the sectional shape of the light emitting part 20 obtained when the center part of the light emitting part 20 is cut along a virtual plane perpendicular to the axis line of the light emitting part is a triangle. At this time, the sectional shape of the light emitting part 20 obtained when the end part of the light emitting part 20 is cut along a virtual plane perpendicular to the axis line of the light emitting part is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a deposited layer 40" having the same multilayer structure as that of the current block layer 40 is formed above the top surface of the light emitting part 20. Subsequently to the formation of the current block layer 40, the first burying layer 31A is so formed as to cover the side surfaces of the light emitting part 20 and the side surfaces of at least one layer of the deposited layer 40" stacked above the light emitting part 20, at both the end parts in particular. Subsequently, at the timing of the completion of the covering of at least the side surfaces of the light emitting part 20 and the side surfaces of a compound semiconductor layer 30' by the first burying layer 31A, the formation of the second burying layer 31B is started, so that the entire surface is covered by the second burying layer 31B. If a compound semiconductor layer of the first conductivity type is included in the deposited layer 40" particularly as above, it is desirable that the burying layer 31 of the second conductivity type (e.g. the burying layer 31B) whose impurity substitution site does not compete with the impurity substitution site in this compound semiconductor layer of the first conductivity type included in the deposited layer 40" be in contact with at least a part of the side surface of the deposited layer 40". This structure allows the impurity of the second conductivity type in the burying layer 31 (e.g. the burying layer 31B) to diffuse from the at least a part of the side surface of the deposited layer 40". This makes it possible to initially carry out conductivity type compensation for the compound semiconductor layer of the first conductivity type that is included in the deposited layer 40" and causes the current blocking, and thus turn this compound semiconductor layer of the first conductivity type to a layer of the second conductivity type. At this time, the impurity for causing the second burying layer 31B to have the second conductivity type is such that the substitution site of the impurity in the second burying layer 31B (the site occupied by a group III atom, in the eighteenth embodiment) does not compete with the substitution site of the impurity in the third compound semiconductor layer (the site occupied by a group V atom, in the eighteenth embodiment) for causing the third compound semiconductor layer 43 to have the first conductivity type (see Table 15A or Table 15B). Therefore, e.g. the impurity for causing the second burying layer 31B that is deposited to a large thickness so that the apex may be finally covered to have the second conductivity type diffuses into a deposited layer 43" of the third compound semiconductor layer, having the first conductivity type and formed above the top surface at both the end parts of the light emitting part 20. This diffusion turns the deposited layer 43" of the third compound semiconductor layer to a deposited layer 43' of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased.

Nineteenth Embodiment

The nineteenth embodiment is a modification of the eighteenth embodiment, and relates to the ((II)-1-b)-th configuration of the present invention and the ((II)-3-b)-th configuration of the present invention.

Figure 26A:
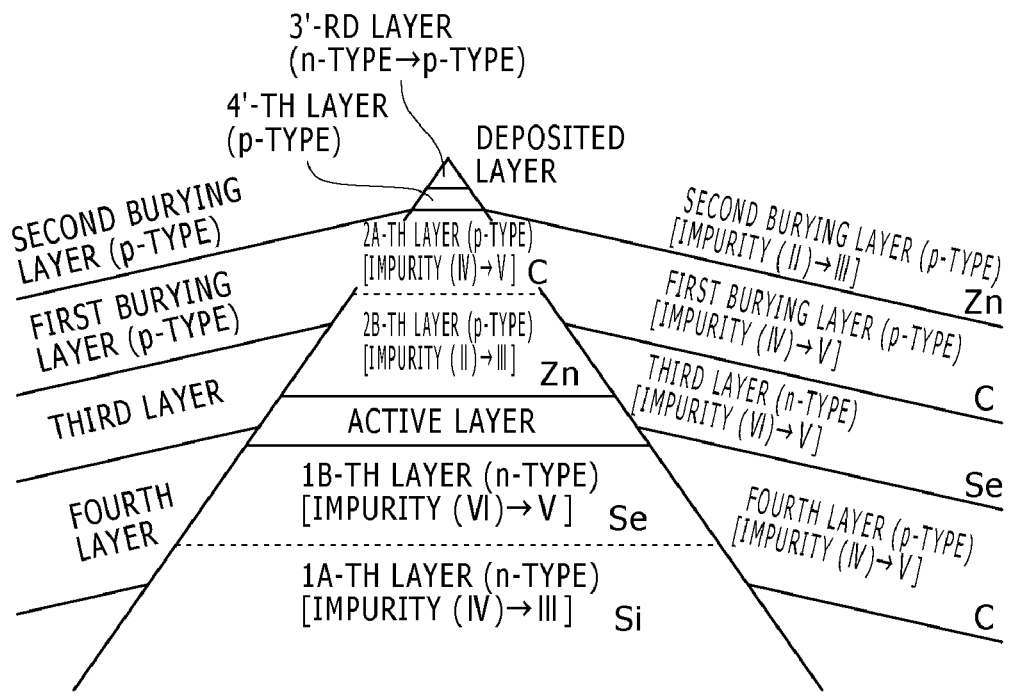
FIGS. 26A and 26B are conceptual diagrams of a semiconductor light emitting device according to a nineteenth embodiment of the present invention.
Figure 26B:
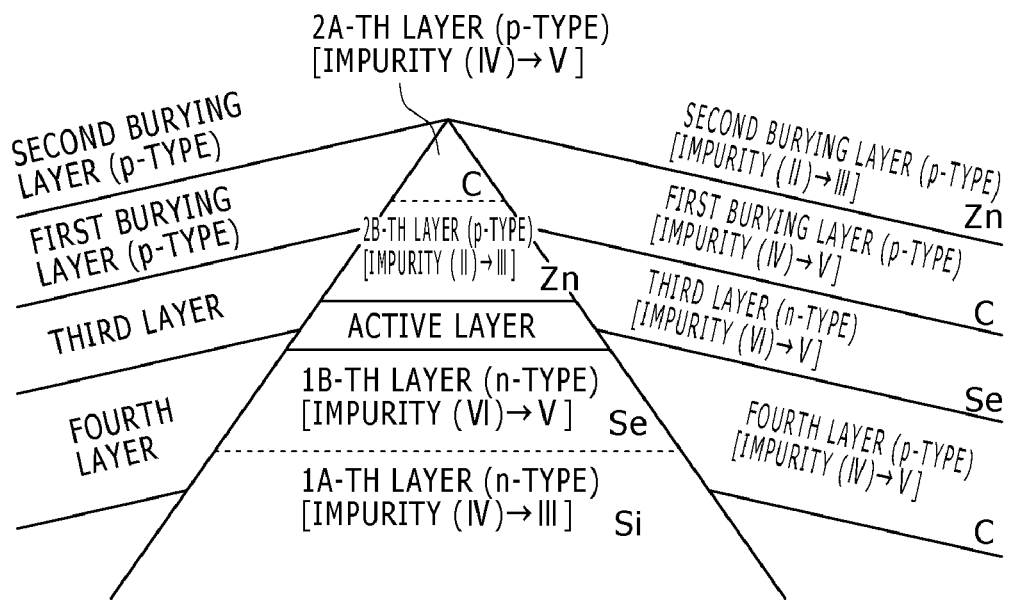

Specifically, as shown in FIG. 26A as a conceptual diagram of the end parts of the light emitting part and FIG. 26B as a conceptual diagram of the center part of the light emitting part, when the semiconductor light emitting device of the nineteenth embodiment is represented based on the ((II)-1-b)-th configuration of the present invention, in the semiconductor light emitting device of the nineteenth embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom.

Furthermore, when the semiconductor light emitting device of the nineteenth embodiment is represented based on the ((II)-3-b)-th configuration of the present invention, in the semiconductor light emitting device of the nineteenth embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group VI impurity, the impurity for causing the fourth compound semiconductor layer to be the p-type as the second conductivity type is carbon (C), the impurity for causing the first burying layer to be the p-type as the second conductivity type is carbon (C), and the impurity for causing the second burying layer to be the p-type as the second conductivity type is a group II impurity.

More specifically, in the semiconductor light emitting device of the nineteenth embodiment, the respective layers have the configuration shown in Table 16A or Table 16B shown below. In the example shown in Table 16A, the third compound semiconductor layer is stacked on the fourth compound semiconductor layer. In the example shown in Table 16B, the fourth compound semiconductor layer is stacked on the third compound semiconductor layer.

TABLE 16A (Configuration of light emitting part)

| | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer-A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: Zn |
| First burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer | p-$Al_{0.47}Ga_{0.53}As$: C |
| (Whole) | |
| Contact layer | p-GaAs: C (or Zn) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of p-$Al_{0.47}Ga_{0.53}As$: C is formed between the third compound semiconductor layer and the first burying layer (the partial portion of the first burying layer 31A in the vicinity of the interface with the third compound semiconductor layer corresponds to this fifth compound semiconductor layer).

TABLE 16B (Configuration of light emitting part)

| | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer-A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: Zn |
| First burying layer | p-$Al_{0.47}Ga_{0.53}As$: C |
| Fourth compound semiconductor layer | p-$Al_{0.47}Ga_{0.53}As$: C |
| Third compound semiconductor layer | n-$Al_{0.47}Ga_{0.53}As$: Se |
| Adjustment layer | p-$Al_{0.47}Ga_{0.53}As$: C |
| (Whole) | |
| Contact layer | p-GaAs: C (or Zn) |

(Note 1)
The adjustment layer is formed subsequently to the 2A-th compound semiconductor layer.
(Note 2)
The first burying layer is formed subsequently to the fourth compound semiconductor layer in a continuous manner, and a boundary does not exist between the first burying layer and the fourth compound semiconductor layer substantially.

Twentieth Embodiment

The twentieth embodiment is also a modification of the eighteenth embodiment, and relates to the (1-c)-th configuration of the present invention, the (3-c)-th configuration of the present invention, and the (4-a)-th configuration of the present invention. In the twentieth embodiment and the twenty-first embodiment to be described later, the conductivity types are reversed from those in the eighteenth embodiment. That is, in the twentieth embodiment and the twenty-first embodiment to be described later, the first conductivity type is the p-type and the second conductivity type is the n-type.

Figure 27A:
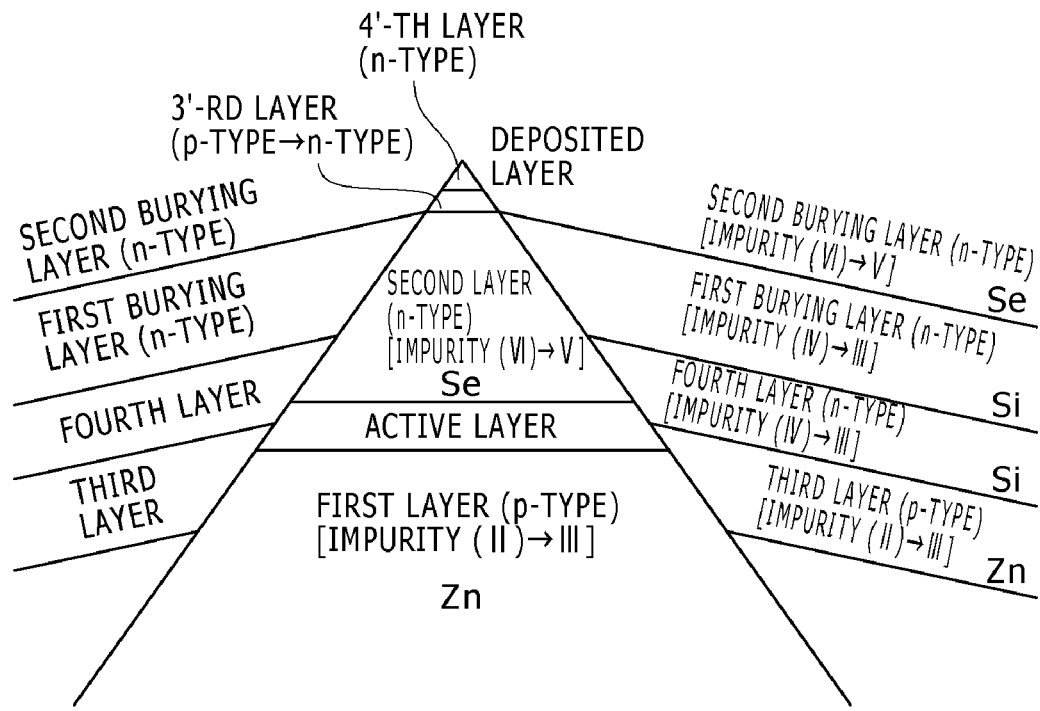
FIGS. 27A and 27B are conceptual diagrams of a semiconductor light emitting device according to a twentieth embodiment of the present invention.
Figure 27B:
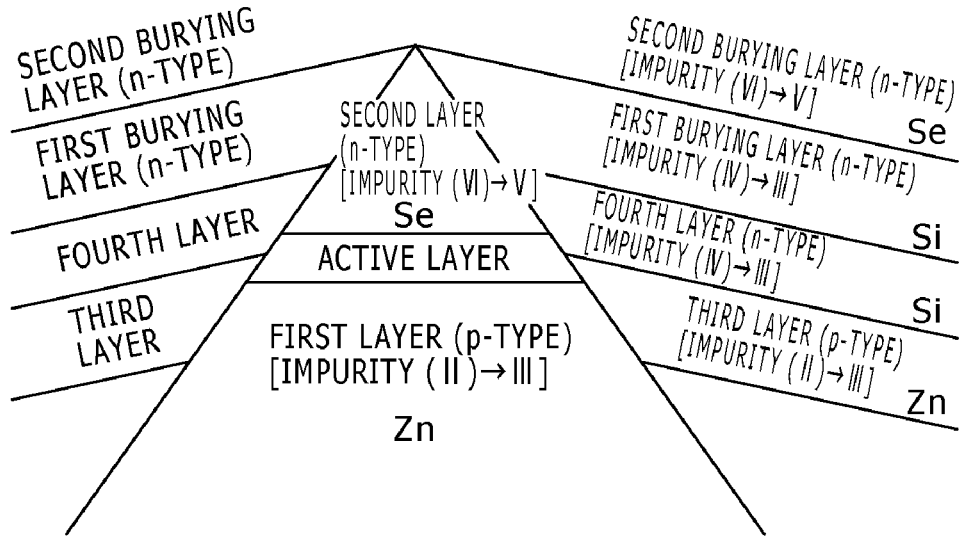

Specifically, as shown in FIG. 27A as a conceptual diagram of the end parts of the light emitting part and FIG. 27B as a conceptual diagram of the center part of the light emitting part, when the semiconductor light emitting device of the twentieth embodiment is represented based on the ((II)-1-c)-th configuration of the present invention, in the semiconductor light emitting device of the twentieth embodiment, a first compound semiconductor layer 21, second compound semiconductor layers 22A and 22B, a current block layer 40 (a third compound semiconductor layer 43 and a fourth compound semiconductor layer 44), a first burying layer, and a second burying layer are composed of a III-V compound semiconductor, the substitution site of the impurity in the first compound semiconductor layer 21 is the site occupied by a group III atom, the substitution site of the impurity in the second compound semiconductor layers 22A and 22B is the site occupied by a group V atom, the substitution site of the impurity in the third compound semiconductor layer 43 and the substitution site of the impurity in the fourth compound semiconductor layer 44 are the site occupied by a group III atom, the substitution site of the impurity in the first burying layer is the site occupied by a group III atom, and the substitution site of the impurity in the second burying layer is the site occupied by a group V atom. Schematic partial sectional views of the semiconductor light emitting device of the twentieth embodiment are the same as those shown in FIGS. 55 and 56.

Furthermore, when the semiconductor light emitting device of the twentieth embodiment is represented based on the ((II)-3-c)-th configuration of the present invention, in the semiconductor light emitting device of the twentieth embodiment, the first compound semiconductor layer 21, the second compound semiconductor layers 22A and 22B, the current block layer 40 (the third compound semiconductor layer 43 and the fourth compound semiconductor layer 44), the first burying layer, and the second burying layer are composed of a III-V compound semiconductor, the impurity for causing the second compound semiconductor layers 22A and 22B to be the n-type as the second conductivity type is a group VI impurity, the impurity for causing the fourth compound semiconductor layer 44 to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity.

Furthermore, when the semiconductor light emitting device of the twentieth embodiment is represented based on the ((II)-4-a)-th configuration of the present invention, in the semiconductor light emitting device of the twentieth embodiment, the impurity for causing the second compound semiconductor layers 22A and 22B to have the second conductivity type (n-type) is different from the impurity for causing the fourth compound semiconductor layer 44 to have the second conductivity type (n-type).

More specifically, in the semiconductor light emitting device of the twentieth embodiment, the respective layers have the configuration shown in Table 17A or Table 17B shown below. In the example shown in Table 17A, the third compound semiconductor layer 43 is stacked on the fourth compound semiconductor layer 44. In the example shown in Table 17B, the fourth compound semiconductor layer 44 is stacked on the third compound semiconductor layer 43.

TABLE 17A (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer-B] |
| First compound semiconductor layer 21 | p-$Al_{0.4}Ga_{0.6}As$: Zn |
| (Current block layer) | |
| Second burying layer 31B | n-$Al_{0.47}Ga_{0.53}As$: Se |
| First burying layer 31A | n-$Al_{0.47}Ga_{0.53}As$: Si |
| Third compound semiconductor layer 43 | p-$Al_{0.47}Ga_{0.53}As$: Zn |
| Fourth compound semiconductor layer 44 | n-$Al_{0.47}Ga_{0.53}As$: Si |
| Adjustment layer 30 | n-$Al_{0.47}Ga_{0.53}As$: Si |
| (Whole) | |
| Contact layer 32 | n-GaAs: Si (or Se) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of n-$Al_{0.47}Ga_{0.53}As$: Si is formed between the third compound semiconductor layer 43 and the first burying layer 31A (the partial portion of the first burying layer 31A in the vicinity of the interface with the third compound semiconductor layer 43 corresponds to this fifth compound semiconductor layer).

TABLE 17B (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer-B] |
| First compound semiconductor layer 21 | p-$Al_{0.4}Ga_{0.6}As$: Zn |
| (Current block layer) | |
| Second burying layer 31B | n-$Al_{0.47}Ga_{0.53}As$: Se |
| First burying layer 31A | n-$Al_{0.47}Ga_{0.53}As$: Si |
| Fourth compound semiconductor layer 44 | n-$Al_{0.47}Ga_{0.53}As$: Si |
| Third compound semiconductor layer 43 | p-$Al_{0.47}Ga_{0.53}As$: Zn |
| Adjustment layer 30 | n-$Al_{0.47}Ga_{0.53}As$: Si |
| (Whole) | |
| Contact layer 32 | n-GaAs: Si (or Se) |

(Note 1)
The adjustment layer 30 is formed subsequently to the second compound semiconductor layer 22B.
(Note 2)
The first burying layer 31A is formed subsequently to the fourth compound semiconductor layer 44 in a continuous manner, and a boundary does not exist between the first burying layer 31A and the fourth compound semiconductor layer 44 substantially.

Also in the twentieth embodiment, at the timing when the formation of a light emitting part 20 is completed in a step similar to [Step-120] of the first embodiment, the sectional shape of the light emitting part 20 obtained when the center part of the light emitting part 20 is cut along a virtual plane perpendicular to the axis line of the light emitting part 20 is a triangle. At this time, the sectional shape of the light emitting part 20 obtained when the end part of the light emitting part 20 is cut along a virtual plane perpendicular to the axis line of the light emitting part 20 is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a deposited layer 40" having the same multilayer structure as that of the current block layer 40 is formed above the top surface of the light emitting part 20. Subsequently to the formation of the current block layer 40, the first burying layer 31A is so formed as to cover the side surfaces of the light emitting part 20 and the side surfaces of at least one layer of the deposited layer 40" stacked above the light emitting part 20, at both the end parts in particular. Subsequently, at the timing of the completion of the covering of at least the side surfaces of the light emitting part 20 and the side surfaces of a compound semiconductor layer 30' by the first burying layer 31A, the formation of the second burying layer 31B is started, so that the entire surface is covered by the second burying layer 31B. If a compound semiconductor layer of the first conductivity type is included in the deposited layer 40" particularly as above, it is desirable that the burying layer 31 of the second conductivity type (e.g. the burying layer 31B) whose impurity substitution site does not compete with the impurity substitution site in this compound semiconductor layer of the first conductivity type included in the deposited layer 40" be in contact with at least a part of the side surface of the deposited layer 40". This structure allows the impurity of the second conductivity type in the burying layer 31 (e.g. the burying layer 31B) to diffuse from the at least a part of the side surface of the deposited layer 40". This makes it possible to initially carry out conductivity type compensation for the compound semiconductor layer of the first conductivity type that is included in the deposited layer 40" and causes the current blocking, and thus turn this compound semiconductor layer of the first conductivity type to a layer of the second conductivity type. At this time, the impurity for causing the second burying layer 31B to have the second conductivity type is such that the substitution site of the impurity in the second burying layer 31B (the site occupied by a group V atom, in the twentieth embodiment) does not compete with the substitution site of the impurity in the third compound semiconductor layer (the site occupied by a group III atom, in the twentieth embodiment) for causing the third compound semiconductor layer 43 to have the first conductivity type (see Table 17A or Table 17B). Therefore, e.g. the impurity for causing the second burying layer 31B that is deposited to a large thickness so that the apex may be finally covered to have the second conductivity type diffuses into a deposited layer 43" of the third compound semiconductor layer, having the first conductivity type and formed above the top surface at both the end parts of the light emitting part 20. This diffusion turns the deposited layer 43" of the third compound semiconductor layer to a deposited layer 43' of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased.

Twenty-First Embodiment

The twenty-first embodiment is a modification of the eighteenth embodiment and the twentieth embodiment, and relates to the ((II)-1-d)-th configuration of the present invention and the ((II)-3-d)-th configuration of the present invention.

Figure 28A:
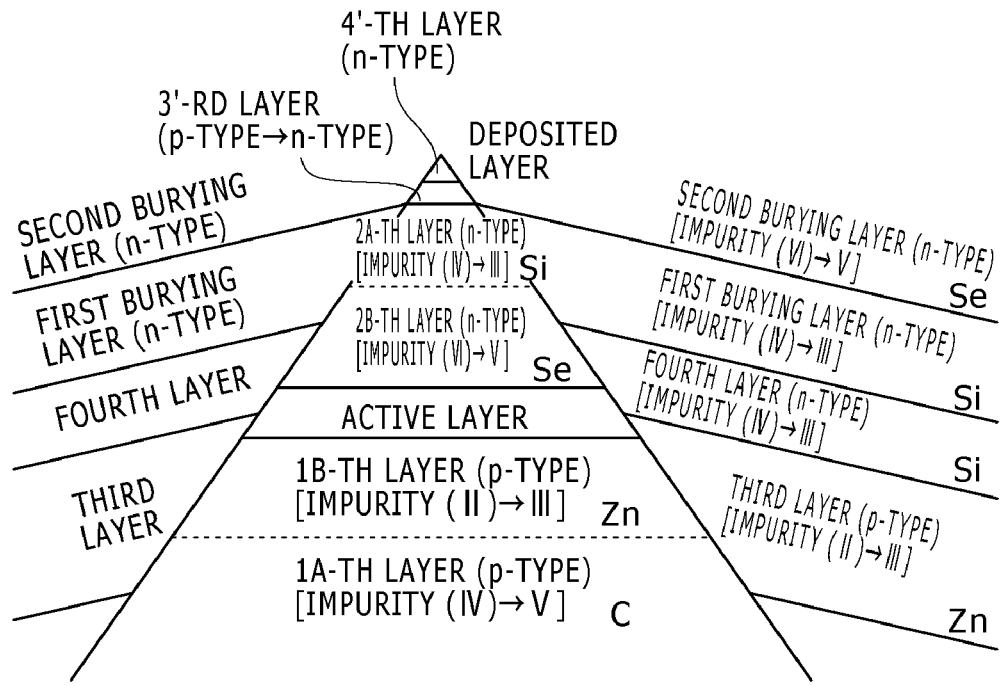
FIGS. 28A and 28B are conceptual diagrams of a semiconductor light emitting device according to a twenty-first embodiment of the present invention.
Figure 28B:
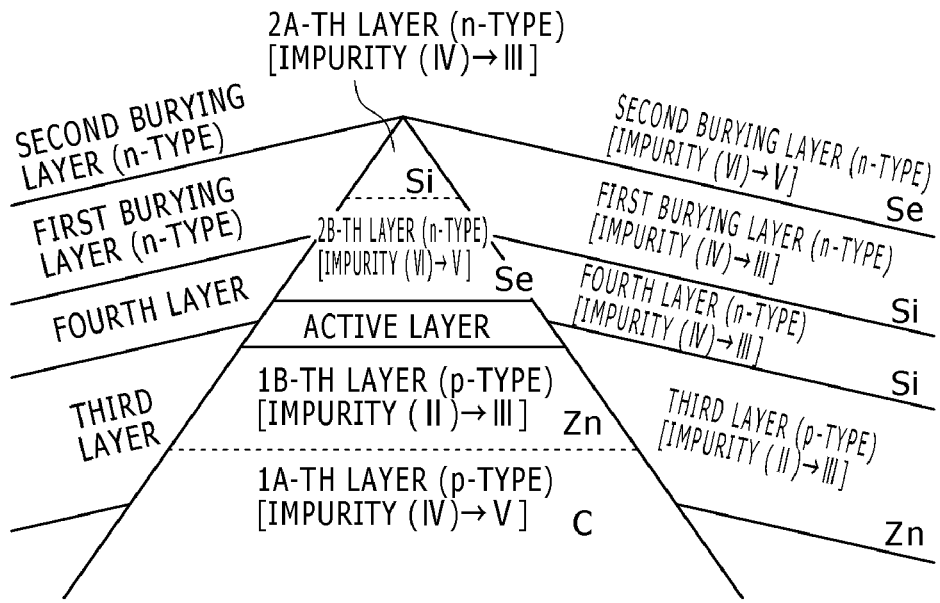

Specifically, as shown in FIG. 28A as a conceptual diagram of the end parts of the light emitting part and FIG. 28B as a conceptual diagram of the center part of the light emitting part, when the semiconductor light emitting device of the twenty-first embodiment is represented based on the ((II)-1-d)-th configuration of the present invention, in the semiconductor light emitting device of the twenty-first embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom.

Furthermore, when the semiconductor light emitting device of the twenty-first embodiment is represented based on the ((II)-3-d)-th configuration of the present invention, in the semiconductor light emitting device of the twenty-first embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is a group II impurity, the impurity for causing the fourth compound semiconductor layer to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity.

More specifically, in the semiconductor light emitting device of the twenty-first embodiment, the respective layers have the configuration shown in Table 18A or Table 18B shown below. In the example shown in Table 18A, the third compound semiconductor layer is stacked on the fourth compound semiconductor layer. In the example shown in Table 18B, the fourth compound semiconductor layer is stacked on the third compound semiconductor layer.

TABLE 18A (Configuration of light emitting part)

| 2A-th compound semiconductor layer | n-$Al_{0.4}Ga_{0.6}As$: Si |
|---|---|
| 2B-th compound semiconductor layer | n-$Al_{0.4}Ga_{0.6}As$: Se |
| Active layer | [Active layer - B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Se |
| First burying layer | n-$Al_{0.47}Ga_{0.53}As$: Si |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Si |
| (Whole) | |
| Contact layer | n-GaAs: Si (or Se) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of n-$Al_{0.47}Ga_{0.53}As$: Si is formed between the third compound semiconductor layer and the first burying layer (the partial portion of the first burying layer in the vicinity of the interface with the third compound semiconductor layer corresponds to this fifth compound semiconductor layer).

TABLE 18B (Configuration of light emitting part)

| 2A-th compound semiconductor layer | n-$Al_{0.4}Ga_{0.6}As$: Si |
|---|---|
| 2B-th compound semiconductor layer | n-$Al_{0.4}Ga_{0.6}As$: Se |

TABLE 18B-continued

| Active layer | [Active layer - B] |
|---|---|
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Se |
| First burying layer | n-$Al_{0.47}Ga_{0.53}As$: Si |
| Fourth compound semiconductor layer | n-$Al_{0.47}Ga_{0.53}As$: Si |
| Third compound semiconductor layer | p-$Al_{0.47}Ga_{0.53}As$: Zn |
| Adjustment layer | n-$Al_{0.47}Ga_{0.53}As$: Si |
| (Whole) | |
| Contact layer | n-GaAs: Si (or Se) |

(Note 1)
The adjustment layer is formed subsequently to the 2A-th compound semiconductor layer.
(Note 2)
The first burying layer is formed subsequently to the fourth compound semiconductor layer in a continuous manner, and a boundary does not exist between the first burying layer and the fourth compound semiconductor layer substantially.

Twenty-Second Embodiment

Figure 29A:
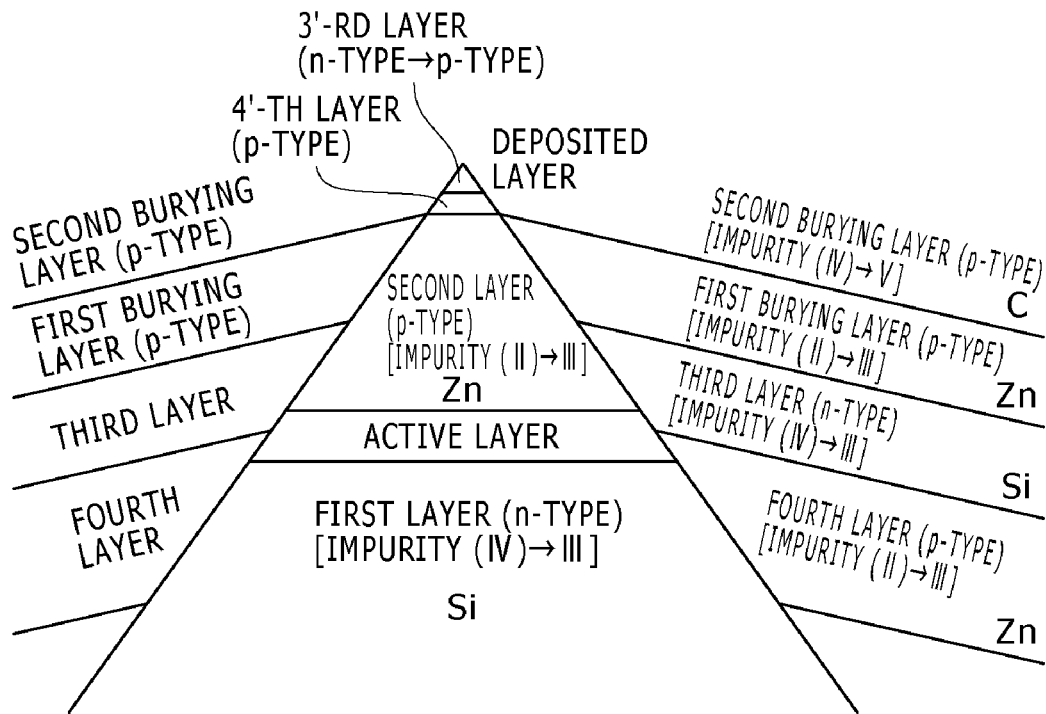
FIGS. 29A to 48B are conceptual diagrams of a semiconductor light emitting device according to a twenty-second embodiment of the present invention.
Figure 29B:
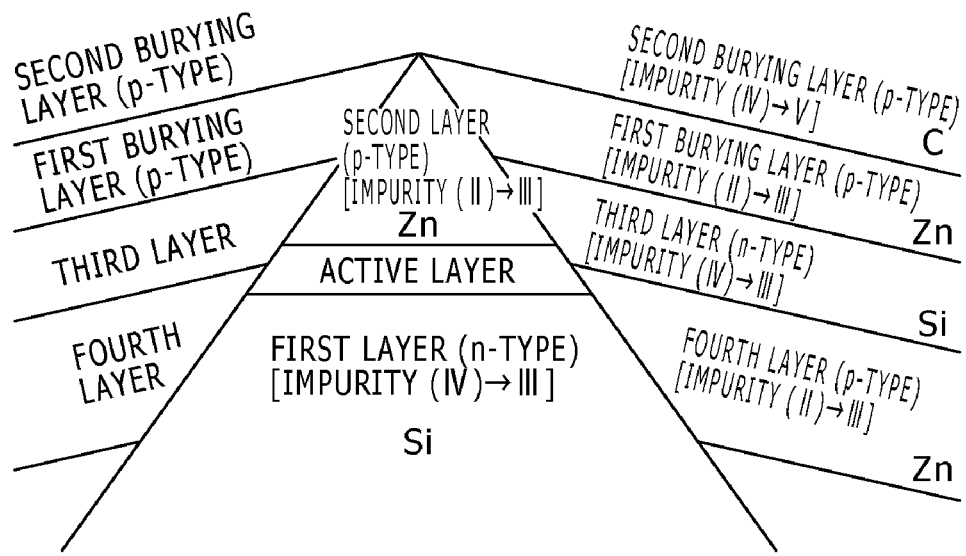

The twenty-second embodiment relates to the semiconductor light emitting device according to the ((II)-5-th) configuration (specifically, the ((II)-5-A-1)-th configuration) of the present invention. As shown in FIG. 29A as a conceptual diagram of the end parts of the light emitting part, FIG. 29B as a conceptual diagram of the center part of the light emitting part, FIGS. 49 and 50 as schematic partial sectional views, and FIGS. 51A to 51C as enlarged schematic partial sectional views, the semiconductor light emitting device of the twenty-second embodiment includes (A) a light emitting part 20 formed of a multilayer structure arising from sequential stacking of a first compound semiconductor layer 21 of a first conductivity type (n-type, in the twenty-second embodiment), an active layer 23, and a second compound semiconductor layer 22 of a second conductivity type (p-type, in the twenty-second embodiment), and (B) a current block layer 40 provided in contact with the side surface of the light emitting part 20.

The current block layer 40 has the same configuration and structure as that of the current block layer 40 in the thirteenth embodiment, and the positional relationship between the current block layer 40 and the light emitting part 20 is the same as that in the thirteenth embodiment.

Also in the semiconductor light emitting device of the twenty-second embodiment, the first compound semiconductor layer 21, the second compound semiconductor layer 22, the fourth compound semiconductor layer 44, and the third compound semiconductor layer 43 are composed of a III-V compound semiconductor. Furthermore, as described later, a 1A-th compound semiconductor layer 21A, a 1B-th compound semiconductor layer 21B, the second compound semiconductor layer 22, the fourth compound semiconductor layer 44, and the third compound semiconductor layer 43 are composed of a III-V compound semiconductor. In addition, the first compound semiconductor layer 21, a 2A-th compound semiconductor layer 22A, a 2B-th compound semiconductor layer 22B, the fourth compound semiconductor layer 44, the third compound semiconductor layer 43, a first burying layer 31A, and a second burying layer 31B are composed of a III-V compound semiconductor.

In the twenty-second embodiment, the substitution site of the impurity in the first compound semiconductor layer 21, the substitution site of the impurity in the second compound semiconductor layer 22, the substitution site of the impurity in the fourth compound semiconductor layer 44, and the substitution site of the impurity in the third compound semiconductor layer 43 are the site occupied by a group III atom. The substitution site of the impurity in the first burying layer is the site occupied by a group III atom, and the substitution site of the impurity in the second burying layer is the site occupied by a group V atom. The impurity for causing the first compound semiconductor layer 21 and the third compound semiconductor layer 43 to be the n-type as the first conductivity type is a group IV impurity (specifically, silicon, Si). The impurity for causing the second compound semiconductor layer 22 and the fourth compound semiconductor layer 44 to be the p-type as the second conductivity type is a group II impurity (specifically, zinc, Zn). The impurity for causing the first burying layer 31A to be the p-type as the second conductivity type is a group II impurity (specifically, zinc, Zn). The impurity for causing the second burying layer 31B to be the p-type as the second conductivity type is carbon (C).

More specifically, in the semiconductor light emitting device of the twenty-second embodiment, the respective layers have the configuration shown in Table 19A shown below.

TABLE 19A

| (Configuration of light emitting part) | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer - A] |
| First compound semiconductor layer 21 | n-$Al_{0.4}Ga_{0.6}As$: Si |
| (Current block layer) | |
| Second burying layer 31B | p-$Al_{0.47}Ga_{0.53}As$: C |
| First burying layer 31A | p-$Al_{0.47}Ga_{0.53}As$: Zn |
| Third compound semiconductor layer 43 | n-$Al_{0.47}Ga_{0.53}As$: Si |
| Fourth compound semiconductor layer 44 | p-$Al_{0.47}Ga_{0.53}As$: Zn |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the adjustment layer 30 and the fourth compound semiconductor layer 44 substantially.

Also in the twenty-second embodiment, at the timing when the formation of the light emitting part 20 is completed in a step similar to [Step-120] of the first embodiment, the sectional shape of the light emitting part 20 obtained when the center part of the light emitting part 20 is cut along a virtual plane perpendicular to the axis line of the light emitting part is a triangle. At this time, the sectional shape of the light emitting part 20 obtained when the end part of the light emitting part 20 is cut along a virtual plane perpendicular to the axis line of the light emitting part is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a deposited layer 40" having the same multilayer structure as that of the current block layer 40 is formed above the top surface of the light emitting part 20. Subsequently to the formation of the current block layer 40, the first burying layer 31A is so formed as to cover the side surfaces of the light emitting part 20 and the side surfaces of at least one layer of the deposited layer 40" stacked above the light emitting part 20, at both the end parts in particular. Subsequently, at the timing of the completion of the covering of at least the side surfaces of the light emitting part 20 and the side surfaces of a compound semiconductor layer 30' by the first burying layer 31A, the formation of the second burying layer 31B is started, so that the entire surface is covered by the second burying layer 31B. If a compound semiconductor layer of the first conductivity type is included in the deposited layer 40" particularly as above, it is desirable that the burying layer 31 of the second conductivity type (e.g. the burying layer 31B) whose impurity substitution site does not compete with the impurity substitution site in this compound semiconductor layer of the first conductivity type included in the deposited layer 40" be in contact with at least a part of the side surface of the deposited layer 40". This structure allows the impurity of the second conductivity type in the burying layer 31 (e.g. the burying layer 31B) to diffuse from the at least a part of the side surface of the deposited layer 40". This makes it possible to initially carry out conductivity type compensation for the compound semiconductor layer of the first conductivity type that is included in the deposited layer 40" and causes the current blocking, and thus turn this compound semiconductor layer of the first conductivity type to a layer of the second conductivity type. At this time, the impurity for causing the second burying layer 31B to have the second conductivity type is such that the substitution site of the impurity in the second burying layer 31B (the site occupied by a group V atom, in the twenty-second embodiment) does not compete with the substitution site of the impurity in the third compound semiconductor layer (the site occupied by a group III atom, in the twenty-second embodiment) for causing the third compound semiconductor layer 43 to have the first conductivity type (see Table 19A or Table 19B). Therefore, e.g. the impurity for causing the second burying layer 31B that is deposited to a large thickness so that the apex may be finally covered to have the second conductivity type diffuses into a deposited layer 43" of the third compound semiconductor layer, having the first conductivity type and formed above the top surface at both the end parts of the light emitting part 20. This diffusion turns the deposited layer 43" of the third compound semiconductor layer to a deposited layer 43' of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased.

Except for the above-described points, the semiconductor light emitting device of the twenty-second embodiment has the same configuration and structure as those of the semiconductor light emitting device of the fourteenth embodiment basically, and therefore the detailed description thereof is omitted.

Modification examples of the semiconductor light emitting device of the twenty-second embodiment will be described below.

Figure 30A:
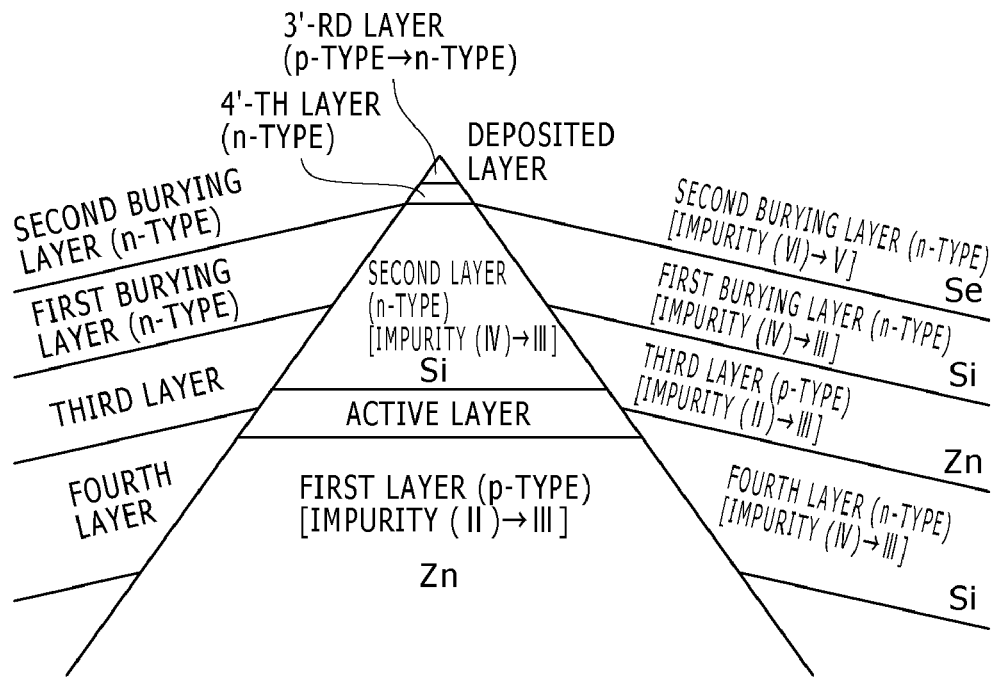
Figure 30B:
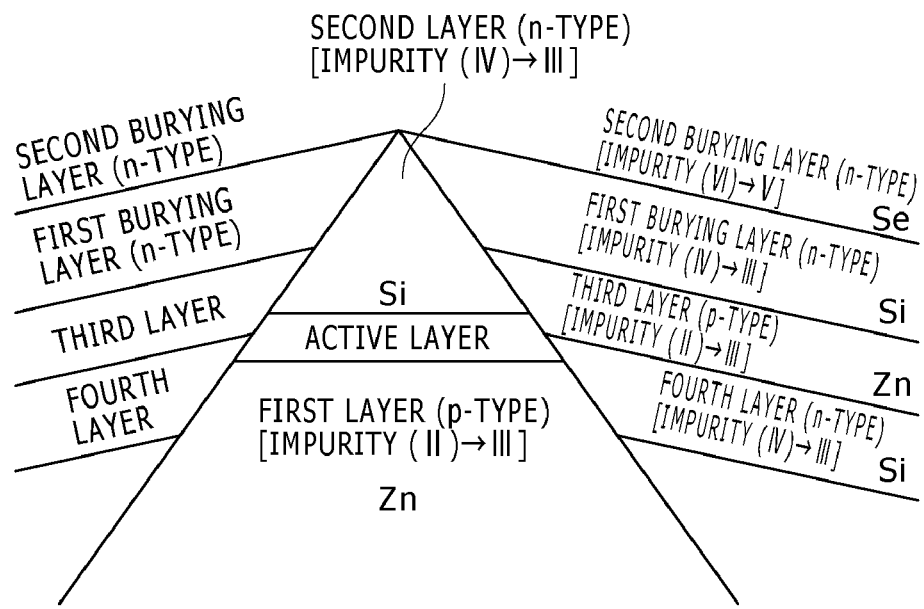

A modification example of the semiconductor light emitting device of the twenty-second embodiment is shown in FIG. 30A as a conceptual diagram of the end parts of the light emitting part and FIG. 30B as a conceptual diagram of the center part of the light emitting part. This modification example corresponds to the semiconductor light emitting device according to the ((II)-5-A-2)-th configuration of the present invention. Specifically, in this semiconductor light emitting device, the impurity for causing the first compound semiconductor layer and the third compound semiconductor layer to be the p-type as the first conductivity type is a group II impurity (specifically, Zn), the impurity for causing the second compound semiconductor layer and the fourth compound semiconductor layer to be the n-type as the second conductivity type is a group IV impurity (specifically, Si), and the impurity for causing the first burying layer to be the n-type as the second conductivity type is a group IV impurity, and the impurity for causing the second burying layer to be the n-type as the second conductivity type is a group VI impurity.

More specifically, in this modification example of the semiconductor light emitting device of the twenty-second embodiment, the respective layers have the configuration shown in Table 19B shown below. Table 19B is given the same notes as (Note 1) and (Note 2) of Table 19A (this applies also to Tables 9C to 9J to be described later).

TABLE 19B (Configuration of light emitting part)

| | |
|---|---|
| Second compound semiconductor layer | n-$Al_{0.47}Ga_{0.53}As$: Si |
| Second compound semiconductor layer | n-$Al_{0.4}Ga_{0.6}As$: Si |
| Active layer | [Active layer - B] |
| First compound semiconductor layer | p-$Al_{0.4}Ga_{0.6}As$: Zn |
| (Current block layer) | |
| Second burying layer | n-$Al_{0.47}Ga_{0.53}As$: Se |
| First burying layer | n-$Al_{0.47}Ga_{0.53}As$: Si |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Se |
| (Whole) | |
| Contact layer | p-GaAs: Zn (or C) |

Figure 31A:
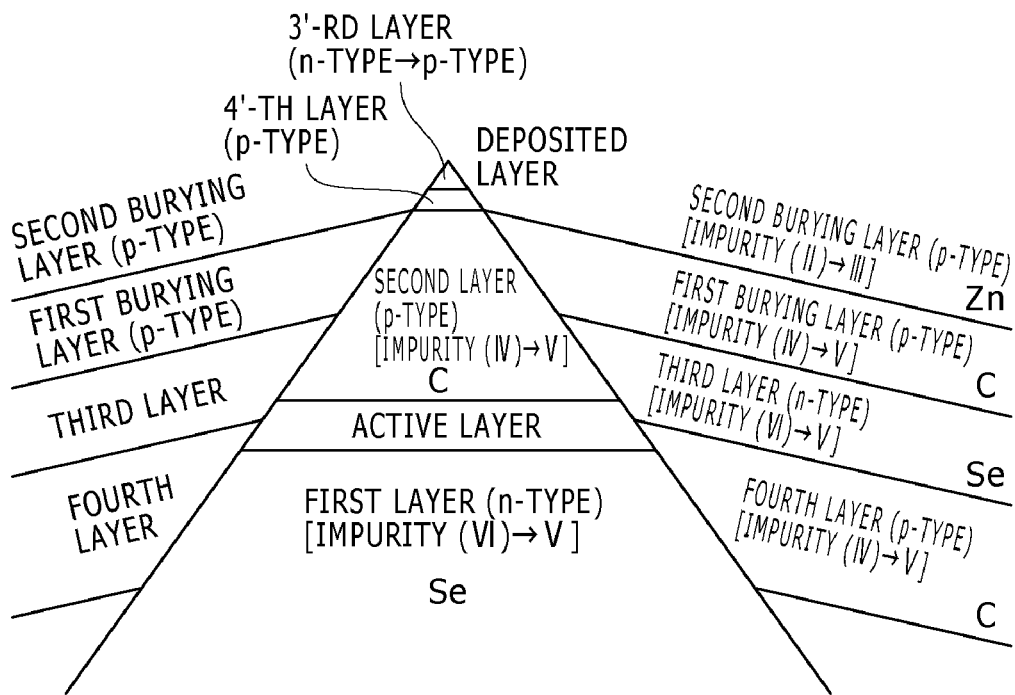
Figure 31B:
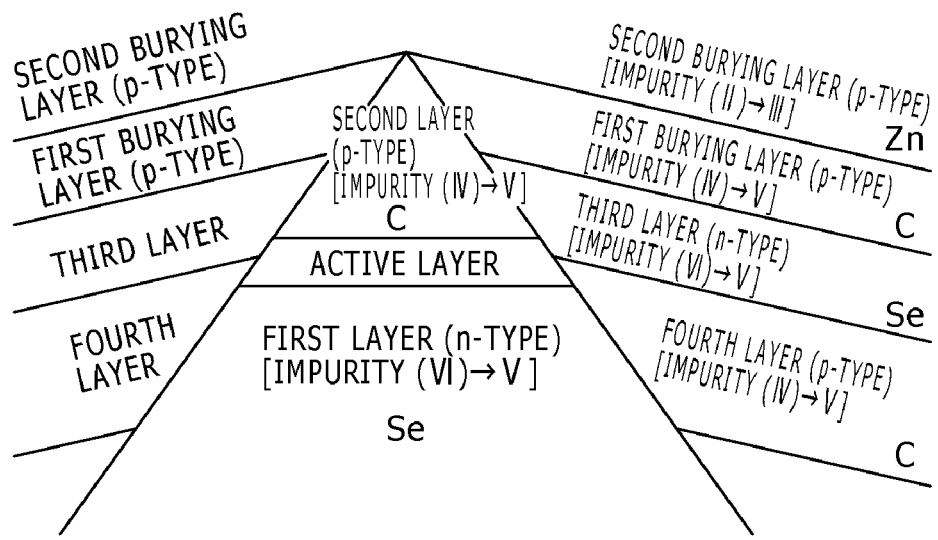
Figure 32A:
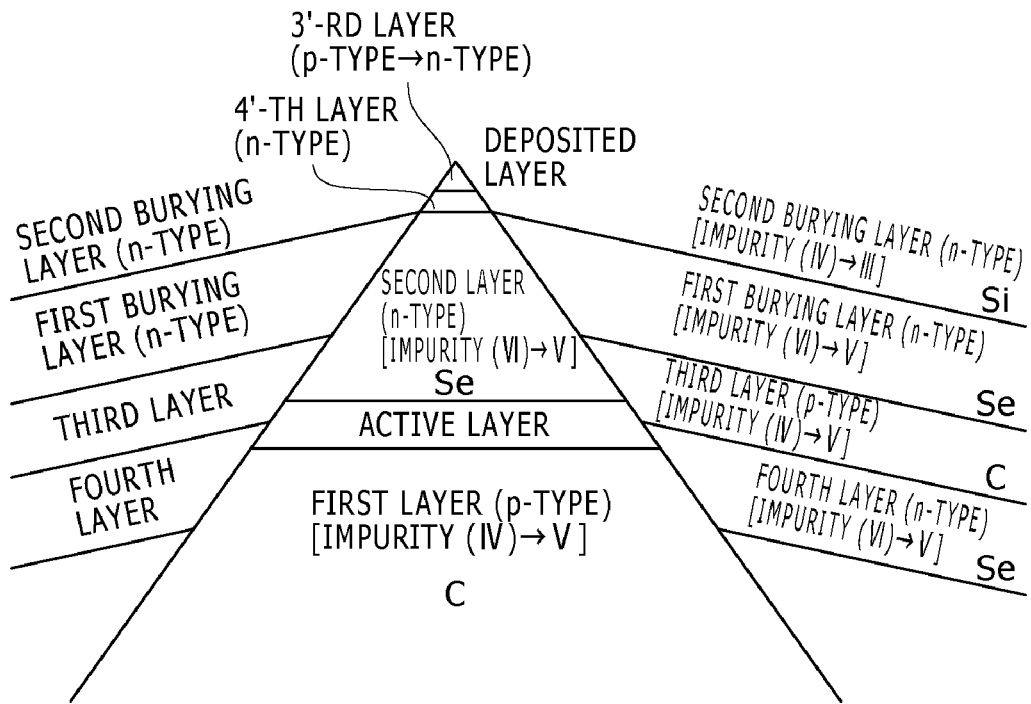

A modification example of the semiconductor light emitting device of the twenty-second embodiment is shown in FIG. 31A as a conceptual diagram of the end parts of the light emitting part and FIG. 31B as a conceptual diagram of the center part of the light emitting part. Furthermore, another modification example of the semiconductor light emitting device of the twenty-second embodiment is shown in FIG. 32A as a conceptual diagram of the end parts of the light emitting part and FIG. 32B as a conceptual diagram of the center part of the light emitting part. These modification examples correspond to the semiconductor light emitting device according to the ((II)-5-a)-th configuration of the present invention. In this semiconductor light emitting device, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the first burying layer is the site occupied by a group V atom, and the substitution site of the impurity in the second burying layer is the site occupied by a group III atom.

The modification example of the semiconductor light emitting device of the twenty-second embodiment whose conceptual diagrams are shown in FIGS. 31A and 31B correspond to the semiconductor light emitting device according to the ((II)-5-a-1)-th configuration of the present invention. In this semiconductor light emitting device, the impurity for causing the first compound semiconductor layer and the third compound semiconductor layer to be the n-type as the first conductivity type is a group VI impurity (specifically, Se), the impurity for causing the second compound semiconductor layer and the fourth compound semiconductor layer to be the p-type as the second conductivity type is carbon (C), and the impurity for causing the first burying layer to be the p-type as the second conductivity type is carbon (C), and the impurity for causing the second burying layer to be the p-type as the second conductivity type is a group II impurity.

More specifically, in this modification example of the semiconductor light emitting device of the twenty-second embodiment, the respective layers have the configuration shown in Table 19C shown below.

TABLE 19C (Configuration of light emitting part)

| | |
|---|---|
| Second compound semiconductor layer | p-$Al_{0.47}Ga_{0.53}As$: C |
| Second compound semiconductor layer | p-$Al_{0.4}Ga_{0.6}As$: C |
| Active layer | [Active layer - A] |
| First compound semiconductor layer | n-$Al_{0.4}Ga_{0.6}As$: Se |
| (Current block layer) | |
| Second burying layer | p-$Al_{0.47}Ga_{0.53}As$: Zn |
| First burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer | p-$Al_{0.47}Ga_{0.53}As$: Zn |
| (Whole) | |
| Contact layer 32 | p-GaAs: Zn (or C) |

Figure 32B:
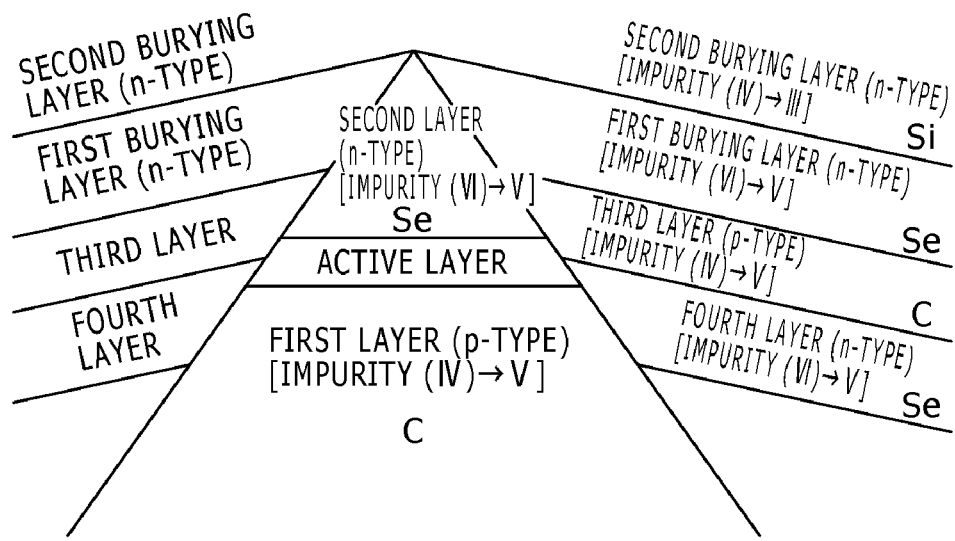

The modification example of the semiconductor light emitting device of the twenty-second embodiment whose conceptual diagrams are shown in FIGS. 32A and 32B correspond to the semiconductor light emitting device according to the ((II)-5-a-2)-th configuration of the present invention. In this semiconductor light emitting device, the impurity for causing the first compound semiconductor layer and the third compound semiconductor layer to be the p-type as the first conductivity type is carbon (C), the impurity for causing the second compound semiconductor layer and the fourth compound semiconductor layer to be the n-type as the second conductivity type is a group VI impurity (specifically, Se), and the impurity for causing the first burying layer to be the n-type as the second conductivity type is a group VI impurity, and the impurity for causing the second burying layer to be the n-type as the second conductivity type is a group IV impurity.

More specifically, in this modification example of the semiconductor light emitting device of the twenty-second embodiment, the respective layers have the configuration shown in Table 19D shown below.

TABLE 19D (Configuration of light emitting part)

| | |
|---|---|
| Second compound semiconductor layer | n-$Al_{0.47}Ga_{0.53}As$: Se |
| Second compound semiconductor layer | n-$Al_{0.4}Ga_{0.6}As$: Se |
| Active layer | [Active layer - B] |
| First compound semiconductor layer | p-$Al_{0.4}Ga_{0.6}As$: C |

TABLE 19D-continued

| (Current block layer) | |
|---|---|
| Second burying layer | n-$Al_{0.47}Ga_{0.53}$As: Si |
| First burying layer | n-$Al_{0.47}Ga_{0.53}$As: Se |
| Third compound semiconductor layer | p-$Al_{0.47}Ga_{0.53}$As: C |
| Fourth compound semiconductor layer | n-$Al_{0.47}Ga_{0.53}$As: Se |
| Adjustment layer | n-$Al_{0.47}Ga_{0.53}$As: Se |
| (Whole) | |
| Contact layer | p-GaAs: Zn (or C) |

Figure 33A:
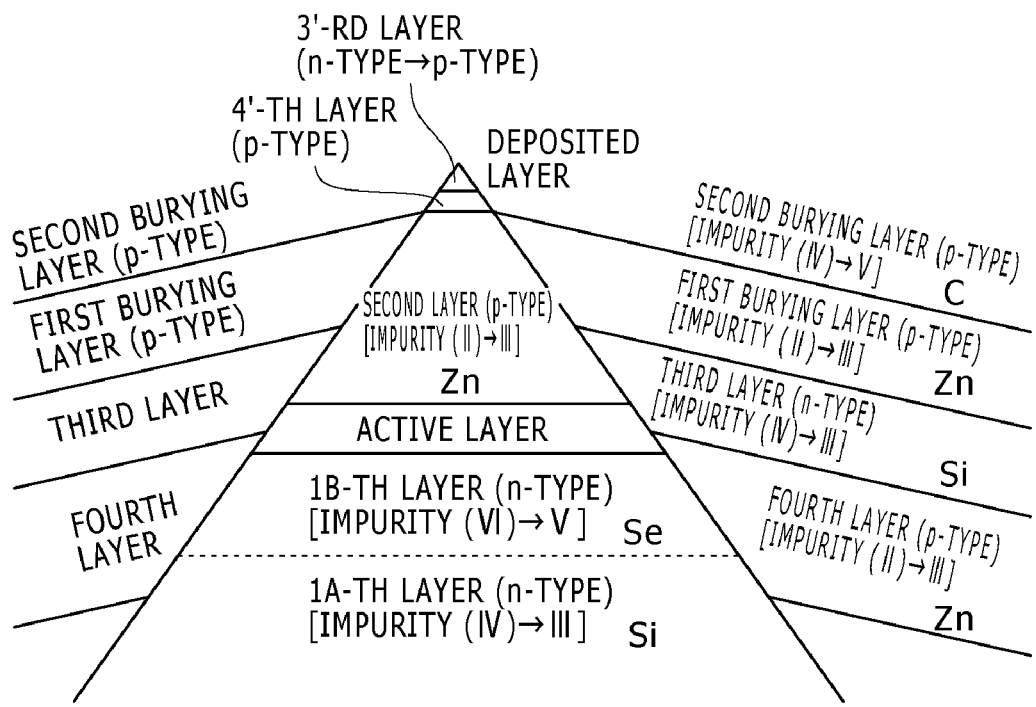
Figure 33B:
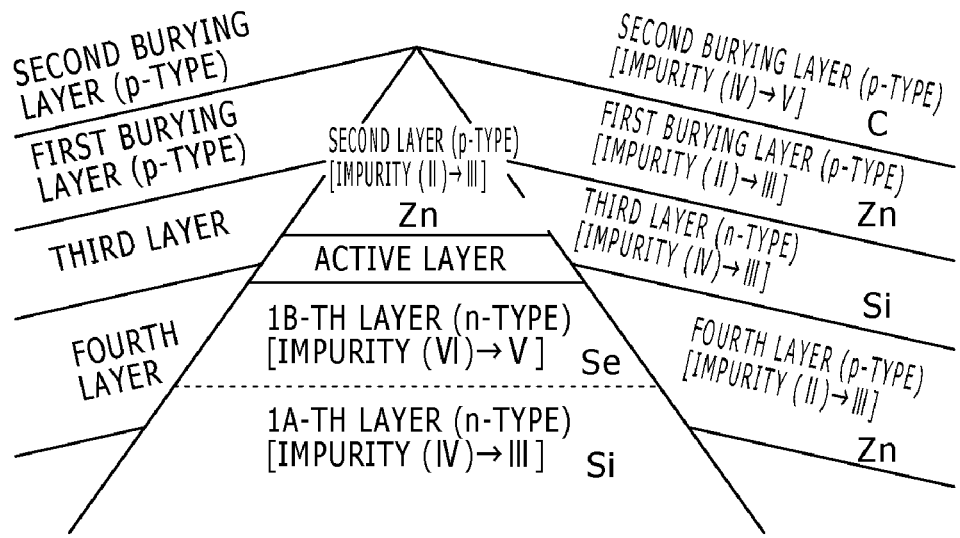
Figure 34A:
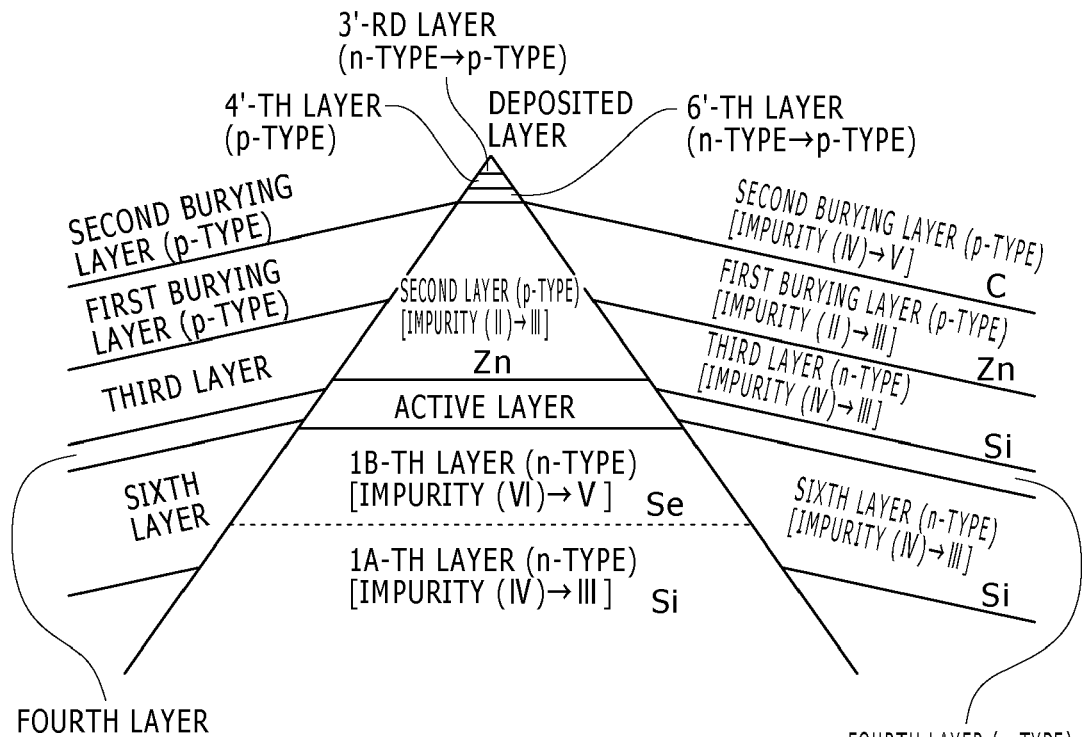
Figure 34B:
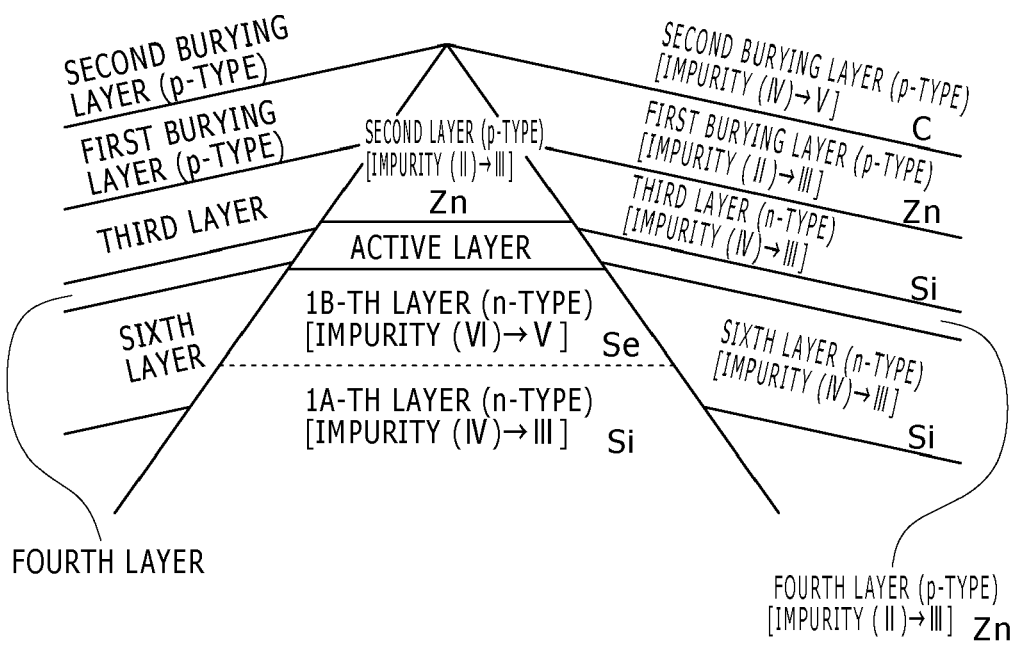
Figure 35A:
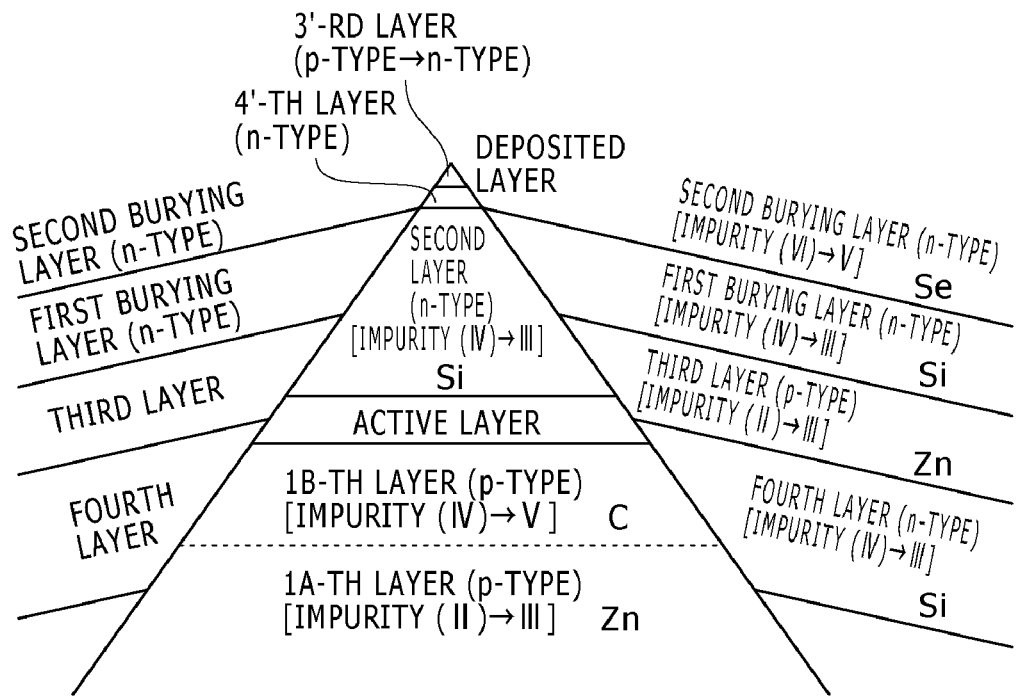

A modification example of the semiconductor light emitting device of the twenty-second embodiment is shown in FIG. 33A as a conceptual diagram of the end parts of the light emitting part and FIG. 33B as a conceptual diagram of the center part of the light emitting part. Furthermore, another modification example of the semiconductor light emitting device of the twenty-second embodiment is shown in FIG. 35A as a conceptual diagram of the end parts of the light emitting part and FIG. 35B as a conceptual diagram of the center part of the light emitting part. These modification examples correspond to the semiconductor light emitting device according to the ((II)-5-B)-th configuration of the present invention. In this semiconductor light emitting device, the first compound semiconductor layer is composed of a 1A-th compound semiconductor layer and a 1B-th compound semiconductor layer that is provided on the 1A-th compound semiconductor layer and is in contact with an active layer, and the impurity for causing the 1B-th compound semiconductor layer to have the first conductivity type is such that the substitution site of the impurity in the 1B-th compound semiconductor layer does not compete with the substitution site of the impurity in the 1A-th compound semiconductor layer for causing the 1A-th compound semiconductor layer to have the first conductivity type, and does not compete with the substitution site of the impurity in the second compound semiconductor layer for causing the second compound semiconductor layer to have the second conductivity type. The impurity for causing the 1A-th compound semiconductor layer to have the first conductivity type is such that the substitution site of the impurity in the 1A-th compound semiconductor layer competes with the substitution site of the impurity in the fourth compound semiconductor layer for causing the fourth compound semiconductor layer to have the second conductivity type. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. The substitution site of the impurity in the 1B-th compound semiconductor layer is the site occupied by a group V atom. The substitution site of the impurity in the first burying layer is the site occupied by a group III atom. The substitution site of the impurity in the second burying layer is the site occupied by a group V atom.

The modification example of the semiconductor light emitting device of the twenty-second embodiment whose conceptual diagrams are shown in FIGS. 33A and 33B correspond to the semiconductor light emitting device according to the ((II)-5-B-1)-th configuration of the present invention. In this semiconductor light emitting device, the impurity for causing the 1A-th compound semiconductor layer and the third compound semiconductor layer to be the n-type as the first conductivity type is a group IV impurity (specifically, Si), the impurity for causing the 1B-th compound semiconductor layer to be the n-type as the first conductivity type is a group VI impurity (specifically, Se), the impurity for causing the second compound semiconductor layer and the fourth compound semiconductor layer to be the p-type as the second conductivity type is a group II impurity (specifically, Zn), and the impurity for causing the first burying layer to be the p-type as the second conductivity type is a group II impurity, and the impurity for causing the second burying layer to be the p-type as the second conductivity type is carbon (C).

More specifically, in this modification example of the semiconductor light emitting device of the twenty-second embodiment, the respective layers have the configuration shown in Table 19E shown below.

TABLE 19E

| (Configuration of light emitting part) | |
|---|---|
| Second compound semiconductor layer | p-$Al_{0.47}Ga_{0.53}$As: Zn |
| Second compound semiconductor layer | p-$Al_{0.4}Ga_{0.6}$As: Zn |
| Active layer | [Active layer - A] |
| 1B-th compound semiconductor layer | n-$Al_{0.4}Ga_{0.6}$As: Se |
| 1A-th compound semiconductor layer | n-$Al_{0.4}Ga_{0.6}$As: Si |
| (Current block layer) | |
| Second burying layer | p-$Al_{0.47}Ga_{0.53}$As: C |
| First burying layer | p-$Al_{0.47}Ga_{0.53}$As: Zn |
| Third compound semiconductor layer | n-$Al_{0.47}Ga_{0.53}$As: Si |
| Fourth compound semiconductor layer | p-$Al_{0.47}Ga_{0.53}$As: Zn |
| Adjustment layer | p-$Al_{0.47}Ga_{0.53}$As: Zn |
| (Whole) | |
| Contact layer | p-GaAs: Zn (or C) |

Figure 35B:
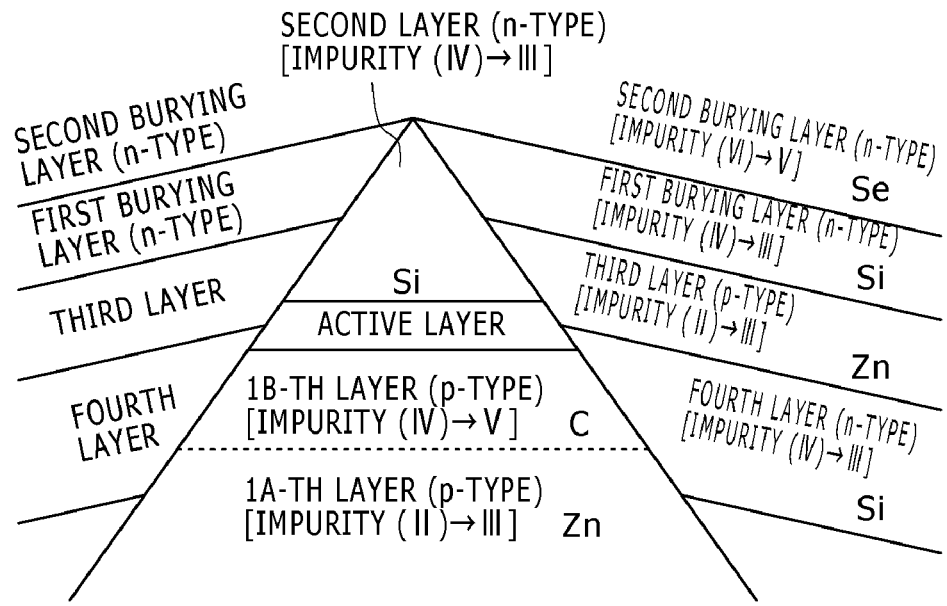

The modification example of the semiconductor light emitting device of the twenty-second embodiment whose conceptual diagrams are shown in FIGS. 35A and 35B correspond to the semiconductor light emitting device according to the ((II)-5-B-2)-th configuration of the present invention. In this semiconductor light emitting device, the impurity for causing the 1A-th compound semiconductor layer and the third compound semiconductor layer to be the p-type as the first conductivity type is a group II impurity (specifically, Zn), the impurity for causing the 1B-th compound semiconductor layer to be the p-type as the first conductivity type is carbon (C), the impurity for causing the second compound semiconductor layer and the fourth compound semiconductor layer to be the n-type as the second conductivity type is a group IV impurity (specifically, Si), and the impurity for causing the first burying layer to be the n-type as the second conductivity type is a group IV impurity, and the impurity for causing the second burying layer to be the n-type as the second conductivity type is a group VI impurity.

More specifically, in this modification example of the semiconductor light emitting device of the twenty-second embodiment, the respective layers have the configuration shown in Table 19F shown below.

TABLE 19F

| (Configuration of light emitting part) | |
|---|---|
| Second compound semiconductor layer | n-$Al_{0.47}Ga_{0.53}$As: Si |
| Second compound semiconductor layer | n-$Al_{0.4}Ga_{0.6}$As: Si |
| Active layer | [Active layer - B] |

TABLE 19F-continued

| | |
|---|---|
| 1B-th compound semiconductor layer | p-$Al_{0.4}Ga_{0.6}As$: C |
| 1A-th compound semiconductor layer | p-$Al_{0.4}Ga_{0.6}As$: Zn |
| (Current block layer) | |
| Second burying layer | n-$Al_{0.47}Ga_{0.53}As$: Se |
| First burying layer | n-$Al_{0.47}Ga_{0.53}As$: Si |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Se |
| (Whole) | |
| Contact layer | p-GaAs: Zn (or C) |

Conceptual diagrams of further-modified examples of the modification examples of the semiconductor light emitting device of the twenty-second embodiment whose conceptual diagrams are shown in FIGS. 33A and 33B and FIGS. 35A and 35B are shown in FIGS. 34A and 34B and FIGS. 36A and 36B. In these further-modified examples, a sixth compound semiconductor layer of the first conductivity type is provided under the fourth compound semiconductor layer, the impurity for causing the sixth compound semiconductor layer and the 1A-th compound semiconductor layer to have the first conductivity type is such that the substitution site of the impurity in the sixth compound semiconductor layer competes with the substitution site of the impurity in the 1A-th compound semiconductor layer for causing the 1A-th compound semiconductor layer to have the first conductivity type (specifically, a group IV impurity, Si, in FIGS. 34A and 34B, and a group II impurity, Zn, in FIGS. 36A and 36B), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. The bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

Figure 37A:
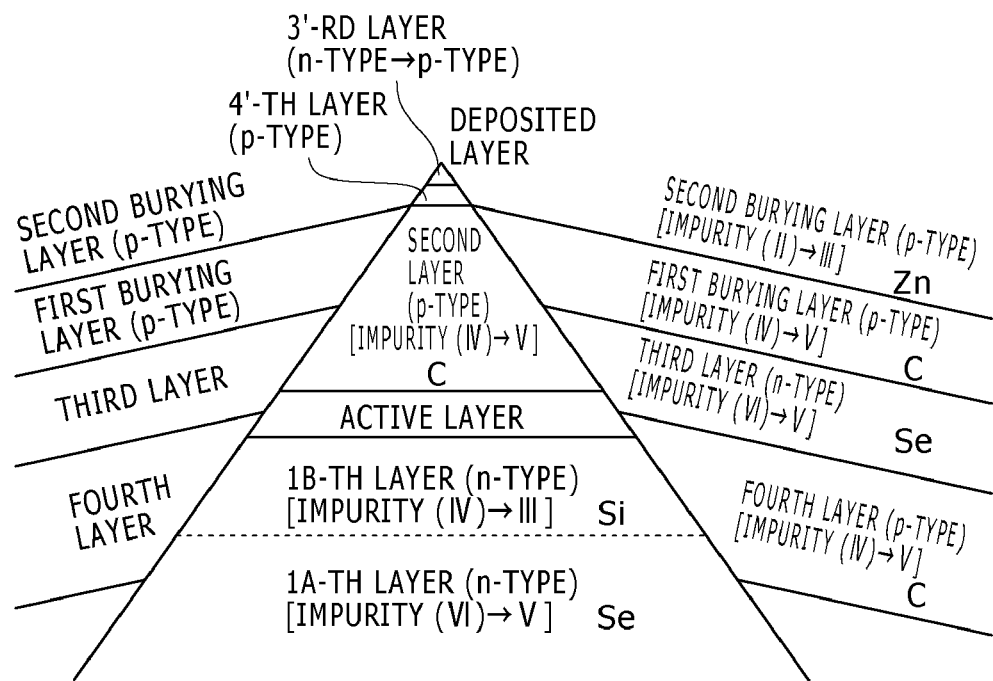
Figure 37B:
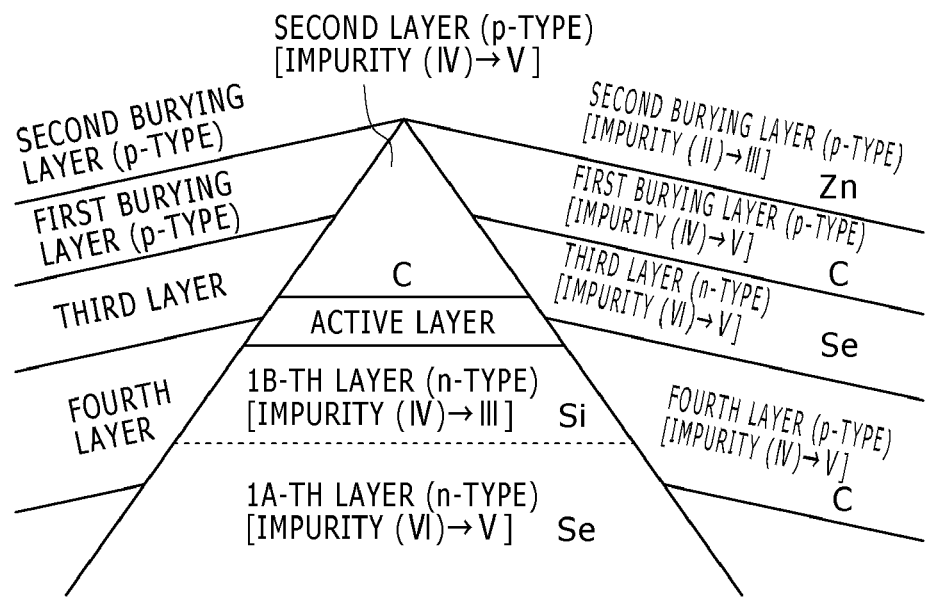
Figure 39A:
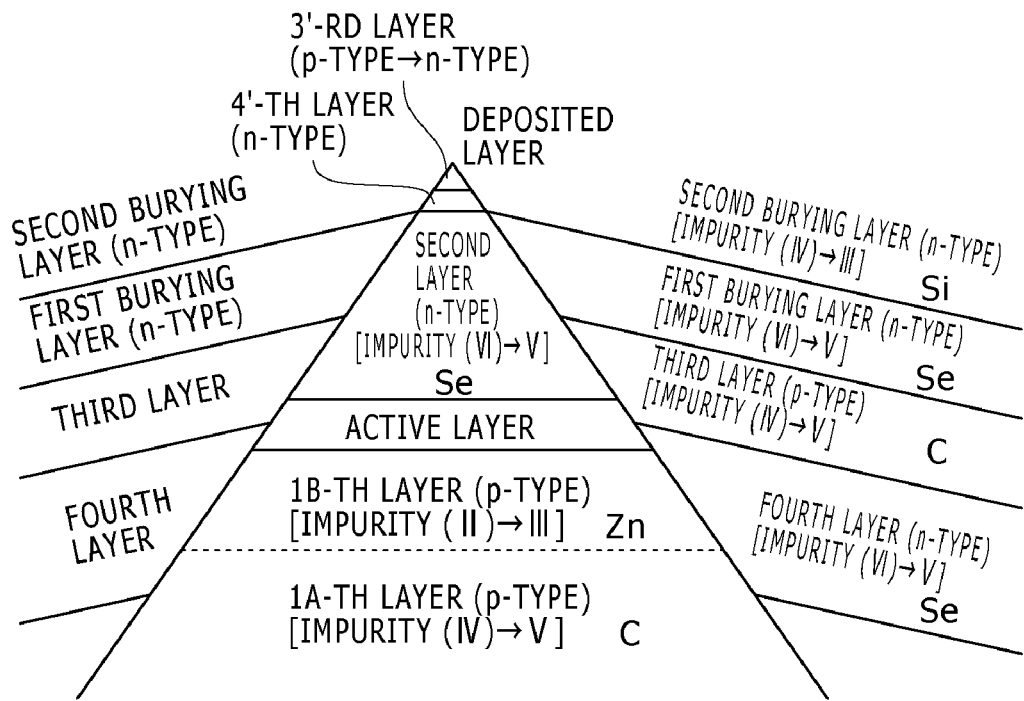

A modification example of the semiconductor light emitting device of the twenty-second embodiment is shown in FIG. 37A as a conceptual diagram of the end parts of the light emitting part and FIG. 37B as a conceptual diagram of the center part of the light emitting part. Furthermore, another modification example of the semiconductor light emitting device of the twenty-second embodiment is shown in FIG. 39A as a conceptual diagram of the end parts of the light emitting part and FIG. 39B as a conceptual diagram of the center part of the light emitting part. These modification examples correspond to the semiconductor light emitting device according to the ((II)-5-b)-th configuration of the present invention. In this semiconductor light emitting device, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the 1B-th compound semiconductor layer is the site occupied by a group III atom. The substitution site of the impurity in the first burying layer is the site occupied by a group V atom, and the substitution site of the impurity in the second burying layer is the site occupied by a group III atom.

The modification example of the semiconductor light emitting device of the twenty-second embodiment whose conceptual diagrams are shown in FIGS. 37A and 37B correspond to the semiconductor light emitting device according to the ((II)-5-b-1)-th configuration of the present invention. In this semiconductor light emitting device, the impurity for causing the 1A-th compound semiconductor layer and the third compound semiconductor layer to be the n-type as the first conductivity type is a group VI impurity (specifically, Se), the impurity for causing the 1B-th compound semiconductor layer to be the n-type as the first conductivity type is a group IV impurity (specifically, Si), the impurity for causing the second compound semiconductor layer and the fourth compound semiconductor layer to be the p-type as the second conductivity type is carbon (C), and the impurity for causing the first burying layer to be the p-type as the second conductivity type is carbon (C), and the impurity for causing the second burying layer to be the p-type as the second conductivity type is a group II impurity.

More specifically, in this modification example of the semiconductor light emitting device of the twenty-second embodiment, the respective layers have the configuration shown in Table 19G shown below.

TABLE 19G

| (Configuration of light emitting part) | |
|---|---|
| Second compound semiconductor layer | p-$Al_{0.47}Ga_{0.53}As$: C |
| Second compound semiconductor layer | p-$Al_{0.4}Ga_{0.6}As$: C |
| Active layer | [Active layer - A] |
| 1B-th compound semiconductor layer | n-$Al_{0.4}Ga_{0.6}As$: Si |
| 1A-th compound semiconductor layer | n-$Al_{0.4}Ga_{0.6}As$: Se |
| (Current block layer) | |
| Second burying layer | p-$Al_{0.47}Ga_{0.53}As$: Zn |
| First burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer | p-$Al_{0.47}Ga_{0.53}As$: Zn |
| (Whole) | |
| Contact layer | p-GaAs: Zn (or C) |

Figure 39B:
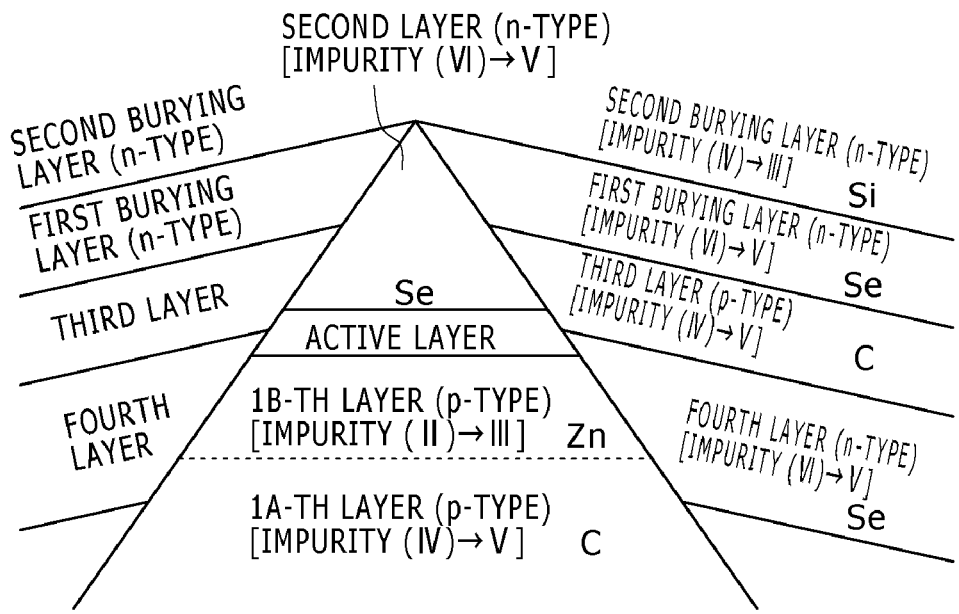

The modification example of the semiconductor light emitting device of the twenty-second embodiment whose conceptual diagrams are shown in FIGS. 39A and 39B correspond to the semiconductor light emitting device according to the ((II)-5-b-2)-th configuration of the present invention. In this semiconductor light emitting device, the impurity for causing the 1A-th compound semiconductor layer and the third compound semiconductor layer to be the p-type as the first conductivity type is carbon (C), the impurity for causing the 1B-th compound semiconductor layer to be the p-type as the first conductivity type is a group II impurity (specifically, Zn), the impurity for causing the second compound semiconductor layer and the fourth compound semiconductor layer to be the n-type as the second conductivity type is a group VI impurity (specifically, Se), and the impurity for causing the first burying layer to be the n-type as the second conductivity type is a group VI impurity, and the impurity for causing the second burying layer to be the n-type as the second conductivity type is a group IV impurity.

More specifically, in this modification example of the semiconductor light emitting device of the twenty-second embodiment, the respective layers have the configuration shown in Table 19H shown below.

TABLE 19H

| (Configuration of light emitting part) | |
|---|---|
| Second compound semiconductor layer | n-$Al_{0.47}Ga_{0.53}As$: Se |
| Second compound semiconductor layer | n-$Al_{0.4}Ga_{0.6}As$: Se |
| Active layer | [Active layer - B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Si |
| First burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |
| (Whole) | |
| Contact layer | p-GaAs: Zn (or C) |

Conceptual diagrams of further-modified examples of the modification examples of the semiconductor light emitting device of the twenty-second embodiment whose conceptual diagrams are shown in FIGS. 37A and 37B and FIGS. 39A and 39B are shown in FIGS. 38A and 38B and FIGS. 40A and 40B. Also in these further-modified examples, the sixth compound semiconductor layer of the first conductivity type is provided under the fourth compound semiconductor layer, the impurity for causing the sixth compound semiconductor layer to have the first conductivity type is such that the substitution site of the impurity in the sixth compound semiconductor layer competes with the substitution site of the impurity in the 1A-th compound semiconductor layer for causing the 1A-th compound semiconductor layer to have the first conductivity type (specifically, a group VI impurity, Se, in FIGS. 38A and 38B, and carbon (C) in FIGS. 40A and 40B), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. The bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

Figure 41A:
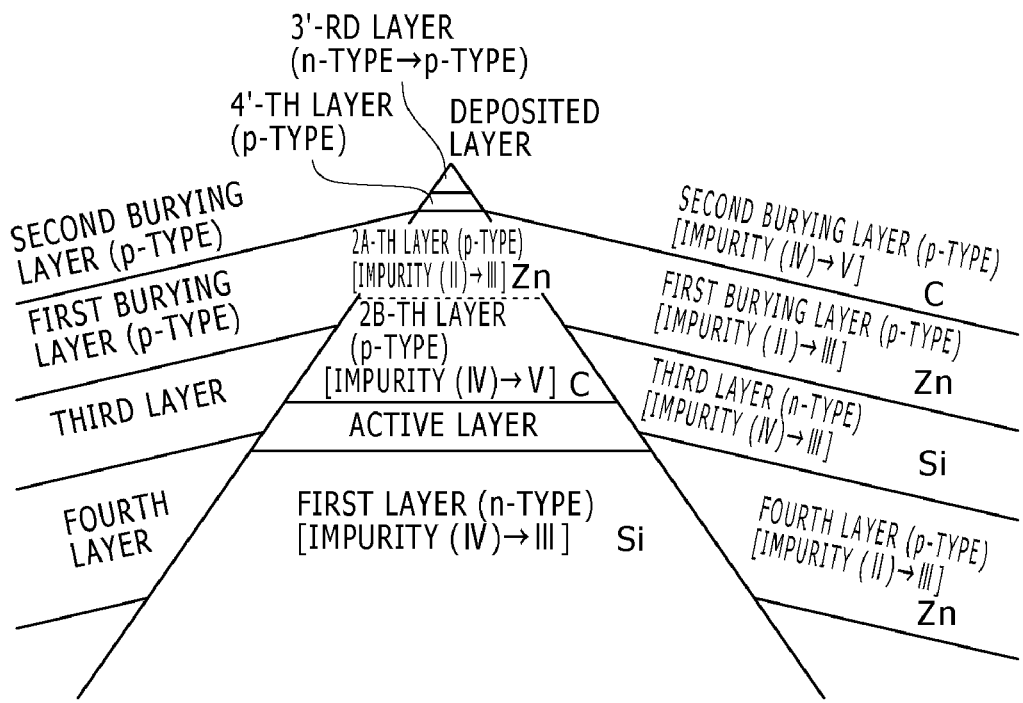
Figure 41B:
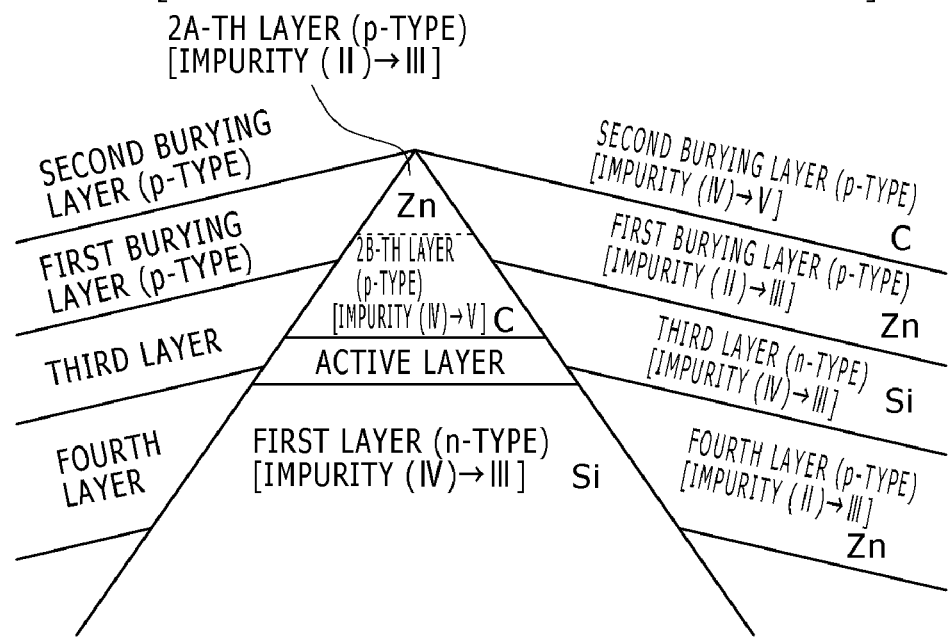
Figure 42A:
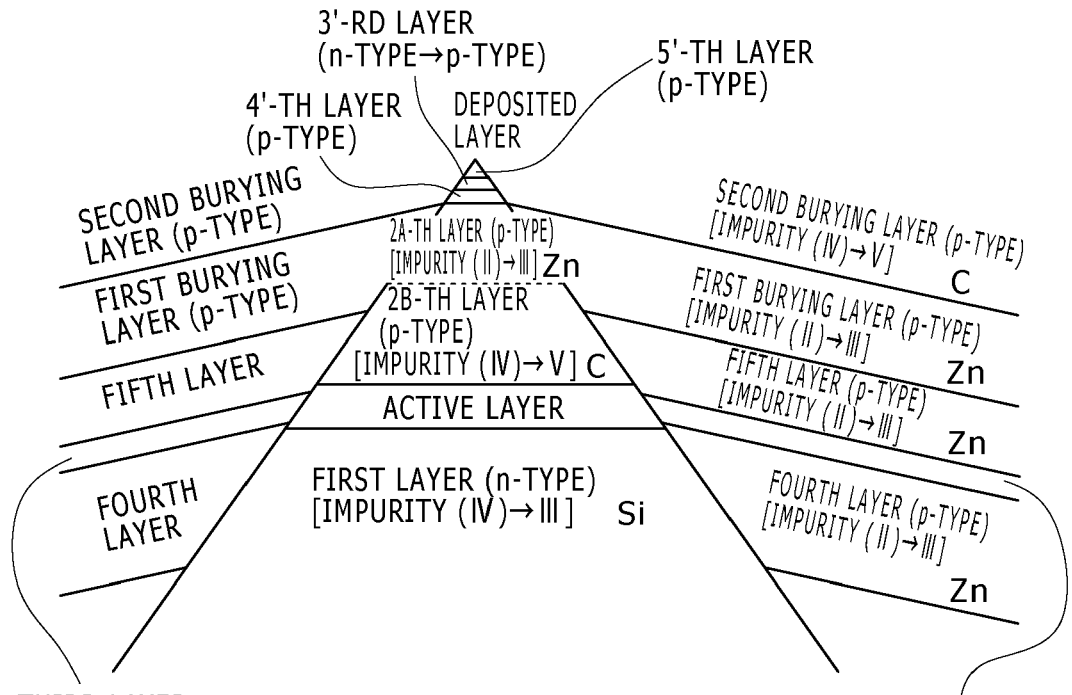
Figure 42B:
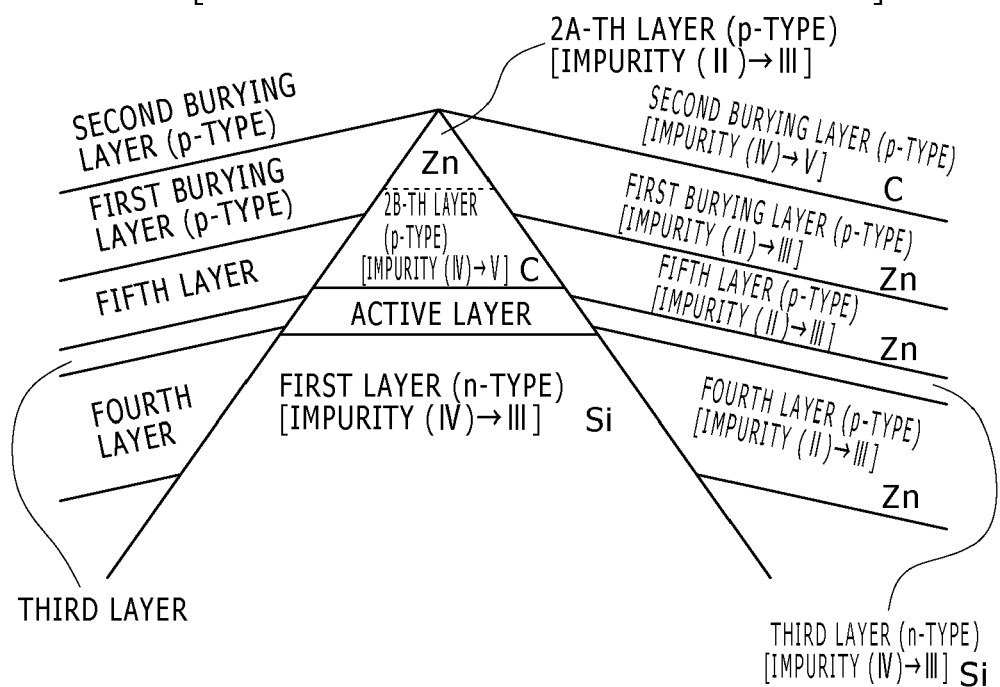
Figure 43A:
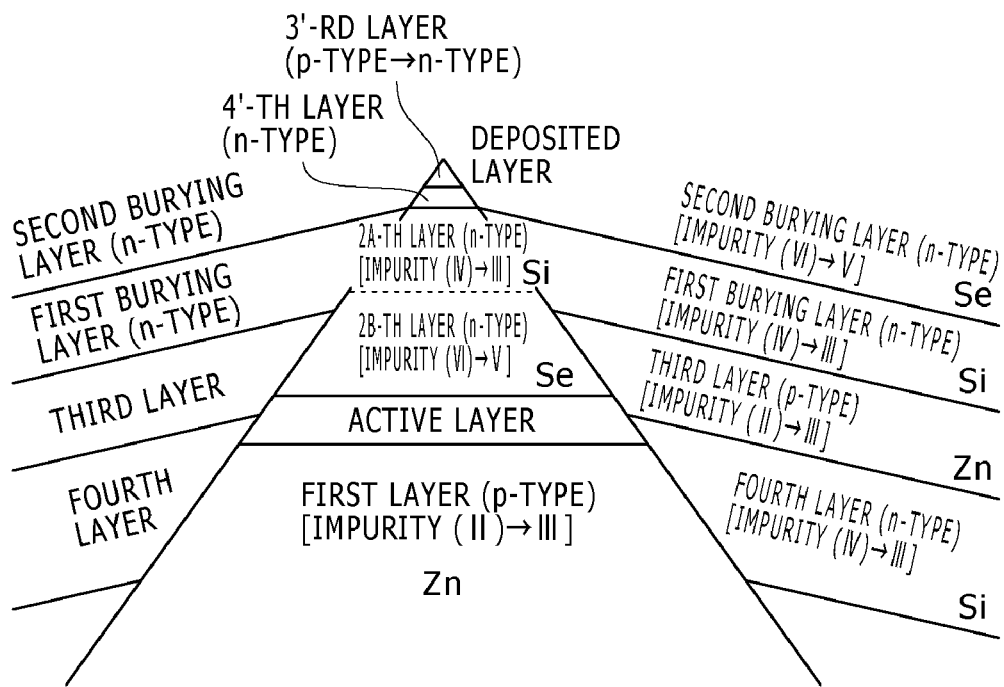

A modification example of the semiconductor light emitting device of the twenty-second embodiment is shown in FIG. 41A as a conceptual diagram of the end parts of the light emitting part and FIG. 41B as a conceptual diagram of the center part of the light emitting part. Furthermore, another modification example of the semiconductor light emitting device of the twenty-second embodiment is shown in FIG. 43A as a conceptual diagram of the end parts of the light emitting part and FIG. 43B as a conceptual diagram of the center part of the light emitting part. These modification examples correspond to the semiconductor light emitting device according to the ((II)-5-C)-th configuration of the present invention. In this semiconductor light emitting device, the second compound semiconductor layer is composed of a 2B-th compound semiconductor layer in contact with the active layer and a 2A-th compound semiconductor layer provided on the 2B-th compound semiconductor layer, and the impurity for causing the 2B-th compound semiconductor layer to have the second conductivity type is such that the substitution site of the impurity in the 2B-th compound semiconductor layer does not compete with the substitution site of the impurity in the 2A-th compound semiconductor layer for causing the 2A-th compound semiconductor layer to have the second conductivity type, and does not compete with the substitution site of the impurity in the first compound semiconductor layer for causing the first compound semiconductor layer to have the first conductivity type. The impurity for causing the 2A-th compound semiconductor layer to have the second conductivity type is such that the substitution site of the impurity in the 2A-th compound semiconductor layer competes with the substitution site of the impurity in the third compound semiconductor layer for causing the third compound semiconductor layer to have the first conductivity type. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group III atom. The substitution site of the impurity in the 2B-th compound semiconductor layer is the site occupied by a group V atom. The substitution site of the impurity in the first burying layer is the site occupied by a group III atom. The substitution site of the impurity in the second burying layer is the site occupied by a group V atom.

The modification example of the semiconductor light emitting device of the twenty-second embodiment whose conceptual diagrams are shown in FIGS. 41A and 41B correspond to the semiconductor light emitting device according to the ((II)-5-C-1)-th configuration of the present invention. In this semiconductor light emitting device, the impurity for causing the first compound semiconductor layer and the third compound semiconductor layer to be the n-type as the first conductivity type is a group IV impurity (specifically, Si), the impurity for causing the 2A-th compound semiconductor layer and the fourth compound semiconductor layer to be the p-type as the second conductivity type is a group II impurity (specifically, Zn), the impurity for causing the 2B-th compound semiconductor layer to be the p-type as the second conductivity type is carbon (C), and the impurity for causing the first burying layer to be the p-type as the second conductivity type is a group II impurity, and the impurity for causing the second burying layer to be the p-type as the second conductivity type is carbon (C).

More specifically, in this modification example of the semiconductor light emitting device of the twenty-second embodiment, the respective layers have the configuration shown in Table 19I shown below.

TABLE 19I (Configuration of light emitting part)

| | |
|---|---|
| 2B-th compound semiconductor layer | p-$Al_{0.4}Ga_{0.6}As$: Zn |
| 2A-th compound semiconductor layer | p-$Al_{0.4}Ga_{0.6}As$: C |
| Active layer | [Active layer - A] |
| First compound semiconductor layer | n-$Al_{0.4}Ga_{0.6}As$: Si |
| (Current block layer) | |
| Second burying layer | p-$Al_{0.47}Ga_{0.53}As$: C |
| First burying layer | p-$Al_{0.47}Ga_{0.53}As$: Zn |
| Third compound semiconductor layer | n-$Al_{0.47}Ga_{0.53}As$: Si |
| Fourth compound semiconductor layer | p-$Al_{0.47}Ga_{0.53}As$: Zn |
| Adjustment layer | p-$Al_{0.47}Ga_{0.53}As$: Zn |
| (Whole) | |
| Contact layer | p-GaAs: Zn (or C) |

Figure 43B:
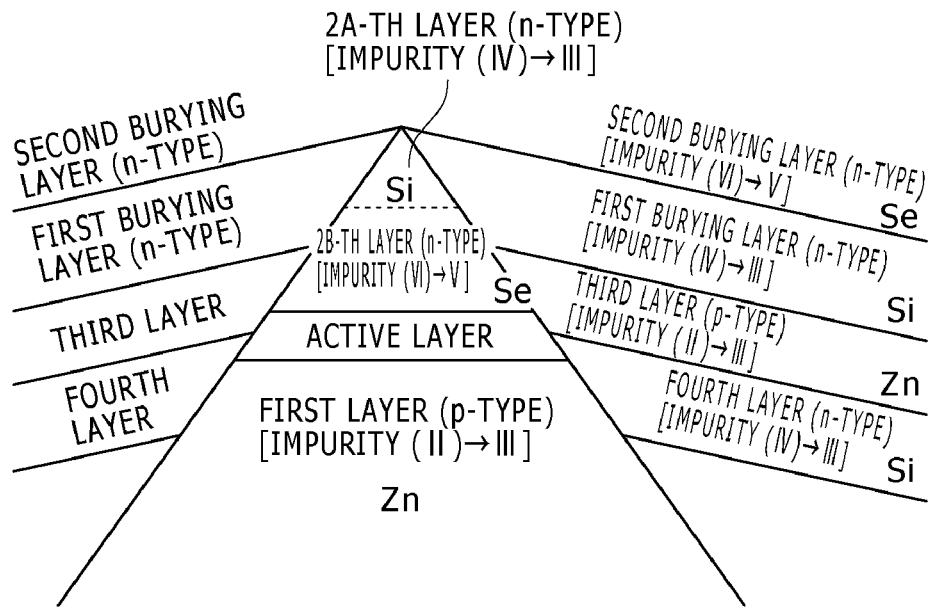
Figure 44A:
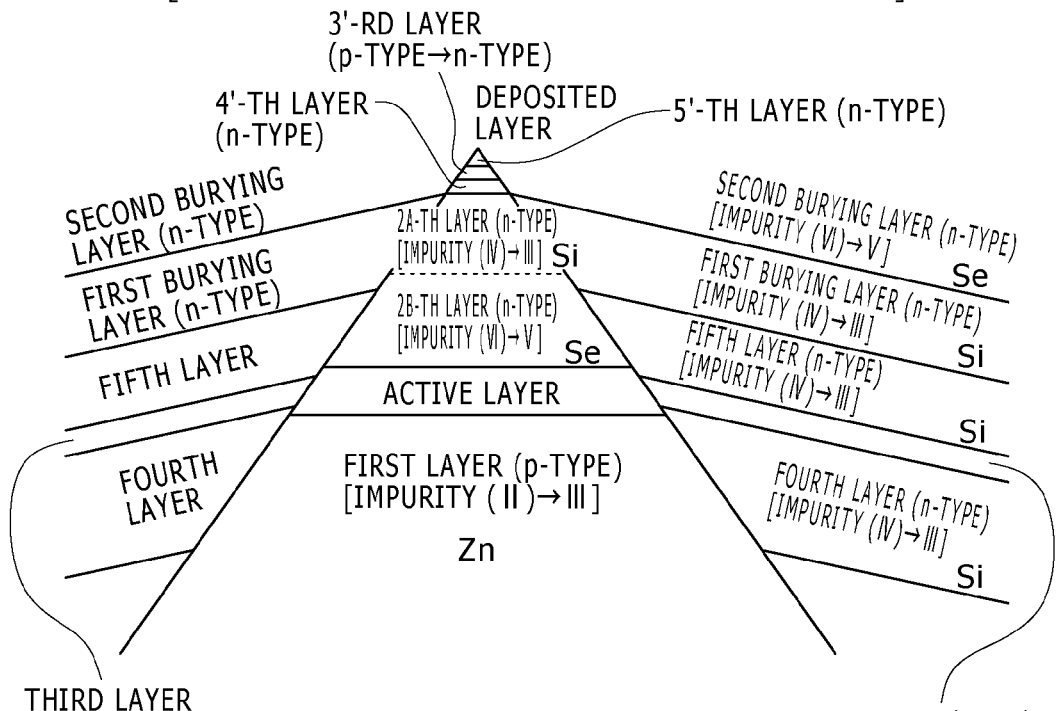
Figure 44B:
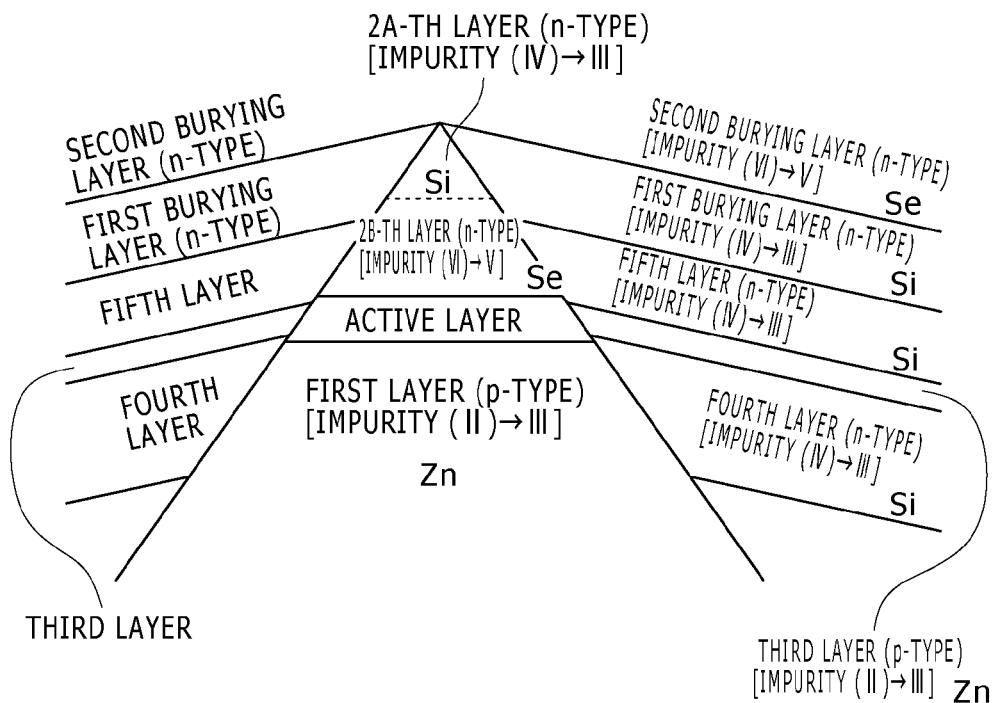

The modification example of the semiconductor light emitting device of the twenty-second embodiment whose conceptual diagrams are shown in FIGS. 43A and 43B correspond to the semiconductor light emitting device according to the ((II) 5-C-2)-th configuration of the present invention. In this semiconductor light emitting device, the impurity for causing the first compound semiconductor layer and the third compound semiconductor layer to be the p-type as the first conductivity type is a group II impurity (specifically, Zn), the impurity for causing the 2A-th compound semiconductor layer and the fourth compound semiconductor layer to be the n-type as the second conductivity type is a group IV impurity (specifically, Si), the impurity for causing the 2B-th compound semiconductor layer to be the n-type as the second conductivity type is a group VI impurity (specifically, Se), and the impurity for causing the first burying layer to be the n-type as the second conductivity type is a group IV impurity, and the impurity for causing the second burying layer to be the n-type as the second conductivity type is a group VI impurity.

More specifically, in this modification example of the semiconductor light emitting device of the twenty-second embodiment, the respective layers have the configuration shown in Table 19J shown below.

TABLE 19J (Configuration of light emitting part)

| | |
|---|---|
| 2B-th compound semiconductor layer | n-$Al_{0.4}Ga_{0.6}As$: Si |
| 2A-th compound semiconductor layer | n-$Al_{0.4}Ga_{0.6}As$: Se |
| Active layer | [Active layer - B] |
| First compound semiconductor layer | p-$Al_{0.4}Ga_{0.6}As$: Zn |
| (Current block layer) | |
| Second burying layer | n-$Al_{0.47}Ga_{0.53}As$: Se |
| First burying layer | n-$Al_{0.47}Ga_{0.53}As$: Si |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Se |
| (Whole) | |
| Contact layer | p-GaAs: Zn (or C) |

Conceptual diagrams of further-modified examples of the modification examples of the semiconductor light emitting device of the twenty-second embodiment whose conceptual diagrams are shown in FIGS. 41A and 41B and FIGS. 43A and 43B are shown in FIGS. 42A and 42B and FIGS. 44A and 44B. In these further-modified examples, a fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the 2A-th compound semiconductor layer for causing the 2A-th compound semiconductor layer to have the second conductivity type (specifically, a group II impurity, Zn, in FIGS. 42A and 42B, and a group IV impurity, Si, in FIGS. 44A and 44B), and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). The bypass channel is composed of the first compound semiconductor layer, the fourth compound semiconductor layer, the third compound semiconductor layer, the fifth compound semiconductor layer, and the second compound semiconductor layer (the 2A-th compound semiconductor layer and the 2B-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

Figure 45A:
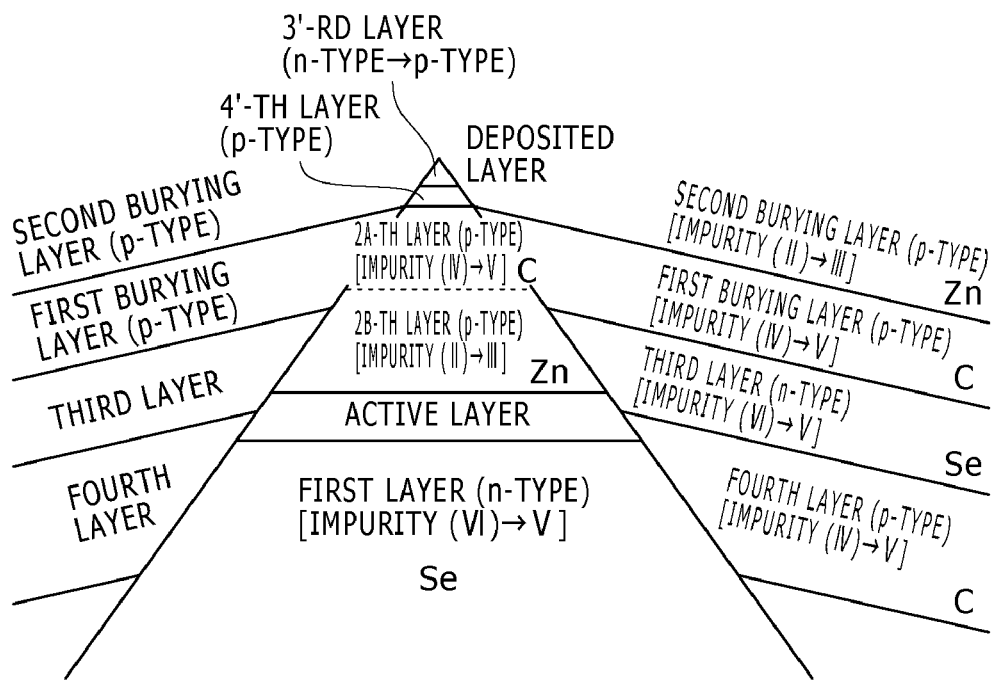
Figure 45B:
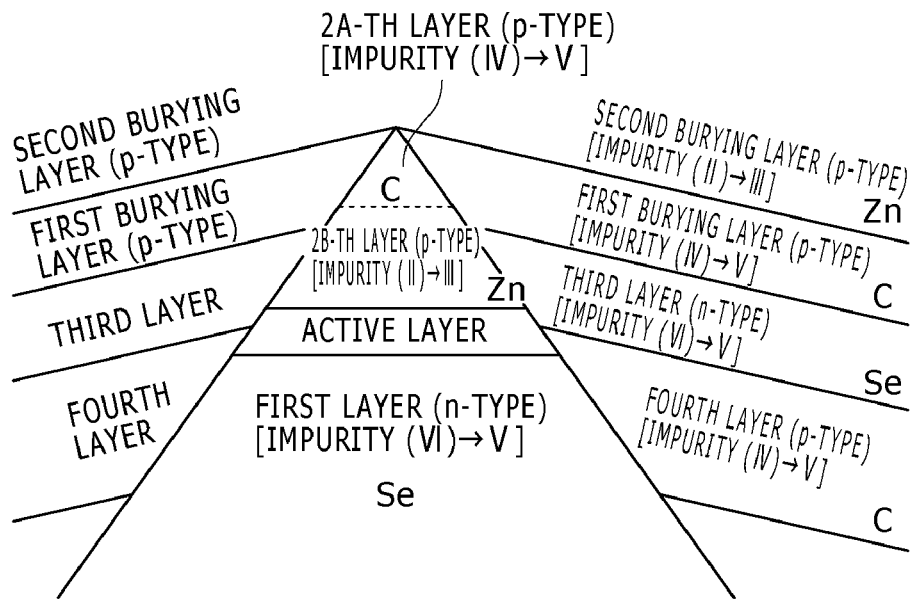
Figure 46A:
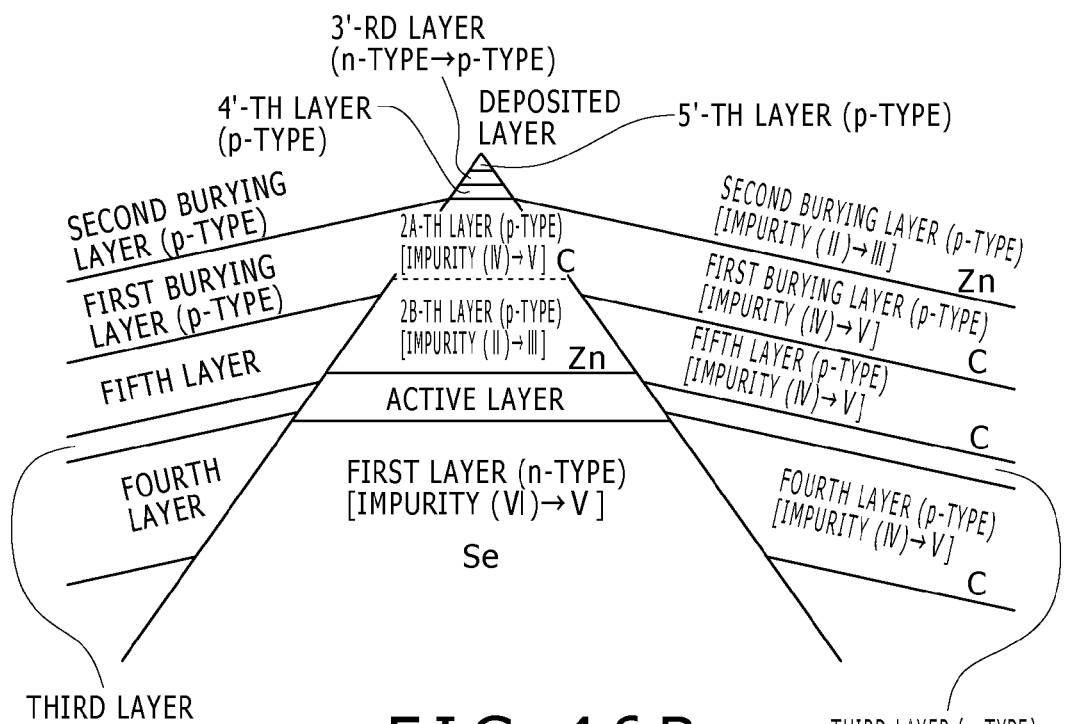
Figure 46B:
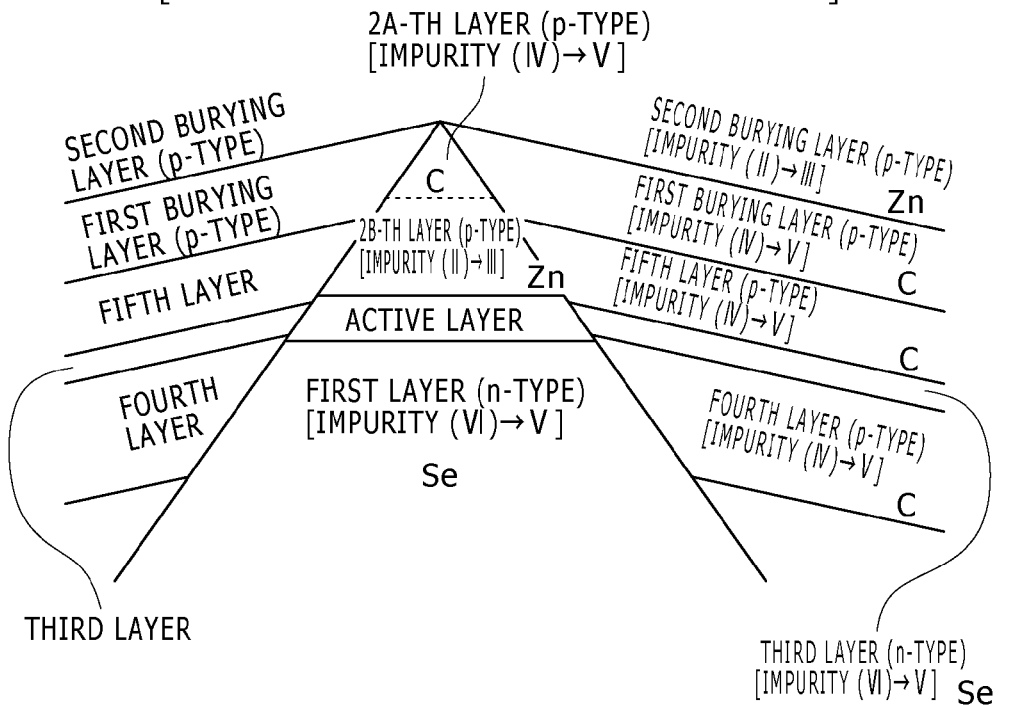
Figure 47A:
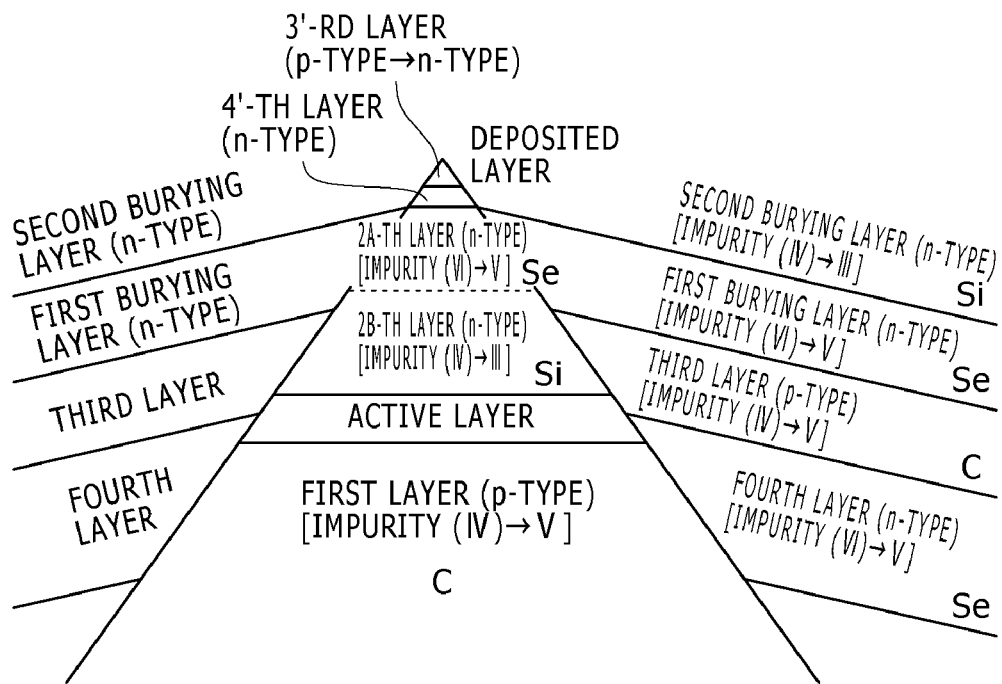

A modification example of the semiconductor light emitting device of the twenty-second embodiment is shown in FIG. 45A as a conceptual diagram of the end parts of the light emitting part and FIG. 45B as a conceptual diagram of the center part of the light emitting part. Furthermore, another modification example of the semiconductor light emitting device of the twenty-second embodiment is shown in FIG. 47A as a conceptual diagram of the end parts of the light emitting part and FIG. 47B as a conceptual diagram of the center part of the light emitting part. These modification examples correspond to the semiconductor light emitting device according to the ((II)-5-c)-th configuration of the present invention. In this semiconductor light emitting device, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group V atom. The substitution site of the impurity in the 2B-th compound semiconductor layer is the site occupied by a group III atom. The substitution site of the impurity in the first burying layer is the site occupied by a group V atom, and the substitution site of the impurity in the second burying layer is the site occupied by a group III atom.

The modification example of the semiconductor light emitting device of the twenty-second embodiment whose conceptual diagrams are shown in FIGS. 45A and 45B correspond to the semiconductor light emitting device according to the ((II)-5-c-1)-th configuration of the present invention. In this semiconductor light emitting device, the impurity for causing the first compound semiconductor layer and the third compound semiconductor layer to be the n-type as the first conductivity type is a group VI impurity (specifically, Se), the impurity for causing the 2A-th compound semiconductor layer and the fourth compound semiconductor layer to be the p-type as the second conductivity type is carbon (C), the impurity for causing the 2B-th compound semiconductor layer to be the p-type as the second conductivity type is a group II impurity (specifically, Zn), and the impurity for causing the first burying layer to be the p-type as the second conductivity type is carbon (C), and the impurity for causing the second burying layer to be the p-type as the second conductivity type is a group II impurity.

More specifically, in this modification example of the semiconductor light emitting device of the twenty-second embodiment, the respective layers have the configuration shown in Table 19K shown below.

TABLE 19K

| (Configuration of light emitting part) | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer - A] |
| First compound semiconductor layer (Current block layer) | n-$Al_{0.4}Ga_{0.6}As$: Se |
| Second burying layer | p-$Al_{0.47}Ga_{0.53}As$: Zn |
| First burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer (Whole) | p-$Al_{0.47}Ga_{0.53}As$: Zn |
| Contact layer | p-GaAs: Zn (or C) |

Figure 47B:
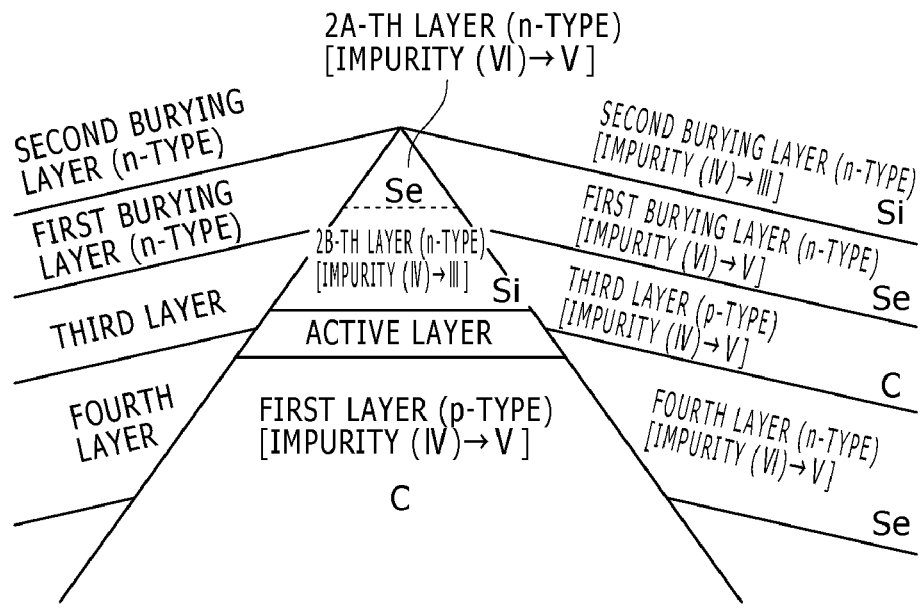
Figure 48A:
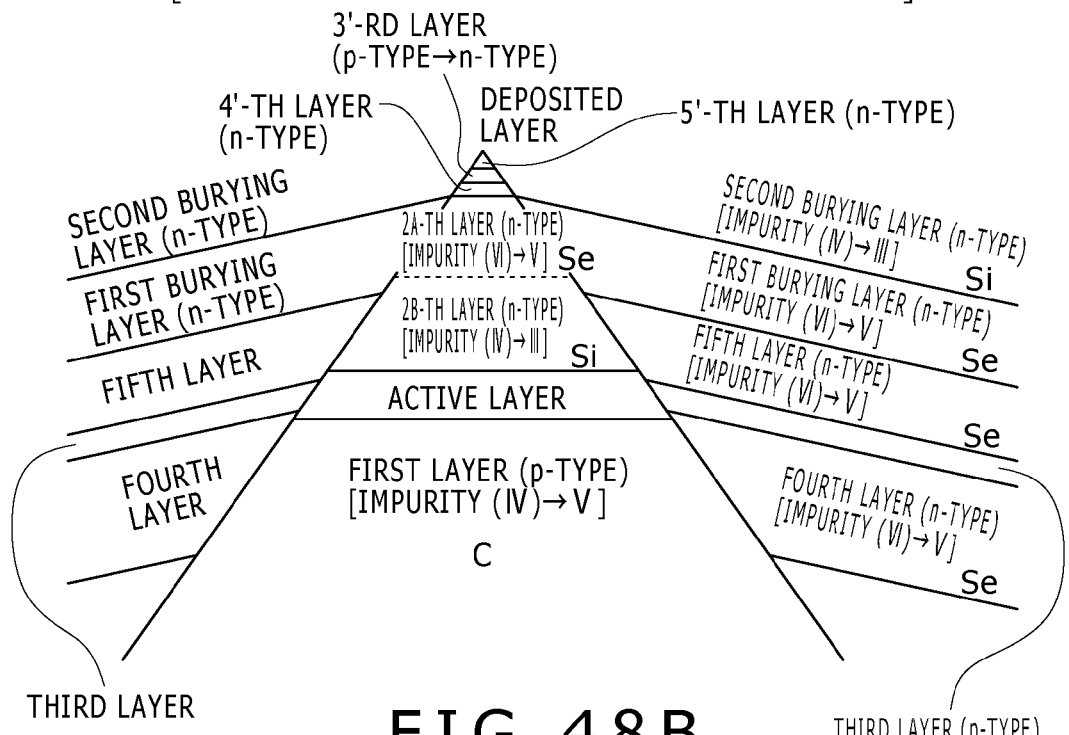
Figure 48B:
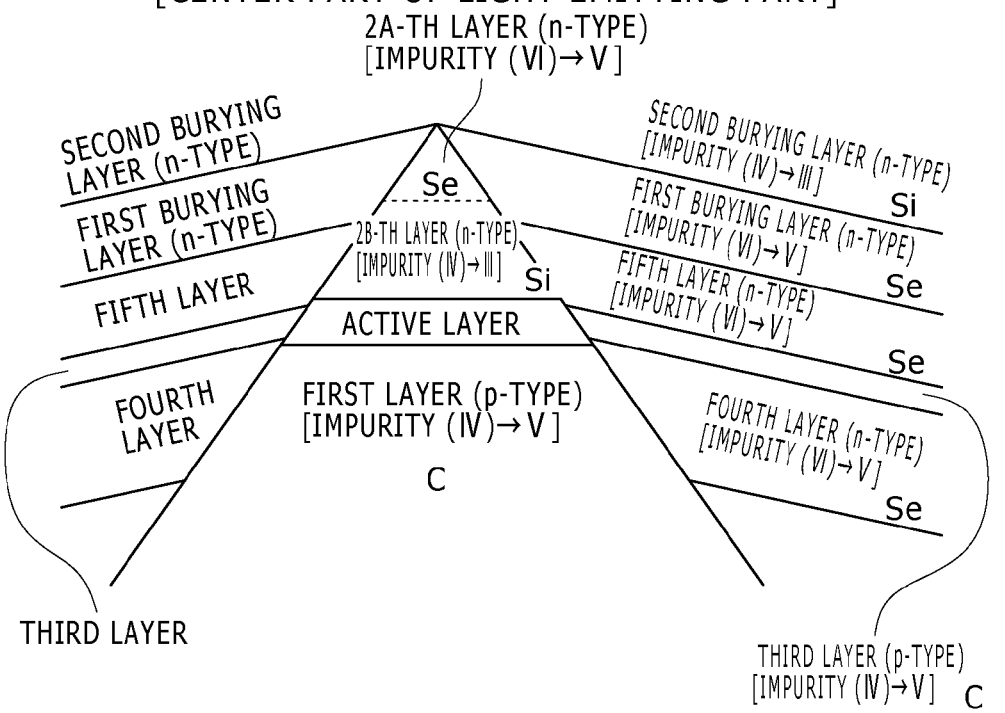

The modification example of the semiconductor light emitting device of the twenty-second embodiment whose conceptual diagrams are shown in FIGS. 47A and 47B correspond to the semiconductor light emitting device according to the ((II)-5-c-2)-th configuration of the present invention. In this semiconductor light emitting device, the impurity for causing the first compound semiconductor layer and the third compound semiconductor layer to be the p-type as the first conductivity type is carbon (C), the impurity for causing the 2A-th compound semiconductor layer and the fourth compound semiconductor layer to be the n-type as the second conductivity type is a group VI impurity (specifically, Se), the impurity for causing the 2B-th compound semiconductor layer to be the n-type as the second conductivity type is a group IV impurity (specifically, Si), and the impurity for causing the first burying layer to be the n-type as the second conductivity type is a group VI impurity, and the impurity for causing the second burying layer to be the n-type as the second conductivity type is a group IV impurity.

More specifically, in this modification example of the semiconductor light emitting device of the twenty-second embodiment, the respective layers have the configuration shown in Table 19L shown below.

TABLE 19L

| (Configuration of light emitting part) | |
|---|---|
| 2A-th compound semiconductor layer | n-$Al_{0.4}Ga_{0.6}As$: Se |
| 2B-th compound semiconductor layer | n-$Al_{0.4}Ga_{0.6}As$: Si |

TABLE 19L-continued

| Active layer | [Active layer - B] |
|---|---|
| First compound semiconductor layer (Current block layer) | p-$Al_{0.4}Ga_{0.6}As$: C |
| Second burying layer | n-$Al_{0.47}Ga_{0.53}As$: Si |
| First burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer (Whole) | n-$Al_{0.47}Ga_{0.53}As$: Se |
| Contact layer | p-GaAs: Zn (or C) |

Conceptual diagrams of further-modified examples of the modification examples of the semiconductor light emitting device of the twenty-second embodiment whose conceptual diagrams are shown in FIGS. 45A and 45B and FIGS. 47A and 27B are shown in FIGS. 46A and 46B and FIGS. 48A and 48B. Also in these further-modified examples, the fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the 2A-th compound semiconductor layer for causing the 2A-th compound semiconductor layer to have the second conductivity type (specifically, carbon in FIGS. 46A and 46B, and a group VI impurity, Se, in FIGS. 48A and 48B), and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). The bypass channel is composed of the first compound semiconductor layer, the fourth compound semiconductor layer, the third compound semiconductor layer, the fifth compound semiconductor layer, and the second compound semiconductor layer (the 2A-th compound semiconductor layer and the 2B-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

This is the end of the description of preferred embodiments of the present invention. The invention however is not limited to these embodiments.

The structure of the first compound semiconductor layer in the fifth embodiment (see FIG. 7A) may be combined with the structure of the second compound semiconductor layer in the sixth embodiment (see FIG. 8A) The structure of the second compound semiconductor layer in the fifth embodiment (see FIG. 7A) may be combined with the structure of the first compound semiconductor layer in the sixth embodiment (see FIG. 8A). The structure of the first compound semiconductor layer in the seventh embodiment (see FIG. 9A) may be combined with the structure of the second compound semiconductor layer in the eighth embodiment (see FIG. 10A). The structure of the second compound semiconductor layer in the seventh embodiment (see FIG. 9A) may be combined with the structure of the first compound semiconductor layer in the eighth embodiment (see FIG. 10A). Furthermore, the structure of the first compound semiconductor layer in the ninth embodiment (see FIG. 7B) may be combined with the structure of the second compound semiconductor layer in the tenth embodiment (see FIG. 8B). The structure of the second compound semiconductor layer in the ninth embodiment (see FIG. 7B) may be combined with the structure of the first compound semiconductor layer in the tenth embodiment (see FIGS. 8B). The structure of the first compound semiconductor layer in the eleventh embodiment (see FIG. 9B) may be combined with the structure of the second compound semiconductor layer in the twelfth embodiment (see FIG. 10B). The structure of the second compound semiconductor layer in the eleventh embodiment (see FIG. 9B) may be combined with the structure of the first compound semiconductor layer in the twelfth embodiment (see FIG. 10B).

The structure of the first compound semiconductor layer in the fourteenth embodiment (see FIGS. 21A and 21B) may be combined with the structure of the second compound semiconductor layer in the fifteenth embodiment (see FIGS. 22A and 22B). The structure of the second compound semiconductor layer in the fourteenth embodiment (see FIGS. 21A and 21B) may be combined with the structure of the first compound semiconductor layer in the fifteenth embodiment (see FIGS. 22A and 22B). The structure of the first compound semiconductor layer in the sixteenth embodiment (see FIGS. 23A and 23B) may be combined with the structure of the second compound semiconductor layer in the seventeenth embodiment (see FIGS. 24A and 24B). The structure of the second compound semiconductor layer in the sixteenth embodiment (see FIGS. 23A and 23B) may be combined with the structure of the first compound semiconductor layer in the seventeenth embodiment (see FIGS. 24A and 24B). Furthermore, the structure of the first compound semiconductor layer in the eighteenth embodiment (see FIGS. 25A and 25B) may be combined with the structure of the second compound semiconductor layer in the nineteenth embodiment (see FIGS. 26A and 26B). The structure of the second compound semiconductor layer in the eighteenth embodiment (see FIGS. 25A and 25B) may be combined with the structure of the first compound semiconductor layer in the nineteenth embodiment (see FIGS. 26A and 26B). The structure of the first compound semiconductor layer in the twentieth embodiment (see FIGS. 27A and 27B) may be combined with the structure of the second compound semiconductor layer in the twenty-first embodiment (see FIGS. 28A and 28B). The structure of the second compound semiconductor layer in the twentieth embodiment (see FIGS. 27A and 27B) may be combined with the structure of the first compound semiconductor layer in the twenty-first embodiment (see FIGS. 28A and 28B).

Furthermore, it is also possible for the semiconductor light emitting devices described for the fifth to twelfth and fourteenth to twenty-first embodiments to have the following configuration. Specifically, the current block layer 40 further includes a fifth compound semiconductor layer of the second conductivity type, the third compound semiconductor layer 43 is sandwiched by the fourth compound semiconductor layer 44 and the fifth compound semiconductor layer, and the impurity for causing the third compound semiconductor layer 43 to have the first conductivity type is such that the substitution site of the impurity in the third compound semiconductor layer 43 competes with the substitution site of the impurity in the fifth compound semiconductor layer for causing the fifth compound semiconductor layer to have the second conductivity type.

In the fifth, sixth, ninth, and tenth embodiments, it is also possible to regard the adjustment layer 30 as the fifth compound semiconductor layer, and the burying layer 31 as the fifth compound semiconductor layer although depending on the stacking state of the third compound semiconductor layer 43 and the fourth compound semiconductor layer 44. This applies also to the seventh, eighth, eleventh, and twelfth embodiments.

In the fourteenth, fifteenth, eighteenth, and nineteenth embodiments, it is also possible to regard the adjustment layer 30 as the fifth compound semiconductor layer, although depending on the stacking state of the third compound semiconductor layer 43 and the fourth compound semiconductor layer 44. This applies also to the sixteenth, seventeenth, twentieth, and twenty-first embodiments.

In addition, it is also possible for the semiconductor light emitting devices described for the fifth to twelfth and fourteenth to twenty-first embodiments to have the following configuration. Specifically, the current block layer 40 further includes a sixth compound semiconductor layer of the first conductivity type, the fourth compound semiconductor layer 44 is sandwiched by the third compound semiconductor layer 43 and the sixth compound semiconductor layer, and the impurity for causing the fourth compound semiconductor layer 44 to have the second conductivity type is such that the substitution site of the impurity in the fourth compound semiconductor layer 44 competes with the substitution site of the impurity in the sixth compound semiconductor layer for causing the sixth compound semiconductor layer to have the first conductivity type.

In the fifth, sixth, ninth, and tenth embodiments, it is possible for the current block layer 40 to have a three-layer structure arising from the stacking in the order of the third compound semiconductor layer 43 (n-type)/the fourth compound semiconductor layer 44 (p-type)/the sixth compound semiconductor layer (n-type). In addition, it is possible for the current block layer 40 to have a three-layer structure arising from the stacking in the order of the sixth compound semiconductor layer (n-type)/the fourth compound semiconductor layer 44 (p-type) /the third compound semiconductor layer 43 (n-type). Furthermore, also in the seventh, eighth, eleventh, and twelfth embodiments, it is possible for the current block layer 40 to have a three-layer structure arising from the stacking in the order of the third compound semiconductor layer 43 (p-type)/the fourth compound semiconductor layer 44 (n-type)/the sixth compound semiconductor layer (p-type). In addition, it is possible for the current block layer 40 to have a three-layer structure arising from the stacking in the order of the sixth compound semiconductor layer (p-type)/the fourth compound semiconductor layer 44 (n-type)/the third compound semiconductor layer 43 (p-type).

In the fifth, seventh, ninth, and eleventh embodiments, the second compound semiconductor layer has the two-layer structure composed of the second compound semiconductor layer 22A and the second compound semiconductor layer 22B stacked in that order from the active layer side. In the sixth, eighth, tenth, and twelfth embodiments, the second compound semiconductor layer has the two-layer structure composed of the 2A-th compound semiconductor layer and the 2B-th compound semiconductor layer stacked in that order from the active layer side. In the former case, the second compound semiconductor layer of the two-layer structure is defined based on the change of the band gap (or the refractive index). In the latter case, the second compound semiconductor layer of the two-layer structure is defined based on the change of the impurity substitution site. Therefore, regarding the multilayer structure of the second compound semiconductor layer described for the respective embodiments, if the second compound semiconductor layer has the two-layer structure composed of the 2A-th compound semiconductor layer and the 2B-th compound semiconductor layer in particular, the 2A-th compound semiconductor layer can be regarded as the second compound semiconductor layer 22A and the 2B-th compound semiconductor layer can be regarded as the second compound semiconductor layer 22B. In addition, for example, it is also possible that the 2A-th compound semiconductor layer is formed of the multilayer structure composed of the second compound semiconductor layers 22A and 22B, and it is also possible that the 2B-th compound semiconductor layer is formed of the multilayer structure composed of the second compound semiconductor layers 22A and 22B.

In the fourteenth, fifteenth, eighteenth, and nineteenth embodiments, it is possible for the current block layer 40 to have a three-layer structure arising from the stacking in the order of the third compound semiconductor layer 43 (n-type)/the fourth compound semiconductor layer 44 (p-type)/the sixth compound semiconductor layer (n-type). In addition, it is possible for the current block layer 40 to have a three-layer structure arising from the stacking in the order of the sixth compound semiconductor layer (n-type)/the fourth compound semiconductor layer 44 (p-type)/the third compound semiconductor layer 43 (n-type). Furthermore, also in the sixteenth, seventeenth, twentieth, and twenty-first embodiments, it is possible for the current block layer 40 to have a three-layer structure arising from the stacking in the order of the third compound semiconductor layer 43 (p-type)/the fourth compound semiconductor layer 44 (n-type)/the sixth compound semiconductor layer (p-type). In addition, it is possible for the current block layer 40 to have a three-layer structure arising from the stacking in the order of the sixth compound semiconductor layer (p-type)/the fourth compound semiconductor layer 44 (n-type)/the third compound semiconductor layer 43 (p-type).

In the fourteenth, sixteenth, eighteenth, and twentieth embodiments, the second compound semiconductor layer has the two-layer structure composed of the second compound semiconductor layer 22A and the second compound semiconductor layer 22B stacked in that order from the active layer side. In the fifteenth, seventeenth, nineteenth, and twenty-first embodiments, the second compound semiconductor layer has the two-layer structure composed of the 2A-th compound semiconductor layer and the 2B-th compound semiconductor layer stacked in that order from the active layer side. In the former case, the second compound semiconductor layer of the two-layer structure is defined based on the change of the band gap (or the refractive index). In the latter case, the second compound semiconductor layer of the two-layer structure is defined based on the change of the impurity substitution site. Therefore, regarding the multilayer structure of the second compound semiconductor layer described for the respective embodiments, if the second compound semiconductor layer has the two-layer structure composed of the 2A-th compound semiconductor layer and the 2B-th compound semiconductor layer in particular, the 2A-th compound semiconductor layer can be regarded as the second compound semiconductor layer 22A and the 2B-th compound semiconductor layer can be regarded as the second compound semiconductor layer 22B. In addition, for example, it is also possible that the 2A-th compound semiconductor layer is formed of the multilayer structure composed of the second compound semiconductor layers 22A and 22B, and it is also possible that the 2B-th compound semiconductor layer is formed of the multilayer structure composed of the second compound semiconductor layers 22A and 22B.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor light emitting device comprising:
   an underlying layer on a major surface of a substrate having a $\{100\}$ plane as the major surface;
   a light emitting part formed by sequential stacking of a first compound semiconductor layer of a first conductivity type, an active layer, and a second compound semiconductor layer of a second conductivity type above a top surface of the underlying layer; and
   a current block layer above a part of the major surface of the substrate on which the underlying layer is not formed and covering at least an exposed side surface of the active layer of the light emitting part,
   wherein,
   the underlying layer is composed of a III-V compound semiconductor and is formed on the major surface of the substrate by epitaxial growth,
   the underlying layer extends in parallel to a <110> direction of the substrate,
   a sectional shape of the underlying layer obtained when the underlying layer is cut along a virtual plane perpendicular to the <110> direction of the substrate is a trapezoid,
   oblique surfaces of the underlying layer corresponding to two oblique sides of the trapezoid are $\{111\}$B planes, and the top surface of the underlying layer corresponding to an upper side of the trapezoid is a $\{100\}$ plane, and
   an energy band gap of a material of the underlying layer is larger than an energy band gap of a material of the first compound semiconductor layer.

2. The semiconductor light emitting device according to claim 1, wherein
   an energy band gap of a material of the underlying layer is larger than an energy band gap of a material of the substrate.

3. The semiconductor light emitting device according to claim 1, wherein the III-V compound semiconductor of the underlying layer contains, as an element, at least one of arsenic, antimony, and bismuth, and aluminum.

4. The semiconductor light emitting device according to claim 1, wherein
   the III-V compound semiconductor of the underlying layer contains at least phosphorus as an element.

* * * * *